US011145828B2

(12) United States Patent
Stoessel et al.

(10) Patent No.: US 11,145,828 B2
(45) Date of Patent: Oct. 12, 2021

(54) METAL COMPLEXES

(71) Applicant: Merck Patent GmbH, Darmstadt (DE)

(72) Inventors: Philipp Stoessel, Frankfurt am Main (DE); Nils Koenen, Griesheim (DE); Christian Ehrenreich, Darmstadt (DE)

(73) Assignee: Merck Patent GmbH, Darmstadt (DE)

( * ) Notice: Subject to any disclaimer, the term of this patent is extended or adjusted under 35 U.S.C. 154(b) by 353 days.

(21) Appl. No.: 16/342,082

(22) PCT Filed: Oct. 10, 2017

(86) PCT No.: PCT/EP2017/075737
§ 371 (c)(1),
(2) Date: Apr. 15, 2019

(87) PCT Pub. No.: WO2018/069273
PCT Pub. Date: Apr. 19, 2018

(65) Prior Publication Data

US 2019/0252628 A1 Aug. 15, 2019

(30) Foreign Application Priority Data

Oct. 13, 2016 (EP) .................................... 16193610

(51) Int. Cl.

| | |
|---|---|
| ***H01L 51/00*** | (2006.01) |
| ***C07F 15/00*** | (2006.01) |
| ***H01L 51/50*** | (2006.01) |
| ***C09K 11/06*** | (2006.01) |

(52) U.S. Cl.
CPC ...... *H01L 51/0085* (2013.01); *C07F 15/0033* (2013.01); *C09K 11/06* (2013.01); *H01L 51/50* (2013.01); *C09K 2211/1029* (2013.01); *C09K 2211/1033* (2013.01); *C09K 2211/1044* (2013.01); *C09K 2211/1048* (2013.01); *C09K 2211/185* (2013.01); *H01L 51/5012* (2013.01); *H01L 51/5016* (2013.01); *H01L 2251/552* (2013.01)

(58) Field of Classification Search
CPC .......... H01L 51/0085; C09K 2211/185; C09K 2211/1029; C09K 2211/1033; C09K 2211/1044; C09K 2211/1048
See application file for complete search history.

(56) References Cited

U.S. PATENT DOCUMENTS

| | | |
|---|---|---|
| 7,332,232 B2 | 2/2008 | Ma et al. |
| 2006/0220004 A1 | 10/2006 | Stoessel et al. |
| 2018/0026209 A1 | 1/2018 | Stoessel et al. |

FOREIGN PATENT DOCUMENTS

| | | |
|---|---|---|
| WO | 2004081017 A1 | 9/2004 |
| WO | 2016124304 A1 | 8/2016 |

OTHER PUBLICATIONS

Maity et al, Di- and Trinuclear Iridium(III) Complexes with Poly-Mesoionic Carbenes Synthesized through Selective Base-Dependent Metalation, Organometallics, vol. 34, Issue 12, pp. 3090-3096, 2015.*
Gamez et al, The new multi-directional polydentate ligand 2,4,6-(di-pyridin-2-yl-amino)-[1,3,5]triazine (dpyatriz) can discriminate between Zn(II) and Co(II) nitrate, Polyhedron, vol. 22, Issue 1, pp. 205-210, Jan. 2003.*
International Search Report dated Jan. 18, 2018 in International Application No. PCT/EP2017/075737 (2 pages).

* cited by examiner

*Primary Examiner* — Alexander C Kollias
(74) *Attorney, Agent, or Firm* — Faegre Drinker Biddle & Reath LLP

(57) ABSTRACT

The present invention relates to binuclear metal complexes and electronic devices, in particular organic electroluminescent devices containing said metal complexes.

17 Claims, No Drawings

METAL COMPLEXES

RELATED APPLICATIONS

This application is a national stage entry, filed pursuant to 35 U.S.C. § 371, of PCT/EP2017/075737, filed Oct. 10, 2017, which claims the benefit of European Patent Application No. 16193610.9, filed Oct. 13, 2016, which is incorporated herein by reference in its entirety.

The present invention relates to binuclear metal complexes suitable for use as emitters in organic electroluminescent devices.

According to the prior art, triplet emitters used in phosphorescent organic electroluminescent devices (OLEDs) are, in particular, bis- and tris-ortho-metallated iridium complexes having aromatic ligands, where the ligands bind to the metal via a negatively charged carbon atom and an uncharged nitrogen atom or via a negatively charged carbon atom and an uncharged carbene carbon atom. Examples of such complexes are tris(phenylpyridyl)iridium(III) and derivatives thereof, where the ligands used are, for example, 1- or 3-phenylisoquinolines, 2-phenylquinolines or phenylcarbenes. In the case of these complexes, further improvements are still desirable, especially with regard to efficiency, lifetime and thermal stability.

An improvement in the stability of the complexes was achieved by the use of polypodal ligands, as described, for example, in WO 2004/081017, U.S. Pat. No. 7,332,232 and WO 2016/124304. Even though these complexes show advantages over complexes which otherwise have the same ligand structure except that the individual ligands therein do not have polypodal bridging, there is still a need for improvement. Thus, in the case of complexes having polypodal ligands too, improvements are still desirable in relation to the properties on use in an organic electroluminescent device, especially in relation to luminescence lifetime of the excited state, efficiency, voltage and/or lifetime.

The problem addressed by the present invention is therefore that of providing novel metal complexes suitable as emitters for use in OLEDs. It is a particular object to provide emitters which exhibit improved properties in relation to efficiency, operating voltage and/or lifetime.

It has been found that, surprisingly, the binuclear rhodium and iridium complexes as described below show distinct improvements in photophysical properties compared to corresponding mononuclear complexes and hence also lead to improved properties when used in an organic electroluminescent device. The present invention provides these complexes and organic electroluminescent devices comprising these complexes.

The invention thus provides a metal complex containing a ligand of the following formula (1) coordinated to two metals, where the metals are the same or different and are selected from iridium and rhodium, Formula (1)

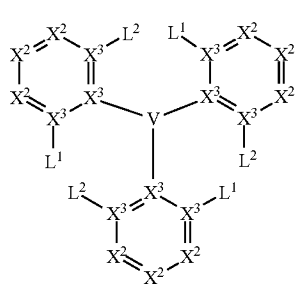

where the symbols used are as follows:

V is a group of the following formula (2) or (3):

Formula (2)

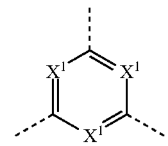

Formula (3)

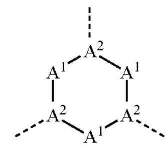

where the dotted bonds represent the bonds to $X^3$;

$L^1$ is the same or different at each instance and is a bidentate monoanionic sub-ligand, where all sub-ligands $L^1$ coordinate to one of the two metals;

$L^2$ is the same or different at each instance and is a bidentate monoanionic sub-ligand, where all sub-ligands $L^2$ coordinate to the other of the two metals;

$X^1$ is the same or different at each instance and is CR or N;

$X^2$ is the same or different at each instance and is CR or N or two adjacent $X^2$ groups together are NR, O or S, thus forming a five-membered ring, and the remaining $X^2$ are the same or different at each instance and are CR or N; or two adjacent $X^2$ groups together are CR or N when one of the $X^3$ groups in the cycle is N, thus forming a five-membered ring; with the proviso that not more than two adjacent $X^2$ groups are N;

$X^3$ is C at each instance or one $X^3$ group is N and the other $X^3$ groups in the same cycle are C; with the proviso that two adjacent $X^2$ groups together are CR or N when one of the $X^3$ groups in the cycle is N;

$A^1$ is the same or different at each instance and is $C(R)_2$ or O;

$A^2$ is the same or different at each instance and is CH, CD or B, with the proviso that, when $A^2$=B, the symbol $A^1$ is O;

R is the same or different at each instance and is H, D, F, Cl, Br, I, $N(R^1)_2$, CN, $NO_2$, $OR^1$, $SR^1$, COOH, $C(=O)N(R^1)_2$, $Si(R^1)_3$, $B(OR^1)_2$, $C(=O)R^1$, $P(=O)(R^1)_2$, $S(=O)R^1$, $S(=O)_2R^1$, $OSO_2R^1$, COO(cation), $SO_3$(cation), $OSO_3$(cation), $OPO_3(\text{cation})_2$, O(cation), $N(R^1)_3$(anion), $P(R^1)_3$(anion), a straight-chain alkyl group having 1 to 20 carbon atoms or an alkenyl or alkynyl group having 2 to 20 carbon atoms or a branched or cyclic alkyl group having 3 to 20 carbon atoms, where the alkyl, alkenyl or alkynyl group may in each case be substituted by one or more $R^1$ radicals, where one or more nonadjacent $CH_2$ groups may be replaced by $Si(R^1)_2$, C=O, $NR^1$, O, S or $CONR^1$, or an aromatic or heteroaromatic ring system which has 5 to 40 aromatic ring atoms and may be substituted in each case by one or more $R^1$ radicals; at the same time, two R radicals together may also form a ring system;

$R^1$ is the same or different at each instance and is H, D, F, Cl, Br, I, $N(R^2)_2$, CN, $NO_2$, $OR^2$, $SR^2$, $Si(R^2)_3$, $B(OR^2)_2$, $C(=O)R^2$, $P(=O)(R^2)_2$, $S(=O)R^2$, $S(=O)_2R^2$, $OSO_2R^2$, COO(cation), $SO_3$(cation), $OSO_3$(cation), $OPO_3(\text{cation})_2$, O(cation), $N(R^2)_3$(anion), $P(R^2)_3$(anion), a straight-chain alkyl group having 1 to 20 carbon atoms or an alkenyl or alkynyl group having 2 to 20 carbon atoms or a branched or cyclic alkyl group having 3 to 20 carbon atoms, where the alkyl, alkenyl or alkynyl group may in each case be substituted by one or more $R^2$ radicals, where one or more nonadjacent $CH_2$ groups may be replaced by $Si(R^2)_2$, C═O, $NR^2$, O, S or $CONR^2$, or an aromatic or heteroaromatic ring system which has 5 to 40 aromatic ring atoms and may be substituted in each case by one or more $R^2$ radicals; at the same time, two or more $R^1$ radicals together may form a ring system;

$R^2$ is the same or different at each instance and is H, D, F or an aliphatic, aromatic or heteroaromatic organic radical, especially a hydrocarbyl radical, having 1 to 20 carbon atoms, in which one or more hydrogen atoms may also be replaced by F;

cation is the same or different at each instance and is selected from the group consisting of proton, deuteron, alkali metal ions, alkaline earth metal ions, ammonium, tetraalkylammonium and tetraalkylphosphonium;

anion is the same or different at each instance and is selected from the group consisting of halides, carboxylates $R^2$—$COO^-$, cyanide, cyanate, isocyanate, thiocyanate, thioisocyanate, hydroxide, $BF_4^-$, $PF_6^-$, $B(C_6F_6)_4^-$, carbonate and sulfonates.

In a preferred embodiment of the invention, the compounds of the invention consist of a ligand of formula (1) and the two metals and do not contain any further ligands.

When two R or $R^1$ radicals together form a ring system, it may be mono- or polycyclic, and aliphatic, heteroaliphatic, aromatic or heteroaromatic. In this case, the radicals which together form a ring system may be adjacent, meaning that these radicals are bonded to the same carbon atom or to carbon atoms directly bonded to one another, or they may be further removed from one another. Preference is given to this kind of ring formation in radicals bonded to carbon atoms directly bonded to one another or to the same carbon atom.

The wording that two or more radicals together may form a ring, in the context of the present description, shall be understood to mean, inter alia, that the two radicals are joined to one another by a chemical bond with formal elimination of two hydrogen atoms. This is illustrated by the following scheme:

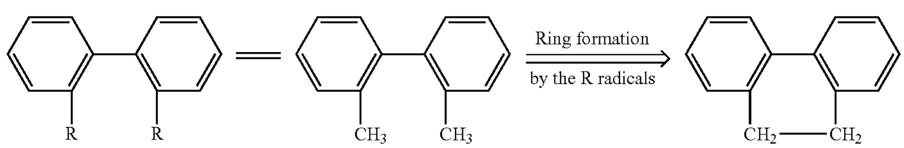

In addition, however, the abovementioned wording shall also be understood to mean that, if one of the two radicals is hydrogen, the second radical binds to the position to which the hydrogen atom was bonded, forming a ring. This shall be illustrated by the following scheme:

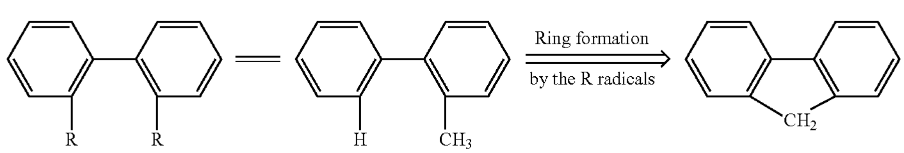

The formation of an aromatic ring system shall be illustrated by the following scheme:

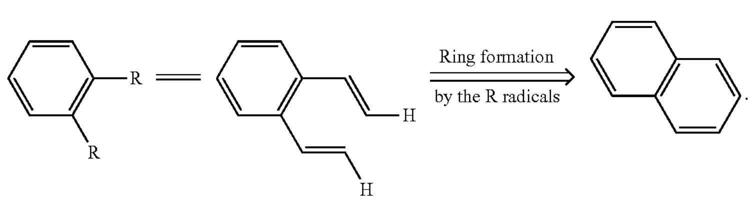

An aryl group in the context of this invention contains 6 to 40 carbon atoms; a heteroaryl group in the context of this invention contains 2 to 40 carbon atoms and at least one heteroatom, with the proviso that the sum total of carbon atoms and heteroatoms is at least 5. The heteroatoms are preferably selected from N, O and/or S. An aryl group or heteroaryl group is understood here to mean either a simple aromatic cycle, i.e. benzene, or a simple heteroaromatic cycle, for example pyridine, pyrimidine, thiophene, etc., or a fused aryl or heteroaryl group, for example naphthalene, anthracene, phenanthrene, quinoline, isoquinoline, etc.

An aromatic ring system in the context of this invention contains 6 to 40 carbon atoms in the ring system. A heteroaromatic ring system in the context of this invention contains 1 to 40 carbon atoms and at least one heteroatom in the ring system, with the proviso that the sum total of carbon atoms and heteroatoms is at least 5. The heteroatoms are preferably selected from N, O and/or S. An aromatic or heteroaromatic ring system in the context of this invention shall be understood to mean a system which does not necessarily contain only aryl or heteroaryl groups, but in which it is also possible for a plurality of aryl or heteroaryl groups to be interrupted by a nonaromatic unit (preferably less than 10% of the atoms other than H), for example a carbon, nitrogen or oxygen atom or a carbonyl group. For example, systems such as 9,9'-spirobifluorene, 9,9-diarylfluorene, triarylamine, diaryl ethers, stilbene, etc. shall thus also be regarded as aromatic ring systems in the context of this invention, and likewise systems in which two or more aryl groups are interrupted, for example, by a linear or cyclic alkyl group or by a silyl group. In addition, systems in which two or more aryl or heteroaryl groups are bonded directly to one another, for example biphenyl, terphenyl, quaterphenyl or bipyridine, shall likewise be regarded as an aromatic or heteroaromatic ring system.

A cyclic alkyl group in the context of this invention is understood to mean a monocyclic, bicyclic or polycyclic group.

In the context of the present invention, a $C_1$- to $C_{20}$-alkyl group in which individual hydrogen atoms or $CH_2$ groups may also be replaced by the abovementioned groups is understood to mean, for example, the methyl, ethyl, n-propyl, i-propyl, cyclopropyl, n-butyl, i-butyl, s-butyl, t-butyl, cyclobutyl, 2-methylbutyl, n-pentyl, s-pentyl, t-pentyl, 2-pentyl, neopentyl, cyclopentyl, n-hexyl, s-hexyl, t-hexyl, 2-hexyl, 3-hexyl, neohexyl, cyclohexyl, 1-methylcyclopentyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2.2.2]octyl, 2-bicyclo[2.2.2]octyl, 2-(2,6-dimethyl)octyl, 3-(3,7-dimethyl)octyl, adamantyl, trifluoromethyl, pentafluoroethyl, 2,2,2-trifluoroethyl, 1,1-dimethyl-n-hex-1-yl, 1,1-dimethyl-n-hept-1-yl, 1,1-dimethyl-n-oct-1-yl, 1,1-dimethyl-n-dec-1-yl, 1,1-dimethyl-n-dodec-1-yl, 1,1-dimethyl-n-tetradec-1-yl, 1,1-dimethyl-n-hexadec-1-yl, 1,1-dimethyl-n-octadec-1-yl, 1,1-diethyl-n-hex-1-yl, 1,1-diethyl-n-hept-1-yl, 1,1-diethyl-n-oct-1-yl, 1,1-diethyl-n-dec-1-yl, 1,1-diethyl-n-dodec-1-yl, 1,1-diethyl-n-tetradec-1-yl, 1,1-diethyl-n-hexadec-1-yl, 1,1-diethyl-n-octadec-1-yl, 1-(n-propyl)cyclohex-1-yl, 1-(n-butyl)cyclohex-1-yl, 1-(n-hexyl)cyclohex-1-yl, 1-(n-octyl)cyclohex-1-yl and 1-(n-decyl)cyclohex-1-yl radicals. An alkenyl group is understood to mean, for example, ethenyl, propenyl, butenyl, pentenyl, cyclopentenyl, hexenyl, cyclohexenyl, heptenyl, cycloheptenyl, octenyl, cyclooctenyl or cyclooctadienyl. An alkynyl group is understood to mean, for example, ethynyl, propynyl, butynyl, pentynyl, hexynyl, heptynyl or octynyl. A $C_1$- to $C_{20}$-alkoxy group as present for $OR^1$ or $OR^2$ is understood to mean, for example, methoxy, trifluoromethoxy, ethoxy, n-propoxy, i-propoxy, n-butoxy, i-butoxy, s-butoxy, t-butoxy or 2-methylbutoxy.

An aromatic or heteroaromatic ring system which has 5-40 aromatic ring atoms and may also be substituted in each case by the abovementioned radicals and which may be joined to the aromatic or heteroaromatic system via any desired positions is understood to mean, for example, groups derived from benzene, naphthalene, anthracene, benzanthracene, phenanthrene, benzophenanthrene, pyrene, chrysene, perylene, fluoranthene, benzofluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or trans-indenofluorene, cis- or trans-monobenzoindenofluorene, cis- or trans-dibenzoindenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, indolocarbazole, indenocarbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

For further illustration of the compound, a simple metal complex containing a ligand of formula (1) is elucidated hereinafter. The three cycles containing $X^2$ and $X^3$ in the simplest case are phenyl groups. These are not coplanar with V, but are twisted out of the plane compared to V, such that the sub-ligands $L^1$ are above the plane of V and the sub-ligands $L^2$ below the plane of V. As a result, the three sub-ligands $L^1$ are arranged such that they can coordinate to a first metal M, and the three sub-ligands $L^2$ are arranged such that they can coordinate to a second metal M. This is shown in schematic form hereinafter:

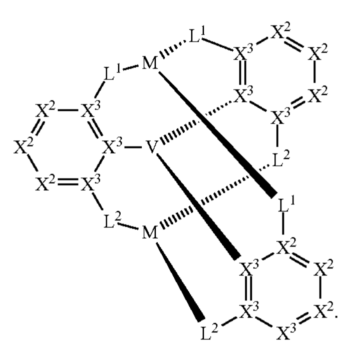

When $X^3$=C and $X^2$=CH, this results in the following structure:

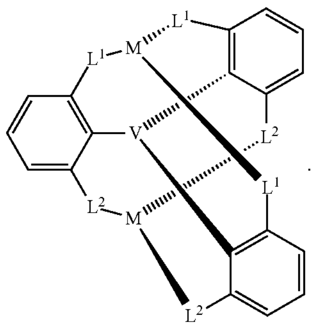

When V is benzene, this leads to the following structure:

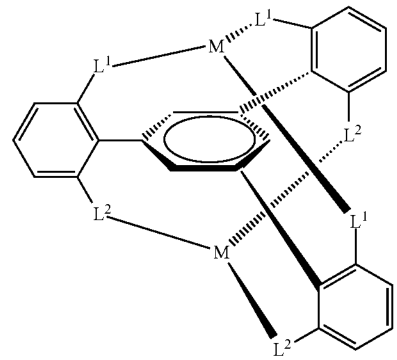

where the symbols used have the definitions given above.

In the structures depicted above, M is the same or different and is iridium or rhodium, and other symbols used have the definitions given above.

The structure of a metal complex of the invention is depicted in full hereinafter:

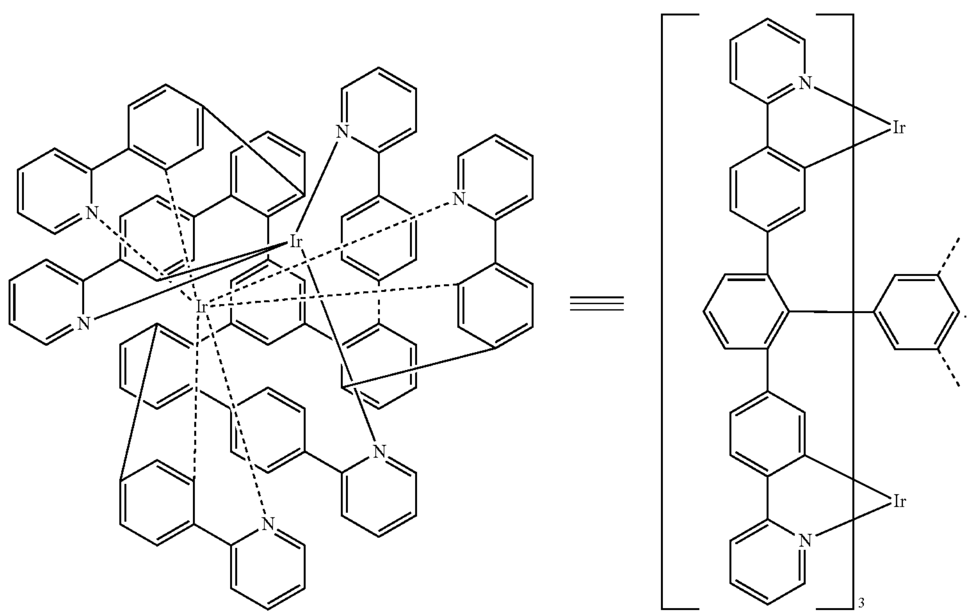

In this structure, V is a benzene group, i.e. a group of the formula (2) with $X^1$=CH. $X^2$ is CH, and $X^3$ is C, and so phenyl groups are bonded to the benzene group V in the 1, 3 and 5 positions, each of which are substituted in the ortho positions by the sub-ligands $L^1$ and $L^2$. All sub-ligands $L^1$ and $L^2$ here represent phenylpyridine. The three sub-ligands $L^1$ are coordinated to a first iridium atom, and the three sub-ligands $L^2$ are coordinated to a second iridium atom. Each of the two iridium atoms is thus coordinated to three phenylpyridine sub-ligands in each case. The sub-ligands here are joined via the central triphenylbenzene unit to form a polypodal system.

When V is a group of the formula (3), it is a cyclohexane group or a hetero analog thereof. This is in a chair form. In this case, $X^3$ in each case is bonded equatorially, and so the structure is a cis,cis cyclohexane or a corresponding hetero analog as shown in schematic form below for cyclohexane, where the dotted bond in each case represents the bond to $X^3$:

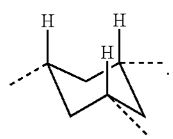

The expression "bidentate sub-ligand" for $L^1$ or $L^2$ in the context of this application means that this unit would be a bidentate ligand if the group V and the cycles comprising $X^2$ and $X^3$ were not present. As a result of the formal abstraction of a hydrogen atom from these bidentate ligands and the linkage of three $L^1$ and three $L^2$ in the ligand of the formula (1), however, $L^1$ and $L^2$ are not separate ligands; instead, they are part of the resultant dodecadentate ligand, i.e. a ligand having a total of 12 coordination sites, and so the term "sub-ligand" is used here for $L^1$ and $L^2$.

The bond of the ligand to the metals may either be a coordinate bond or a covalent bond, or the covalent fraction of the bond may vary according to the sub-ligand. When it is said in the present application that the ligand or sub-ligand coordinates or binds to the metal, this refers in the context of the present application to any kind of bond of the ligand or sub-ligand to the metal, irrespective of the covalent fraction of the bond.

The metal complexes of the invention are preferably uncharged, meaning that they are electrically neutral. This is achieved in that Rh or Ir is in each case in the +III oxidation state. In that case, each of the metals is coordinated by three monoanionic bidentate sub-ligands, so that the sub-ligands compensate for the charge of the complexed metal atom. As described above, the two metals in the metal complex of the invention may be the same or different and are preferably in the +III oxidation state. Possible combinations are therefore Ir/Ir, Ir/Rh and Rh/Rh. In a preferred embodiment of the invention, both metals are Ir(III).

In a preferred embodiment of the invention, $X^2$ in formula (1) is the same or different at each instance and is CR and more preferably CH, and $X^3$ is C.

The ligand of the formula (1) therefore preferably has a structure of the following formula (1'):

Formula (1')

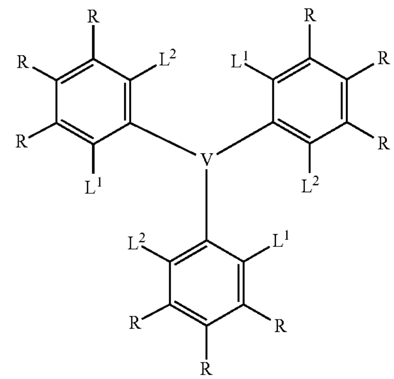

where the symbols have the definitions given above.

Recited hereinafter are preferred embodiments for V, i.e. the group of the formula (2) or (3).

Suitable embodiments of the group of the formula (2) are the structures of the following formulae (2a) to (2d), and suitable embodiments of the group of the formula (3) are the structures of the following formulae (3a) and (3b):

Formula (2a)

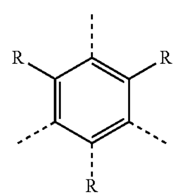

Formula (2b)

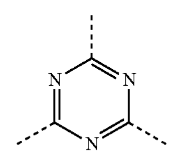

Formula (2c)

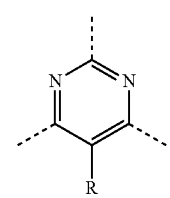

Formula (2d)

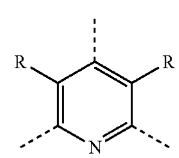

Formula (3a)

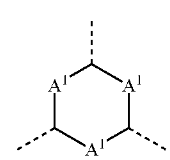

-continued

Formula (3b)

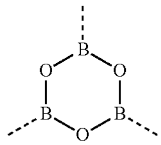

where the symbols have the definitions given above, where, in formula (3a), hydrogen atoms may also be replaced by deuterium.

Preferred R radicals in formulae (2a) to (3b) are as follows:

R is the same or different at each instance and is H, D, F, CN, $OR^1$, a straight-chain alkyl group having 1 to 10 carbon atoms or an alkenyl group having 2 to 10 carbon atoms or a branched or cyclic alkyl group having 3 to 10 carbon atoms, each of which may be substituted by one or more $R^1$ radicals, or an aromatic or heteroaromatic ring system which has 5 to 24 aromatic ring atoms and may be substituted in each case by one or more $R^1$ radicals; with the proviso that R in formula (3d) is an alkyl or alkenyl group or an aromatic or heteroaromatic ring system;

$R^1$ is the same or different at each instance and is H, D, F, CN, $OR^2$, a straight-chain alkyl group having 1 to 10 carbon atoms or an alkenyl group having 2 to 10 carbon atoms or a branched or cyclic alkyl group having 3 to 10 carbon atoms, each of which may be substituted by one or more $R^2$ radicals, or an aromatic or heteroaromatic ring system which has 5 to 24 aromatic ring atoms and may be substituted in each case by one or more $R^2$ radicals; at the same time, two or more adjacent $R^1$ radicals together may form a ring system;

$R^2$ is the same or different at each instance and is H, D, F or an aliphatic, aromatic or heteroaromatic organic radical having 1 to 20 carbon atoms, in which one or more hydrogen atoms may also be replaced by F.

Particularly preferred R radicals in formulae (2a) to (3b) are as follows:

R is the same or different at each instance and is H, D, F, CN, a straight-chain alkyl group having 1 to 4 carbon atoms or a branched or cyclic alkyl group having 3 to 6 carbon atoms, each of which may be substituted by one or more $R^1$ radicals, or an aromatic or heteroaromatic ring system which has 6 to 12 aromatic ring atoms and may be substituted in each case by one or more $R^1$ radicals; with the proviso that R in formula (3d) is an alkyl or alkenyl group or an aromatic or heteroaromatic ring system;

$R^1$ is the same or different at each instance and is H, D, F, CN, a straight-chain alkyl group having 1 to 4 carbon atoms or a branched or cyclic alkyl group having 3 to 6 carbon atoms, each of which may be substituted by one or more $R^2$ radicals, or an aromatic or heteroaromatic ring system which has 6 to 12 aromatic ring atoms and may be substituted in each case by one or more $R^2$ radicals; at the same time, two or more adjacent $R^1$ radicals together may form a ring system;

$R^2$ is the same or different at each instance and is H, D, F or an aliphatic or aromatic hydrocarbyl radical having 1 to 12 carbon atoms.

In a preferred embodiment of the invention, all $X^1$ groups in the group of the formula (2) are CR, and so the central trivalent cycle of the formula (2) is a benzene. More preferably, all $X^1$ groups are CH or CD, especially CH. In a further preferred embodiment of the invention, all $X^1$ groups are a nitrogen atom, and so the central trivalent cycle of the formula (2) is a triazine. Preferred embodiments of the formula (2) are thus the structures of the formulae (2a) and (2b) depicted above. More preferably, the structure of the formula (2a) is a structure of the following formula (2a'):

Formula (2a')

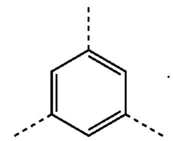

In a further preferred embodiment of the invention, all $A^2$ groups in the group of the formula (3) are CH or CD, especially CH. Preferred embodiments of the formula (3) are thus the structures of the formula (3a) depicted above. More preferably, the structure of the formula (3a) is a structure of the following formula (3a') or (3a"):

Forumla (3a')

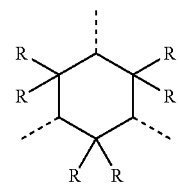

Formula (3a")

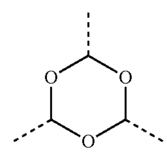

where the symbols have the definitions given above and R is preferably H.

In a preferred embodiment of the invention, the ligand of the formula (1) has a structure of one of the following formulae (1a) to (1d):

Formula (1a)

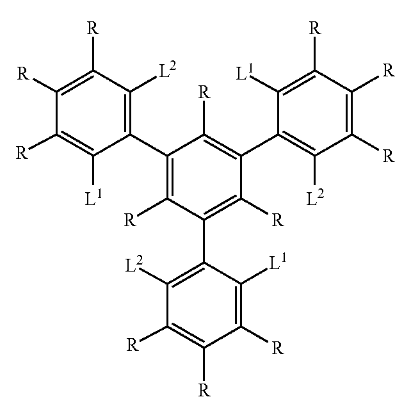

-continued
Formula (1b)
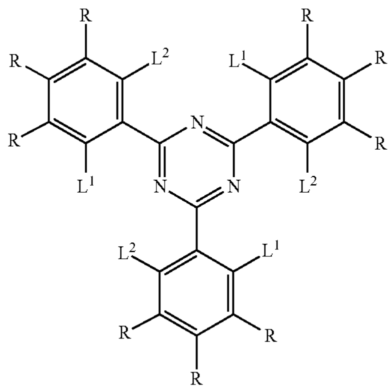
Formula (1c)
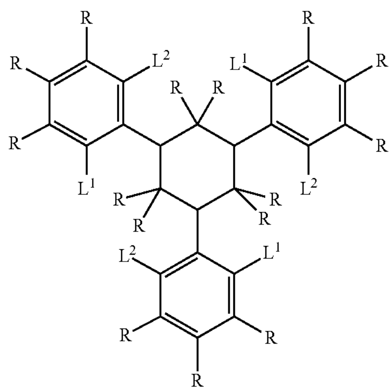
Formula (1d)
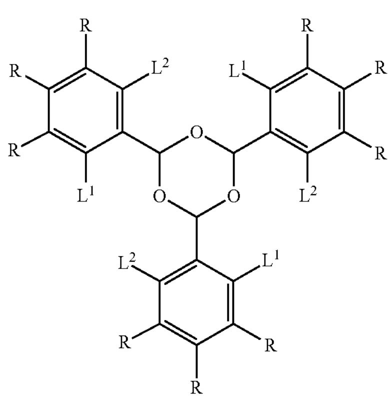
where the symbols used have the definitions given above.
In a particularly preferred embodiment of the invention, the ligand of the formula (1) has a structure of one of the following formulae (1a') to (1d'):
Formula (1a')
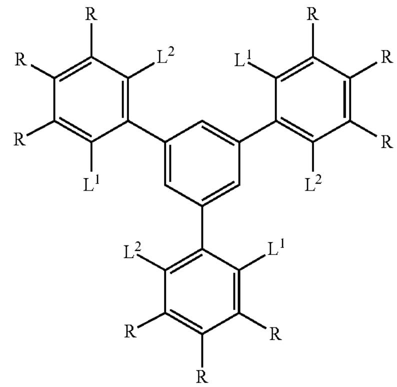
Formula (1b')
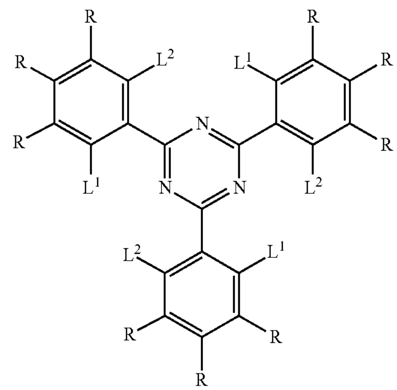
Formula (1c')
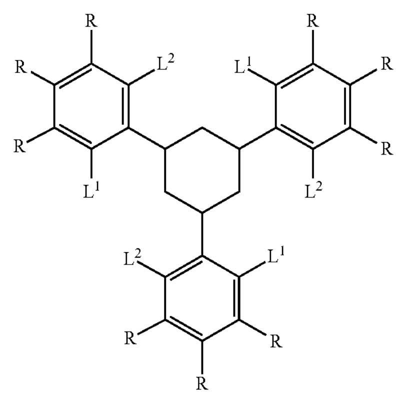
Formula (1d')
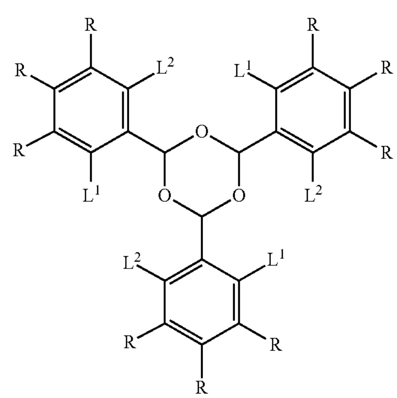
where the symbols used have the definitions given above.

In a very particularly preferred embodiment of the invention, the ligand of the formula (1) has a structure of one of the following formulae (1a") to (1d"):

Formula (1a″)

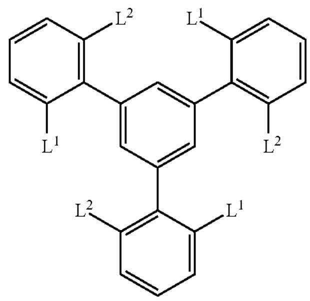

Formula (1b″)

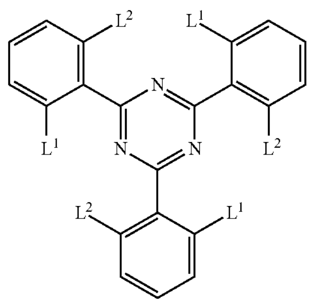

Formula (1c″)

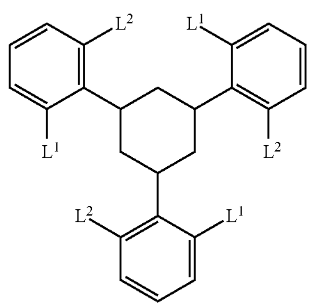

Formula (1d″)

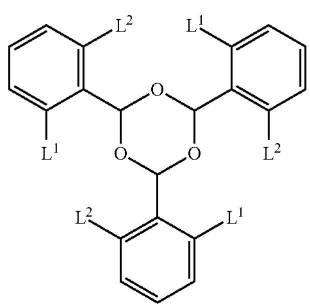

where the symbols used have the definitions given above.

The ligand of the formula (1a") is especially preferred.

There follows a description of the bidentate monoanionic sub-ligands $L^1$ and $L^2$. The sub-ligands $L^1$ and $L^2$ may independently be the same or different. It is preferable here when two sub-ligands $L^1$ are the same and the third sub-ligand $L^1$ is the same or different, "the same" meaning that these also have the same substitution. It is also preferable when two sub-ligands $L^2$ are the same and the third sub-ligand $L^2$ is the same or different, "the same" meaning that these also have the same substitution. More preferably, all sub-ligands $L^1$ are the same. More preferably, in addition, all sub-ligands $L^2$ are the same. Most preferably, all sub-ligands $L^1$ and $L^2$ are the same. This preference can be explained by the better synthetic accessibility of ligands and complexes.

In a further preferred embodiment of the invention, the coordinating atoms of the bidentate sub-ligands $L^1$ and $L^2$ are the same or different at each instance and are selected from C, N, P, O, S and/or B, more preferably C, N and/or O and most preferably C and/or N. The bidentate sub-ligands $L^1$ and $L^2$ preferably have one carbon atom and one nitrogen atom or two carbon atoms or two nitrogen atoms or two oxygen atoms or one oxygen atom and one nitrogen atom as coordinating atoms. In this case, the coordinating atoms of each of the sub-ligands $L^1$ or $L^2$ may be the same, or they may be different. Preferably, at least two of the bidentate sub-ligands $L^1$ and at least two of the bidentate sub-ligands $L^2$ have one carbon atom and one nitrogen atom or two carbon atoms as coordinating atoms, especially one carbon atom and one nitrogen atom. More preferably, at least all bidentate sub-ligands $L^1$ and $L^2$ have one carbon atom and one nitrogen atom or two carbon atoms as coordinating atoms, especially one carbon atom and one nitrogen atom. Particular preference is thus given to a metal complex in which all sub-ligands are ortho-metallated, i.e. form a metallacycle with the metal in which at least two metal-carbon bonds are present.

It is further preferable when the metallacycle which is formed from the metal and the bidentate sub-ligand $L^1$ or $L^2$ is a five-membered ring, which is preferable particularly when the coordinating atoms are C and N, N and N, or N and O. When the coordinating atoms are O, a six-membered metallacyclic ring may also be preferred. This is shown schematically hereinafter:

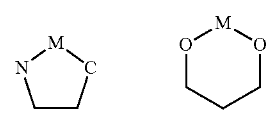

five-membered ring six-membered ring where N is a coordinating nitrogen atom, C is a coordinating carbon atom and O represents coordinating oxygen atoms, the carbon atoms shown are atoms of the bidentate sub-ligand L and M is iridium or rhodium.

In a preferred embodiment of the invention, at least one of the sub-ligands $L^1$ and at least one of the sub-ligands $L^2$, preferably at least two of the sub-ligands $L^1$ and at least two of the sub-ligands $L^2$ and more preferably all bidentate sub-ligands $L^1$ and $L^2$ are the same or different at each instance and are selected from the structures of the following formulae (L-1), (L-2) and (L-3):

Formula (L-1)

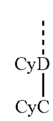

Formula (L-2)

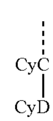

-continued

Formula (L-3)

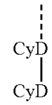

where the dotted bond represents the bond of the sub-ligand $L^1$ or $L^2$ to $X^3$ within the ligand of the formula (1) or the preferred embodiments, and the other symbols used are as follows:

CyC is the same or different at each instance and is a substituted or unsubstituted aryl or heteroaryl group which has 5 to 14 aromatic ring atoms and coordinates to M via a carbon atom and is bonded to CyD via a covalent bond;

CyD is the same or different at each instance and is a substituted or unsubstituted heteroaryl group which has 5 to 14 aromatic ring atoms and coordinates to M via a nitrogen atom or via a carbene carbon atom and is bonded to CyC via a covalent bond;

at the same time, two or more of the optional substituents together may form a ring system. The optional radicals are preferably selected from the abovementioned R radicals.

At the same time, CyD in the sub-ligands of the formulae (L-1) and (L-2) preferably coordinates via an uncharged nitrogen atom or via a carbene carbon atom, especially via an uncharged nitrogen atom. Further preferably, one of the two CyD groups in the ligand of the formula (L-3) coordinates via an uncharged nitrogen atom and the other of the two CyD groups via an anionic nitrogen atom. Further preferably, CyC in the sub-ligands of the formulae (L-1) and (L-2) coordinates via anionic carbon atoms.

When two or more of the substituents, especially two or more R radicals, together form a ring system, it is possible for a ring system to be formed from substituents bonded to directly adjacent carbon atoms. In addition, it is also possible that the substituents on CyC and CyD in the formulae (L-1) and (L-2) or the substituents on the two CyD groups in formula (L-3) together form a ring, as a result of which CyC and CyD or the two CyD groups may also together form a single fused aryl or heteroaryl group as bidentate ligand.

In a preferred embodiment of the present invention, CyC is an aryl or heteroaryl group having 6 to 13 aromatic ring atoms, more preferably having 6 to 10 aromatic ring atoms, most preferably having 6 aromatic ring atoms, especially a phenyl group, which coordinates to the metal via a carbon atom, which may be substituted by one or more R radicals and which is bonded to CyD via a covalent bond.

Preferred embodiments of the CyC group are the structures of the following formulae (CyC-1) to (CyC-20):

(CyC-1)

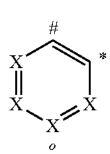

(CyC-2)

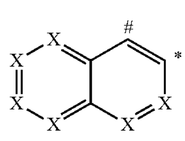

-continued (CyC-3)

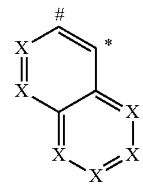

(CyC-4)

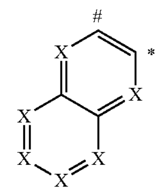

(CyC-5)

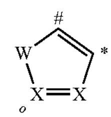

(CyC-6)

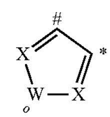

(CyC-7)

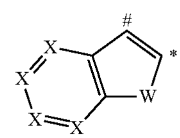

(CyC-8)

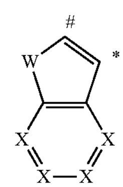

(CyC-9)

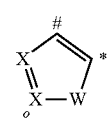

(CyC-10)

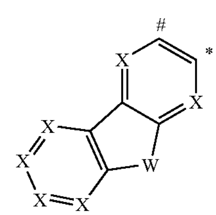

(CyC-11)

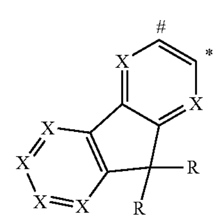

-continued (CyC-12)

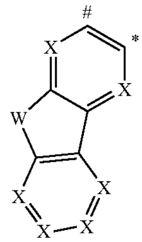

(CyC-13)

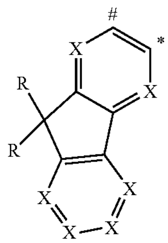

(CyC-14)

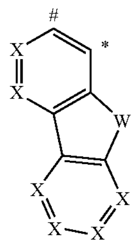

(CyC-15)

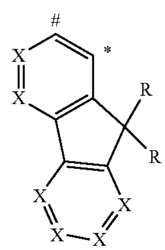

(CyC-16)

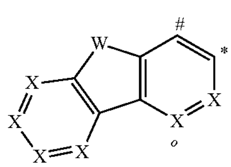

(CyC-17)

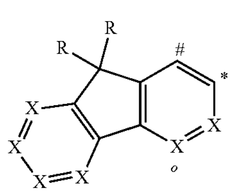

(CyC-18)

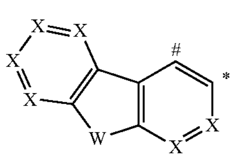

-continued (CyC-19)

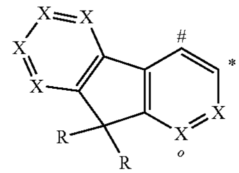

(CyC-20)

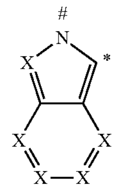

where CyC binds in each case to the position in CyD indicated by # and coordinates to the metal at the position indicated by *, R has the definitions given above and the further symbols used are as follows:

X is the same or different at each instance and is CR or N, with the proviso that not more than two symbols X per cycle are N;

W is NR, O or S;

with the proviso that, when the sub-ligand $L^1$ or $L^2$ is bonded via CyC to $X^3$, one symbol X is C and $X^3$ is bonded to this carbon atom. When the sub-ligand $L^1$ or $L^2$ is bonded via the CyC group to $X^3$, the bond is preferably via the position marked by "o" in the formulae depicted above, and so the symbol X marked by "o" in that case is preferably C. The above-depicted structures which do not contain any symbol X marked by "o" are preferably not bonded to $X^3$, since such a bond to the bridge is not advantageous for steric reasons.

Preferably, a total of not more than two symbols X in CyC are N, more preferably not more than one symbol X in CyC is N, and most preferably all symbols X are CR, with the proviso that, when CyC is bonded directly to $X^3$, one symbol X is C and $X^3$ is bonded to this carbon atom.

Particularly preferred CyC groups are the groups of the following formulae (CyC-1a) to (CyC-20a):

(CyC-1a)

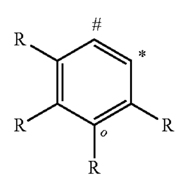

(CyC-1b)

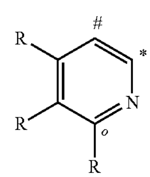

(CyC-1c)

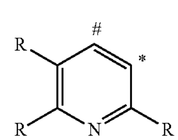

-continued
(CyC-1d)
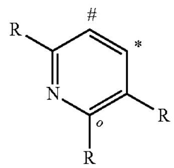
(CyC-1e)
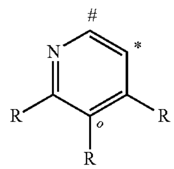
(CyC-1f)
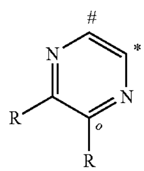
(CyC-1g)
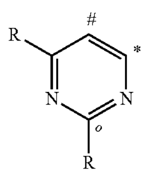
(CyC-1h)
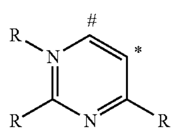
(CyC-2a)
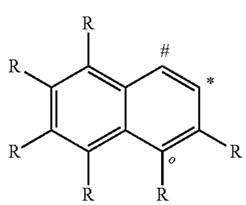
(CyC-2b)
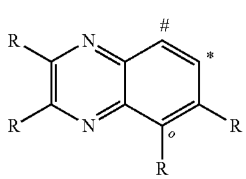
(CyC-3a)
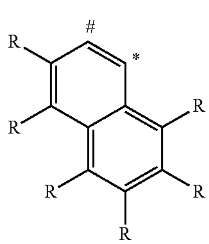
-continued
(CyC-3b)
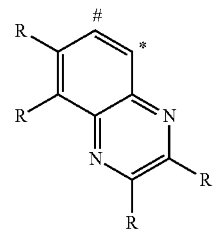
(CyC-4a)
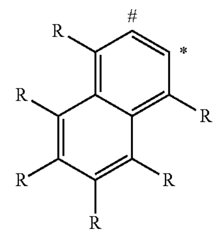
(CyC-4b)
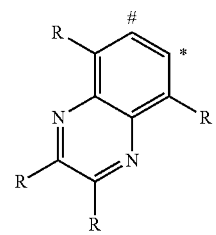
(CyC-5a)
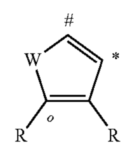
(CyC-6a)
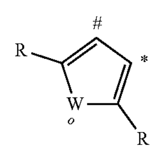
(CyC-7a)
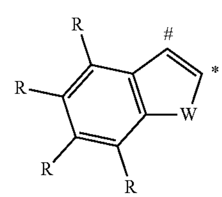
(CyC-8a)
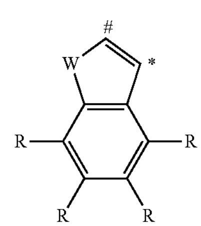
(CyC-9a)
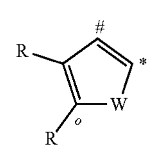

-continued (CyC-10a)

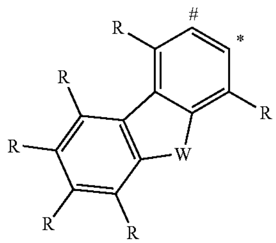

(CyC-11a)

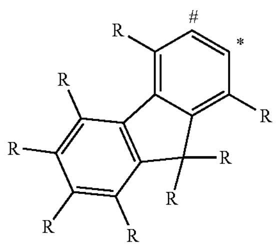

(CyC-12a)

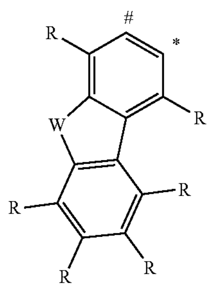

(CyC-13a)

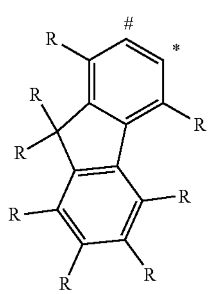

(CyC-14a)

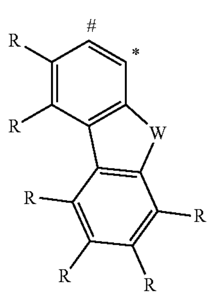

-continued (CyC-15a)

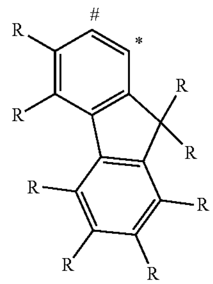

(CyC-16a)

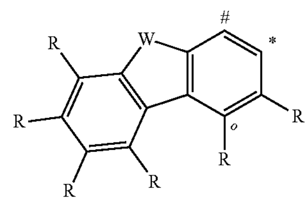

(CyC-17a)

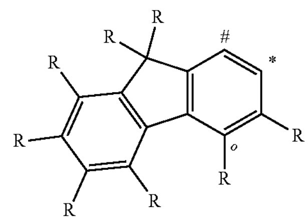

(CyC-18a)

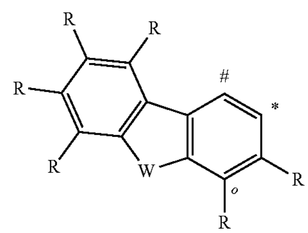

(CyC-19a)

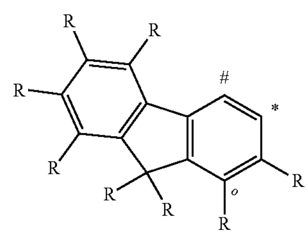

(CyC-20a)

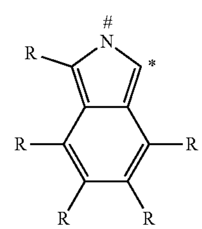

where the symbols have the definitions given above and, when CyC is bonded directly to $X^3$, one R radical is not present and $X^3$ is bonded to the corresponding carbon atom. When the CyC group is bonded directly to $X^3$, the bond is preferably via the position marked by "o" in the formulae depicted above, and so the R radical in this position in that case is preferably absent. The above-depicted structures which do not contain any carbon atom marked by "o" are preferably not bonded directly to $X^3$.

Preferred groups among the (CyC-1) to (CyC-20) groups are the (CyC-1), (CyC-3), (CyC-8), (CyC-10), (CyC-12), (CyC-13) and (CyC-16) groups, and particular preference is given to the (CyC-1a), (CyC-3a), (CyC-8a), (CyC-10a), (CyC-12a), (CyC-13a) and (CyC-16a) groups.

In a further preferred embodiment of the invention, CyD is a heteroaryl group having 5 to 13 aromatic ring atoms, more preferably having 6 to 10 aromatic ring atoms, which coordinates to the metal via an uncharged nitrogen atom or via a carbene carbon atom and which may be substituted by one or more R radicals and which is bonded via a covalent bond to CyC.

Preferred embodiments of the CyD group are the structures of the following formulae (CyD-1) to (CyD-14):

(CyD-1)

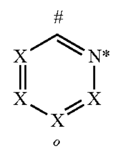

(CyD-2)

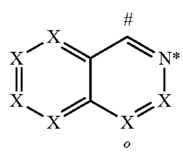

(CyD-3)

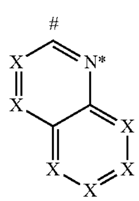

(CyD-4)

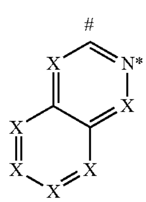

(CyD-5)

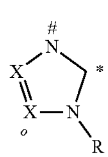

(CyD-6)

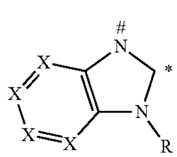

(CyD-7)

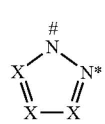

-continued (CyD-8)

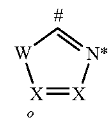

(CyD-9)

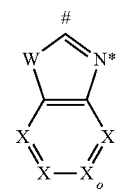

(CyD-10)

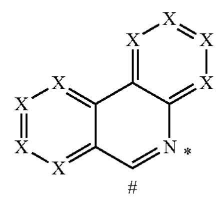

(CyD-11)

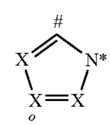

(CyD-12)

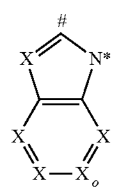

(CyD-13)

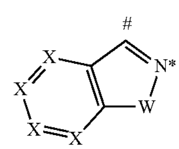

(CyD-14)

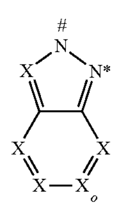

where the CyD group binds to CyC in each case at the position indicated by # and coordinates to the metal at the position indicated by *, and where X, W and R have the definitions given above, with the proviso that, when CyD is bonded directly to $X^3$, one symbol X is C and $X^3$ is bonded to this carbon atom. When the CyD group is bonded directly to $X^3$, the bond is preferably via the position marked by "o" in the formulae depicted above, and so the symbol X marked by "o" in that case is preferably C. The above-depicted structures which do not contain any symbol X marked by "o" are preferably not bonded directly to $X^3$, since such a bond to the bridge is not advantageous for steric reasons.

In this case, the (CyD-1) to (CyD-4), (CyD-7) to (CyD-10), (CyD-13) and (CyD-14) groups coordinate to the metal via an uncharged nitrogen atom, the (CyD-5) and (CyD-6)

groups via a carbene carbon atom and the (CyD-11) and (CyD-12) groups via an anionic nitrogen atom.

Preferably, a total of not more than two symbols X in CyD are N, more preferably not more than one symbol X in CyD is N, and especially preferably all symbols X are CR, with the proviso that, when CyD is bonded directly to $X^3$, one symbol X is C and $X^3$ is bonded to this carbon atom.

Particularly preferred CyD groups are the groups of the following formulae (CyD-1a) to (CyD-14b):

(CyD-1a)

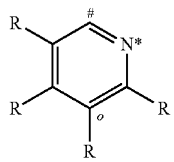

(CyD-2a)

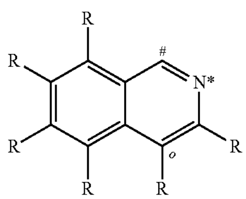

(CyD-3a)

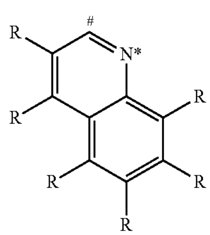

(CyD-3b)

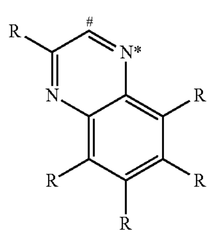

(CyD-4a)

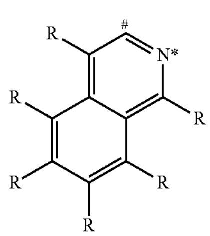

(CyD-5a)

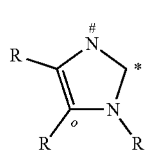

-continued (CyD-6a)

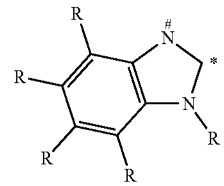

(CyD-7a)

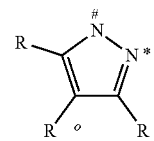

(CyD-8a)

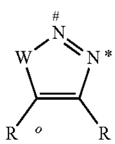

(CyD-9a)

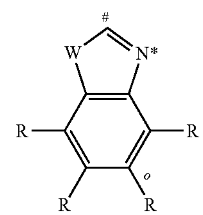

(CyD-10a)

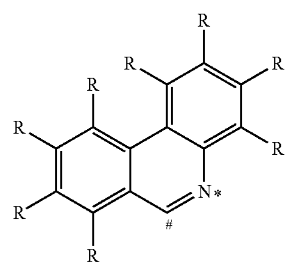

(CyD-11a)

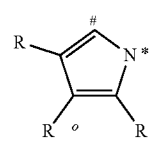

(CyD-11b)

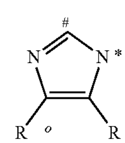

(CyD-11c)

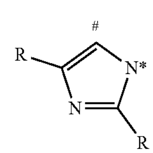

(CyD-11d)

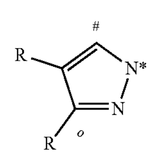

-continued (CyD-12a)

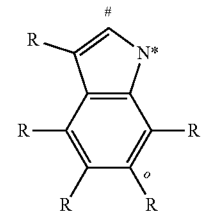

(CyD-12b)

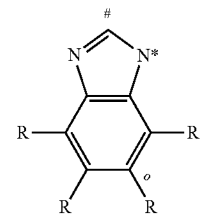

(CyD-13a)

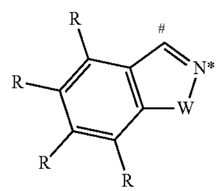

(CyD-14a)

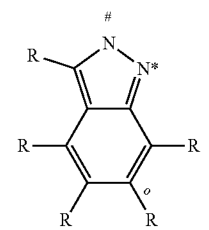

(CyD-14b)

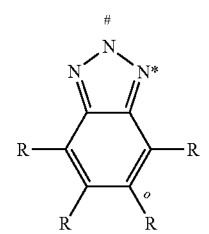

where the symbols used have the definitions given above and, when CyD is bonded directly to $X^3$, one R radical is not present and $X^3$ is bonded to the corresponding carbon atom. When CyD is bonded directly to $X^3$, the bond is preferably via the position marked by "o" in the formulae depicted above, and so the R radical in this position in that case is preferably absent. The above-depicted structures which do not contain any carbon atom marked by "o" are preferably not bonded directly to $X^3$.

Preferred groups among the (CyD-1) to (CyD-14) groups are the (CyD-1), (CyD-2), (CyD-3), (CyD-4), (CyD-5) and (CyD-6) groups, especially (CyD-1), (CyD-2) and (CyD-3), and particular preference is given to the (CyD-1a), (CyD-2a), (CyD-3a), (CyD-4a), (CyD-5a) and (CyD-6a) groups, especially (CyD-1a), (CyD-2a) and (CyD-3a).

In a preferred embodiment of the present invention, CyC is an aryl or heteroaryl group having 6 to 13 aromatic ring atoms, and at the same time CyD is a heteroaryl group having 5 to 13 aromatic ring atoms. More preferably, CyC is an aryl or heteroaryl group having 6 to 10 aromatic ring atoms, and at the same time CyD is a heteroaryl group having 5 to 10 aromatic ring atoms. Most preferably, CyC is an aryl or heteroaryl group having 6 aromatic ring atoms, especially phenyl, and CyD is a heteroaryl group having 6 to 10 aromatic ring atoms. At the same time, CyC and CyD may be substituted by one or more R radicals.

The abovementioned preferred (CyC-1) to (CyC-20) and (CyD-1) to (CyD-14) groups may be combined with one another as desired in the sub-ligands of the formulae (L-1) and (L-2), provided that at least one of the CyC or CyD groups has a suitable attachment site to $X^3$, suitable attachment sites being signified by "o" in the formulae given above. It is especially preferable when the CyC and CyD groups specified above as particularly preferred, i.e. the groups of the formulae (CyC-1a) to (CyC-20a) and the groups of the formulae (CyD1-a) to (CyD-14b), are combined with one another, provided that at least one of the preferred CyC or CyD groups has a suitable attachment site to $X^3$, suitable attachment sites being signified by "o" in the formulae given above. Combinations in which neither CyC nor CyD has such a suitable attachment site to $X^3$ are therefore not preferred.

It is very particularly preferable when one of the (CyC-1), (CyC-3), (CyC-8), (CyC-10), (CyC-12), (CyC-13) and (CyC-16) groups and especially the (CyC-1a), (CyC-3a), (CyC-8a), (CyC-10a), (CyC-12a), (CyC-13a) and (CyC-16a) groups is combined with one of the (CyD-1), (CyD-2) and (CyD-3) groups and especially with one of the (CyD-1a), (CyD-2a) and (CyD-3a) groups.

Preferred sub-ligands (L-1) are the structures of the following formulae (L-1-1) and (L-1-2), and preferred sub-ligands (L-2) are the structures of the following formulae (L-2-1) to (L-2-3):

(L-1-1)

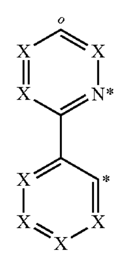

(L-1-2)

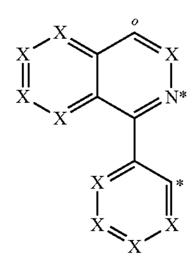

(L-2-1)

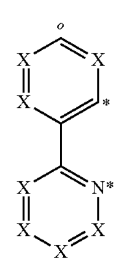

-continued (L-2-2)

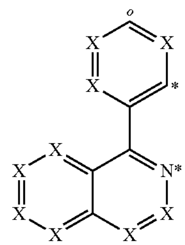

(L-2-3)

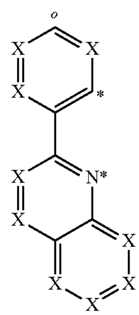

where the symbols used have the definitions given above, * indicates the position of the coordination to the metal and "o" represents the position of the bond to $X^3$.

Particularly preferred sub-ligands (L-1) are the structures of the following formulae (L-1-1a) and (L-1-2b), and particularly preferred sub-ligands (L-2) are the structures of the following formulae (L-2-1a) to (L-2-3a):

(L-1-1a)

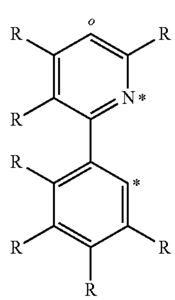

(L-1-2a)

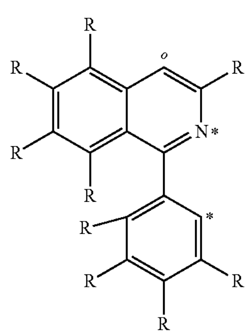

-continued (L-2-1a)

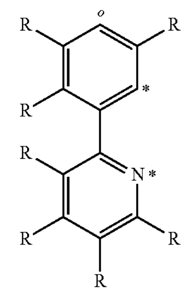

(L-2-2a)

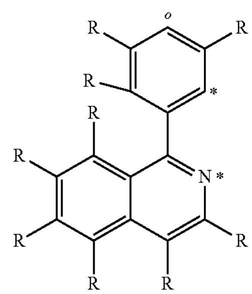

(L-2-3a)

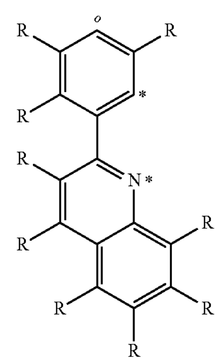

where the symbols used have the definitions given above and "o" represents the position of the bond to $X^3$.

It is likewise possible for the abovementioned preferred CyD groups in the sub-ligands of the formula (L-3) to be combined with one another as desired, by combining an uncharged CyD group, i.e. a (CyD-1) to (CyD-10), (CyD-13) or (CyD-14) group, with an anionic CyD group, i.e. a (CyD-11) or (CyD-12) group, provided that at least one of the preferred CyD groups has a suitable attachment site to $X^3$, suitable attachment sites being signified by "o" in the formulae given above.

When two R radicals, one of them bonded to CyC and the other to CyD in the formulae (L-1) and (L-2) or one of them bonded to one CyD group and the other to the other CyD group in formula (L-3), form an aromatic ring system with one another, this may result in bridged sub-ligands and also in sub-ligands which represent a single larger heteroaryl group overall, for example benzo[h]quinoline, etc. The ring formation between the substituents on CyC and CyD in the formulae (L-1) and (L-2) or between the substituents on the two CyD groups in formula (L-3) is preferably via a group according to one of the following formulae (4) to (13):

Formula (4)

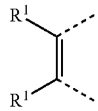

Formula (5)

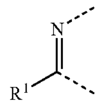

Formula (6)

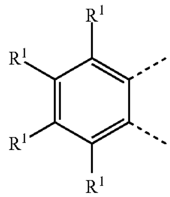

Formula (7)

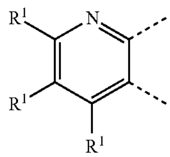

Formula (8)

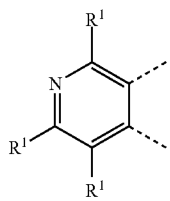

Formula (9)

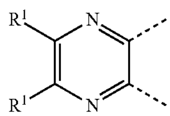

Formula (10)

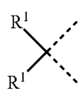

Formula (11)

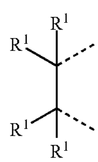

Formula (12)

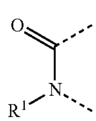

Formula (13)

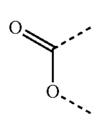

where $R^1$ has the definitions given above and the dotted bonds signify the bonds to CyC or CyD. At the same time, the unsymmetric groups among those mentioned above may be incorporated in each of the two possible orientations; for example, in the group of the formula (13), the oxygen atom may bind to the CyC group and the carbonyl group to the CyD group, or the oxygen atom may bind to the CyD group and the carbonyl group to the CyC group.

At the same time, the group of the formula (10) is preferred particularly when this results in ring formation to give a six-membered ring, as shown below, for example, by the formulae (L-22) and (L-23).

Preferred ligands which arise through ring formation between two R radicals in the different cycles are the structures of the formulae (L-4) to (L-31) shown below:

(L-4)

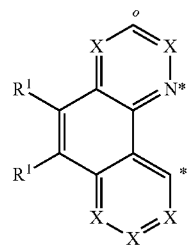

(L-5)

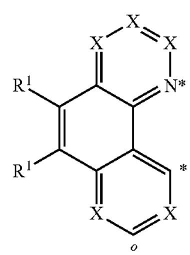

(L-6)

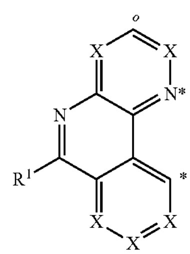

(L-7)

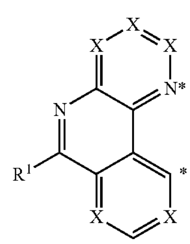

(L-8)

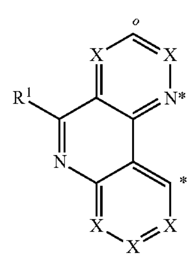

-continued
(L-9)
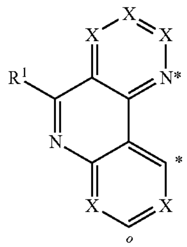
(L-10)
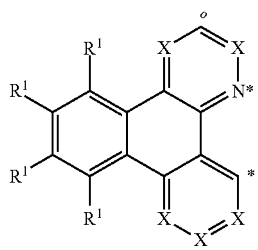
(L-11)
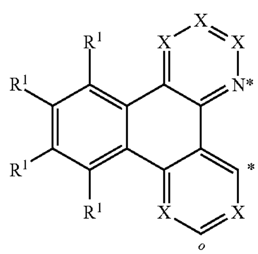
(L-12)
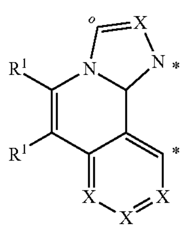
(L-13)
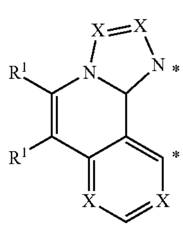
(L-14)
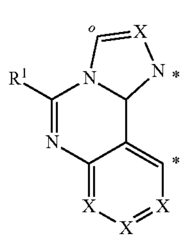
-continued
(L-15)
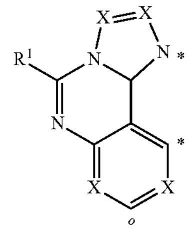
(L-16)
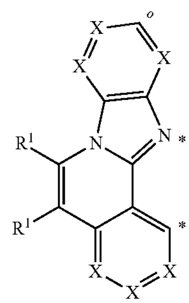
(L-17)
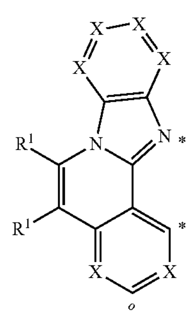
(L-18)
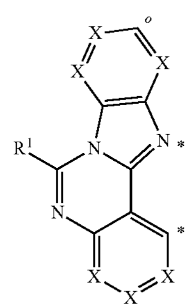
(L-19)
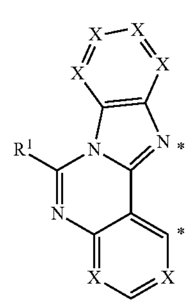

-continued
(L-20)
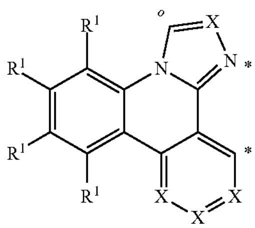
(L-21)
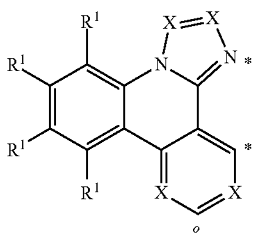
(L-22)
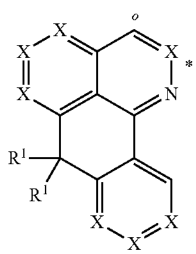
(L-23)
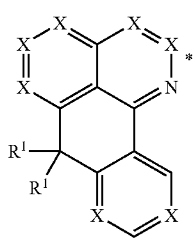
(L-24)
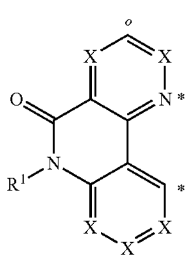
(L-25)
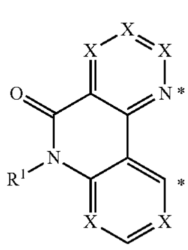
-continued
(L-26)
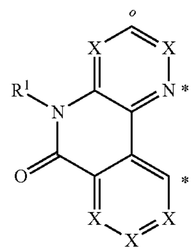
(L-27)
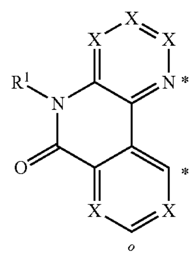
(L-28)
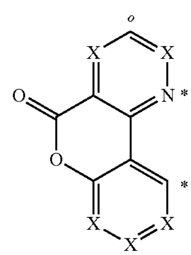
(L-29)
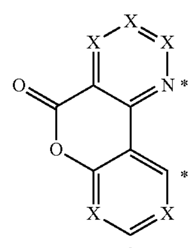
(L-30)
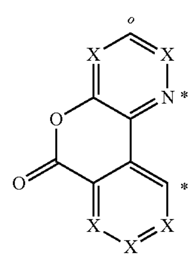
(L-31)
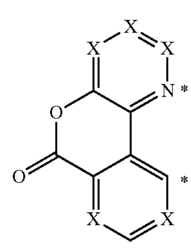

where the symbols used have the definitions given above and "o" indicates the position at which this sub-ligand is joined to $X^3$.

In a preferred embodiment of the sub-ligands of the formulae (L-4) to (L-31), a total of one symbol X is N and the other symbols X are CR, or all symbols X are CR.

In a further embodiment of the invention, it is preferable if, in the groups (CyC-1) to (CyC-20) or (CyD-1) to (CyD-14) or in the sub-ligands (L-1-1) to (L-2-3), (L-4) to (L-31), one of the atoms X is N when an R group bonded as a substituent adjacent to this nitrogen atom is not hydrogen or deuterium. This applies analogously to the preferred structures (CyC-1a) to (CyC-20a) or (CyD-1a) to (CyD-14b) in which a substituent bonded adjacent to a non-coordinating nitrogen atom is preferably an R group which is not hydrogen or deuterium. In this case, this substituent R is preferably a group selected from $CF_3$, $OR^1$ where $R^1$ is an alkyl group having 1 to 10 carbon atoms, alkyl groups having 1 to 10 carbon atoms, especially branched or cyclic alkyl groups having 3 to 10 carbon atoms, a dialkylamino group having 2 to 10 carbon atoms, aromatic or heteroaromatic ring systems or aralkyl or heteroaralkyl groups. These groups are sterically demanding groups. Further preferably, this R radical may also form a cycle with an adjacent R radical.

A further suitable bidentate sub-ligand is the sub-ligand of the following formula (L-32) or (L-33)

(L-32)

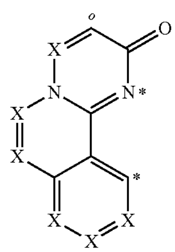

(L-33)

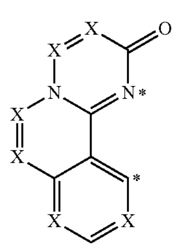

where R has the definitions given above, * represents the position of coordination to the metal, "o" represents the position of linkage of the sub-ligand to $X^3$ and the other symbols used are as follows:

X is the same or different at each instance and is CR or N, with the proviso that not more than one symbol X per cycle is N, and additionally with the proviso that one symbol X is C and the sub-ligand is bonded within the group of the formula (2) or (3) via this carbon atom.

When two R radicals bonded to adjacent carbon atoms in the sub-ligands (L-32) and (L-33) form an aromatic cycle with one another, this cycle together with the two adjacent carbon atoms is preferably a structure of the following formula (14):

Formula (14)

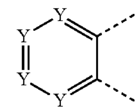

where the dotted bonds symbolize the linkage of this group within the sub-ligand and Y is the same or different at each instance and is $CR^1$ or N and preferably not more than one symbol Y is N. In a preferred embodiment of the sub-ligand (L-32) or (L-33), not more than one group of the formula (14) is present. In a preferred embodiment of the invention, in the sub-ligand of the formulae (L-32) and (L-33), a total of 0, 1 or 2 of the symbols X and, if present, Y are N. More preferably, a total of 0 or 1 of the symbols X and, if present, Y are N.

Further suitable bidentate sub-ligands are the structures of the following formulae (L-34) to (L-38), where preferably not more than one of the sub-ligands Land one of the sub-ligands $L^2$ is one of these structures, (L-34)

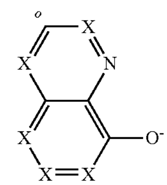

(L-35)

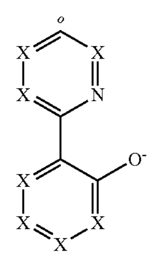

(L-36)

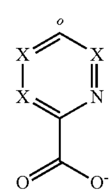

(L-37)

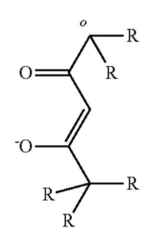

-continued (L-38)

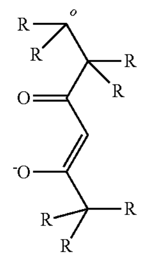

where the sub-ligands (L-34) to (L-36) each coordinate to the metal via the nitrogen atom explicitly shown and the negatively charged oxygen atom, and the sub-ligands (L-37) and (L-38) coordinate to the metal via the two oxygen atoms, X has the definitions given above and "o" indicates the position via which the sub-ligand $L^1$ or $L^2$ is joined to $X^3$.

The above-recited preferred embodiments of X are also preferred for the sub-ligands of the formulae (L-34) to (L-36).

Preferred sub-ligands of the formulae (L-34) to (L-36) are therefore the sub-ligands of the following formulae (L-34a) to (L-36a):

(L-34a)

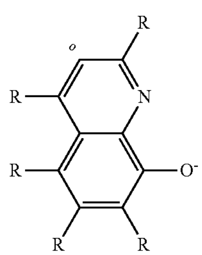

(L-35a)

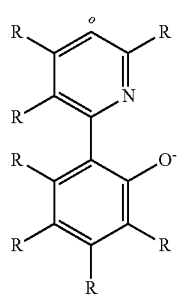

(L-36a)

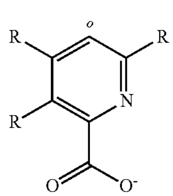

where the symbols used have the definitions given above and "o" indicates the position via which the sub-ligand $L^1$ or $L^2$ is joined to $X^3$.

More preferably, in these formulae, R is hydrogen, where "o" indicates the position via which the sub-ligand $L^1$ or $L^2$ is joined to $X^3$, and so the structures are those of the following formulae (L-34b) to (L-36b):

(L-34b)

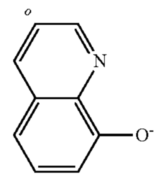

(L-34b)

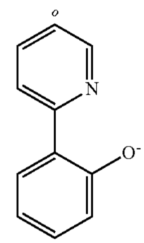

(L-34b)

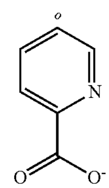

where the symbols used have the definitions given above.

There follows a description of preferred substituents as may be present on the above-described sub-ligands.

In a preferred embodiment of the invention, the compound of the invention contains two substituents R which are bonded to adjacent carbon atoms and together form an aliphatic ring according to one of the formulae described hereinafter. In this case, the two R substituents which form this aliphatic ring may be present on the basic structure of the ligand of the formula (1) or the preferred embodiments and/or on one or more of the bidentate sub-ligands $L^1$ and/or $L^2$. The aliphatic ring which is formed by the ring formation by two substituents R together is preferably described by one of the following formulae (15) to (21):

Formula (15)

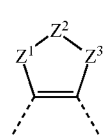

Formula (16)

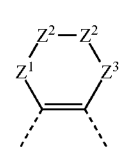

Formula (17)

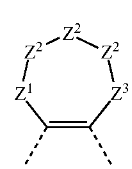

-continued

Formula (18)

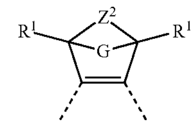

Formula (19)

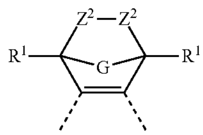

Formula (20)

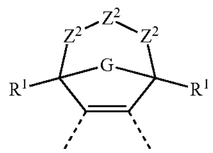

Formula (21)

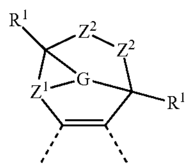

where $R^1$ and $R^2$ have the definitions given above, the dotted bonds signify the linkage of the two carbon atoms in the ligand and, in addition:

$Z^1$, $Z^3$ is the same or different at each instance and is $C(R^3)_2$, O, S, $NR^3$ or C(═O);

$Z^2$ is $C(R^1)_2$, O, S, $NR^3$ or C(═O);

G is an alkylene group which has 1, 2 or 3 carbon atoms and may be substituted by one or more $R^2$ radicals, —$CR^2$═$CR^2$— or an ortho-bonded arylene or heteroarylene group which has 5 to 14 aromatic ring atoms and may be substituted by one or more $R^2$ radicals;

$R^3$ is the same or different at each instance and is H, F, a straight-chain alkyl or alkoxy group having 1 to 10 carbon atoms, a branched or cyclic alkyl or alkoxy group having 3 to 10 carbon atoms, where the alkyl or alkoxy group may be substituted in each case by one or more $R^2$ radicals, where one or more nonadjacent $CH_2$ groups may be replaced by $R^2C$═$CR^2$, C≡C, $Si(R^2)_2$, C═O, $NR^2$, O, S or $CONR^2$, or an aromatic or heteroaromatic ring system which has 5 to 24 aromatic ring atoms and may be substituted in each case by one or more $R^2$ radicals, or an aryloxy or heteroaryloxy group which has 5 to 24 aromatic ring atoms and may be substituted by one or more $R^2$ radicals; at the same time, two $R^3$ radicals bonded to the same carbon atom together may form an aliphatic or aromatic ring system and thus form a spiro system; in addition, $R^3$ with an adjacent R or $R^1$ radical may form an aliphatic ring system;

with the proviso that no two heteroatoms in these groups are bonded directly to one another and no two C═O groups are bonded directly to one another.

In a preferred embodiment of the invention, $R^3$ is not H.

In the above-depicted structures of the formulae (15) to (21) and the further embodiments of these structures specified as preferred, a double bond is depicted in a formal sense between the two carbon atoms. This is a simplification of the chemical structure when these two carbon atoms are incorporated into an aromatic or heteroaromatic system and hence the bond between these two carbon atoms is formally between the bonding level of a single bond and that of a double bond. The drawing of the formal double bond should thus not be interpreted so as to limit the structure; instead, it will be apparent to the person skilled in the art that this is an aromatic bond.

When adjacent radicals in the structures of the invention form an aliphatic ring system, it is preferable when the latter does not have any acidic benzylic protons. Benzylic protons are understood to mean protons which bind to a carbon atom bonded directly to the ligand. This can be achieved by virtue of the carbon atoms in the aliphatic ring system which bind directly to an aryl or heteroaryl group being fully substituted and not containing any bonded hydrogen atoms. Thus, the absence of acidic benzylic protons in the formulae (15) to (17) is achieved by virtue of $Z^1$ and $Z^3$, when they are $C(R^3)_2$, being defined such that $R^3$ is not hydrogen. This can additionally also be achieved by virtue of the carbon atoms in the aliphatic ring system which bind directly to an aryl or heteroaryl group being the bridgeheads in a bi- or polycyclic structure. The protons bonded to bridgehead carbon atoms, because of the spatial structure of the bi- or polycycle, are significantly less acidic than benzylic protons on carbon atoms which are not bonded within a bi- or polycyclic structure, and are regarded as non-acidic protons in the context of the present invention. Thus, the absence of acidic benzylic protons in formulae (18) to (21) is achieved by virtue of this being a bicyclic structure, as a result of which $R^1$, when it is H, is much less acidic than benzylic protons since the corresponding anion of the bicyclic structure is not mesomerically stabilized. Even when $R^1$ in formulae (18) to (21) is H, this is therefore a non-acidic proton in the context of the present application.

In a preferred embodiment of the structure of the formulae (15) to (21), not more than one of the $Z^1$, $Z^2$ and $Z^3$ groups is a heteroatom, especially O or $NR^3$, and the other groups are $C(R^3)_2$ or $C(R^1)_2$, or $Z^1$ and $Z^3$ are the same or different at each instance and are O or $NR^3$ and $Z^2$ is $C(R^1)_2$. In a particularly preferred embodiment of the invention, $Z^1$ and $Z^3$ are the same or different at each instance and are $C(R^3)_2$, and $Z^2$ is $C(R^1)_2$ and more preferably $C(R^3)_2$ or $CH_2$.

Preferred embodiments of the formula (15) are thus the structures of the formulae (15-A), (15-B), (15-C) and (15-D), and a particularly preferred embodiment of the formula (15-A) is the structures of the formulae (15-E) and (15-F):

Formula (15-A)

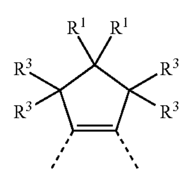

Formula (15-B)

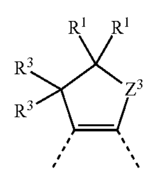

Formula (15-C)

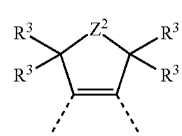

-continued

Formula (15-D)

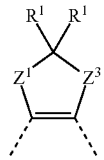

Formula (15-E)

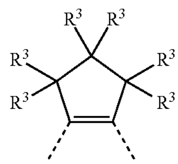

Formula (15-F)

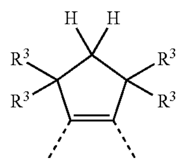

where $R^1$ and $R^3$ have the definitions given above and $Z^1$, $Z^2$ and $Z^3$ are the same or different at each instance and are O or $NR^3$.

Preferred embodiments of the formula (16) are the structures of the following formulae (16-A) to (16-F):

Formula (16-A)

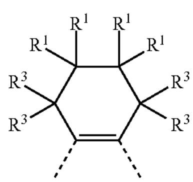

Formula (16-B)

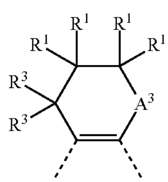

Formula (16-C)

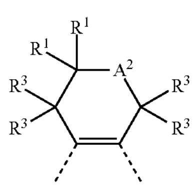

Formula (16-D)

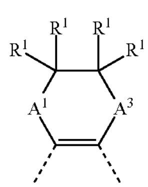

Formula (16-E)

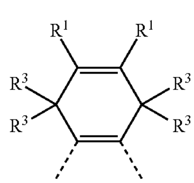

-continued

Formula (16-F)

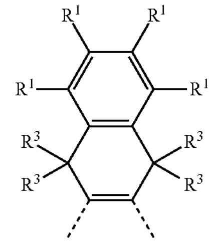

where $R^1$ and $R^3$ have the definitions given above and $Z^1$, $Z^2$ and $Z^3$ are the same or different at each instance and are O or $NR^3$.

Preferred embodiments of the formula (17) are the structures of the following formulae (17-A) to (17-E):

Formula (17-A)

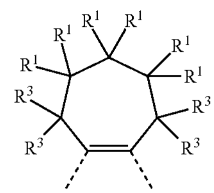

Formula (17-B)

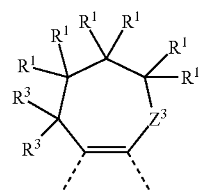

Formula (17-C)

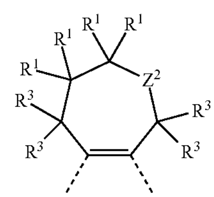

Formula (17-D)

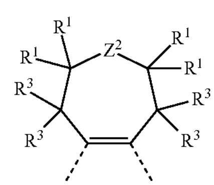

Formula (17-E)

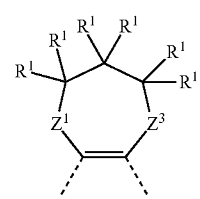

where $R^1$ and $R^3$ have the definitions given above and $Z^1$, $Z^2$ and $Z^3$ are the same or different at each instance and are O or $NR^3$.

In a preferred embodiment of the structure of formula (18), the $R^1$ radicals bonded to the bridgehead are H, D, F or $CH_3$. Further preferably, $Z^2$ is $C(R^1)_2$ or O, and more preferably $C(R^3)_2$. Preferred embodiments of the formula (18) are thus structures of the formulae (18-A) and (18-B), and a particularly preferred embodiment of the formula (18-A) is a structure of the formula (18-C):

Formula (18-A)

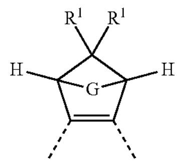

Formula (18-B)

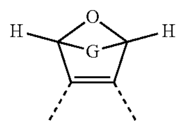

Formula (18-C)

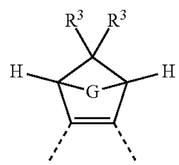

where the symbols used have the definitions given above.

In a preferred embodiment of the structure of formulae (19), (20) and (21), the $R^1$ radicals bonded to the bridgehead are H, D, F or $CH_3$. Further preferably, $Z^2$ is $C(R^1)_2$. Preferred embodiments of the formulae (19), (20) and (21) are thus the structures of the formulae (19-A), (20-A) and (21-A):

Formula (19-A)

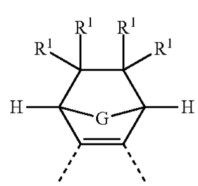

Formula (20-A)

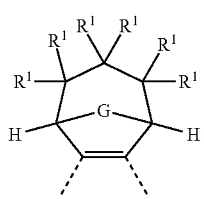

Formula (21-A)

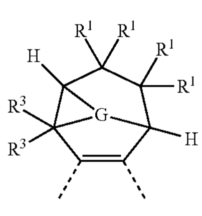

where the symbols used have the definitions given above.

Further preferably, the G group in the formulae (18), (18-A), (18-B), (18-C), (19), (19-A), (20), (20-A), (21) and (21-A) is a 1,2-ethylene group which may be substituted by one or more $R^2$ radicals, where $R^2$ is preferably the same or different at each instance and is H or an alkyl group having 1 to 4 carbon atoms, or an ortho-arylene group which has 6 to 10 carbon atoms and may be substituted by one or more $R^2$ radicals, but is preferably unsubstituted, especially an ortho-phenylene group which may be substituted by one or more $R^2$ radicals, but is preferably unsubstituted.

In a further preferred embodiment of the invention, $R^3$ in the groups of the formulae (15) to (21) and in the preferred embodiments is the same or different at each instance and is F, a straight-chain alkyl group having 1 to 10 carbon atoms or a branched or cyclic alkyl group having 3 to 20 carbon atoms, where one or more nonadjacent $CH_2$ groups in each case may be replaced by $R^2C{=}CR^2$ and one or more hydrogen atoms may be replaced by D or F, or an aromatic or heteroaromatic ring system which has 5 to 14 aromatic ring atoms and may be substituted in each case by one or more $R^2$ radicals; at the same time, two $R^3$ radicals bonded to the same carbon atom may together form an aliphatic or aromatic ring system and thus form a spiro system; in addition, $R^3$ may form an aliphatic ring system with an adjacent R or $R^1$ radical.

In a particularly preferred embodiment of the invention, $R^3$ in the groups of the formulae (15) to (21) and in the preferred embodiments is the same or different at each instance and is F, a straight-chain alkyl group having 1 to 3 carbon atoms, especially methyl, or an aromatic or heteroaromatic ring system which has 5 to 12 aromatic ring atoms and may be substituted in each case by one or more $R^2$ radicals, but is preferably unsubstituted; at the same time, two $R^3$ radicals bonded to the same carbon atom may together form an aliphatic or aromatic ring system and thus form a spiro system; in addition, $R^3$ may form an aliphatic ring system with an adjacent R or $R^1$ radical.

Examples of particularly suitable groups of the formula (15) are the groups depicted below:

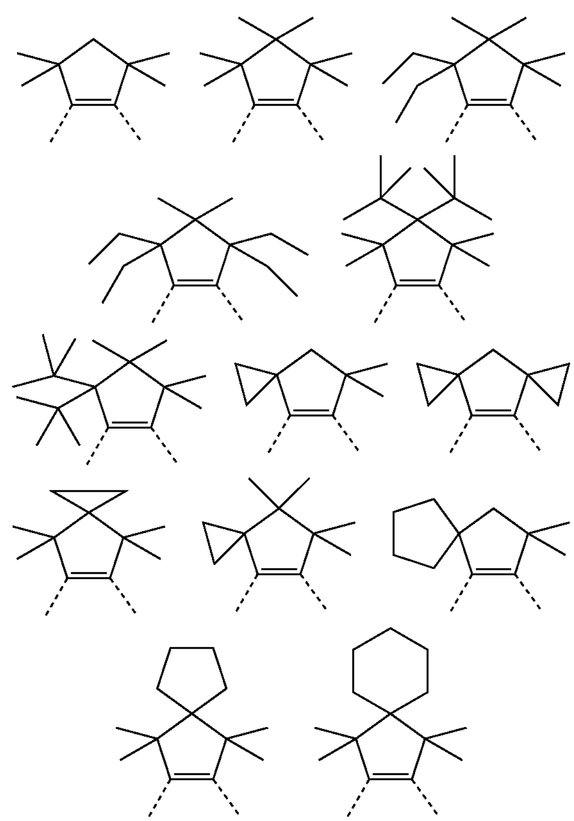

-continued
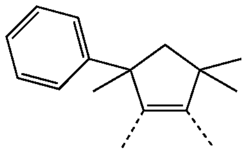
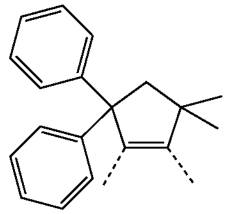
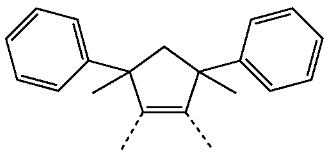
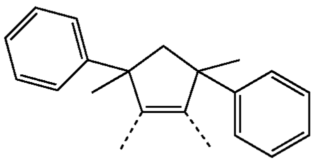
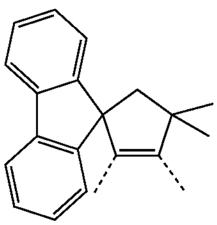
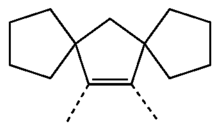
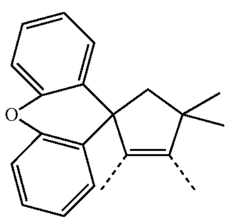
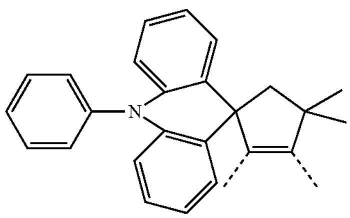
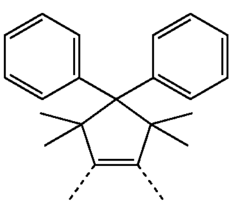
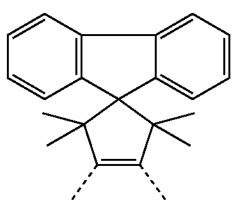
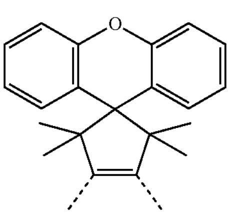
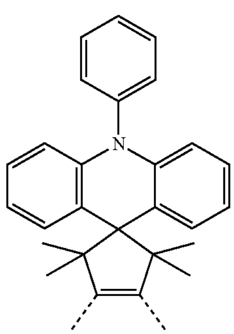
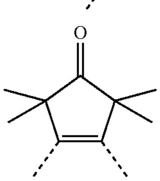
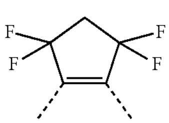
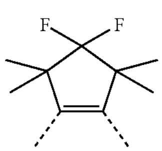
-continued
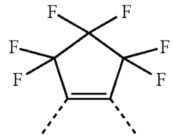
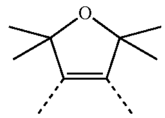
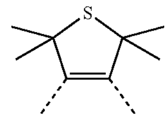
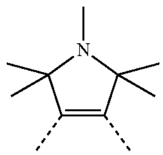
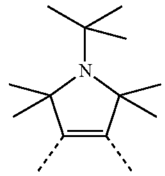
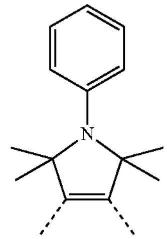
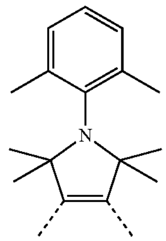
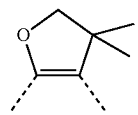
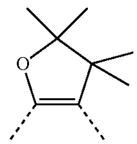
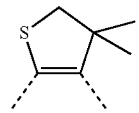
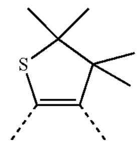
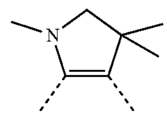
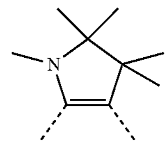
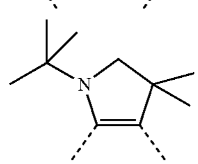
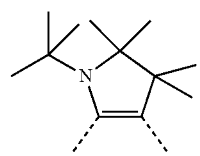
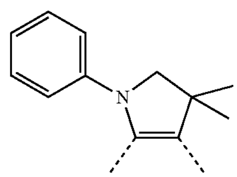
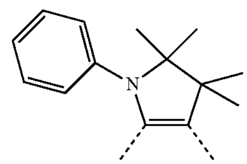
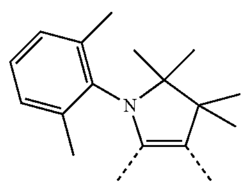
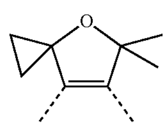
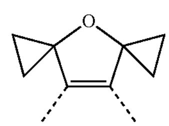
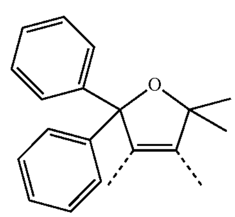
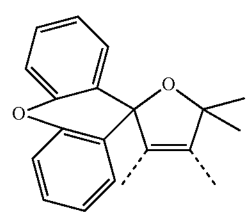
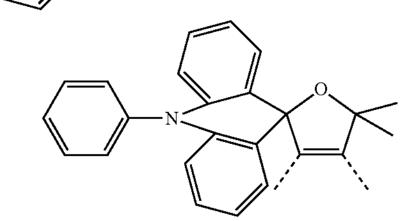

-continued
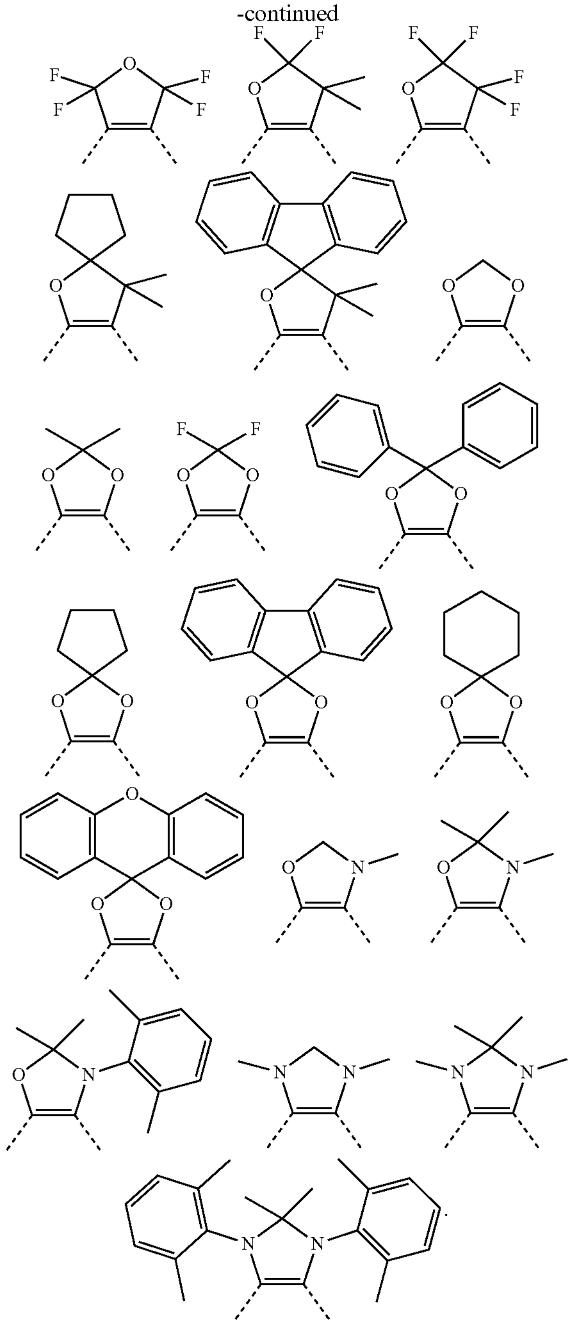
Examples of particularly suitable groups of the formula (16) are the groups depicted below:
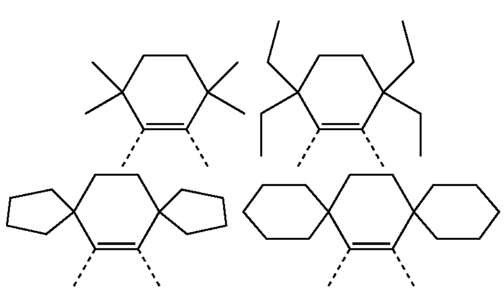
-continued
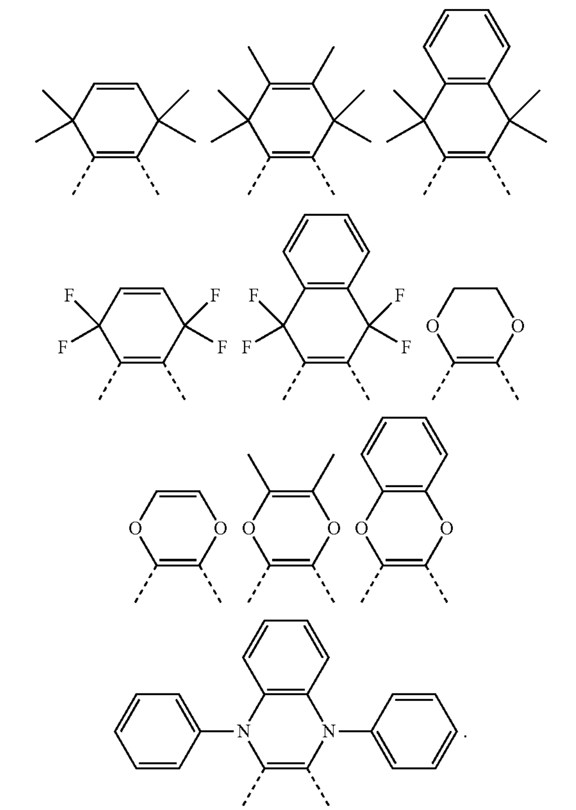
Examples of particularly suitable groups of the formulae (17), (20) and (21) are the groups depicted below:
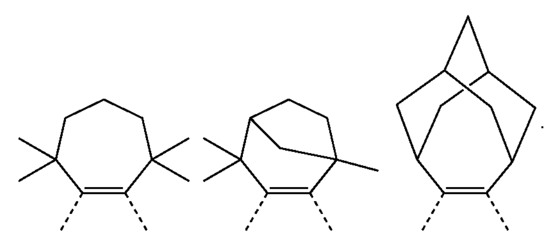
Examples of particularly suitable groups of the formula (18) are the groups depicted below:
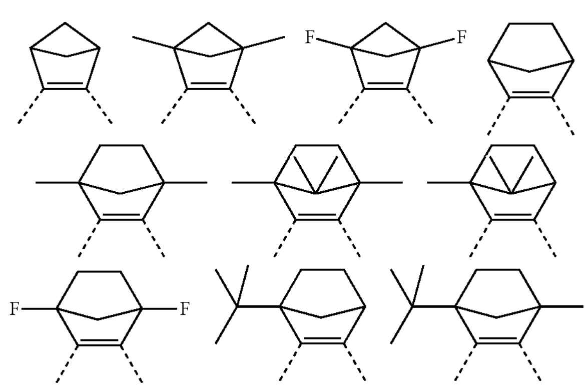

-continued

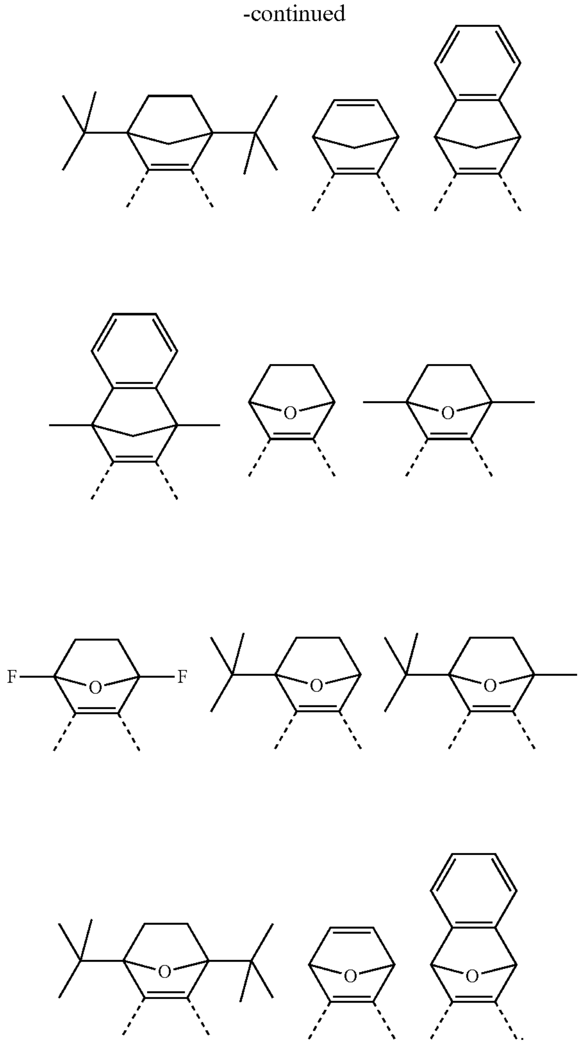

Examples of particularly suitable groups of the formula (19) are the groups depicted below:

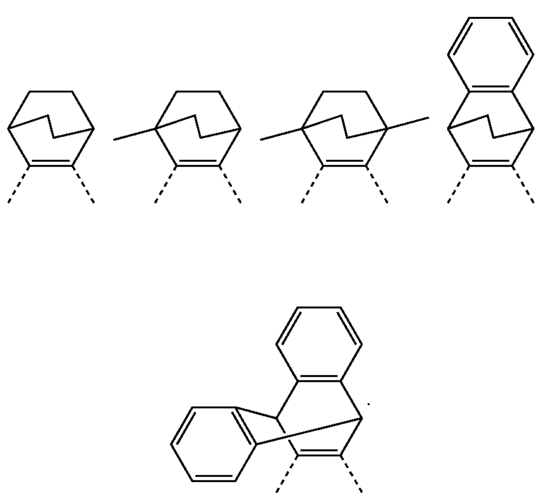

When R radicals are bonded within the bidentate sub-ligands, these R radicals are the same or different at each instance and are preferably selected from the group consisting of H, D, F, Br, I, $N(R^1)_2$, CN, $Si(R^1)_3$, $B(OR^1)_2$, $C(=O)R^1$, a straight-chain alkyl group having 1 to 10 carbon atoms or an alkenyl group having 2 to 10 carbon atoms or a branched or cyclic alkyl group having 3 to 10 carbon atoms, where the alkyl or alkenyl group may be substituted in each case by one or more $R^1$ radicals, or an aromatic or heteroaromatic ring system which has 5 to 30 aromatic ring atoms and may be substituted in each case by one or more $R^1$ radicals; at the same time, two adjacent R radicals together or R together with $R^1$ may also form a mono- or polycyclic, aliphatic or aromatic ring system. More preferably, these R radicals are the same or different at each instance and are selected from the group consisting of H, D, F, $N(R^1)_2$, a straight-chain alkyl group having 1 to 6 carbon atoms or a branched or cyclic alkyl group having 3 to 10 carbon atoms, where one or more hydrogen atoms may be replaced by D or F, or an aromatic or heteroaromatic ring system which has 5 to 24 aromatic ring atoms and may be substituted in each case by one or more $R^1$ radicals; at the same time, two adjacent R radicals together or R together with $R^1$ may also form a mono- or polycyclic, aliphatic or aromatic ring system.

Preferred $R^1$ radicals bonded to R are the same or different at each instance and are H, D, F, $N(R^2)_2$, CN, a straight-chain alkyl group having 1 to 10 carbon atoms or an alkenyl group having 2 to 10 carbon atoms or a branched or cyclic alkyl group having 3 to 10 carbon atoms, where the alkyl group may be substituted in each case by one or more $R^2$ radicals, or an aromatic or heteroaromatic ring system which has 5 to 24 aromatic ring atoms and may be substituted in each case by one or more $R^2$ radicals; at the same time, two or more adjacent $R^1$ radicals together may form a mono- or polycyclic aliphatic ring system. Particularly preferred $R^1$ radicals bonded to R are the same or different at each instance and are H, F, CN, a straight-chain alkyl group having 1 to 5 carbon atoms or a branched or cyclic alkyl group having 3 to 5 carbon atoms, each of which may be substituted by one or more $R^2$ radicals, or an aromatic or heteroaromatic ring system which has 5 to 13 aromatic ring atoms and may be substituted in each case by one or more $R^2$ radicals; at the same time, two or more adjacent $R^1$ radicals together may form a mono- or polycyclic aliphatic ring system.

Preferred $R^2$ radicals are the same or different at each instance and are H, F or an aliphatic hydrocarbyl radical having 1 to 5 carbon atoms or an aromatic hydrocarbyl radical having 6 to 12 carbon atoms; at the same time, two or more $R^2$ substituents together may also form a mono- or polycyclic aliphatic ring system.

The abovementioned preferred embodiments can be combined with one another as desired. In a particularly preferred embodiment of the invention, the abovementioned preferred embodiments apply simultaneously.

Examples of suitable compounds of the invention are the structures 1 to 32 adduced in the table below. The dotted bond to the central 1,3,5-substituted phenyl group in each case indicates the bond of the further ligands.

-continued
1
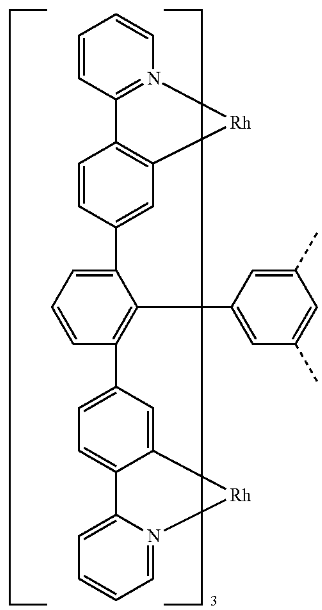
3
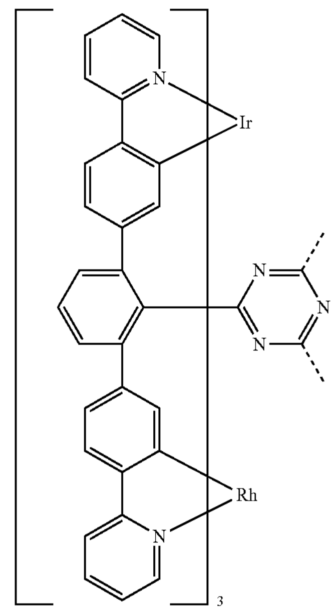
2
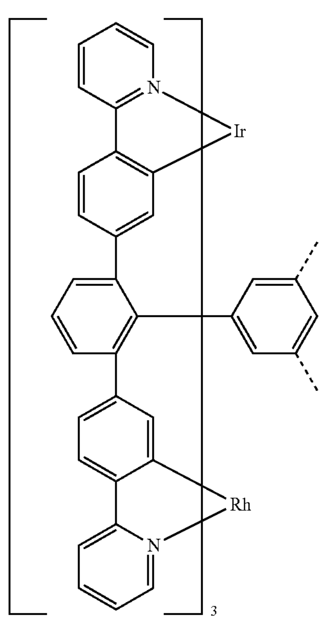
4
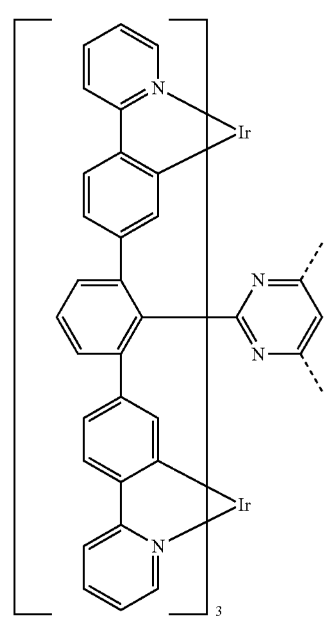

5
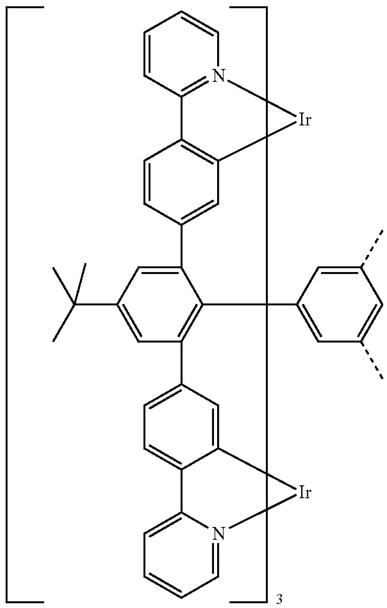
7
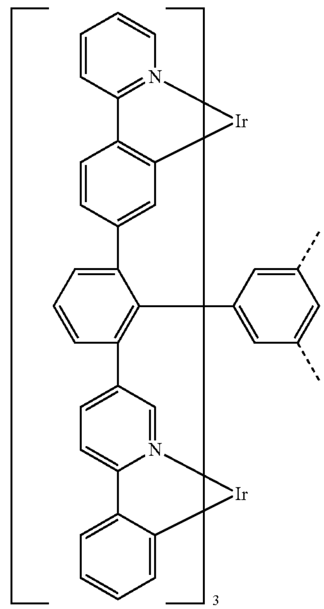
6
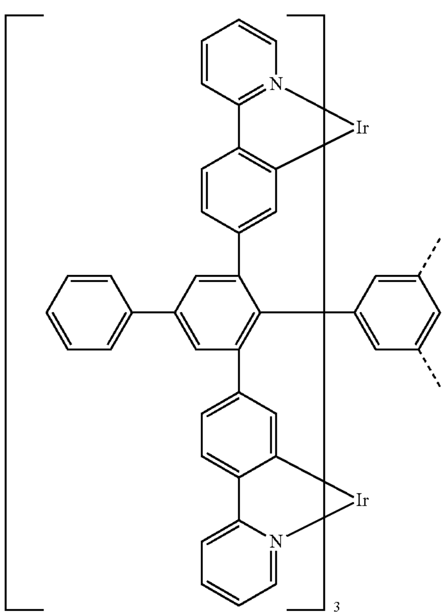
8
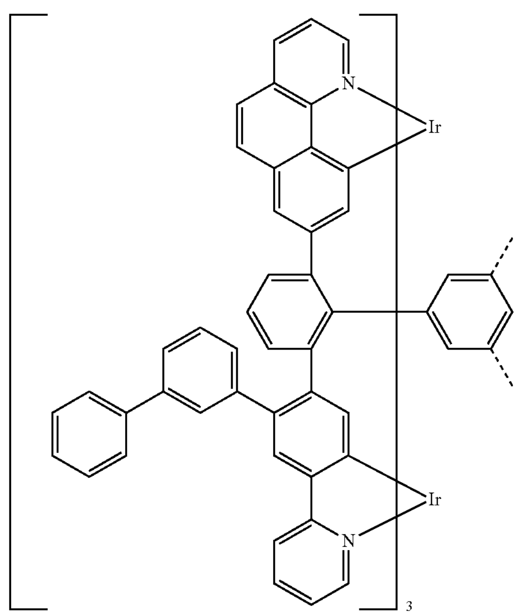

-continued
9
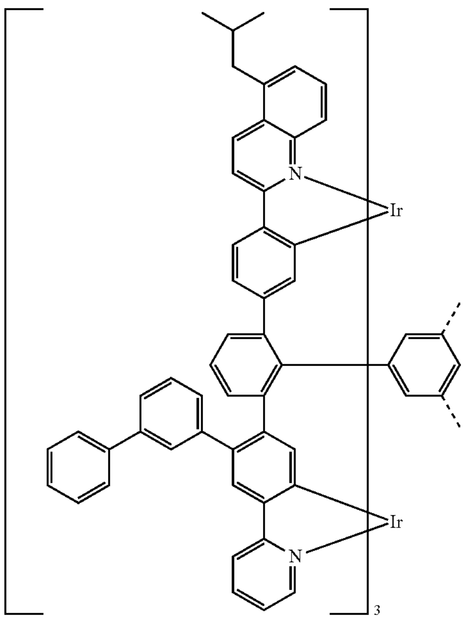
11
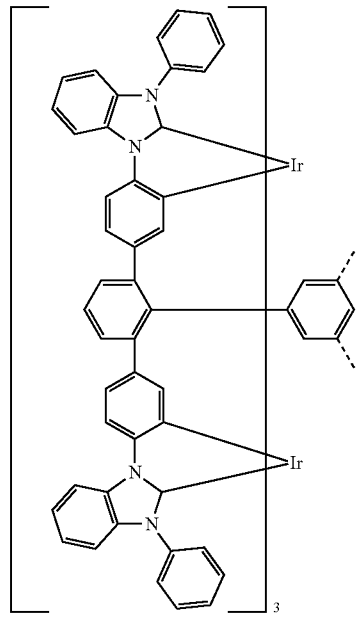
10
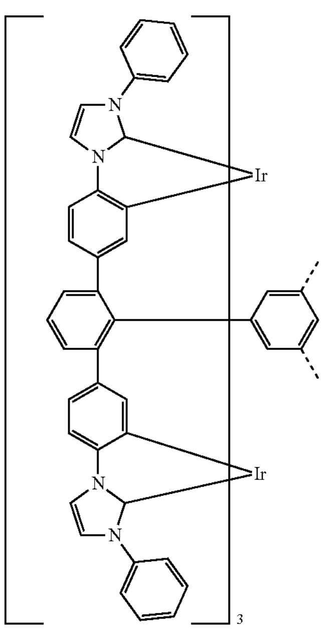
12
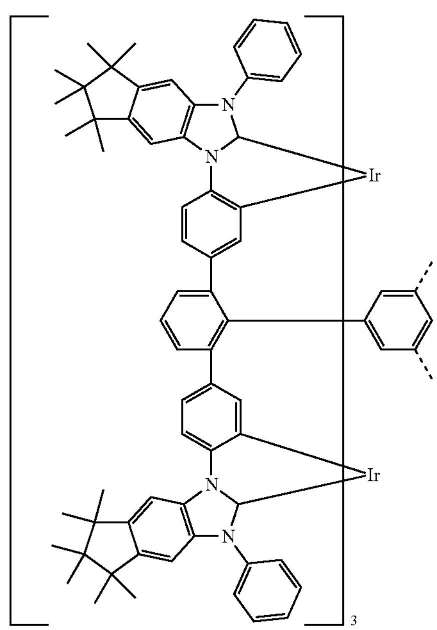

13
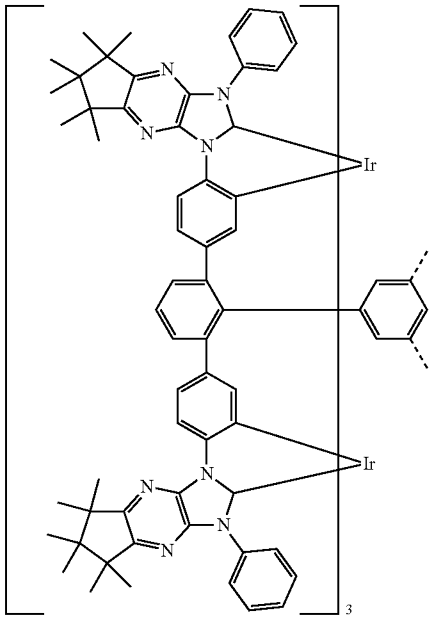
14
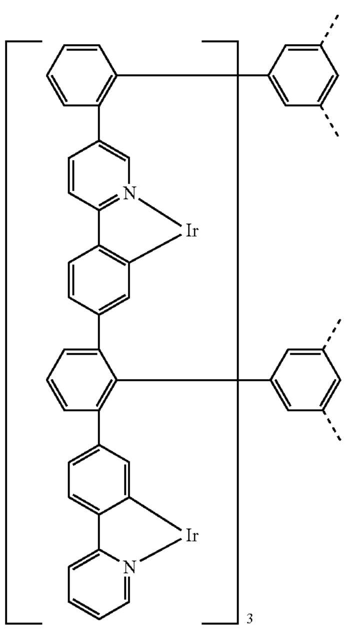
15
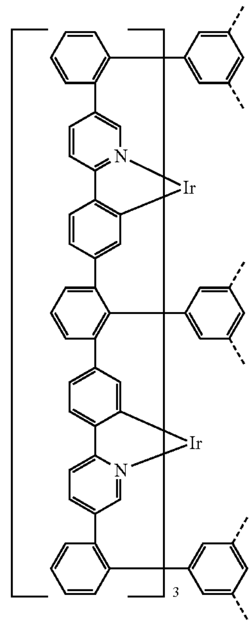
16
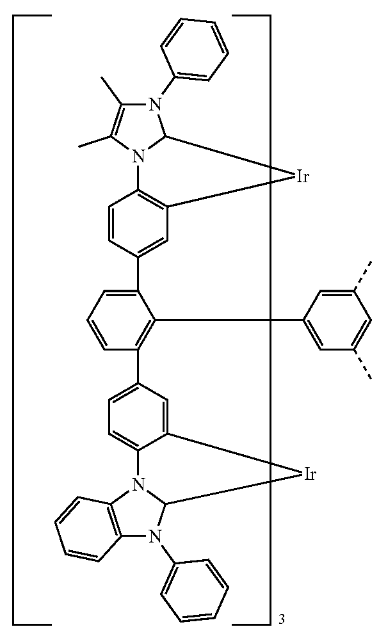

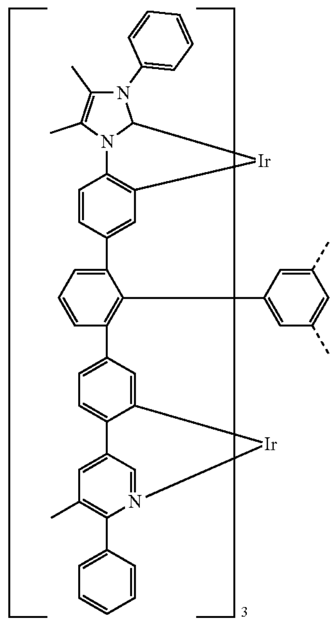
17
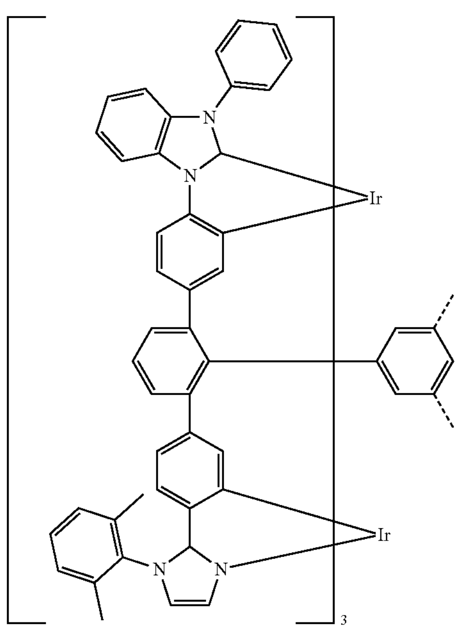
18
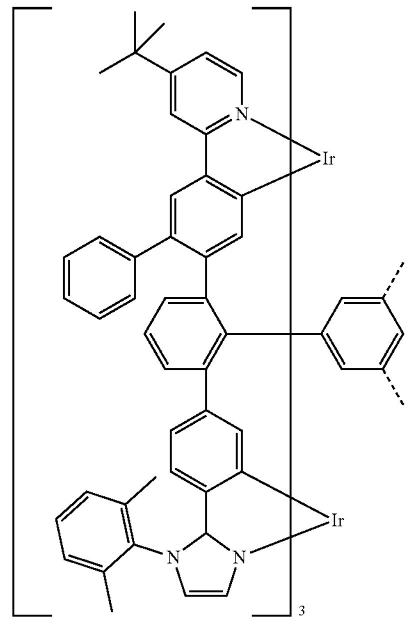
19
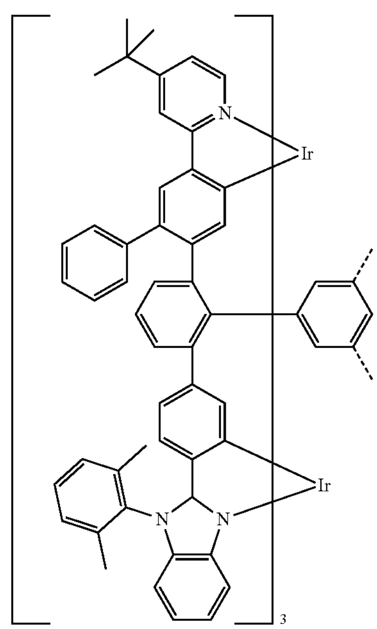
20

-continued
21
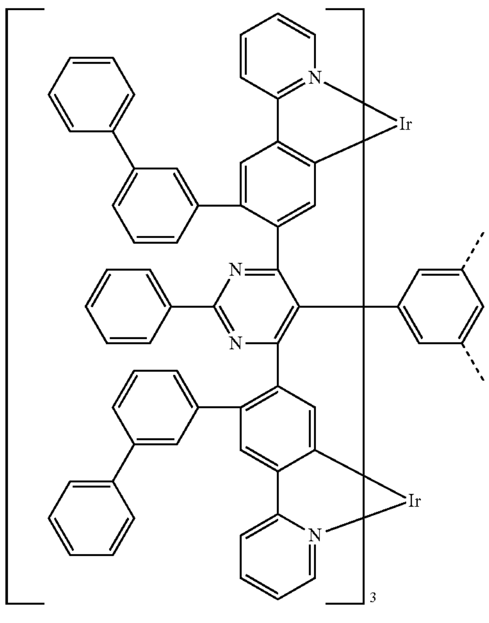
22
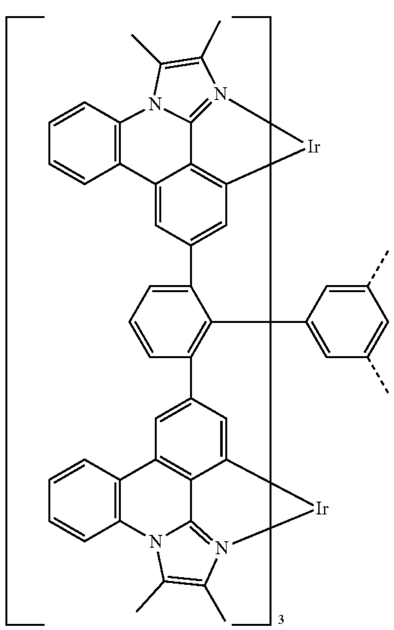
-continued
23
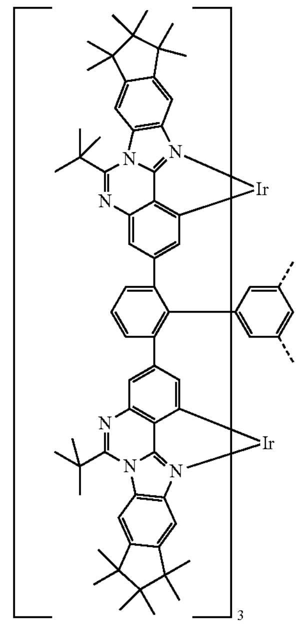
24
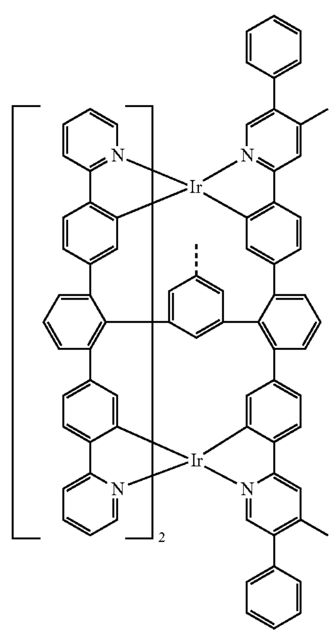

25
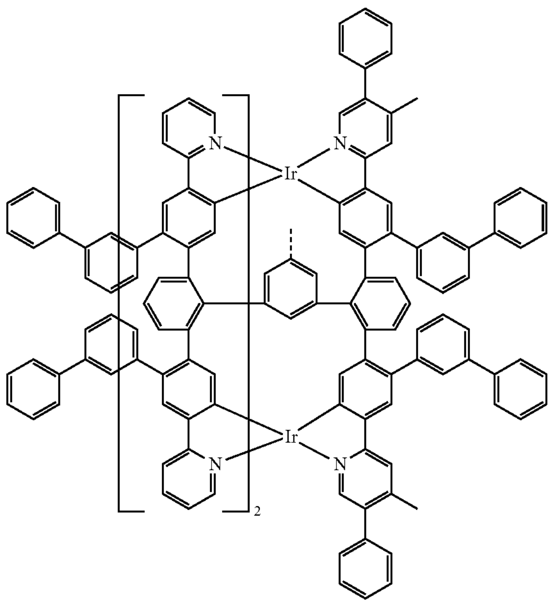
26
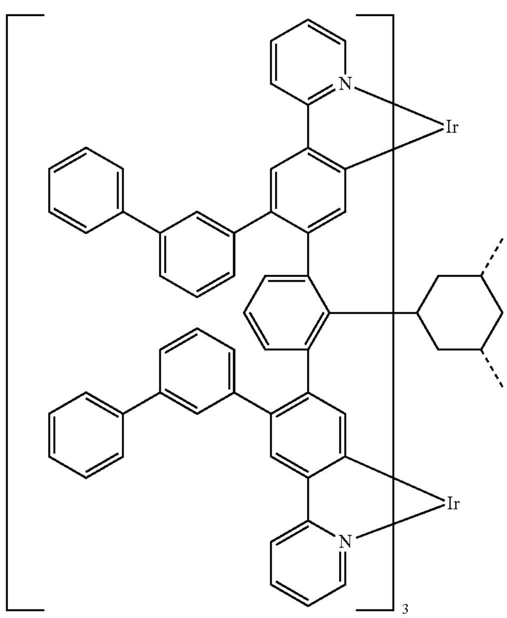
27
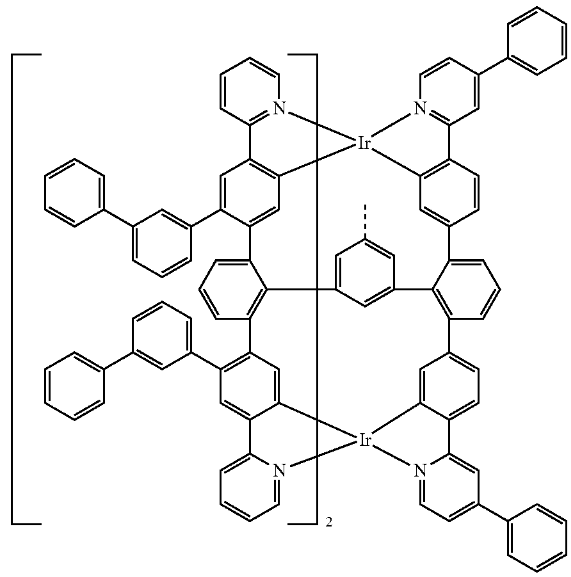
28
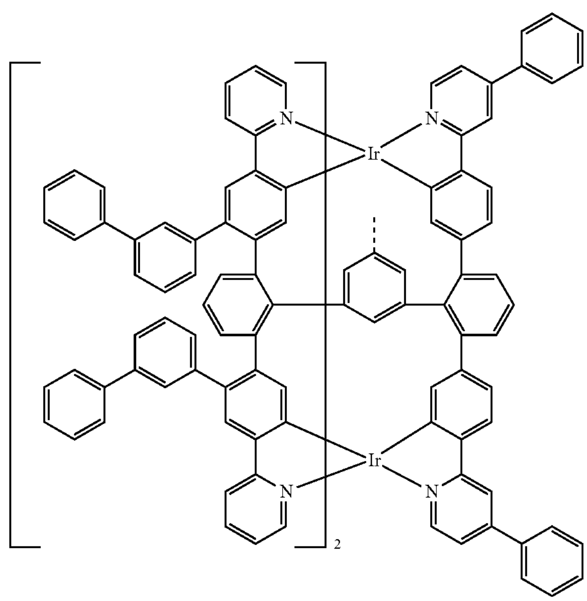

-continued

29

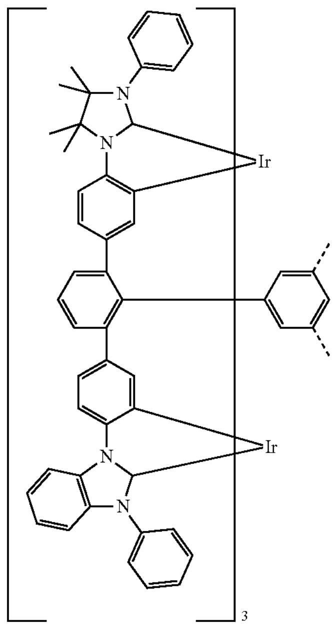

30

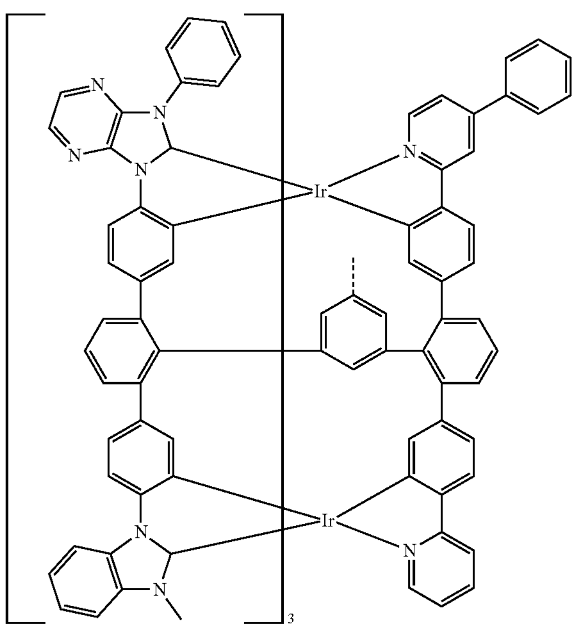

-continued

31

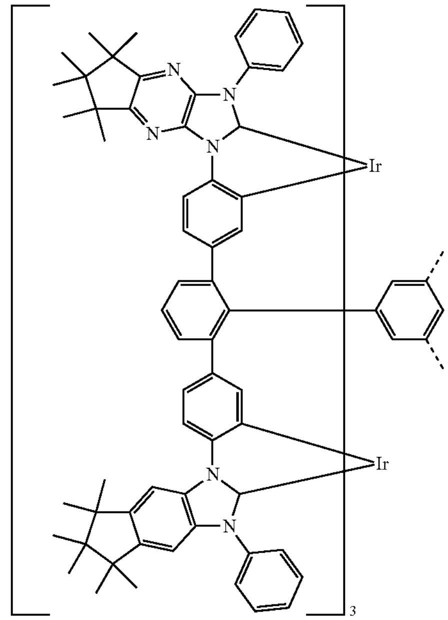

32

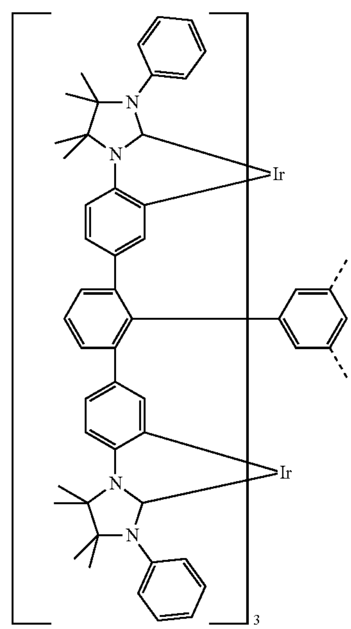

The compounds of the invention are chiral structures. According to the exact structure of the complexes and ligands, the formation of diastereomers and of several pairs of enantiomers is possible. In that case, the complexes of the invention include both the mixtures of the different diastereomers or the corresponding racemates and the individual isolated diastereomers or enantiomers.

The complexes of the invention can especially be prepared by the route described hereinafter. For this purpose, the 12-dentate ligand is prepared and then coordinated to the metals M by an o-metalation reaction. In general, for this purpose, an iridium salt or rhodium salt is reacted with the corresponding free ligand.

Therefore, the present invention further provides a process for preparing the compound of the invention by reacting the corresponding free ligands with metal alkoxides of the formula (22), with metal ketoketonates of the formula (23), with metal halides of the formula (24) or with metal carboxylates of the formula (25)

$$M(OR)_3$$

Formula (22)

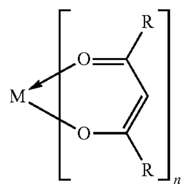

Formula (23)

$$MHal_3$$

Formula (24)

$$M(OOCR)_3$$

Formula (25)

where M is iridium or rhodium, R has the definitions given above, Hal=F, Cl, Br or I and the iridium reactants or rhodium reactants may also take the form of the corresponding hydrates. R here is preferably an alkyl group having 1 to 4 carbon atoms.

It is likewise possible to use iridium compounds or rhodium compounds bearing both alkoxide and/or halide and/or hydroxyl radicals and ketoketonate radicals. These compounds may also be charged.

Corresponding iridium compounds of particular suitability as reactants are disclosed in WO 2004/085449. Particularly suitable are $[IrCl_2(acac)_2]^-$, for example $Na[IrCl_2(acac)_2]$, metal complexes with acetylacetonate derivatives as ligand, for example $Ir(acac)_3$ or tris(2,2,6,6-tetramethylheptane-3,5-dionato)iridium, and $IrCl_3.xH_2O$ where x is typically a number from 2 to 4.

The synthesis of the complexes is preferably conducted as described in WO 2002/060910 and in WO 2004/085449. In this case, the synthesis can, for example, also be activated by thermal or photochemical means and/or by microwave radiation. In addition, the synthesis can also be conducted in an autoclave at elevated pressure and/or elevated temperature.

The reactions can be conducted without addition of solvents or melting aids in a melt of the corresponding ligands to be o-metalated. It is optionally possible to add solvents or melting aids. Suitable solvents are protic or aprotic solvents such as aliphatic and/or aromatic alcohols (methanol, ethanol, isopropanol, t-butanol, etc.), oligo- and polyalcohols (ethylene glycol, propane-1,2-diol, glycerol, etc.), alcohol ethers (ethoxyethanol, diethylene glycol, triethylene glycol, polyethylene glycol, etc.), ethers (di- and triethylene glycol dimethyl ether, diphenyl ether, etc.), aromatic, heteroaromatic and/or aliphatic hydrocarbons (toluene, xylene, mesitylene, chlorobenzene, pyridine, lutidine, quinoline, isoquinoline, tridecane, hexadecane, etc.), amides (DMF, DMAC, etc.), lactams (NMP), sulfoxides (DMSO) or sulfones (dimethyl sulfone, sulfolane, etc.). Suitable melting aids are compounds that are in solid form at room temperature but melt when the reaction mixture is heated and dissolve the reactants, so as to form a homogeneous melt. Particularly suitable are biphenyl, m-terphenyl, triphenyls, R- or S-binaphthol or else the corresponding racemate, 1,2-, 1,3- or 1,4-bisphenoxybenzene, triphenylphosphine oxide, 18-crown-6, phenol, 1-naphthol, hydroquinone, etc. Particular preference is given here to the use of hydroquinone.

It is possible by these processes, if necessary followed by purification, for example recrystallization or sublimation, to obtain the inventive compounds in high purity, preferably more than 99% (determined by means of $^1H$ NMR and/or HPLC).

The compounds of the invention may also be rendered soluble by suitable substitution, for example by comparatively long alkyl groups (about 4 to 20 carbon atoms), especially branched alkyl groups, or optionally substituted aryl groups, for example xylyl, mesityl or branched terphenyl or quaterphenyl groups. Another particular method that leads to a distinct improvement in the solubility of the metal complexes is the use of fused-on aliphatic groups, as shown, for example, by the formulae (15) to (21) disclosed above. Such compounds are then soluble in sufficient concentration at room temperature in standard organic solvents, for example toluene or xylene, to be able to process the complexes from solution. These soluble compounds are of particularly good suitability for processing from solution, for example by printing methods.

For the processing of the metal complexes of the invention from the liquid phase, for example by spin-coating or by printing methods, formulations of the metal complexes of the invention are required. These formulations may, for example, be solutions, dispersions or emulsions. For this purpose, it may be preferable to use mixtures of two or more solvents. Suitable and preferred solvents are, for example, toluene, anisole, o-, m- or p-xylene, methyl benzoate, mesitylene, tetralin, veratrole, THF, methyl-THF, THP, chlorobenzene, dioxane, phenoxytoluene, especially 3-phenoxytoluene, (−)-fenchone, 1,2,3,5-tetramethylbenzene, 1,2,4,5-tetramethylbenzene, 1-methylnaphthalene, 2-methylbenzothiazole, 2-phenoxyethanol, 2-pyrrolidinone, 3-methylanisole, 4-methylanisole, 3,4-dimethylanisole, 3,5-dimethylanisole, acetophenone, α-terpineol, benzothiazole, butyl benzoate, cumene, cyclohexanol, cyclohexanone, cyclohexylbenzene, decalin, dodecylbenzene, ethyl benzoate, indane, NMP, p-cymene, phenetole, 1,4-diisopropylbenzene, dibenzyl ether, diethylene glycol butyl methyl ether, triethylene glycol butyl methyl ether, diethylene glycol dibutyl ether, triethylene glycol dimethyl ether, diethylene glycol monobutyl ether, tripropylene glycol dimethyl ether, tetraethylene glycol dimethyl ether, 2-isopropylnaphthalene, pentylbenzene, hexylbenzene, heptylbenzene, octylbenzene, 1,1-bis(3,4-dimethylphenyl)ethane, hexamethylindane, 2-methylbiphenyl, 3-methylbiphenyl, 1-methylnaphthalene, 1-ethylnaphthalene, ethyl octanoate, diethyl sebacate, octyl octanoate, heptylbenzene, menthyl isovalerate, cyclohexyl hexanoate or mixtures of these solvents.

The present invention therefore further provides a formulation comprising at least one compound of the invention and at least one further compound. The further compound may, for example, be a solvent, especially one of the abovementioned solvents or a mixture of these solvents. The further compound may alternatively be a further organic or inorganic compound which is likewise used in the electronic device, for example a matrix material. This further compound may also be polymeric.

The above-described compound of the invention or the preferred embodiments detailed above can be used as active component or as oxygen sensitizers in the electronic device. The present invention thus further provides for the use of a compound of the invention in an electronic device or as oxygen sensitizer. The present invention still further provides an electronic device comprising at least one compound of the invention.

An electronic device is understood to mean any device comprising anode, cathode and at least one layer, said layer comprising at least one organic or organometallic compound. The electronic device of the invention thus comprises anode, cathode and at least one layer containing at least one metal complex of the invention. Preferred electronic devices are selected from the group consisting of organic electroluminescent devices (OLEDs, PLEDs), organic integrated circuits (O-ICs), organic field-effect transistors (O-FETs), organic thin-film transistors (O-TFTs), organic light-emitting transistors (O-LETs), organic solar cells (O-SCs), the latter being understood to mean both purely organic solar cells and dye-sensitized solar cells, organic optical detectors, organic photoreceptors, organic field-quench devices (O-FQDs), light-emitting electrochemical cells (LECs), oxygen sensors and organic laser diodes (O-lasers), comprising at least one metal complex of the invention in at least one layer. Particular preference is given to organic electroluminescent devices. Active components are generally the organic or inorganic materials introduced between the anode and cathode, for example charge injection, charge transport or charge blocker materials, but especially emission materials and matrix materials. The compounds of the invention exhibit particularly good properties as emission material in organic electroluminescent devices. A preferred embodiment of the invention is therefore organic electroluminescent devices. In addition, the compounds of the invention can be used for production of singlet oxygen or in photocatalysis.

The organic electroluminescent device comprises cathode, anode and at least one emitting layer. Apart from these layers, it may comprise still further layers, for example in each case one or more hole injection layers, hole transport layers, hole blocker layers, electron transport layers, electron injection layers, exciton blocker layers, electron blocker layers, charge generation layers and/or organic or inorganic p/n junctions. At the same time, it is possible that one or more hole transport layers are p-doped, for example with metal oxides such as $MoO_3$ or $WO_3$ or with (per)fluorinated electron-deficient aromatic systems, and/or that one or more electron transport layers are n-doped. It is likewise possible for interlayers to be introduced between two emitting layers, these having, for example, an exciton-blocking function and/or controlling the charge balance in the electroluminescent device. However, it should be pointed out that not necessarily every one of these layers need be present.

In this case, it is possible for the organic electroluminescent device to contain an emitting layer, or for it to contain a plurality of emitting layers. If a plurality of emission layers are present, these preferably have several emission maxima between 380 nm and 750 nm overall, such that the overall result is white emission; in other words, various emitting compounds which may fluoresce or phosphoresce are used in the emitting layers. Three-layer systems are especially preferred, where the three layers exhibit blue, green and orange or red emission, or systems having more than three emitting layers. The system may also be a hybrid system wherein one or more layers fluoresce and one or more other layers phosphoresce. In addition, preference is given to tandem OLEDs. White-emitting organic electroluminescent devices may be used for lighting applications or else with color filters for full-color displays.

In a preferred embodiment of the invention, the organic electroluminescent device comprises the metal complex of the invention as emitting compound in one or more emitting layers.

When the metal complex of the invention is used as emitting compound in an emitting layer, it is preferably used in combination with one or more matrix materials. The mixture of the metal complex of the invention and the matrix material contains between 0.1% and 99% by weight, preferably between 1% and 90% by weight, more preferably between 3% and 40% by weight and especially between 5% and 25% by weight of the metal complex of the invention, based on the overall mixture of emitter and matrix material. Correspondingly, the mixture contains between 99.9% and 1% by weight, preferably between 99% and 10% by weight, more preferably between 97% and 60% by weight and especially between 95% and 75% by weight of the matrix material, based on the overall mixture of emitter and matrix material.

The matrix material used may generally be any materials which are known for the purpose according to the prior art. The triplet level of the matrix material is preferably higher than the triplet level of the emitter.

Suitable matrix materials for the compounds of the invention are ketones, phosphine oxides, sulfoxides and sulfones, for example according to WO 2004/013080, WO 2004/093207, WO 2006/005627 or WO 2010/006680, triarylamines, carbazole derivatives, e.g. CBP (N,N-biscarbazolylbiphenyl), m-CBP or the carbazole derivatives disclosed in WO 2005/039246, US 2005/0069729, JP 2004/288381, EP 1205527, WO 2008/086851 or US 2009/0134784, indolocarbazole derivatives, for example according to WO 2007/063754 or WO 2008/056746, indenocarbazole derivatives, for example according to WO 2010/136109 or WO 2011/000455, azacarbazoles, for example according to EP 1617710, EP 1617711, EP 1731584, JP 2005/347160, bipolar matrix materials, for example according to WO 2007/137725, silanes, for example according to WO 2005/111172, azaboroles or boronic esters, for example according to WO 2006/117052, diazasilole derivatives, for example according to WO 2010/054729, diazaphosphole derivatives, for example according to WO 2010/054730, triazine derivatives, for example according to WO 2010/015306, WO 2007/063754 or WO 2008/056746, zinc complexes, for example according to EP 652273 or WO 2009/062578, dibenzofuran derivatives, for example according to WO 2009/148015, WO 2015/169412 or the as yet unpublished applications EP16158460.2 or EP16159829.7, or bridged carbazole derivatives, for example according to US 2009/0136779, WO 2010/050778, WO 2011/042107 or WO 2011/088877.

It may also be preferable to use a plurality of different matrix materials as a mixture, especially at least one electron-conducting matrix material and at least one hole-conducting matrix material. A preferred combination is, for example, the use of an aromatic ketone, a triazine derivative or a phosphine oxide derivative with a triarylamine derivative or a carbazole derivative as mixed matrix for the metal complex of the invention. Preference is likewise given to the use of a mixture of a charge-transporting matrix material and an electrically inert matrix material having no significant involvement, if any, in the charge transport, as described, for example, in WO 2010/108579. Preference is likewise given to the use of two electron-transporting matrix materials, for example triazine derivatives and lactam derivatives, as described, for example, in WO 2014/094964.

Depicted below are examples of compounds that are suitable as matrix materials for the compounds of the invention.

Examples of triazines and pyrimidines which can be used as electron-transporting matrix materials are the following compounds:
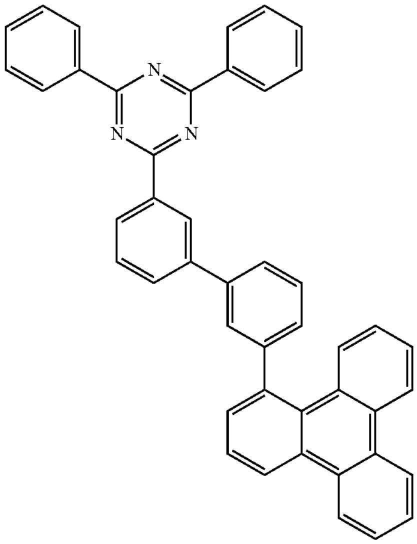
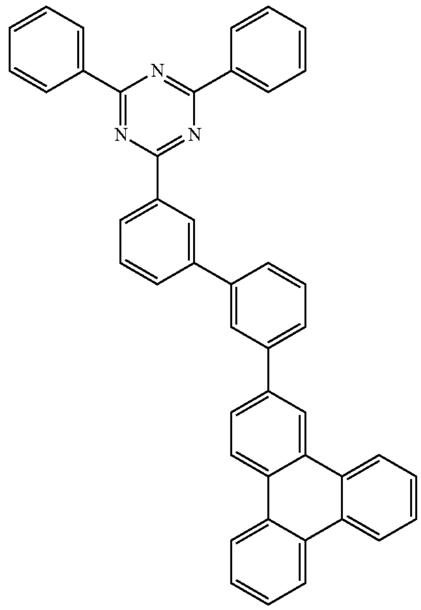
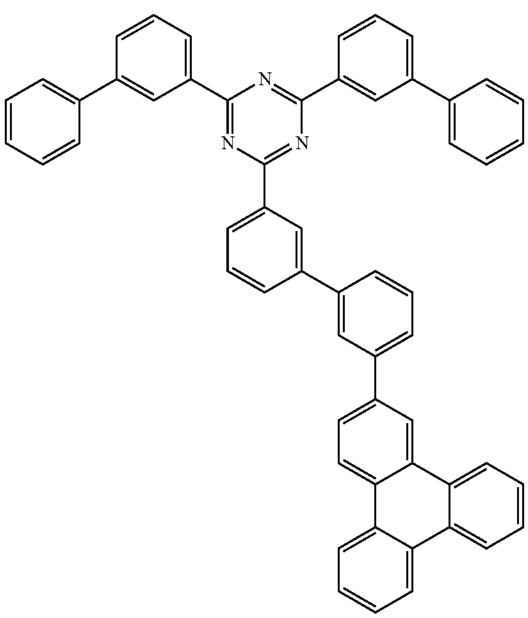
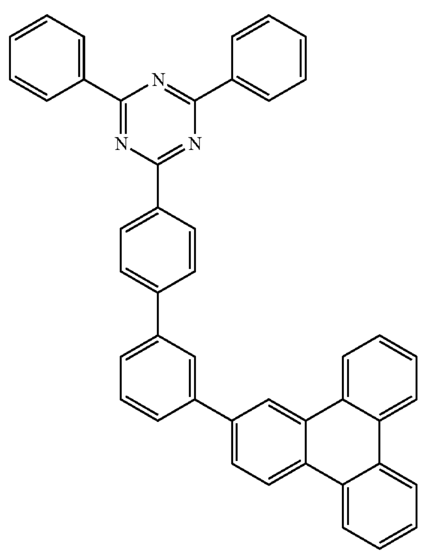

-continued
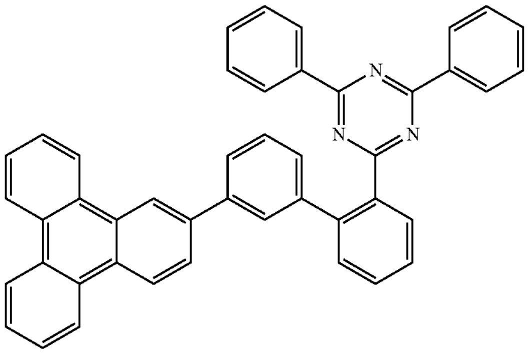
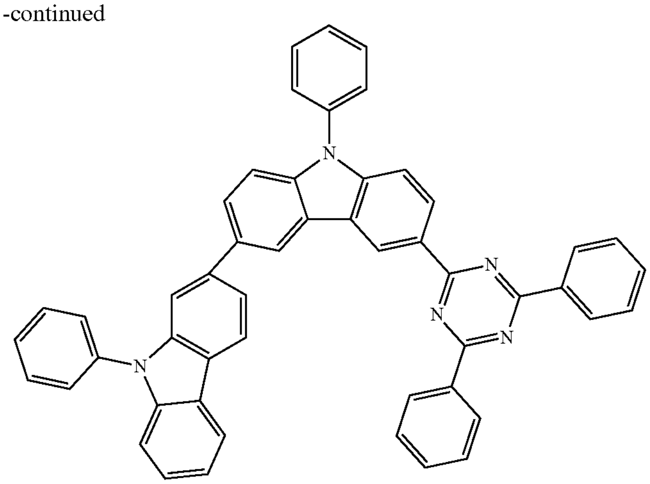
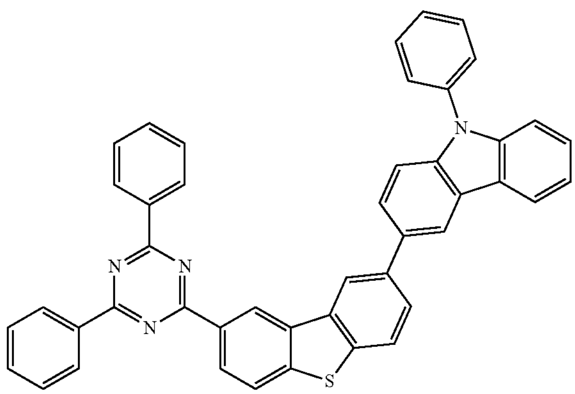
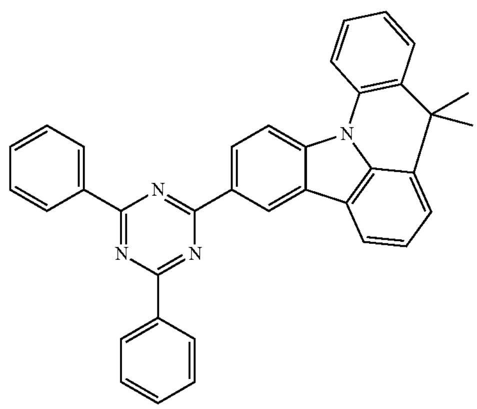
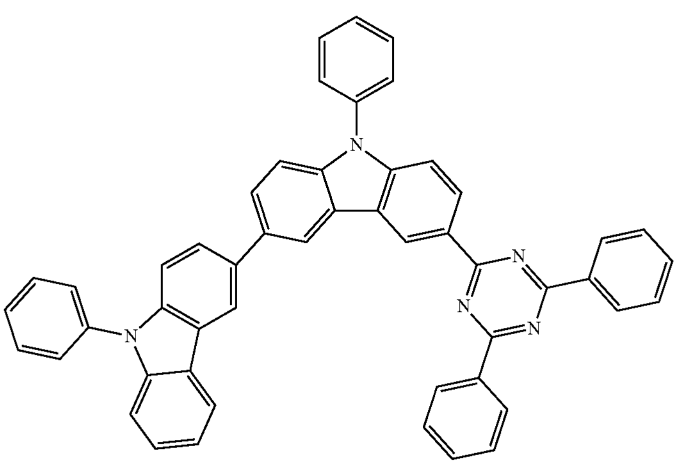

-continued
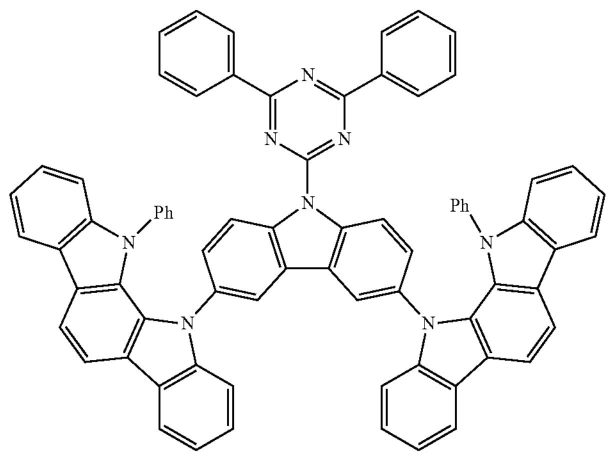
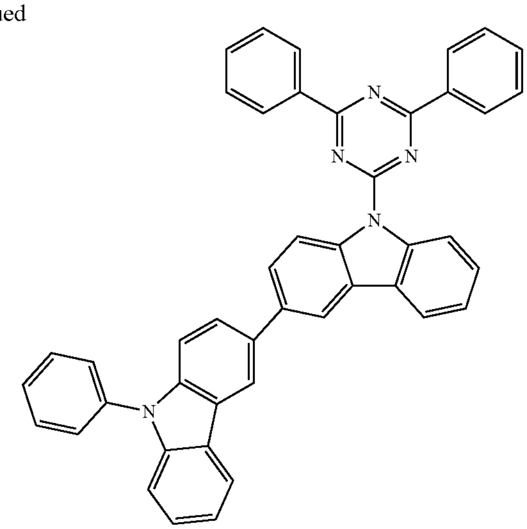
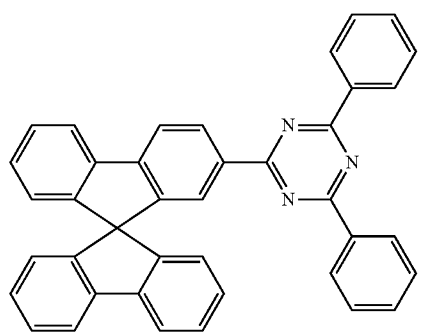
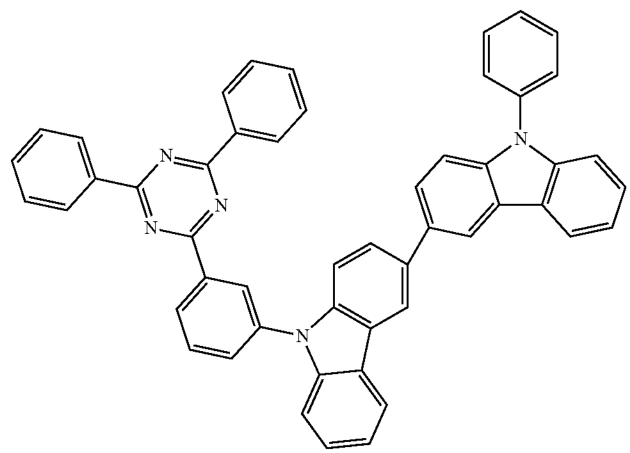
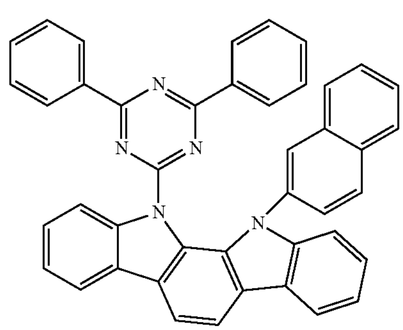
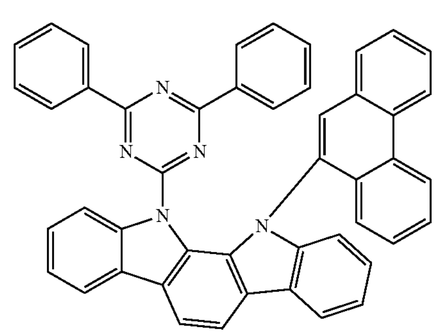

-continued
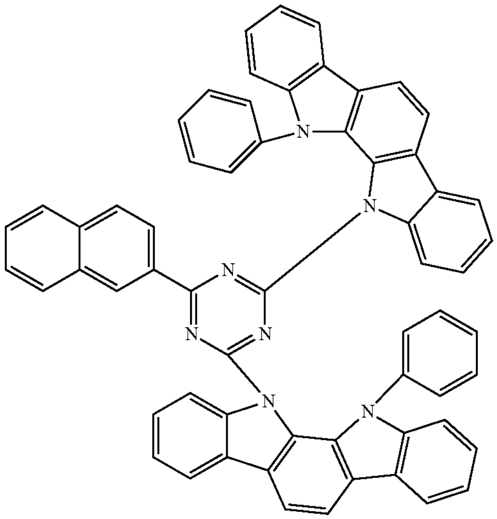
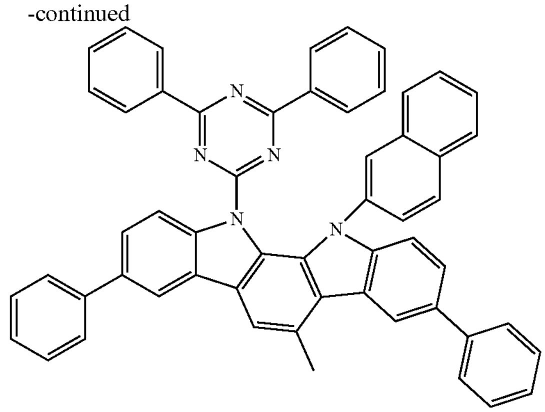
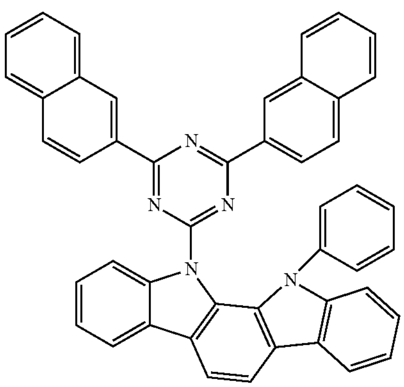
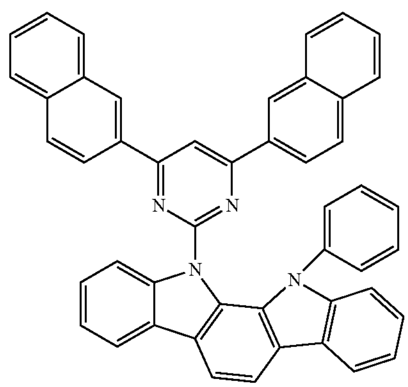
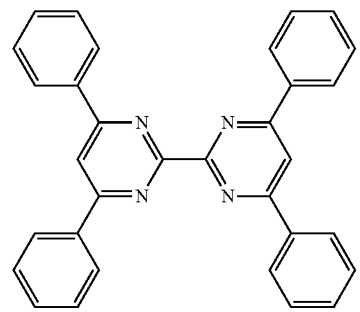
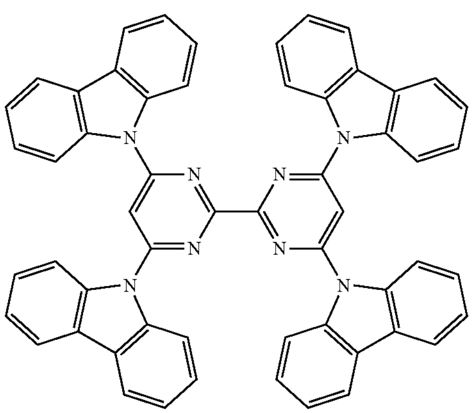
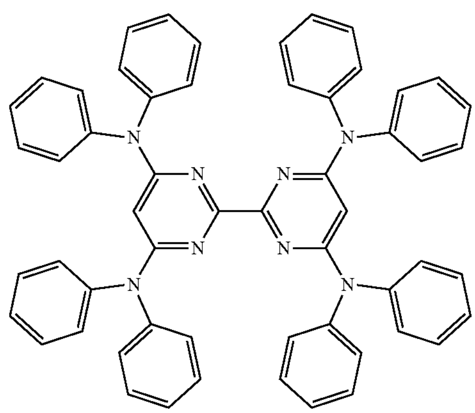
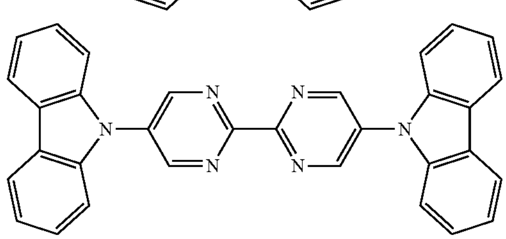
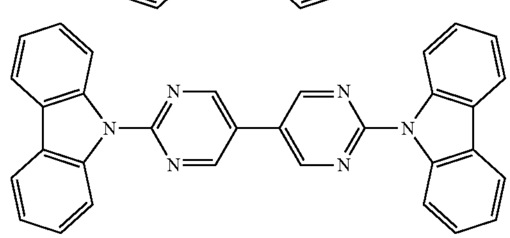

-continued
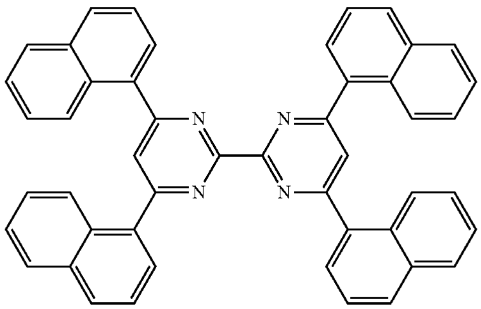
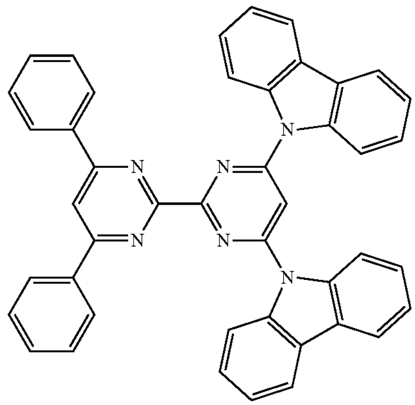
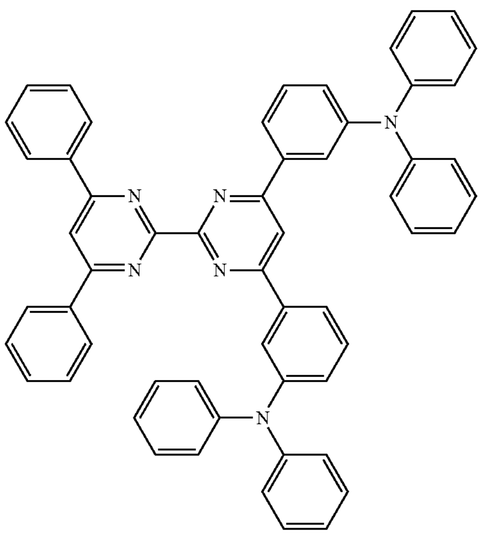
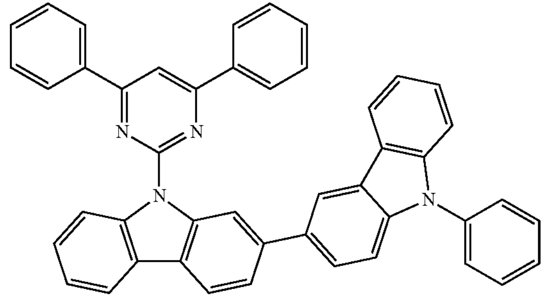
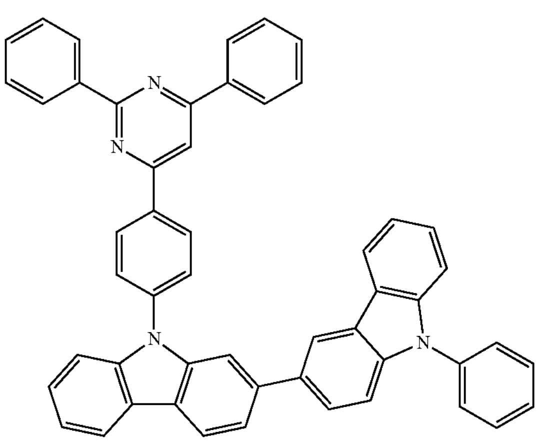
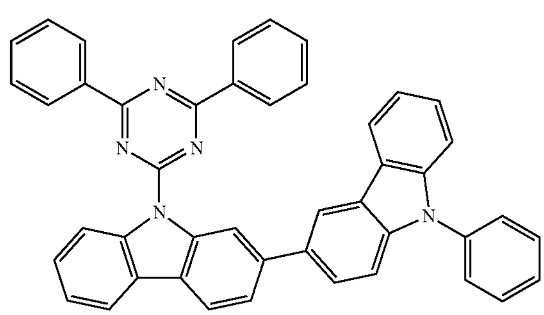

-continued
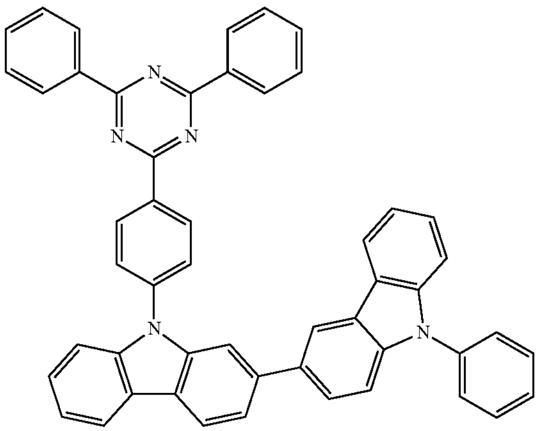
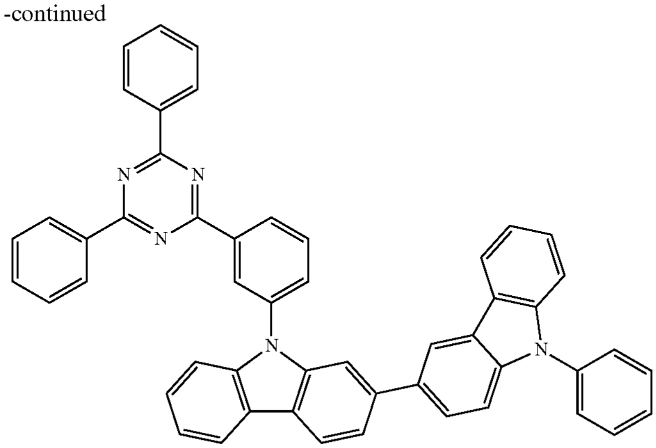
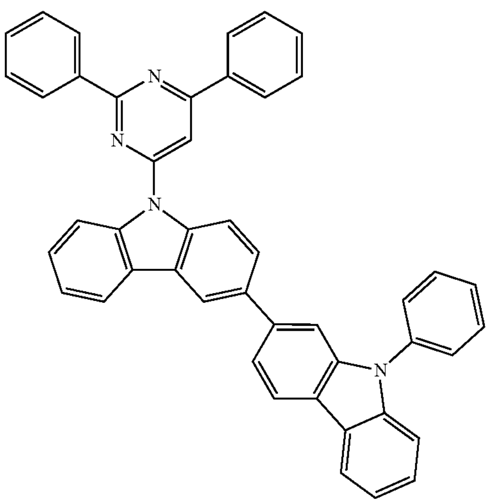
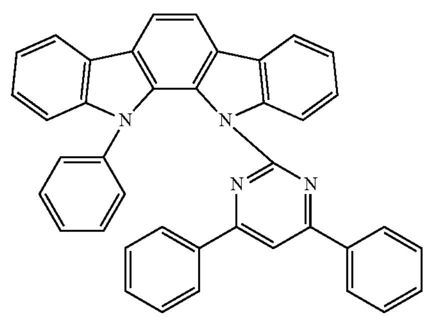
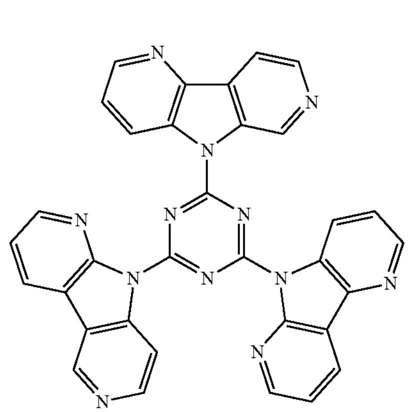
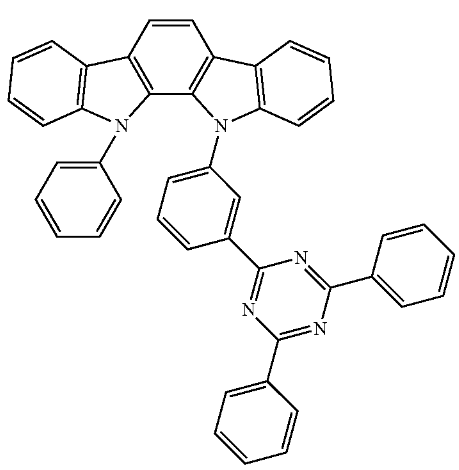

-continued
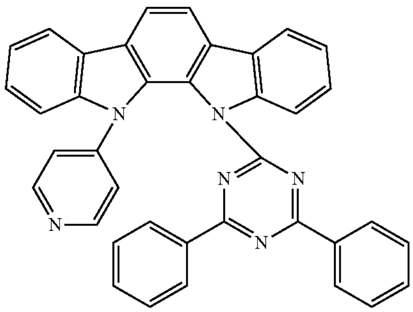
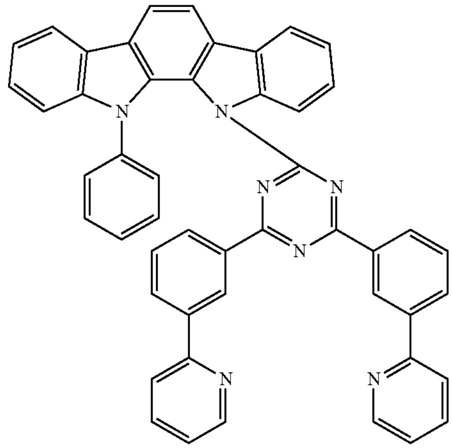
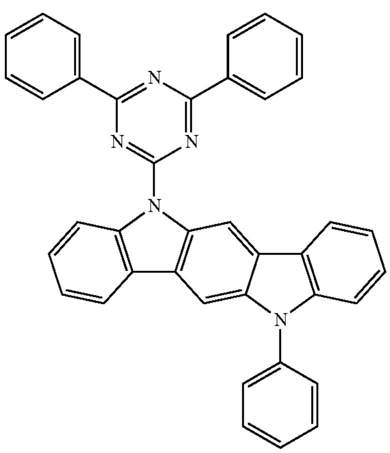
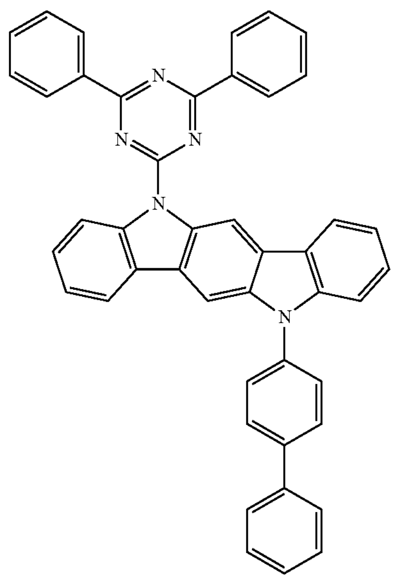
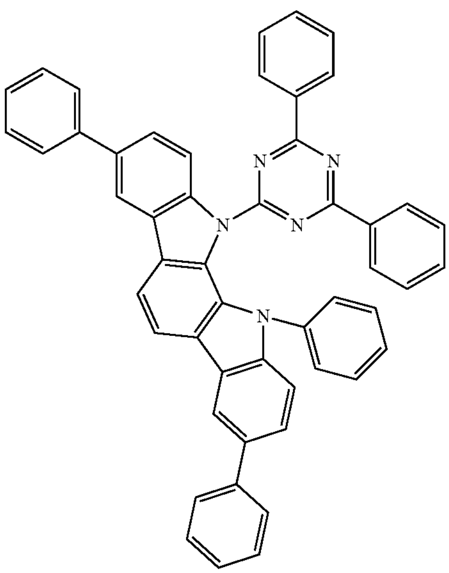
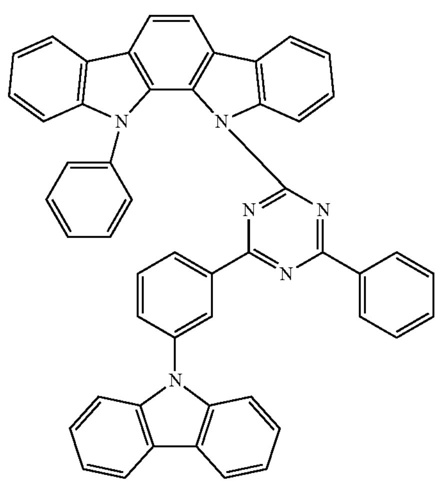

-continued
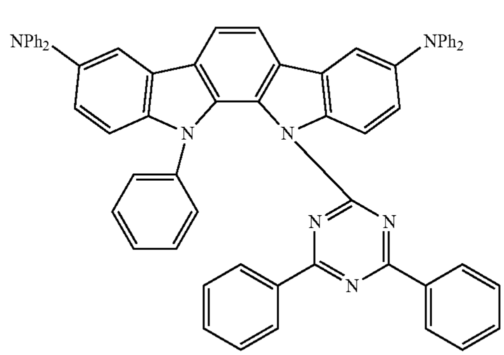
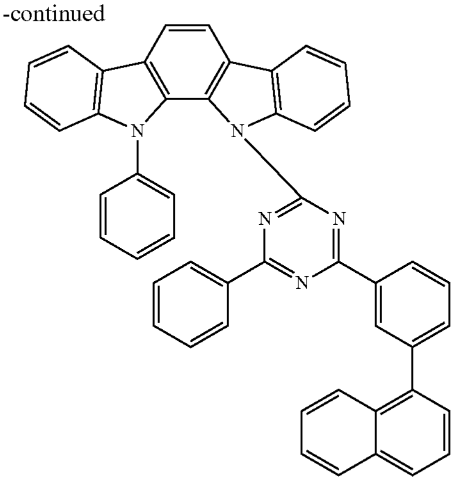
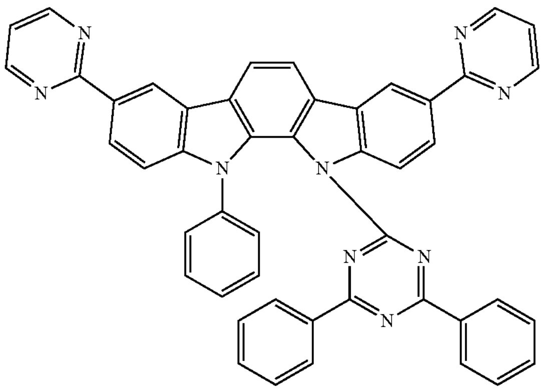
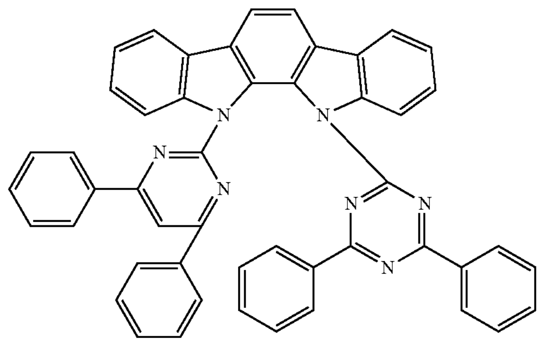
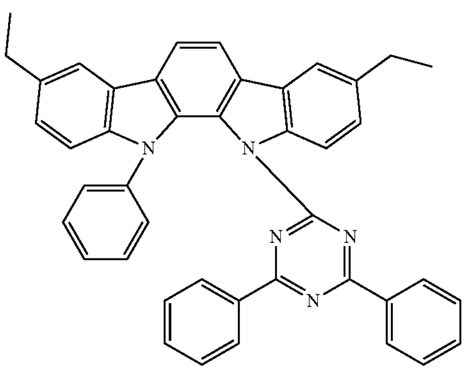
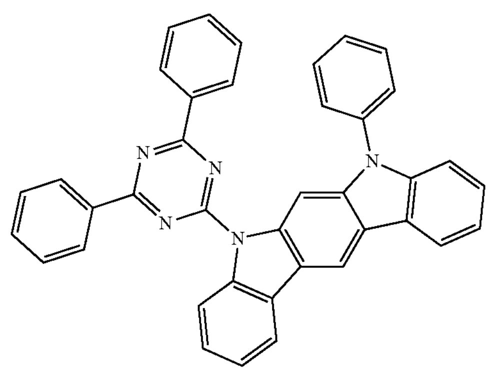
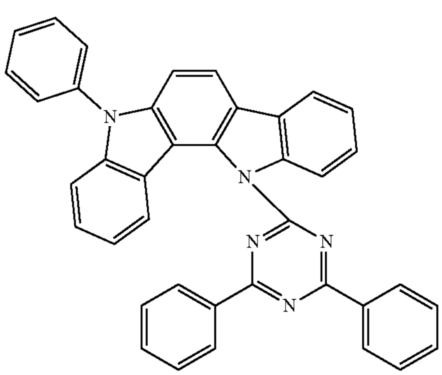
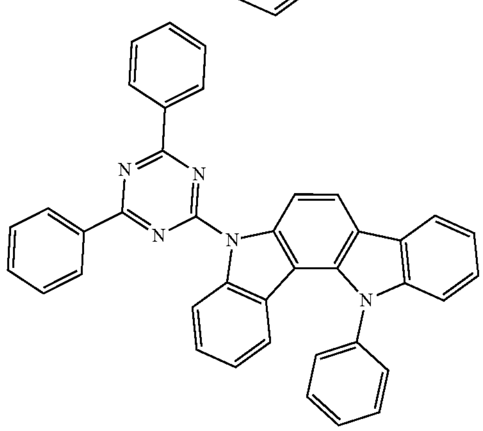

-continued
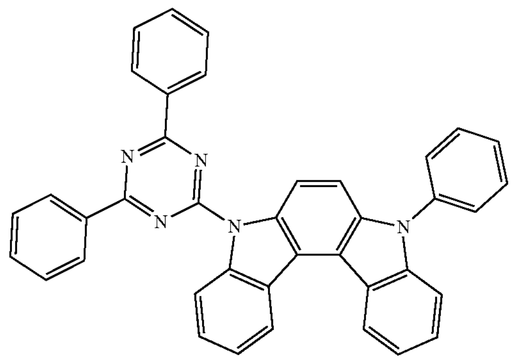
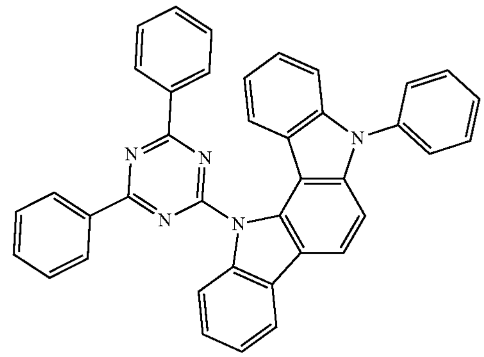
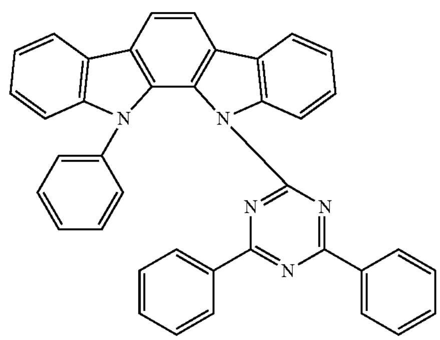
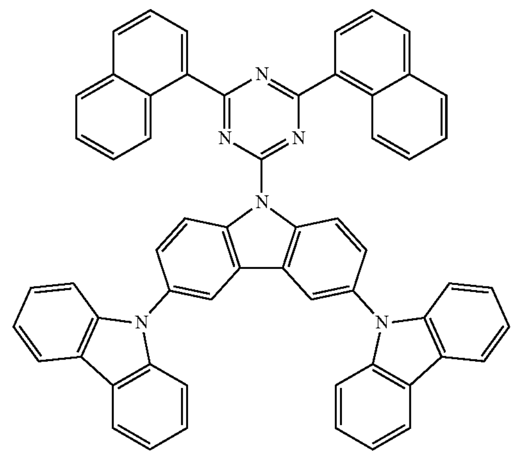
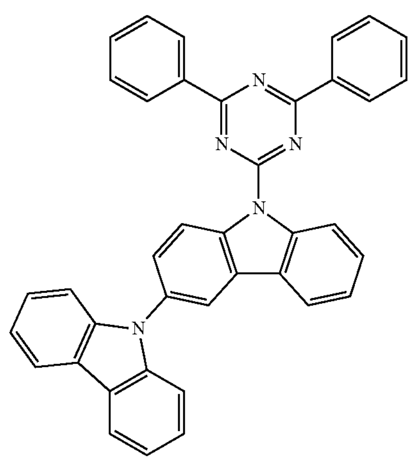
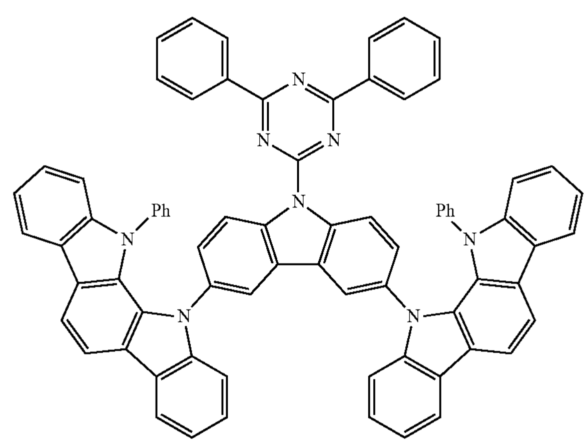

-continued
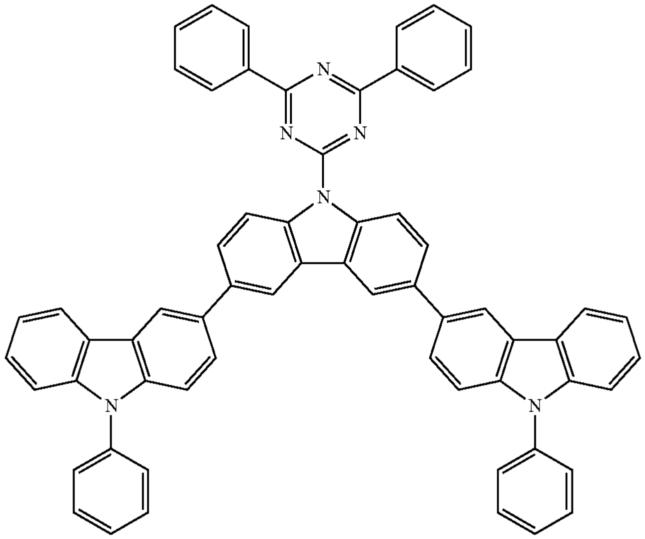
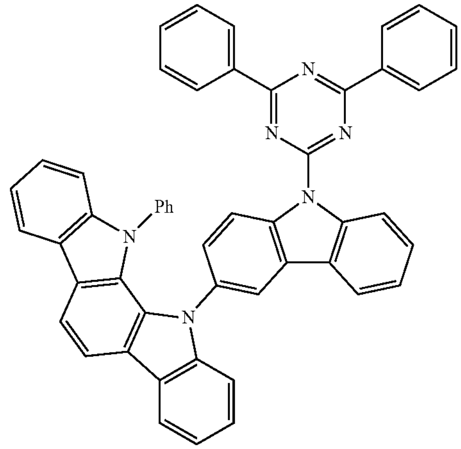
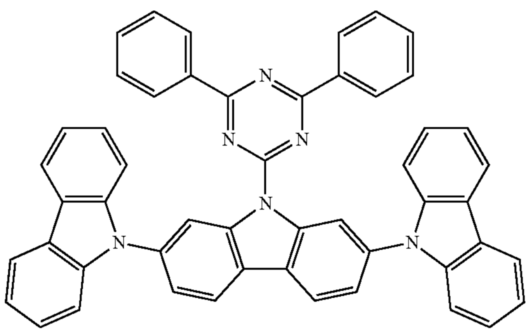
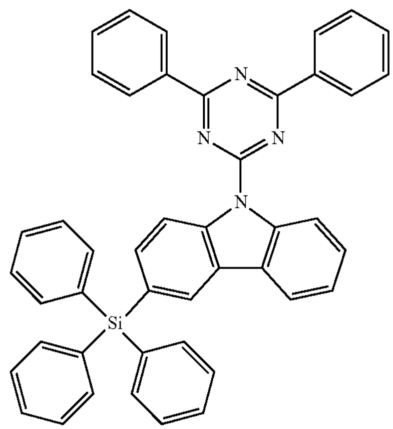
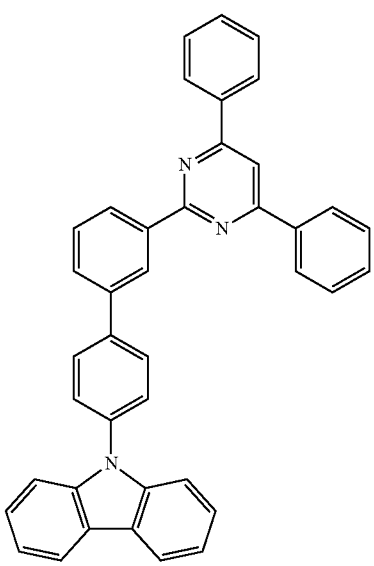
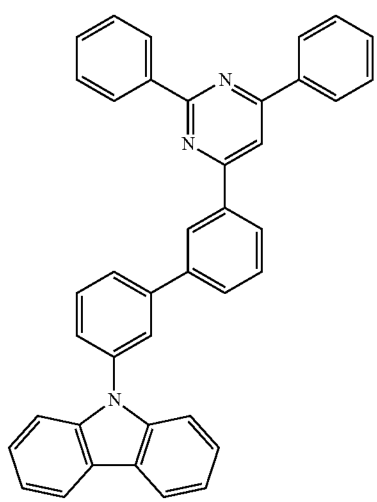

-continued
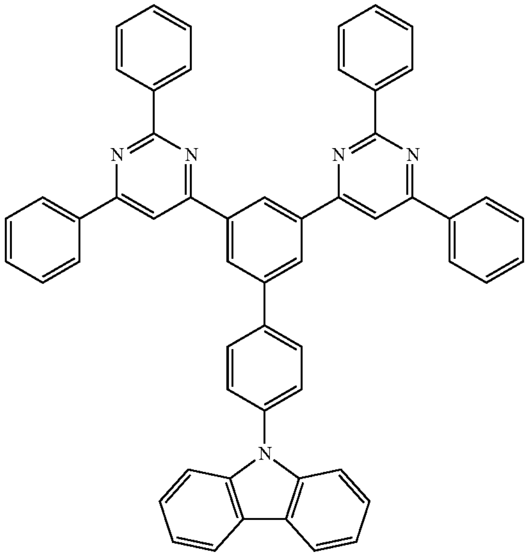
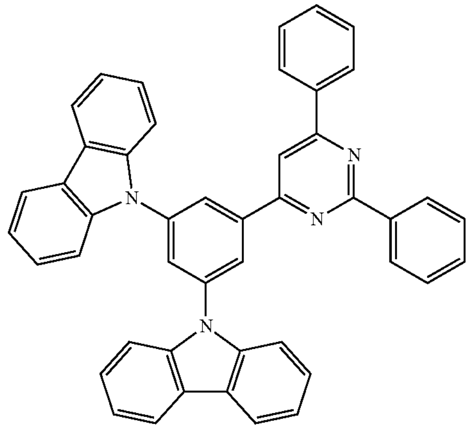
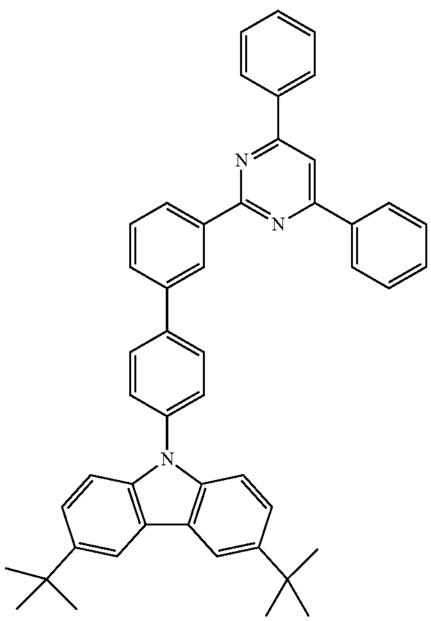
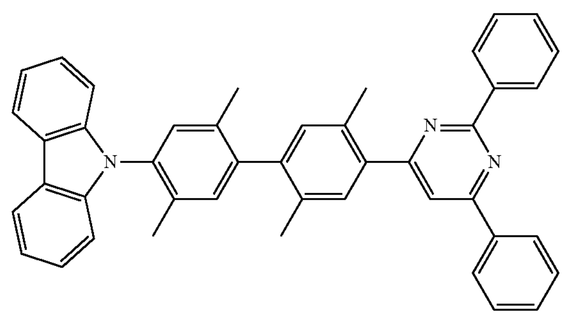
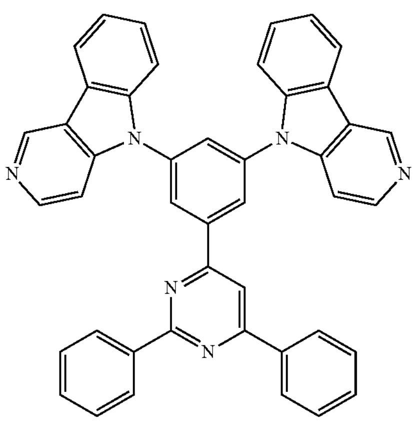
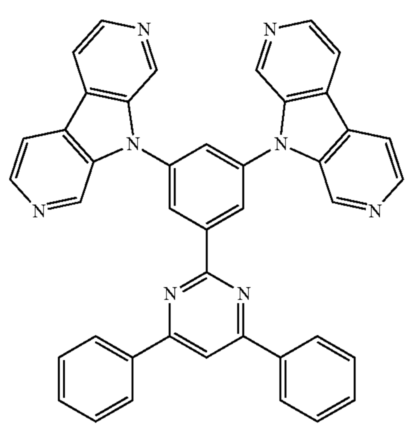

-continued
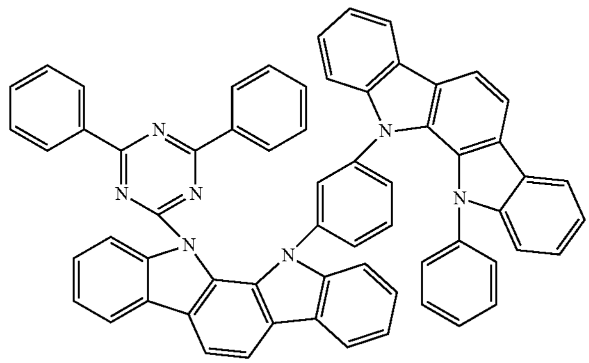
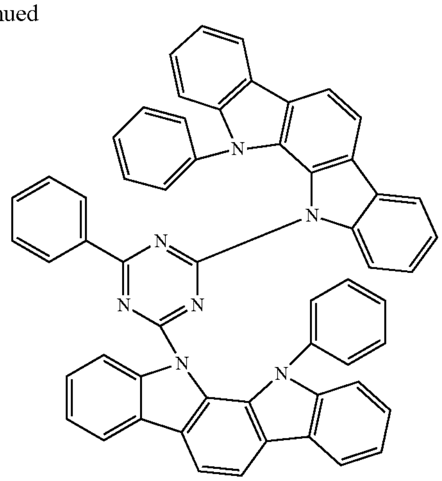
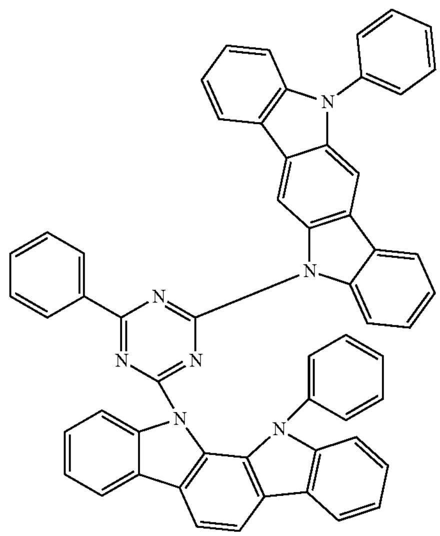
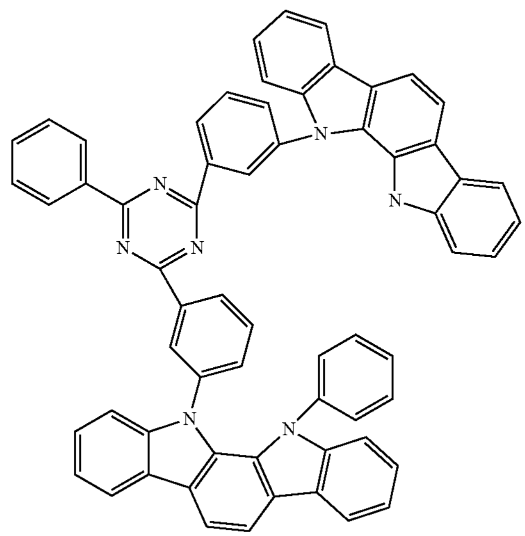
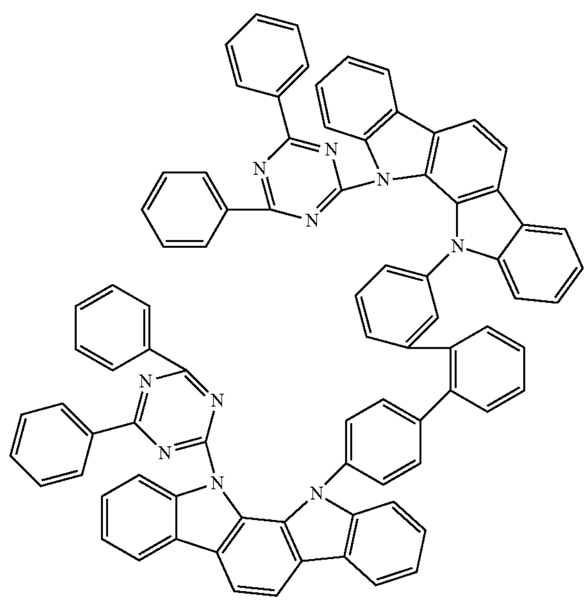
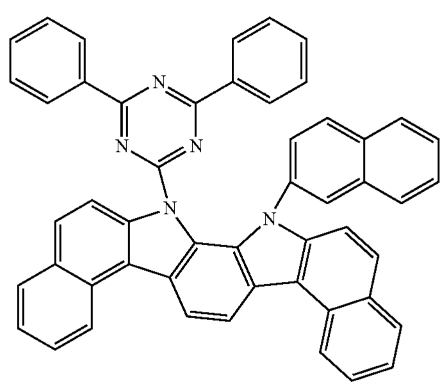

-continued
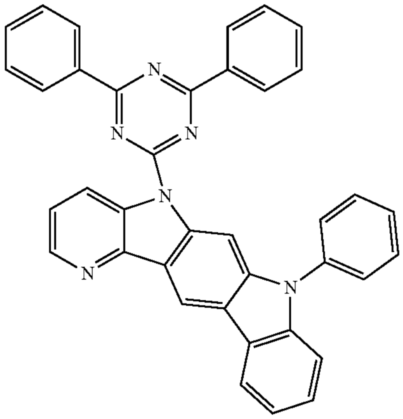
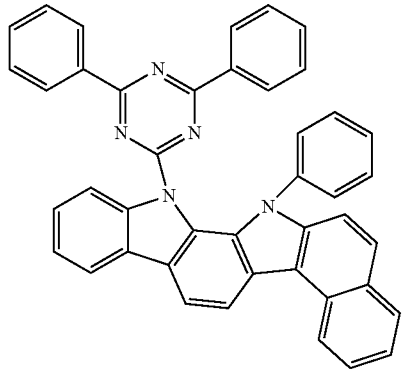
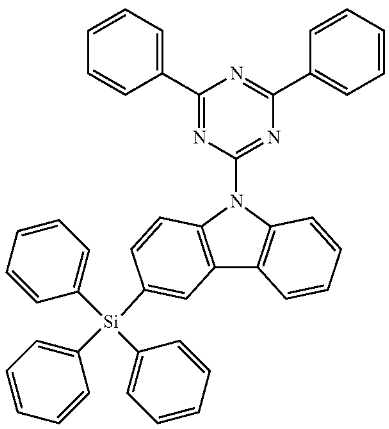
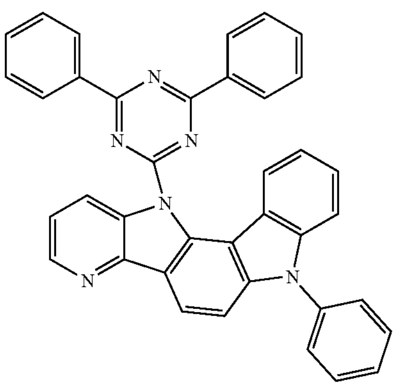
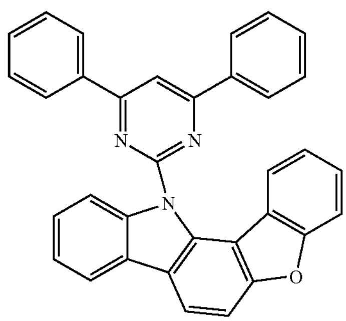
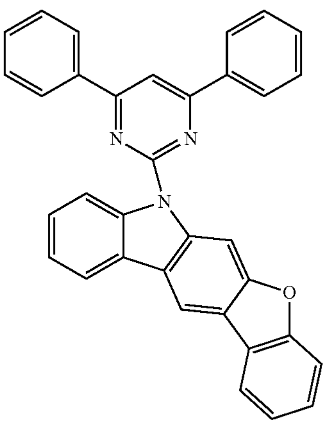
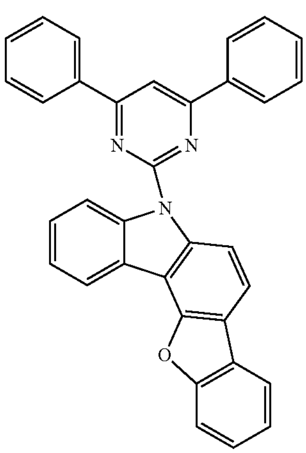
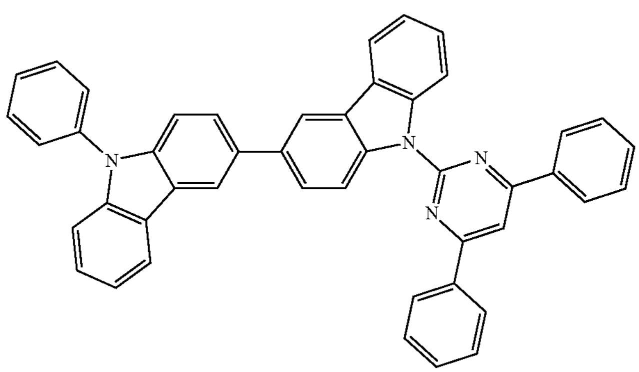

-continued
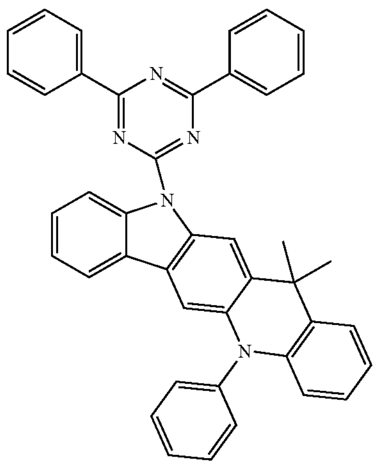
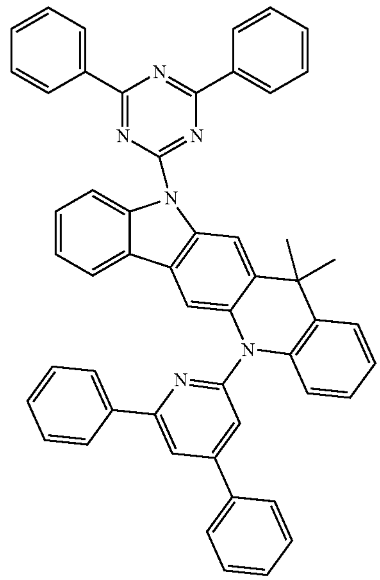
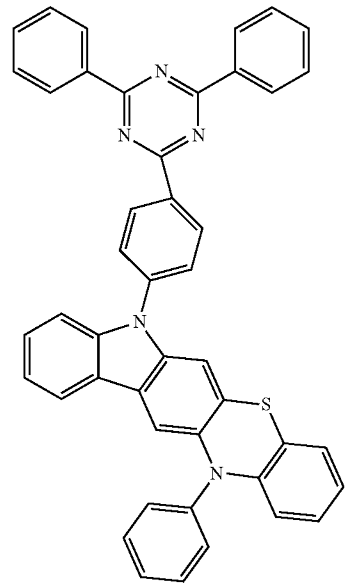
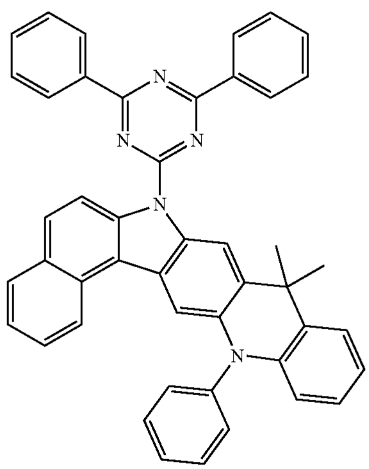
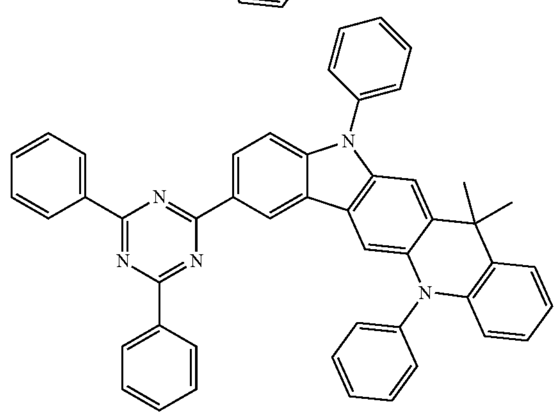
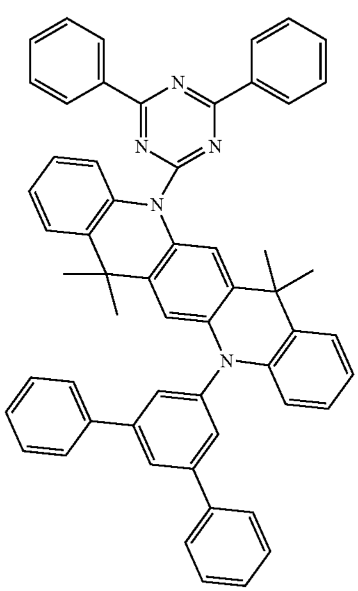
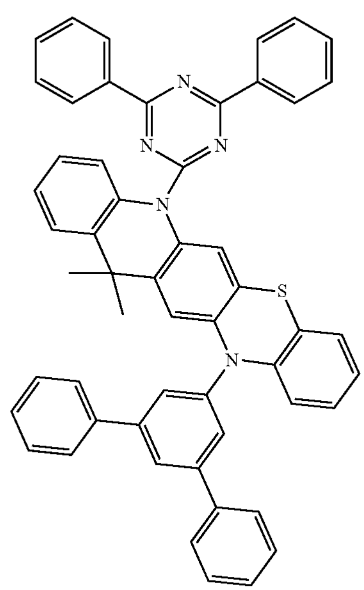
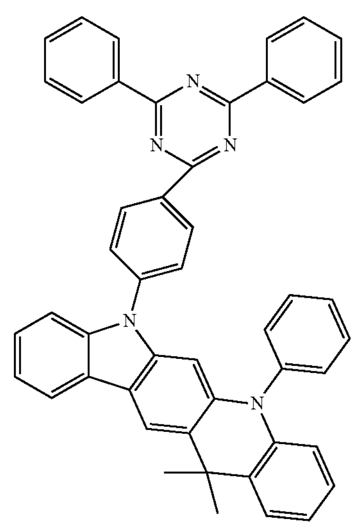

-continued
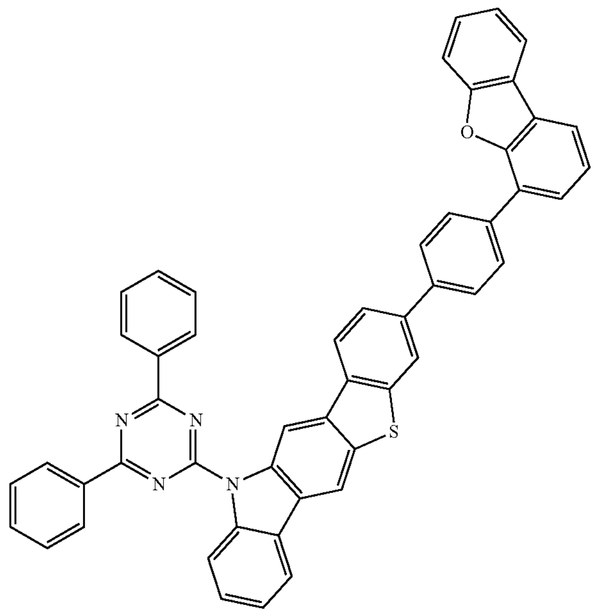
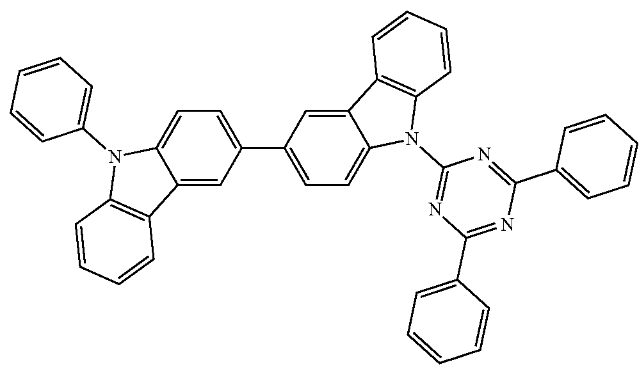
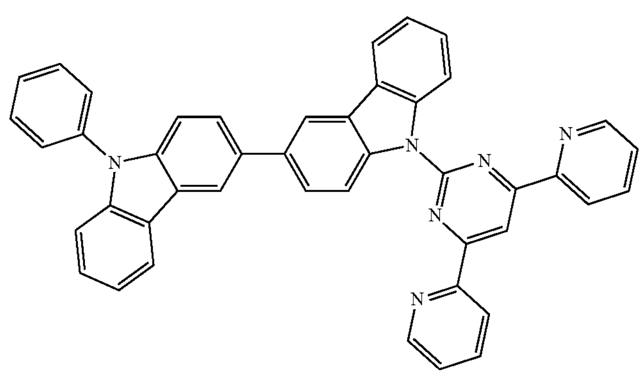
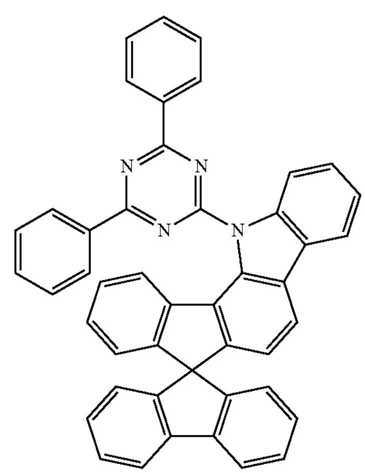

-continued
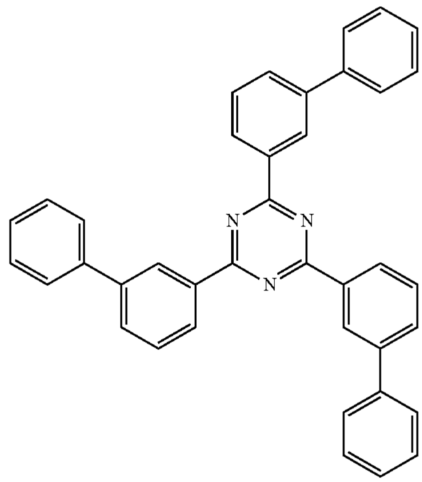
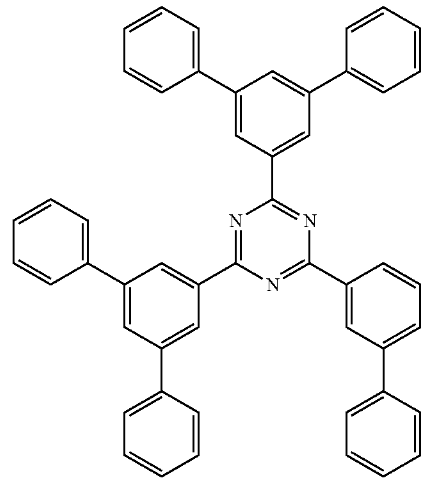
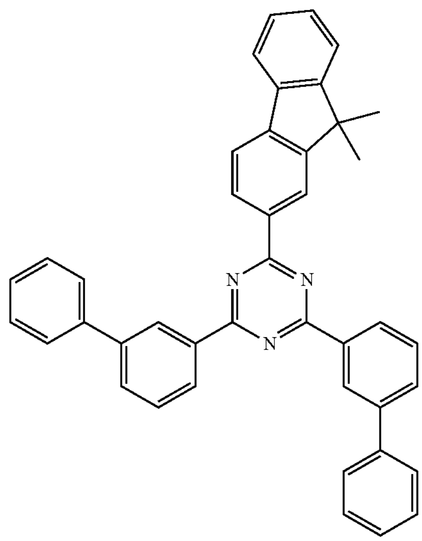
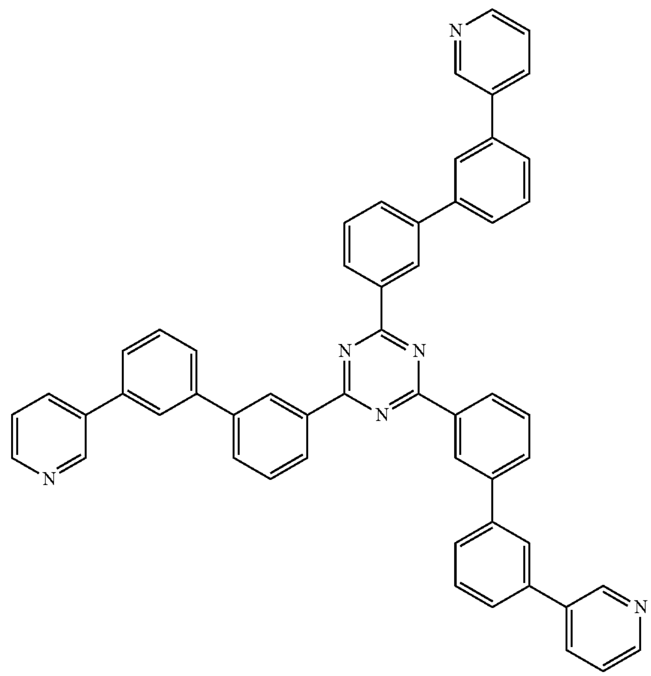
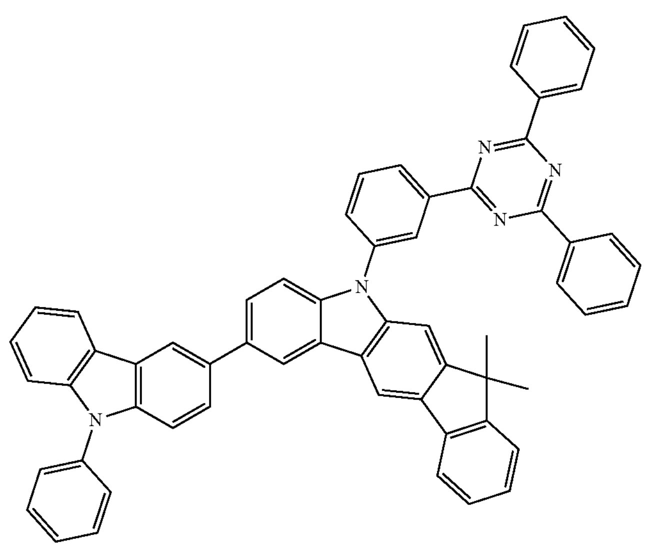

-continued
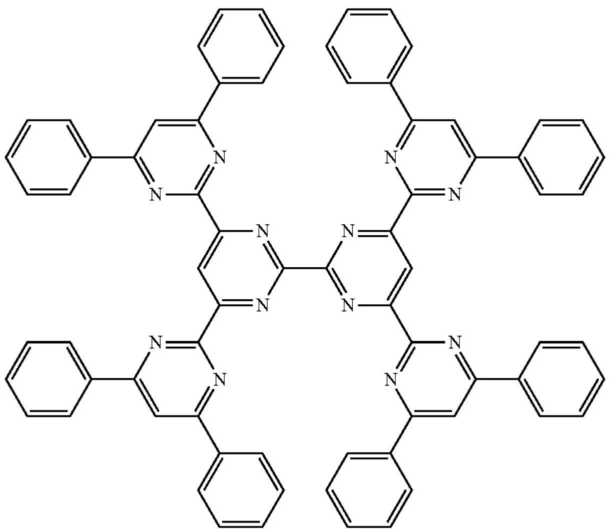
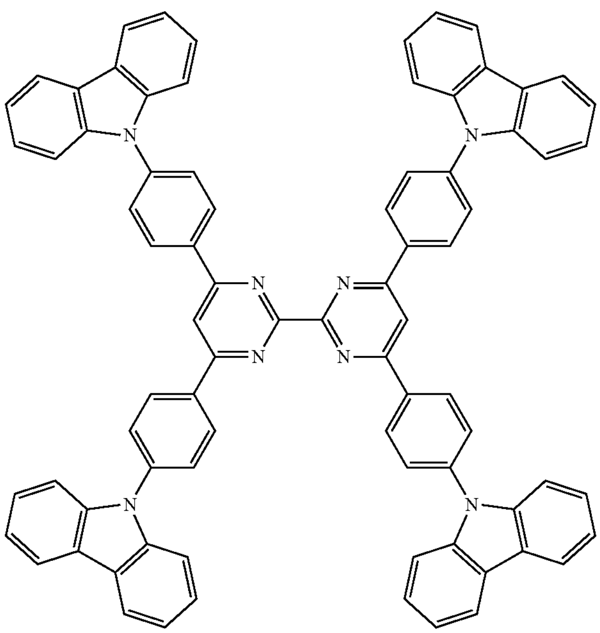
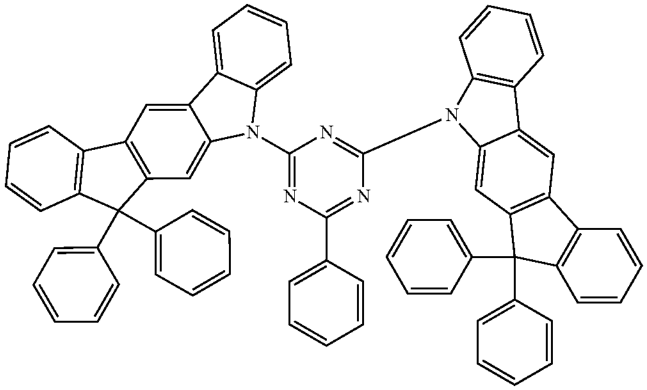

-continued
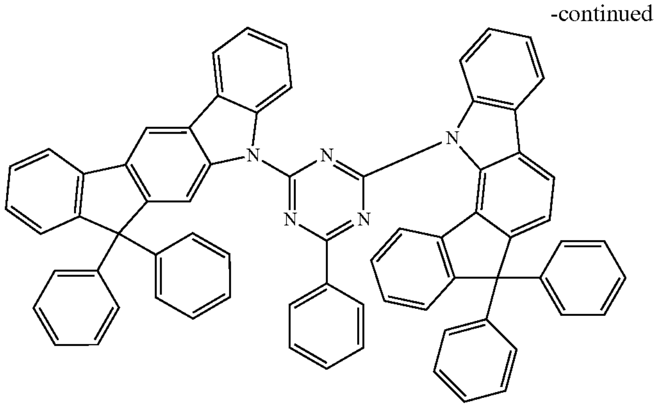
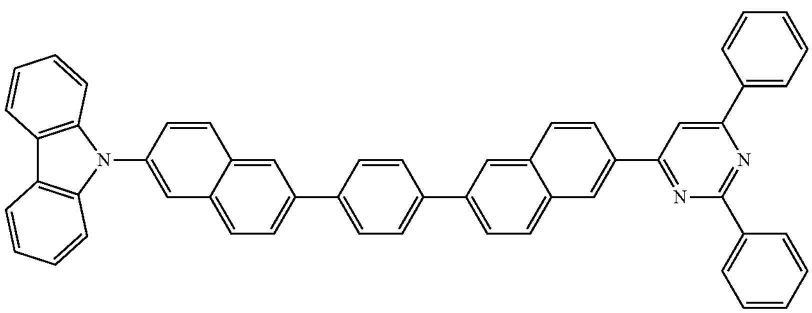
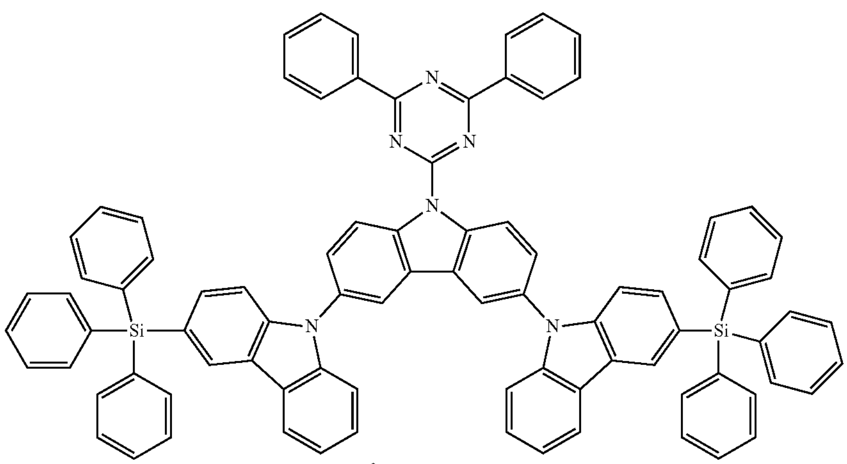
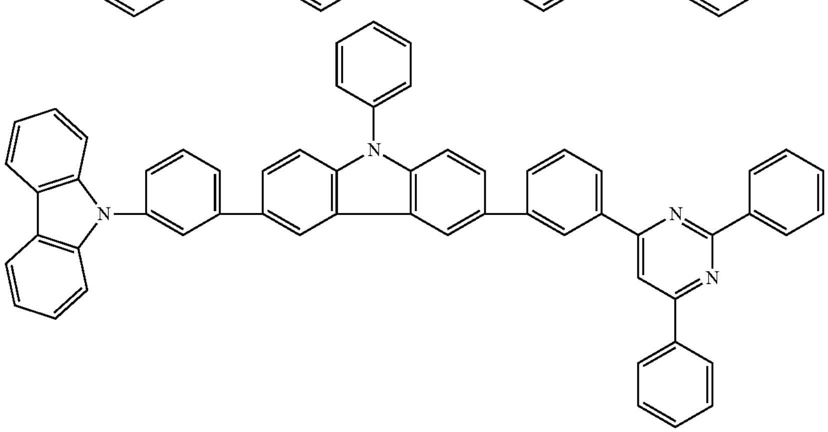

-continued
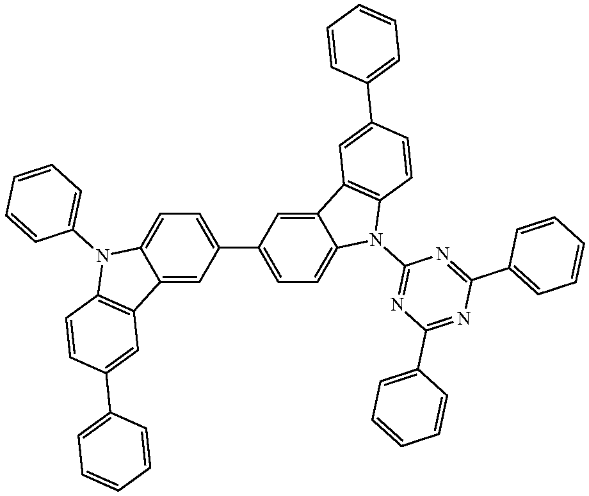
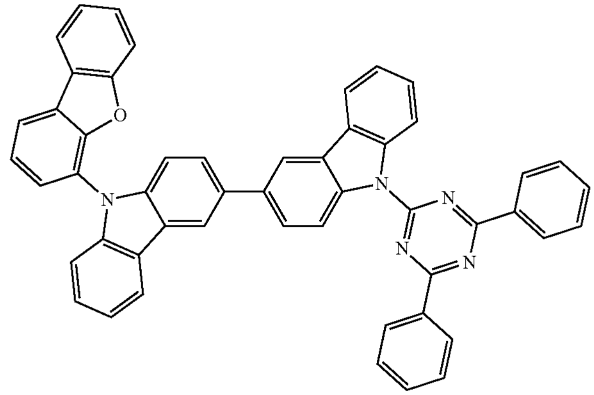
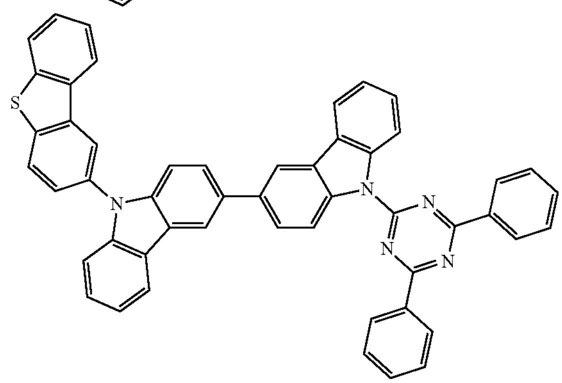
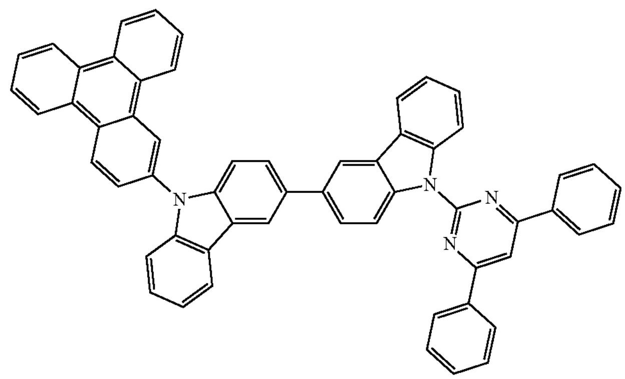
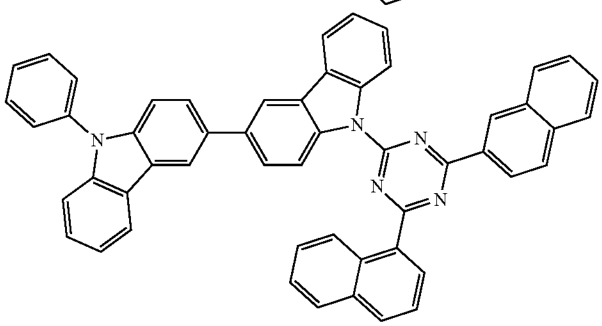
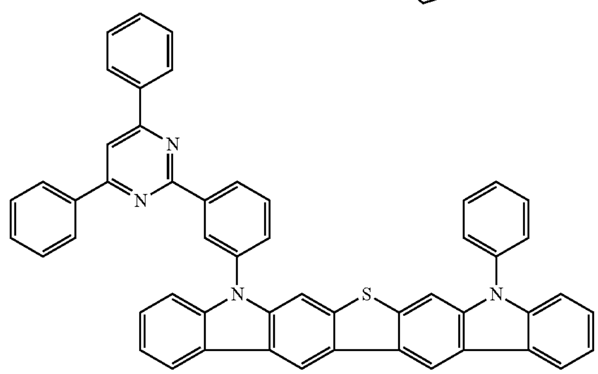
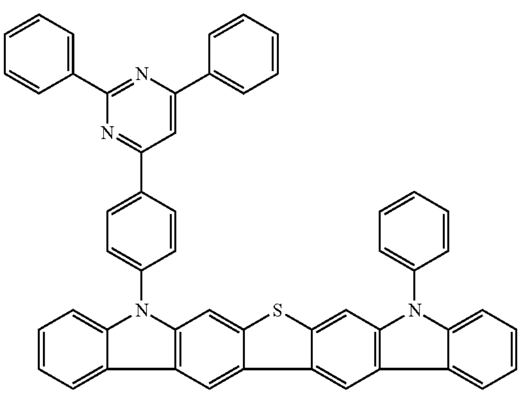
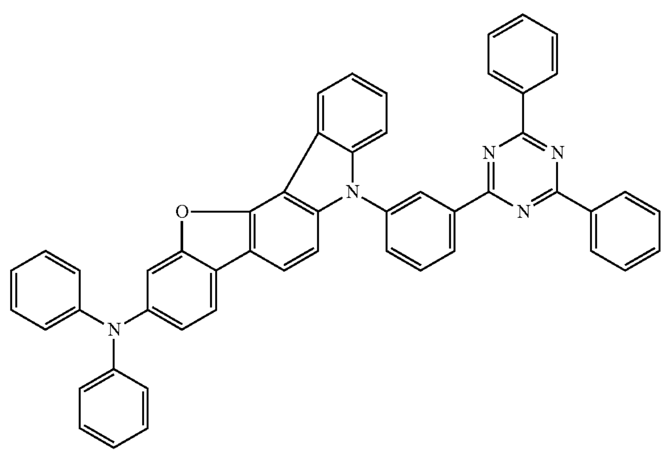

-continued
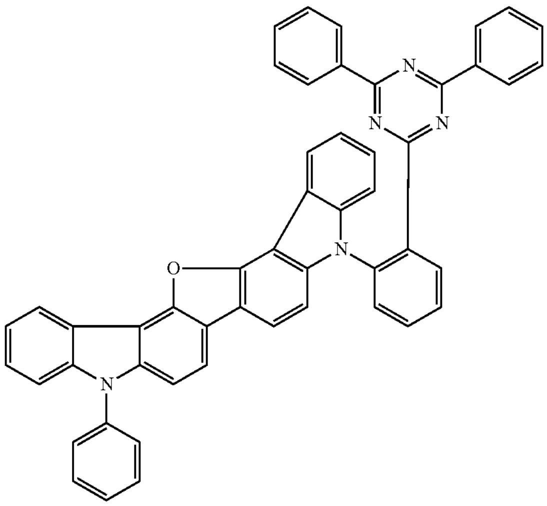
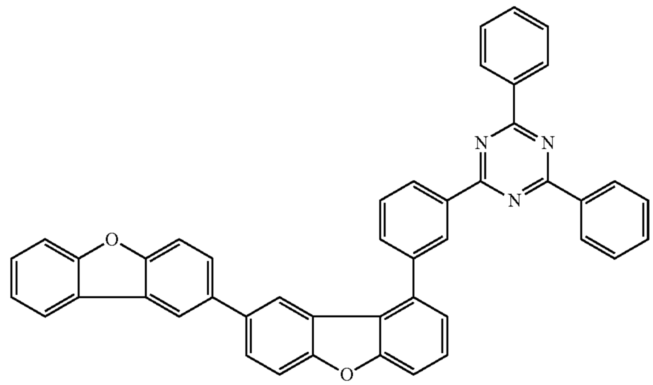
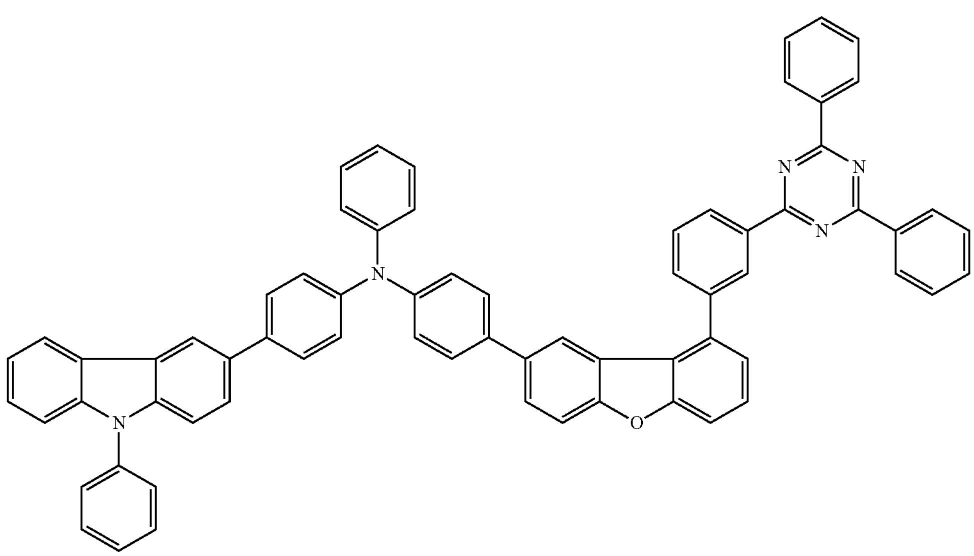
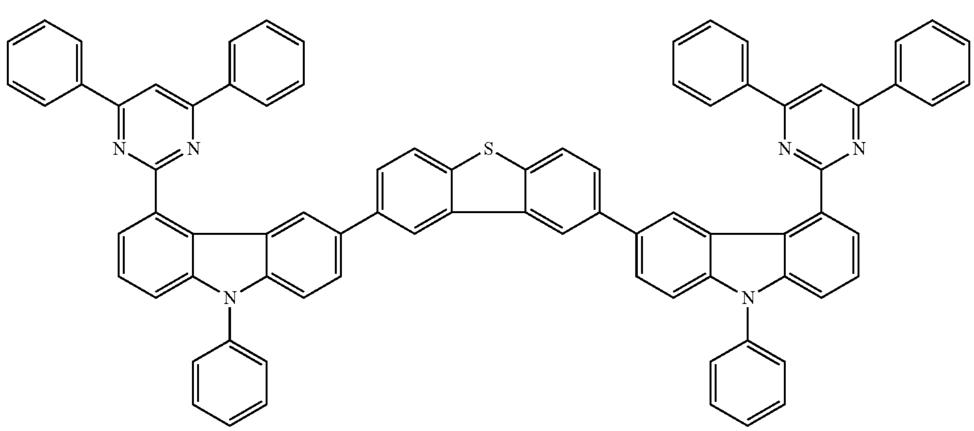

-continued
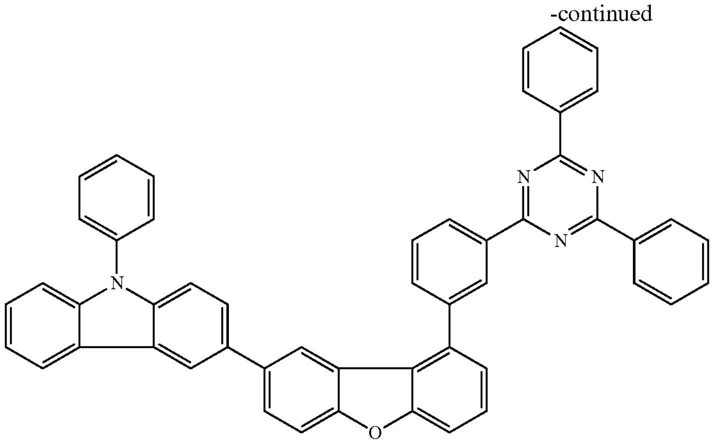
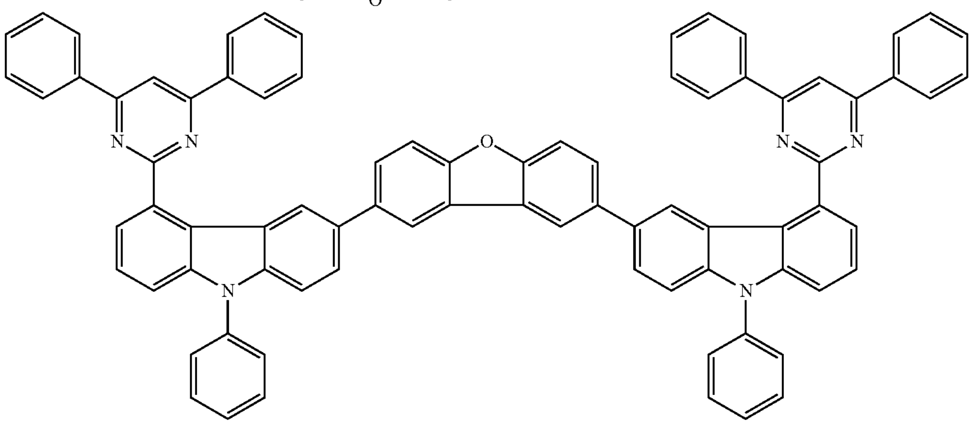
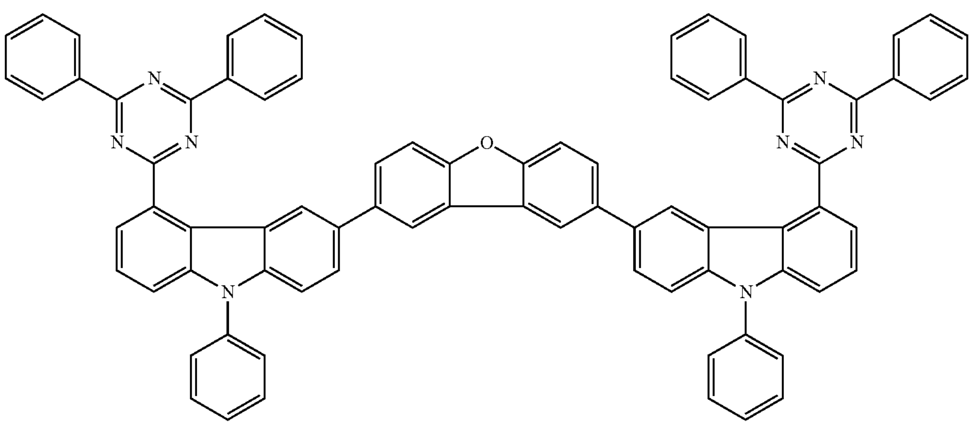
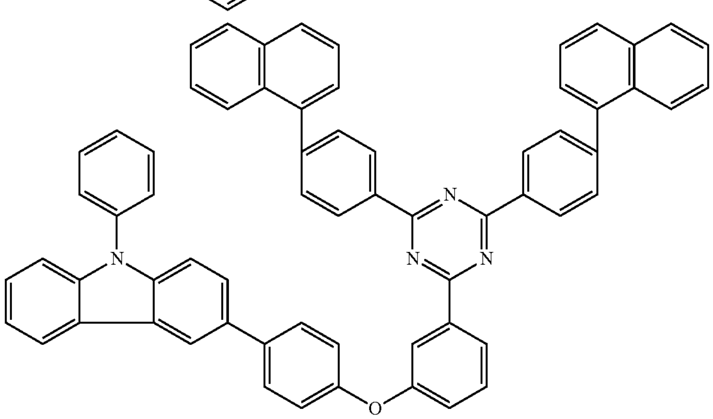

-continued
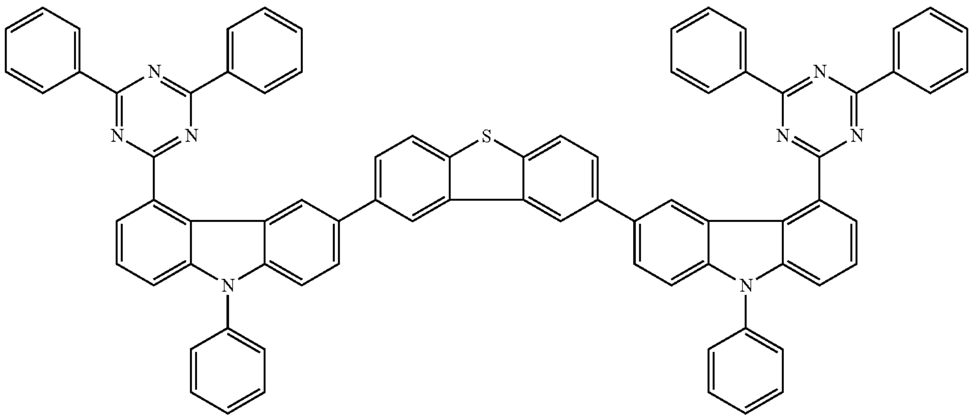
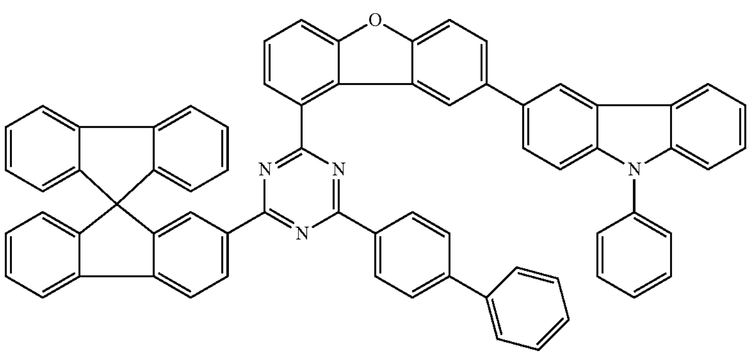
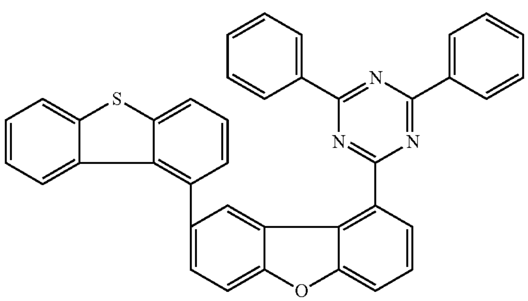
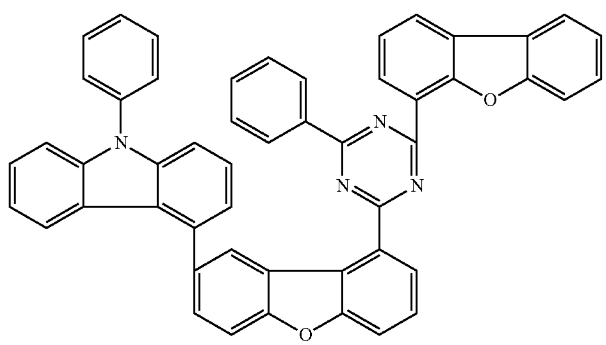
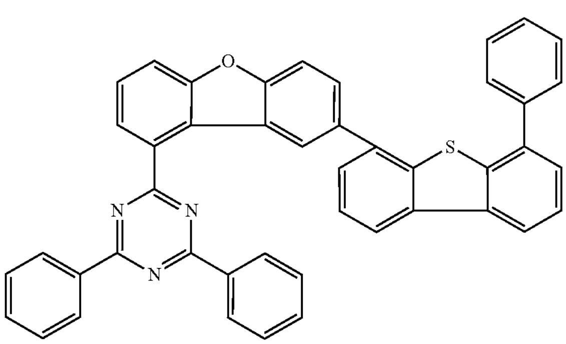

-continued
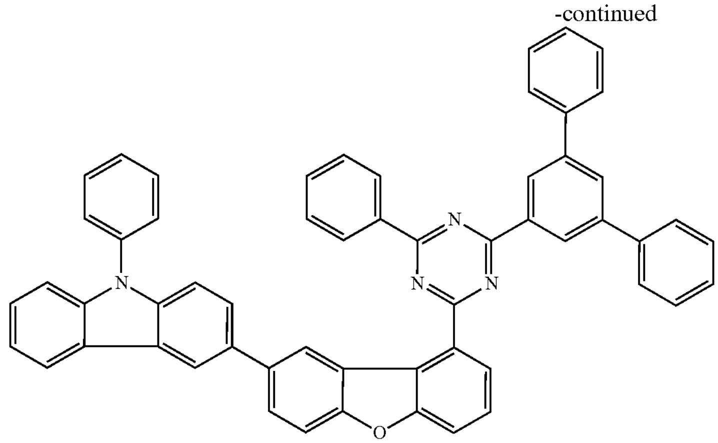
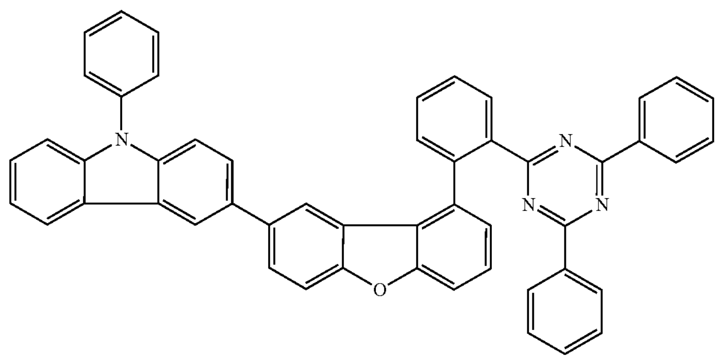
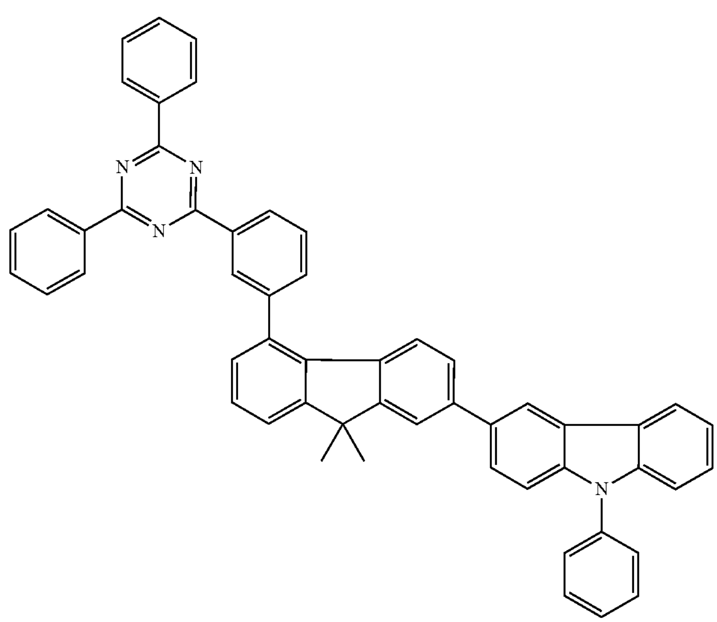

-continued
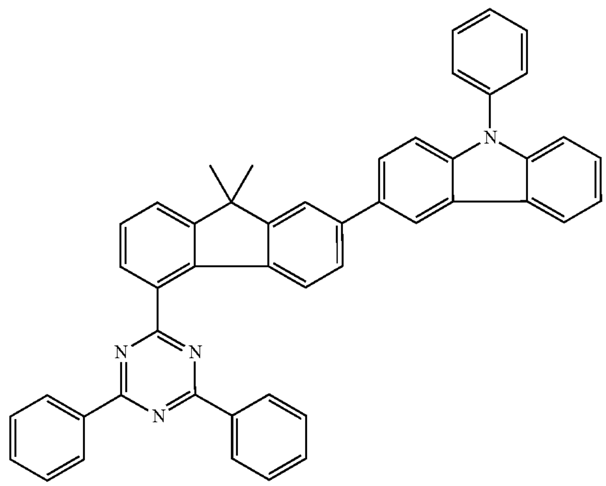
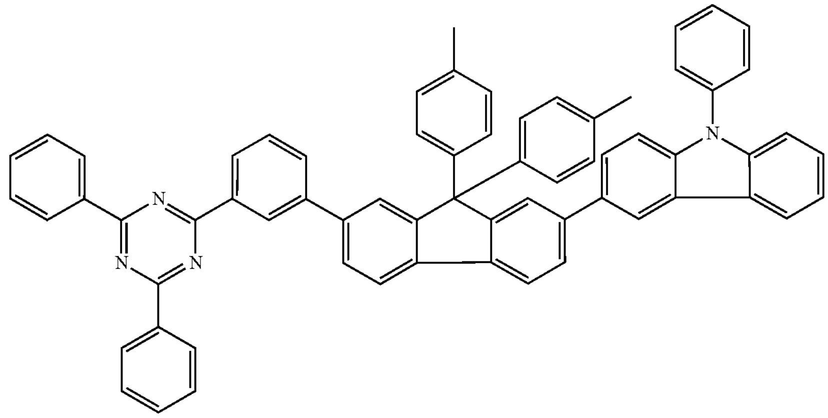
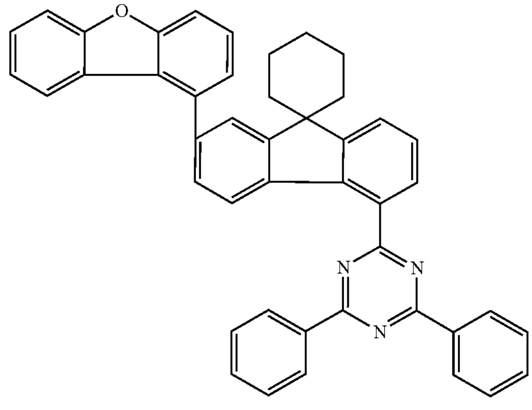
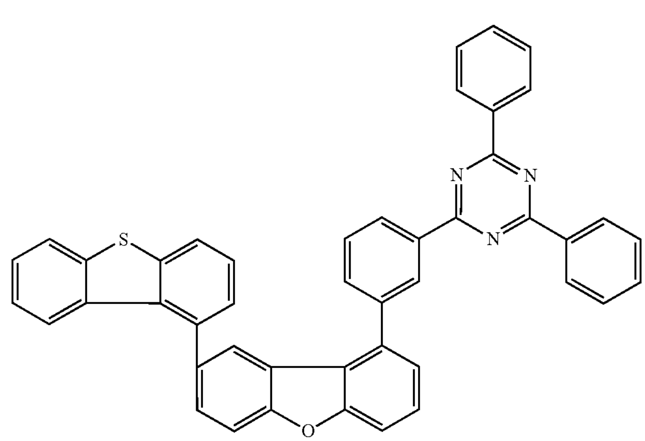

-continued
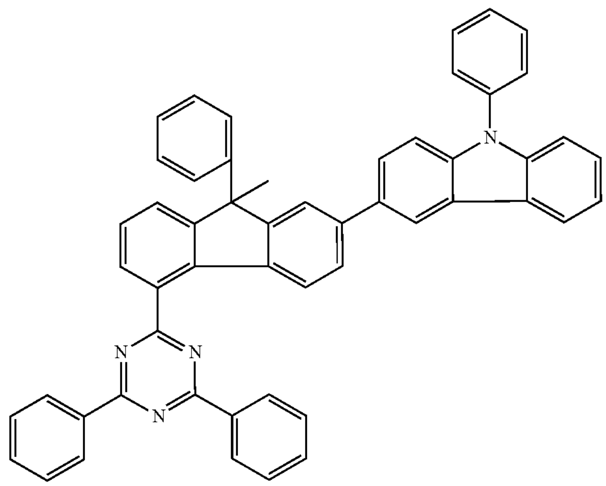
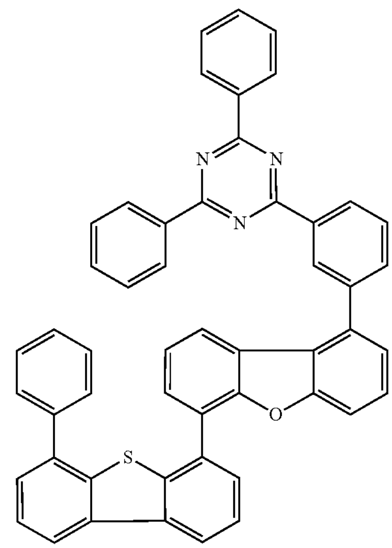
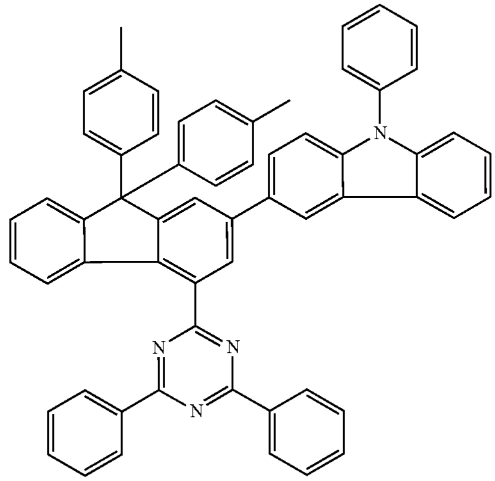
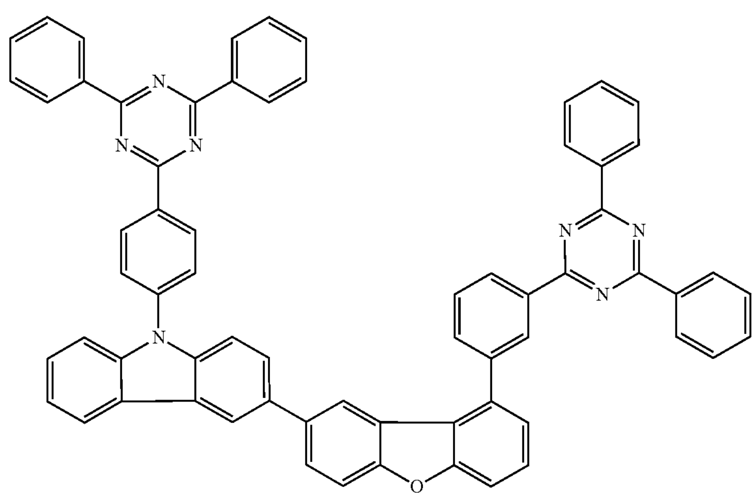

-continued
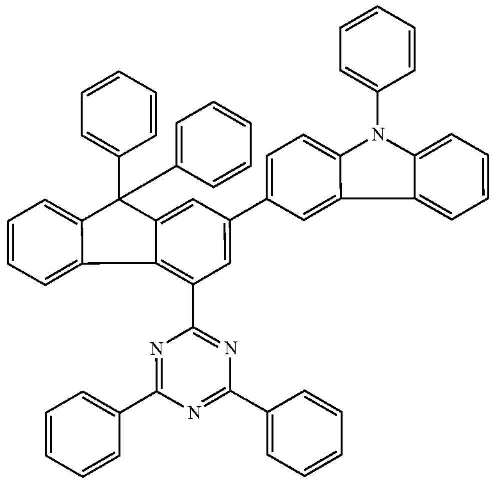
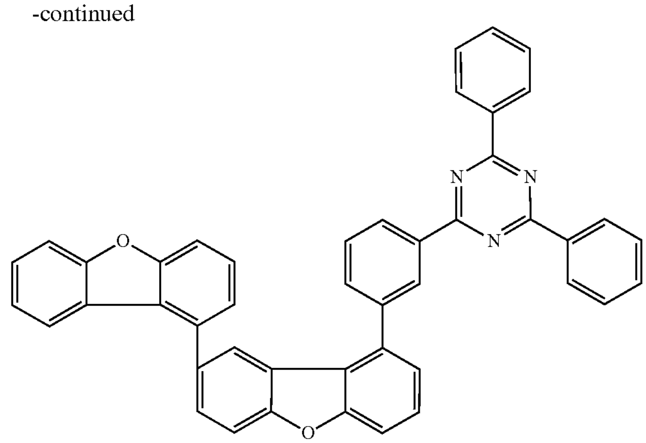
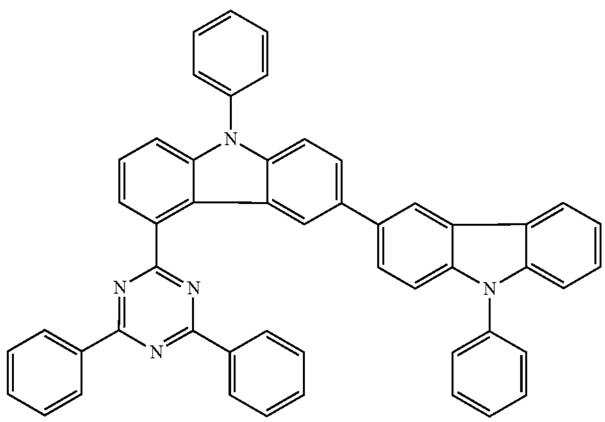
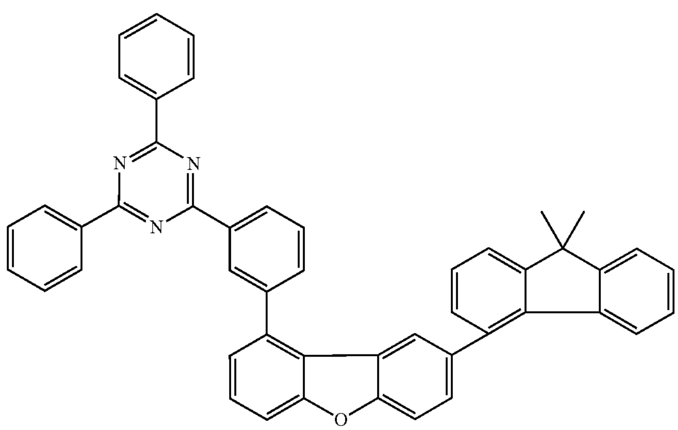
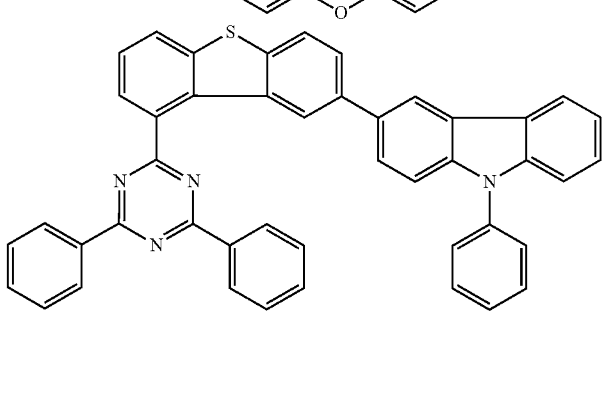

-continued
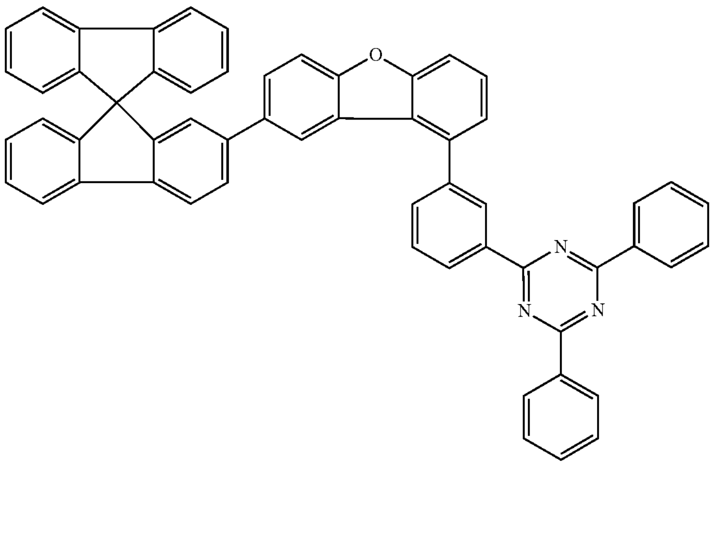
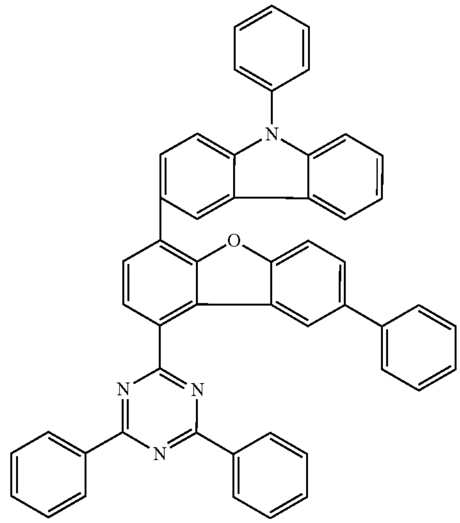
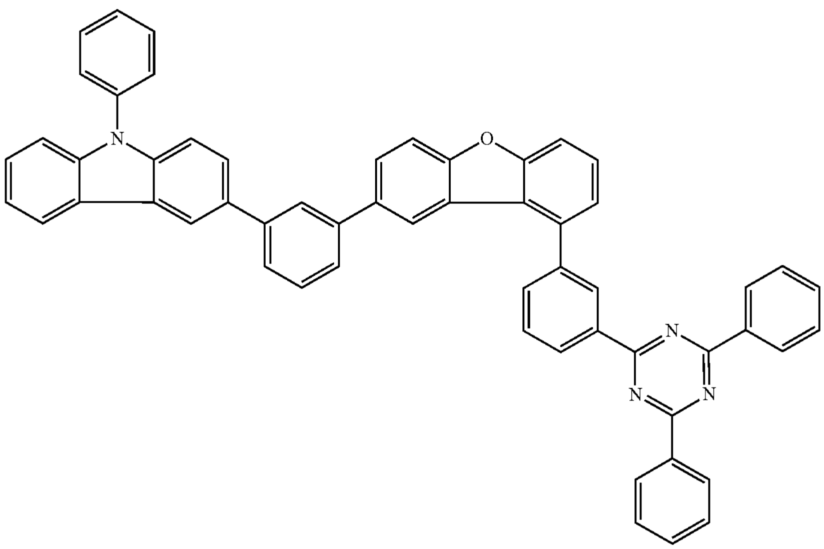
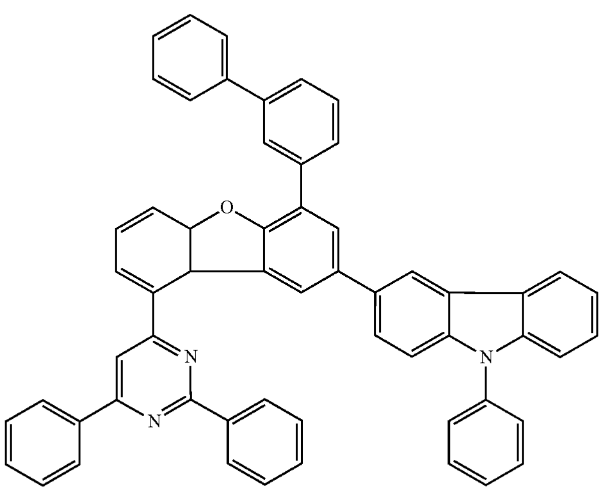

-continued
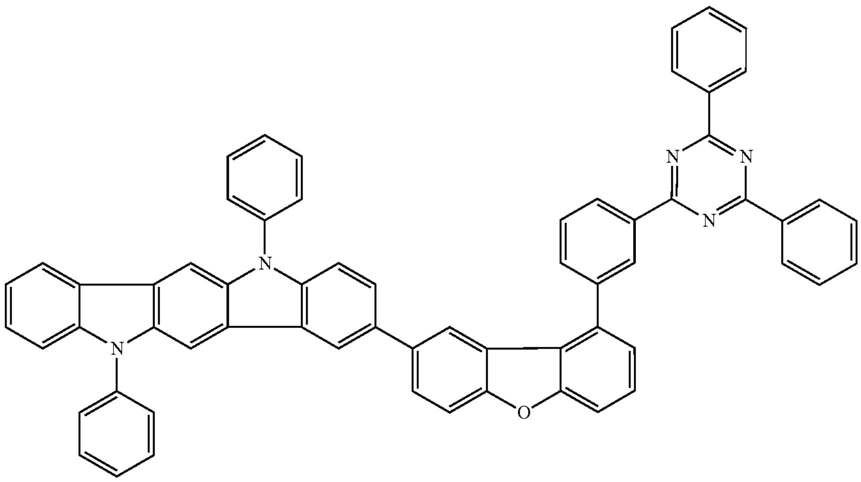
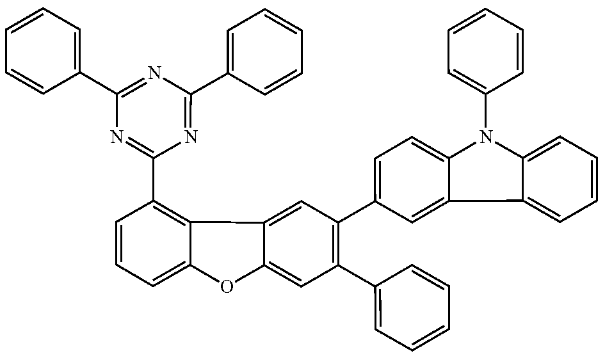
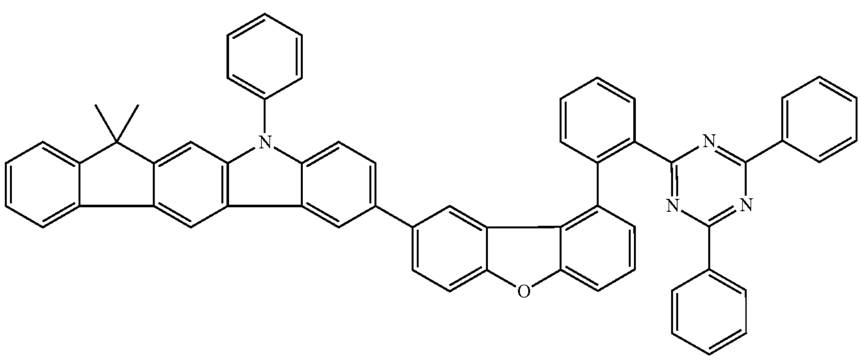
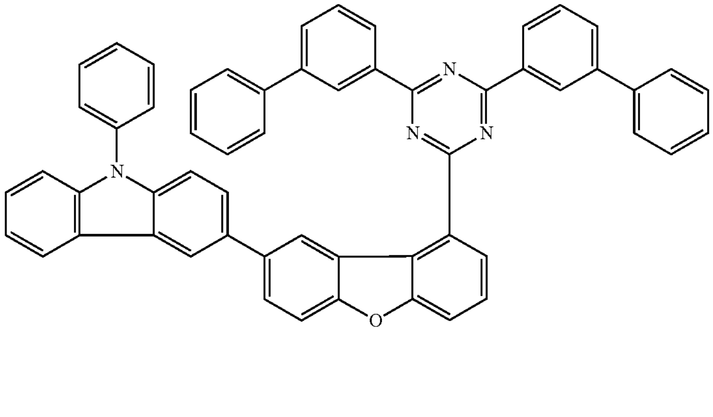
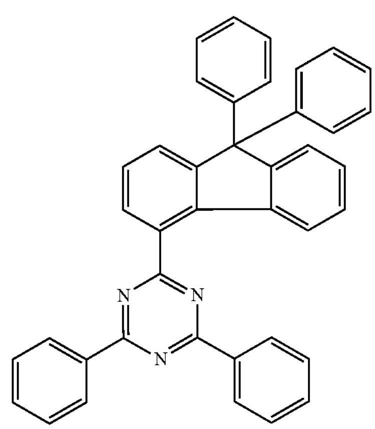

-continued
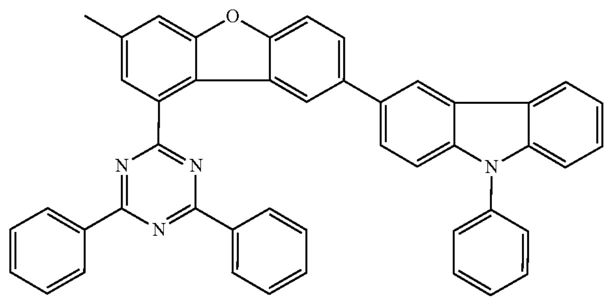
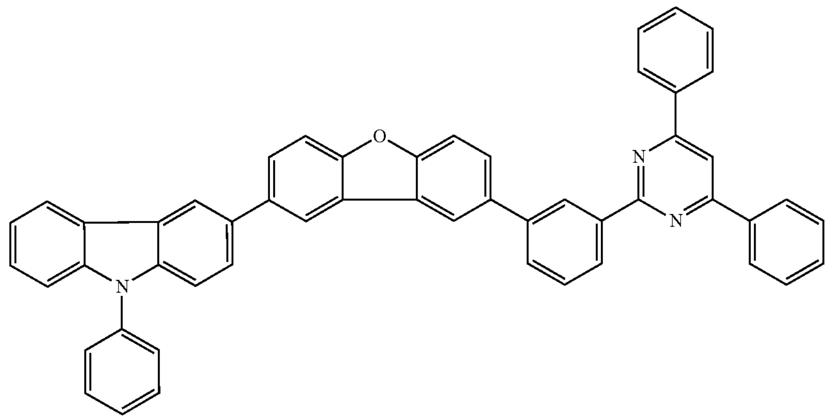
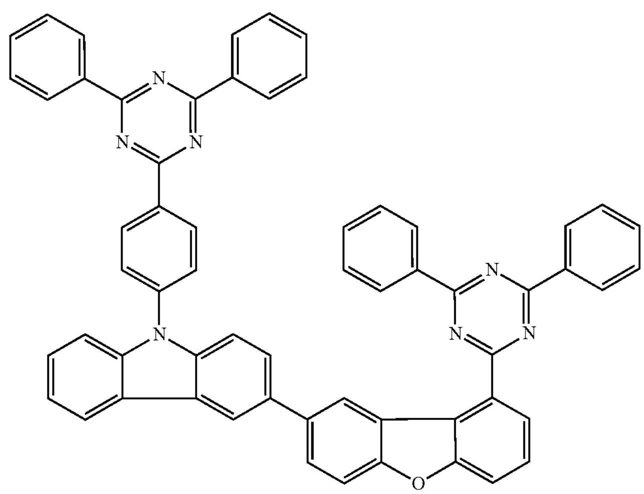
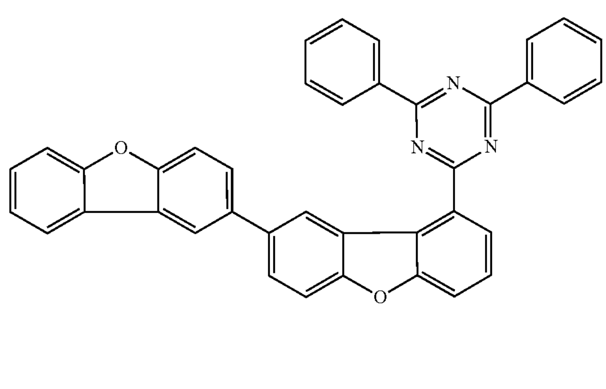
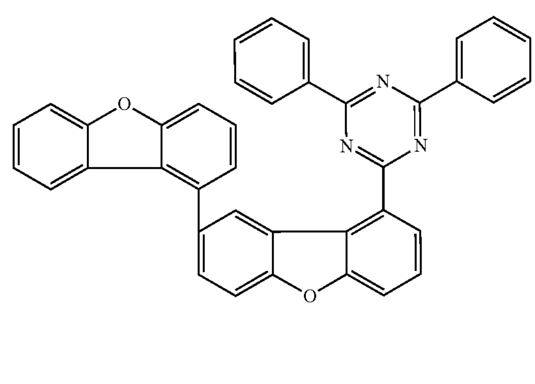

-continued
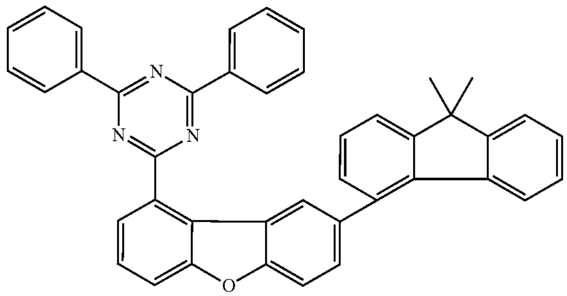
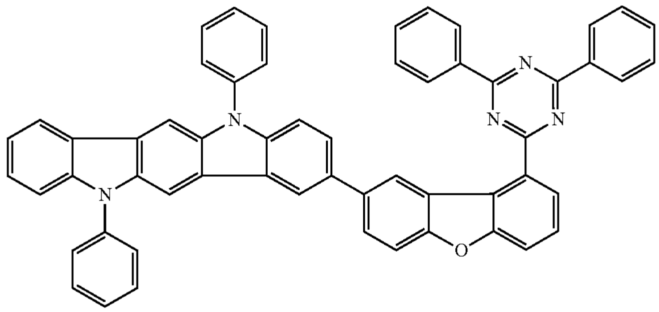
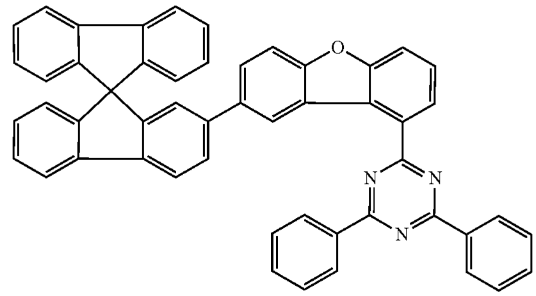
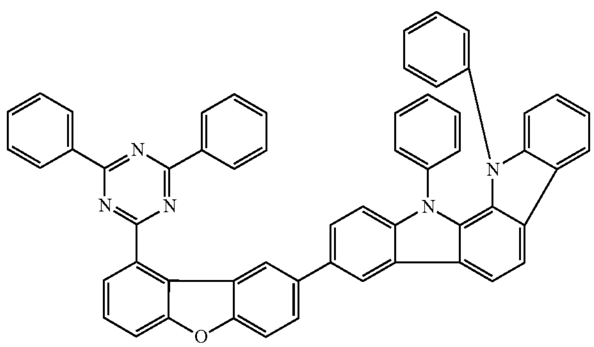
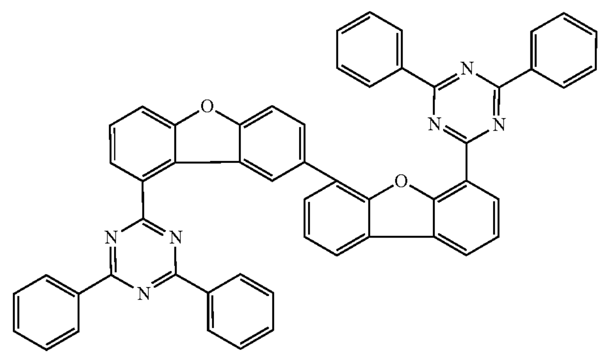
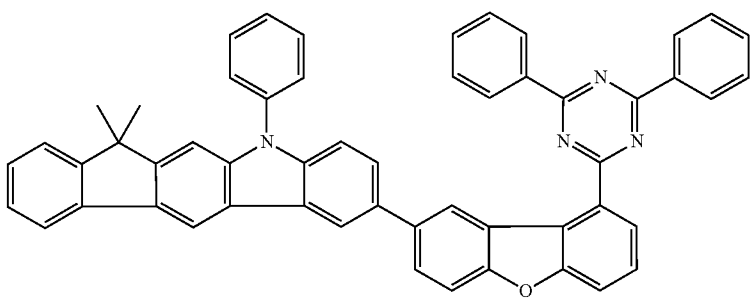
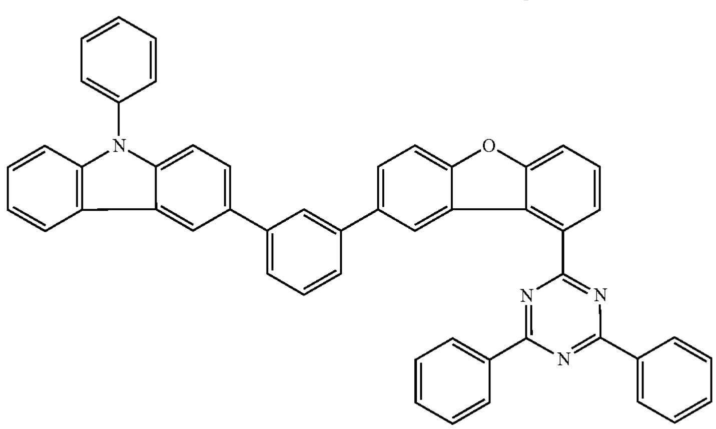

-continued
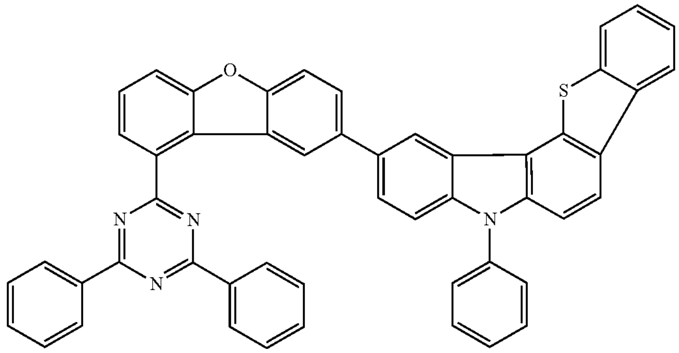
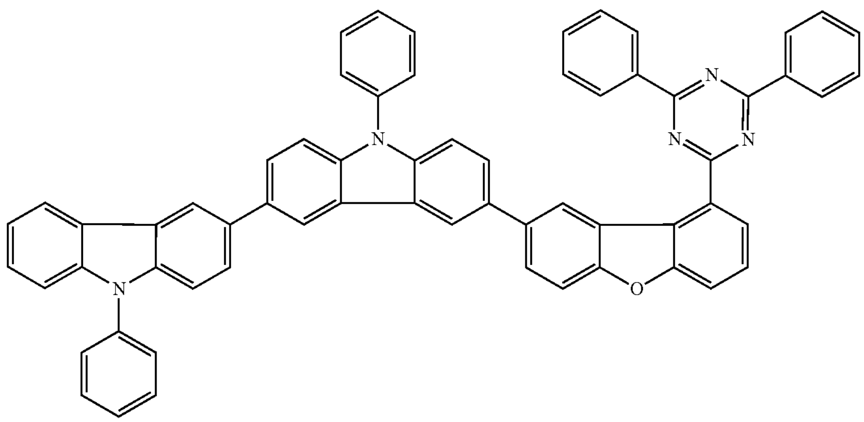
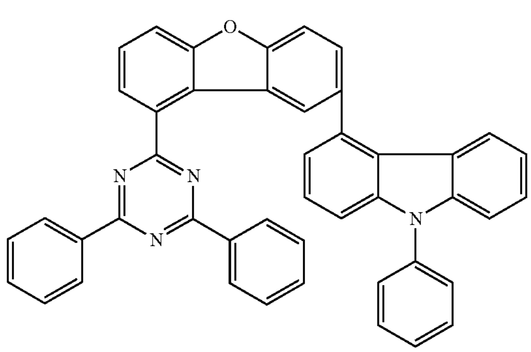
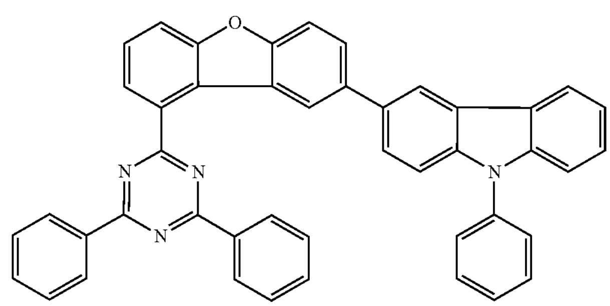
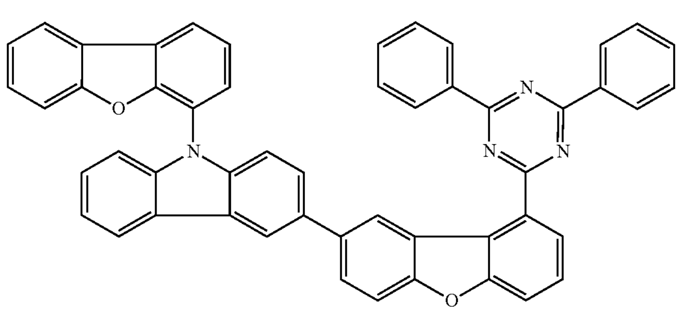
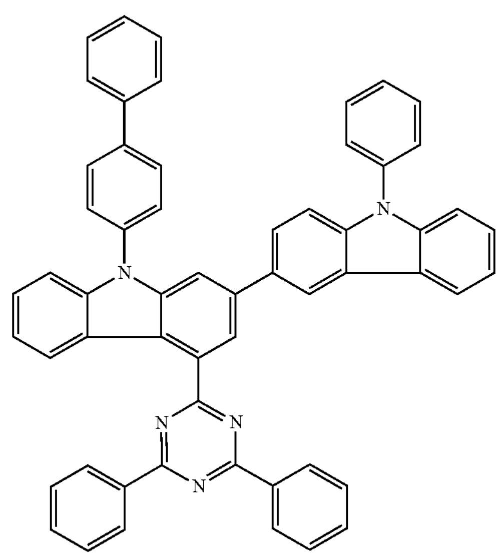

-continued
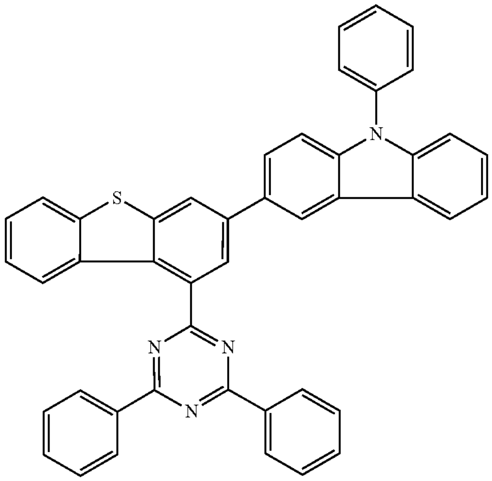
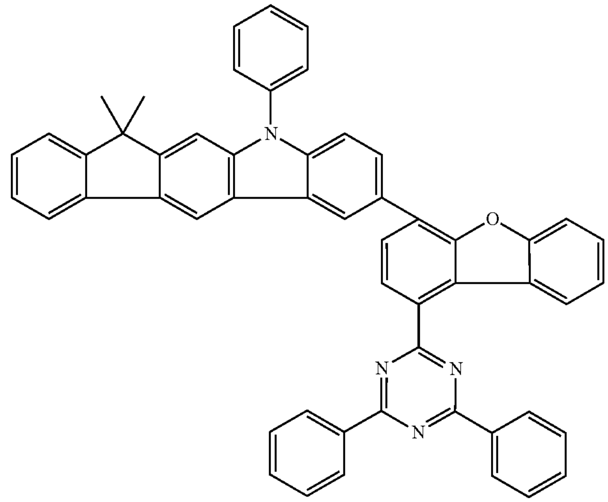
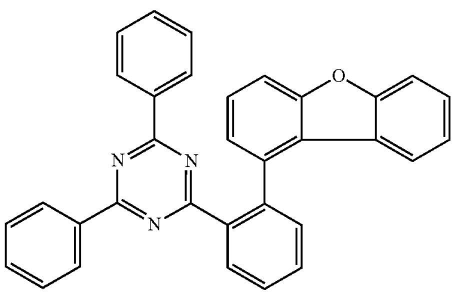
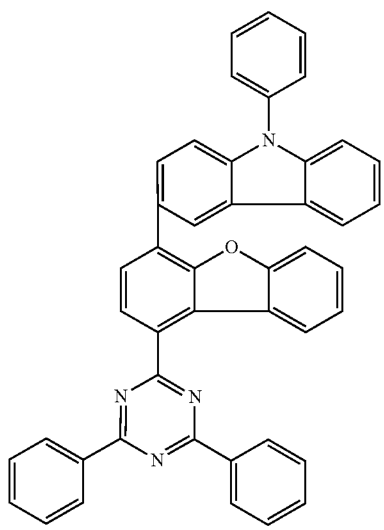
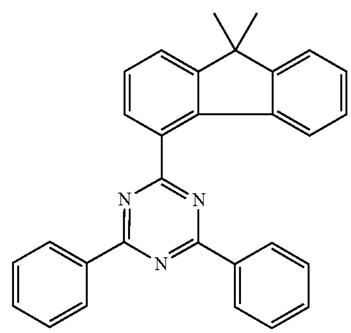
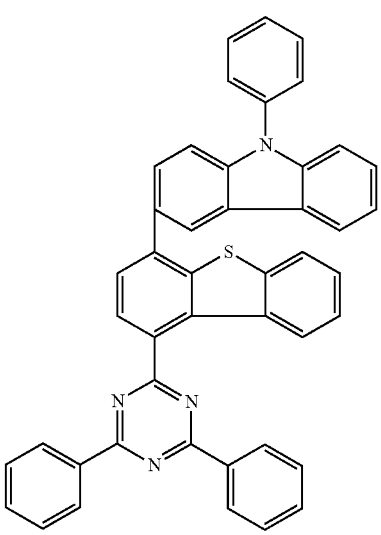
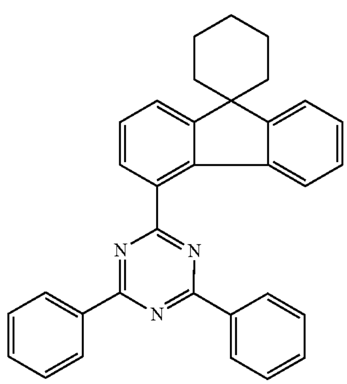
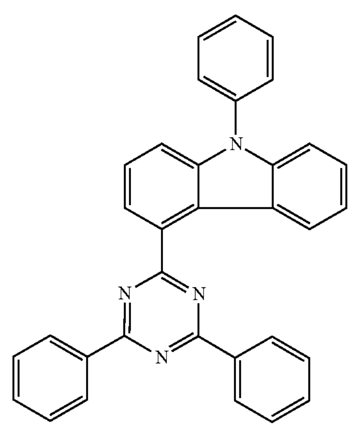

-continued
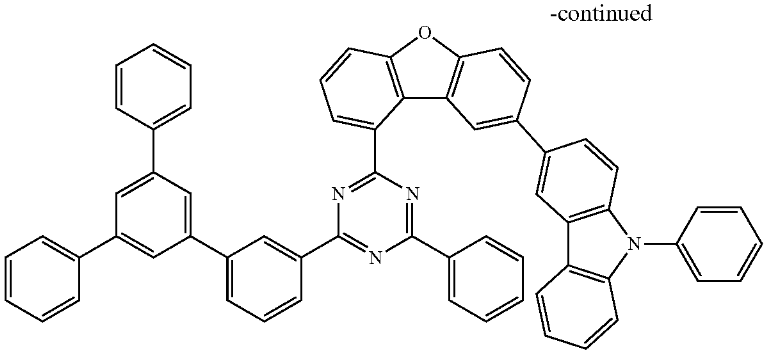
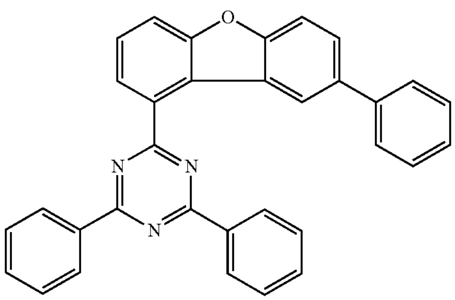
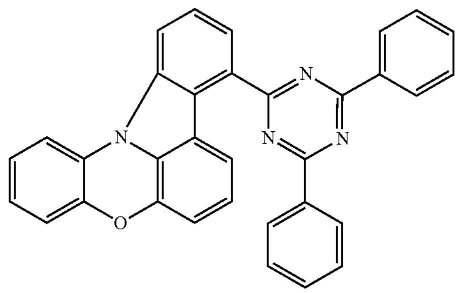
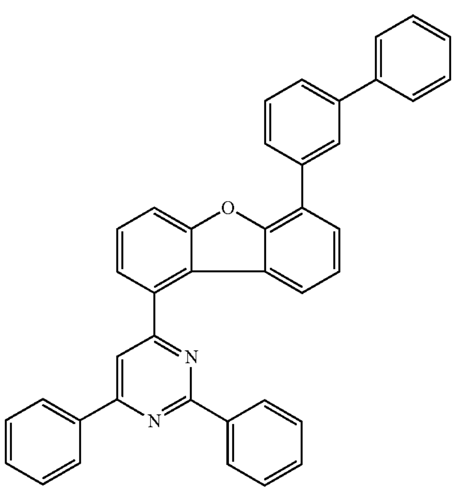
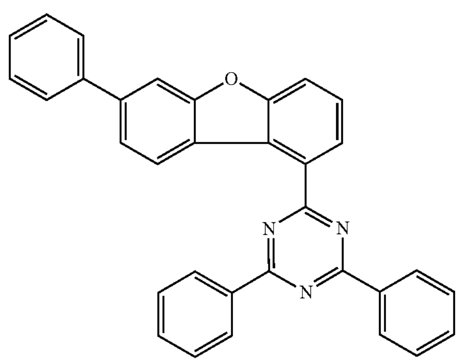
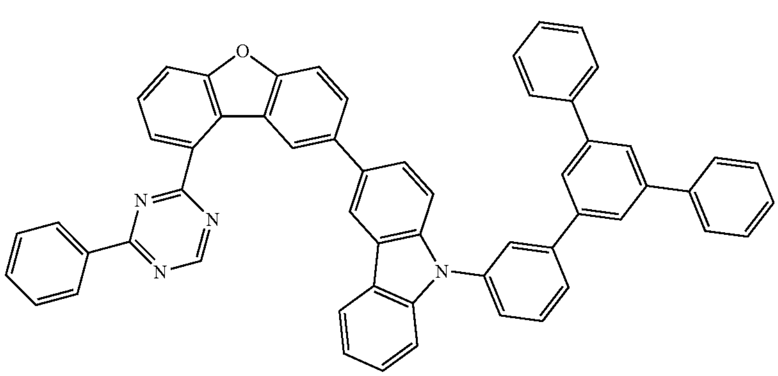

-continued
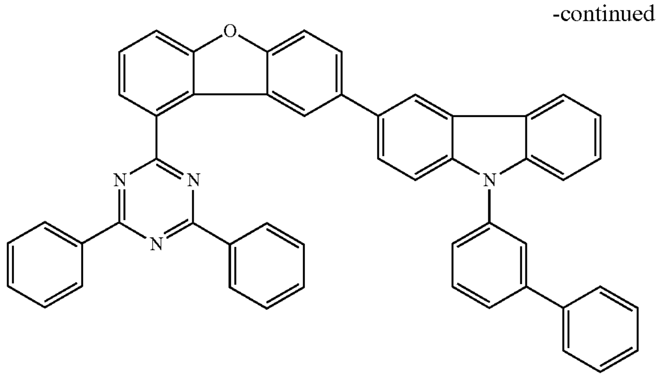
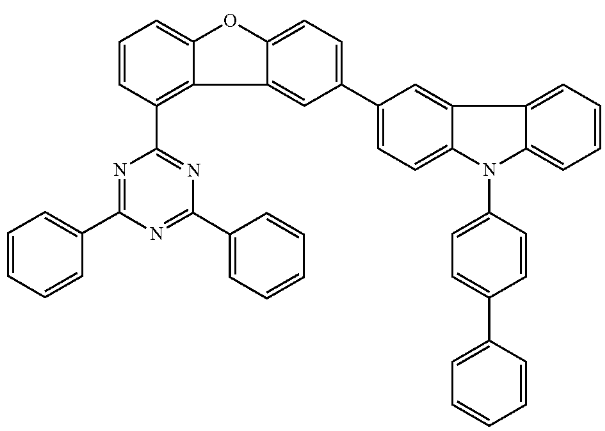
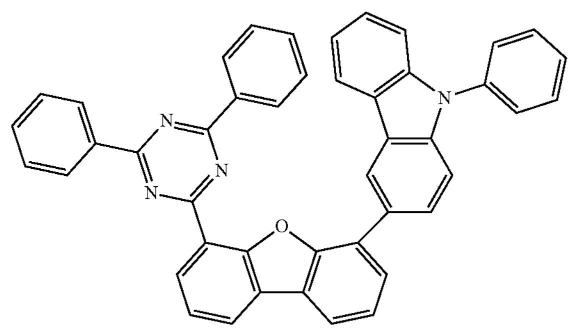
Examples of lactams which can be used as electron-transporting matrix materials are the following compounds:
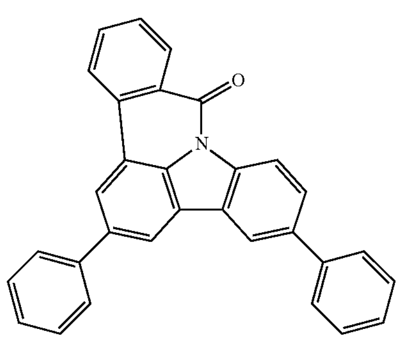
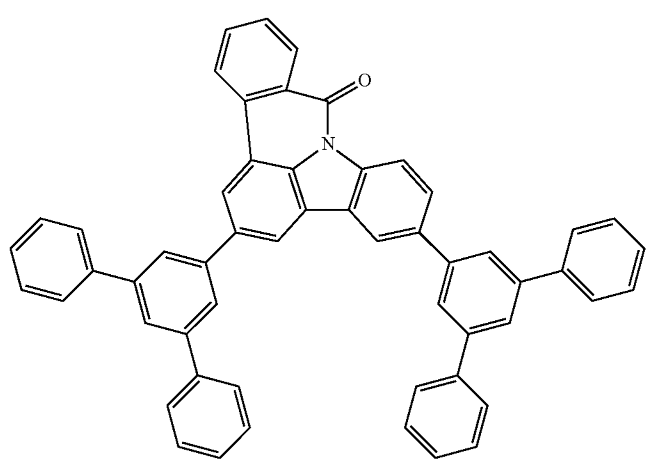

-continued
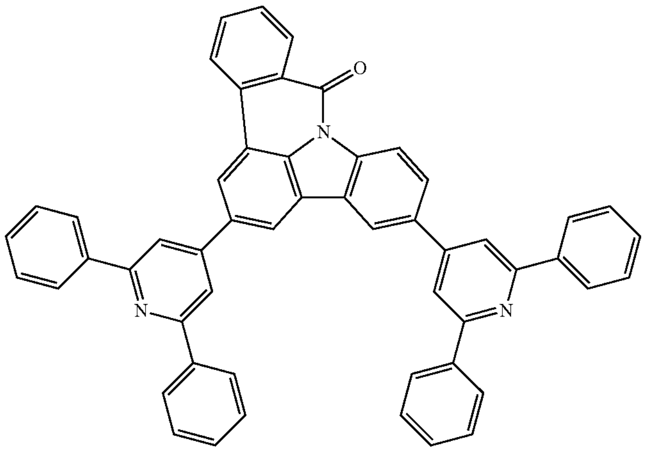
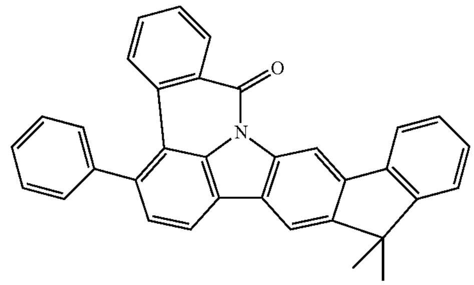
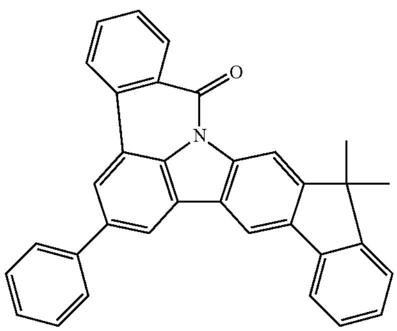
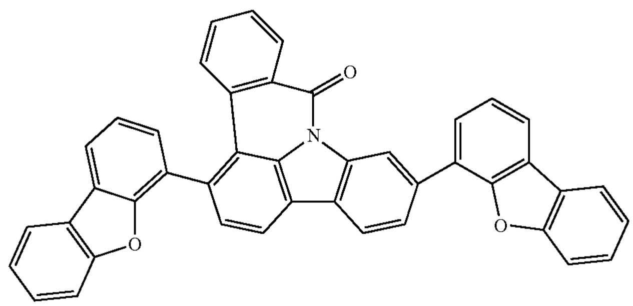
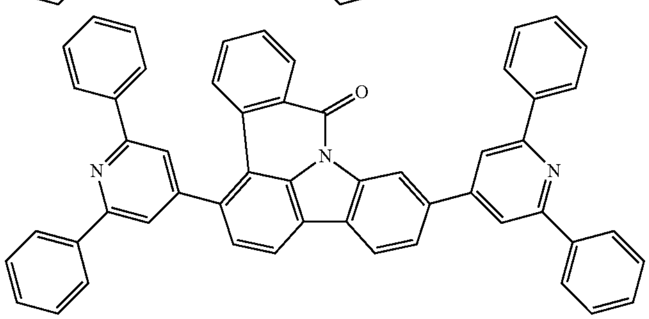
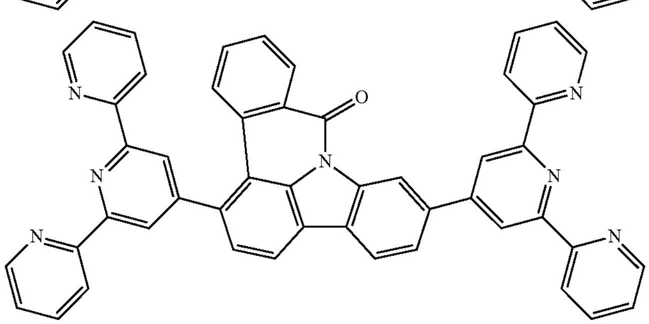
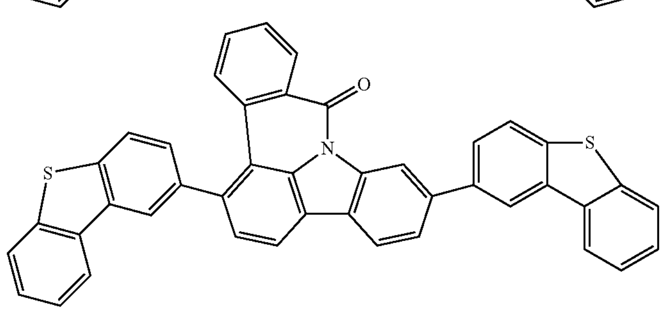
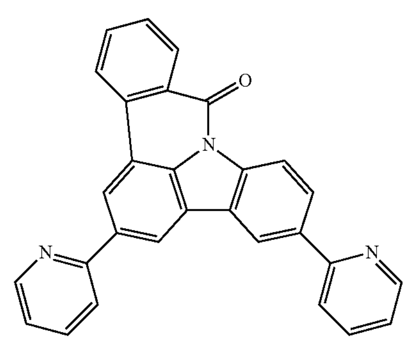

-continued
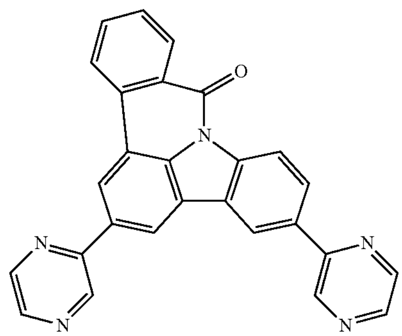
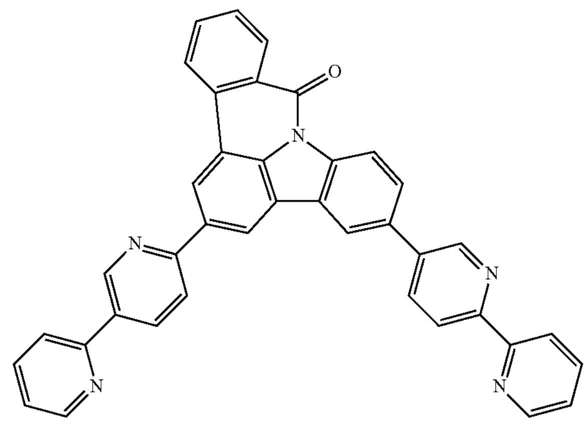
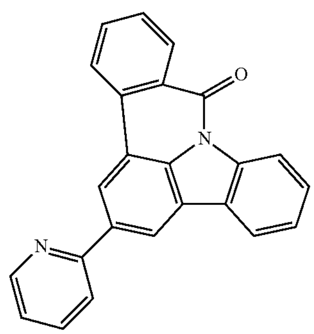
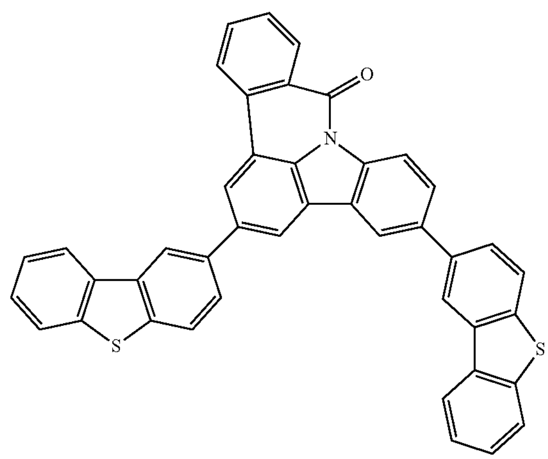
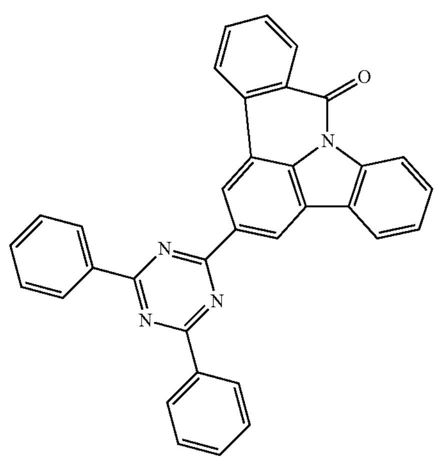
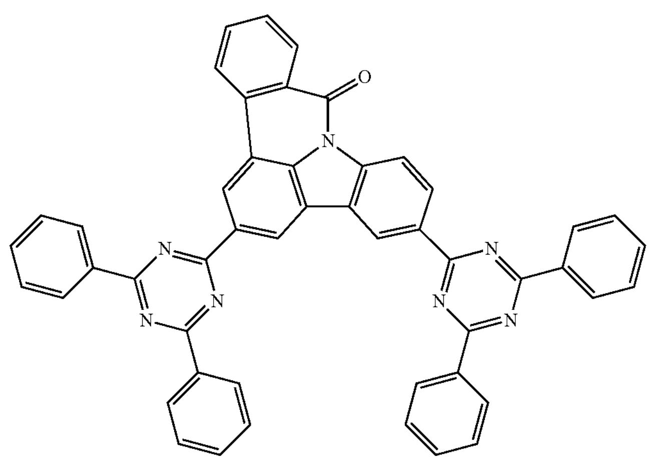

-continued
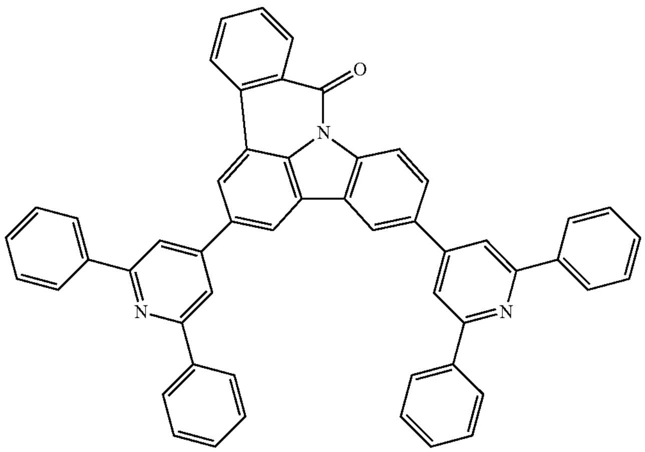
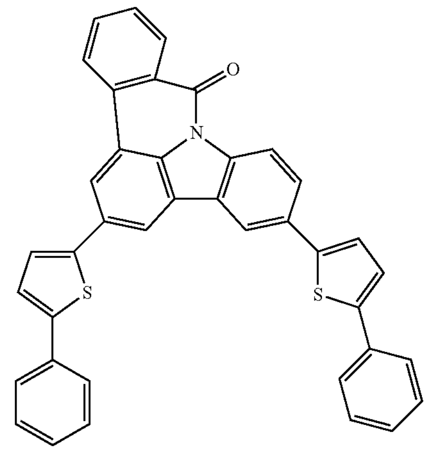
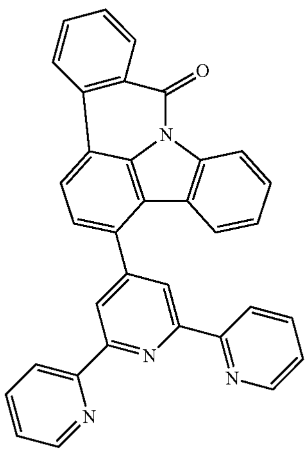
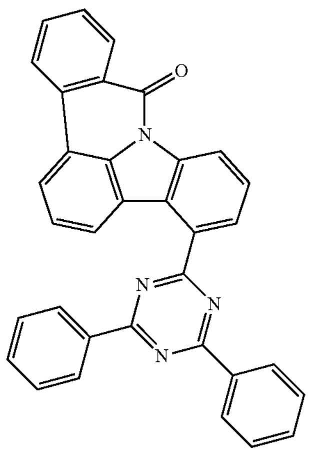
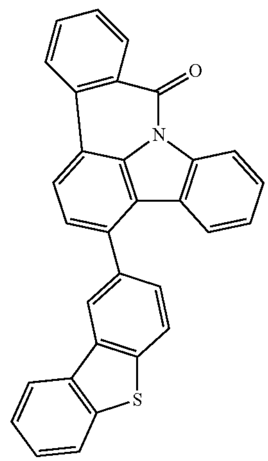
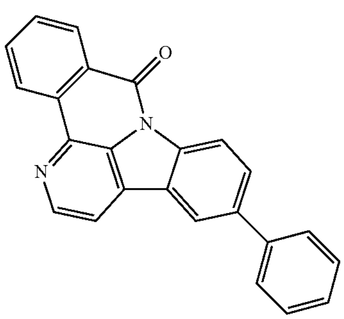
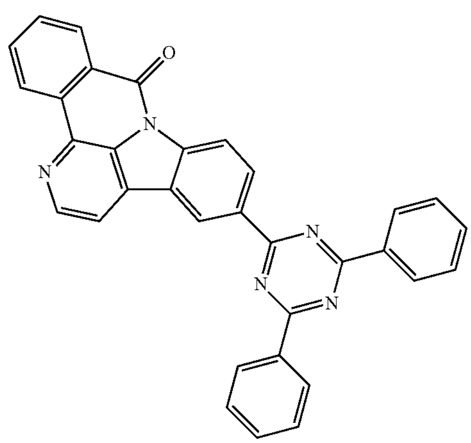
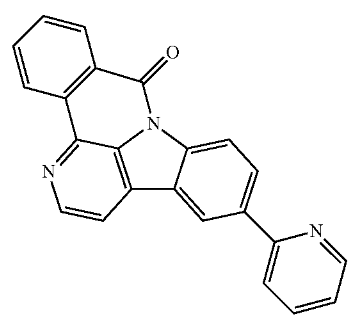

-continued
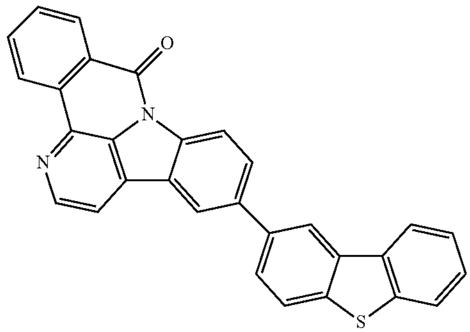
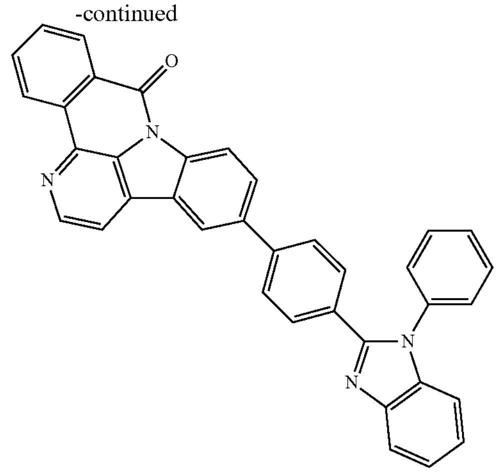
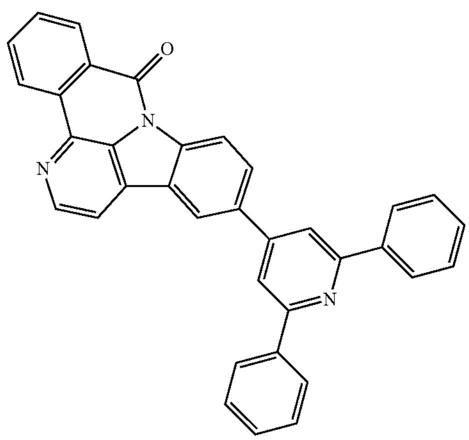
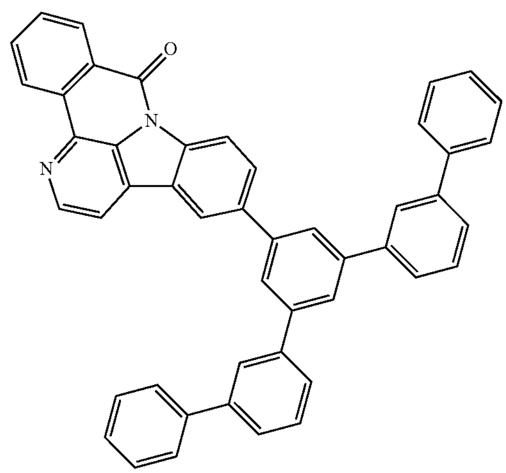
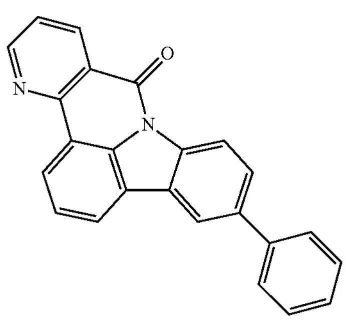
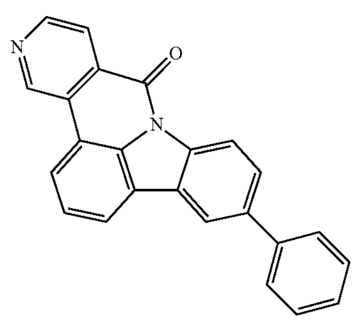
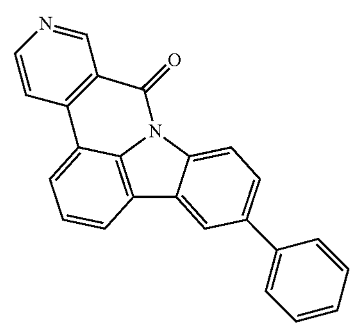
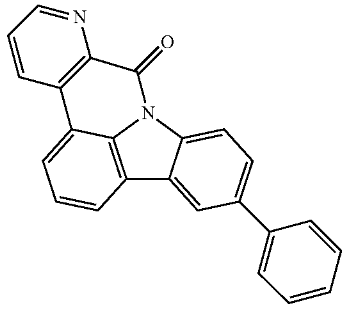
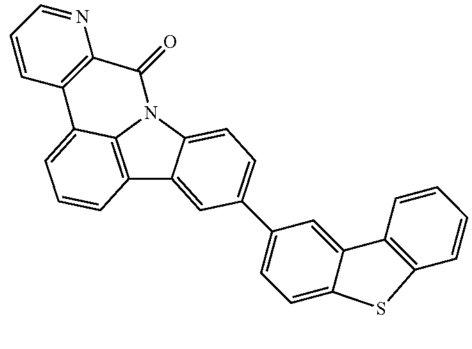
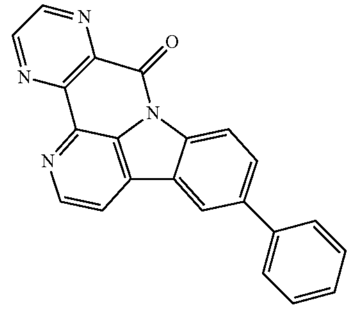

-continued
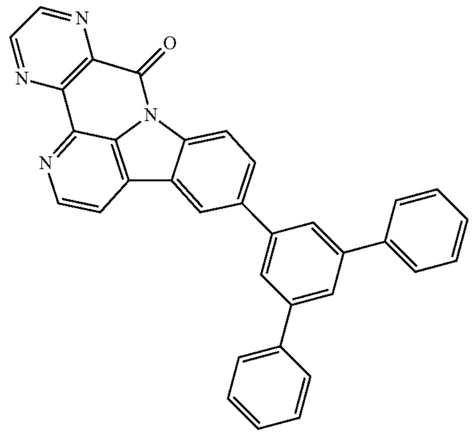
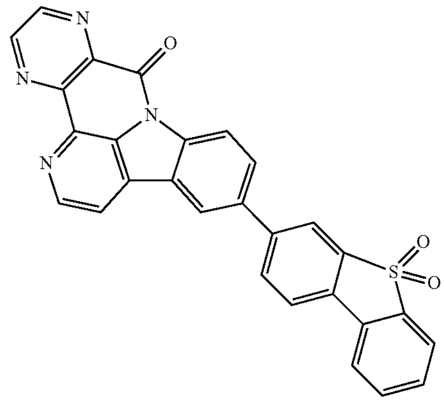
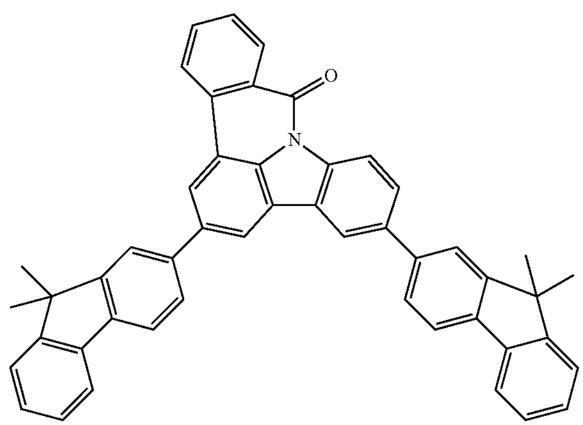
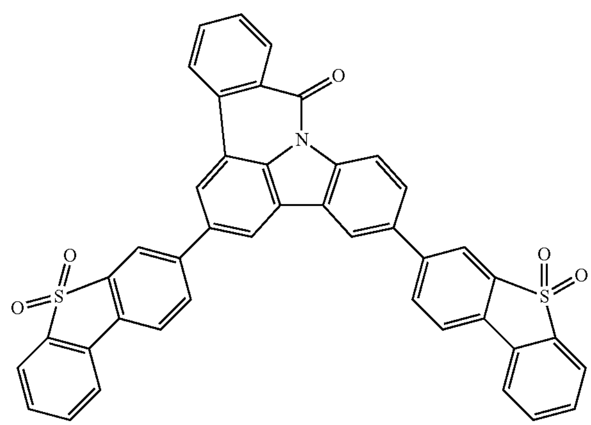
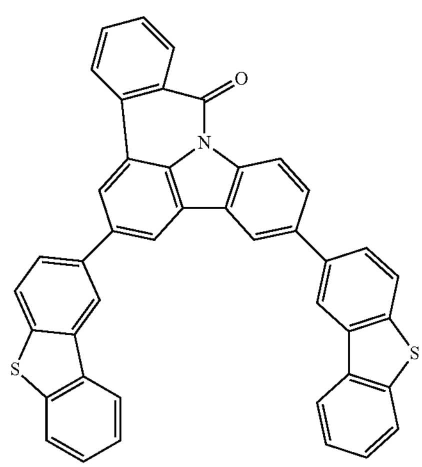
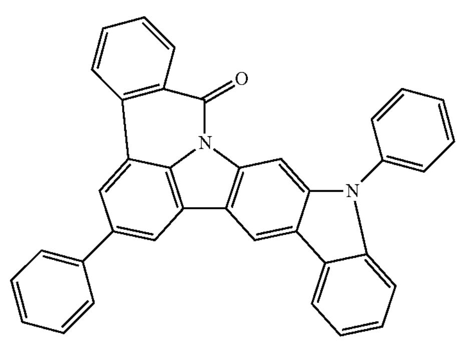

-continued
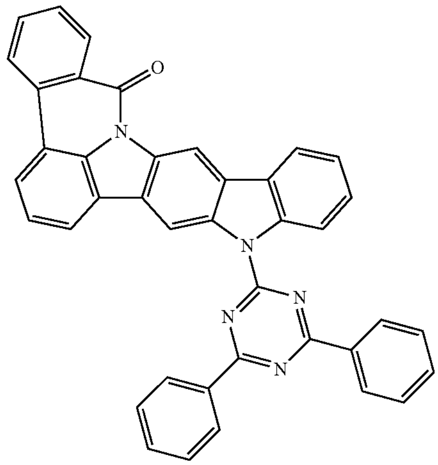
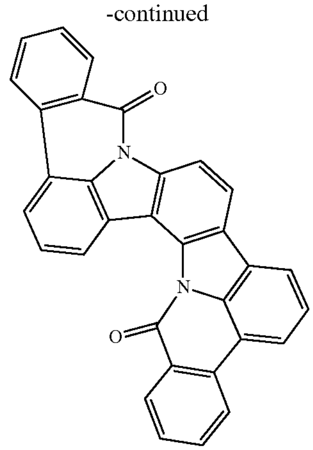
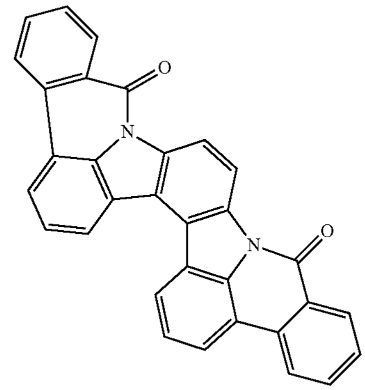
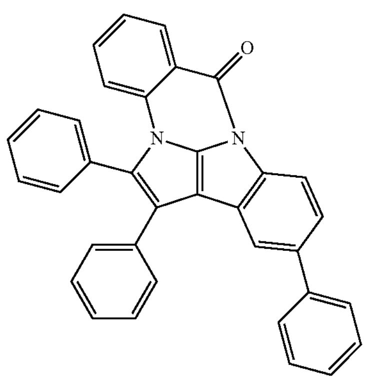
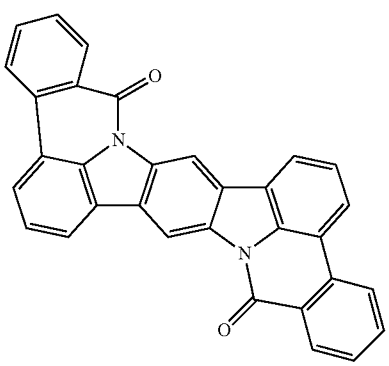
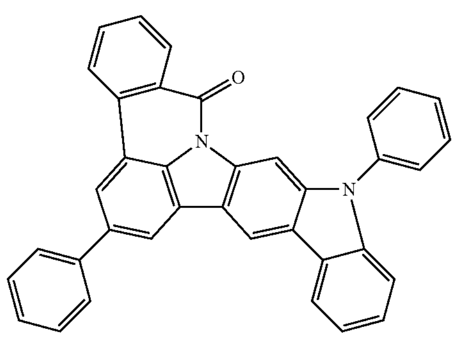
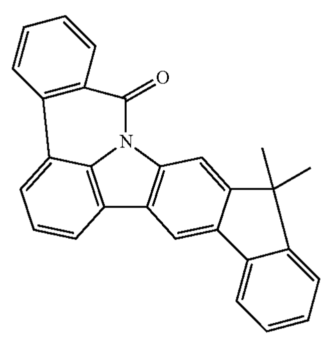
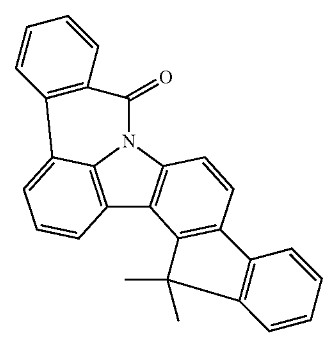
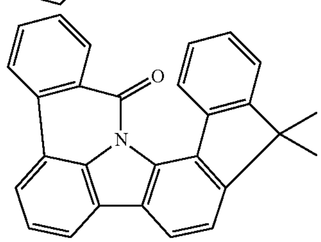
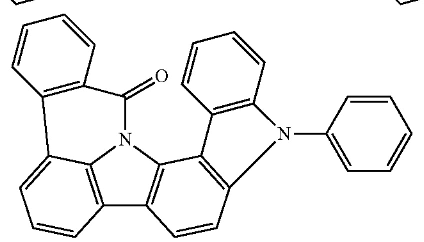
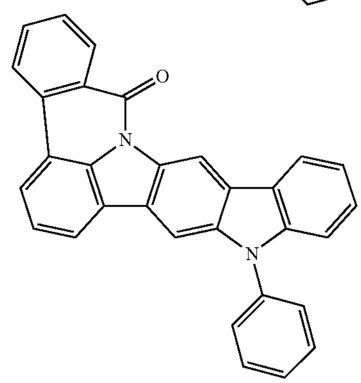

-continued
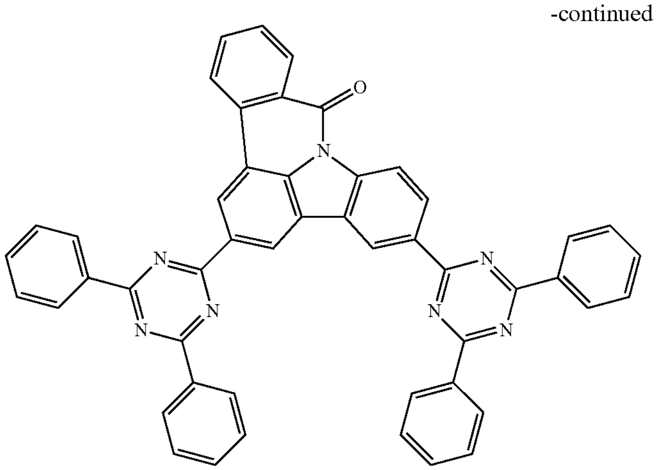
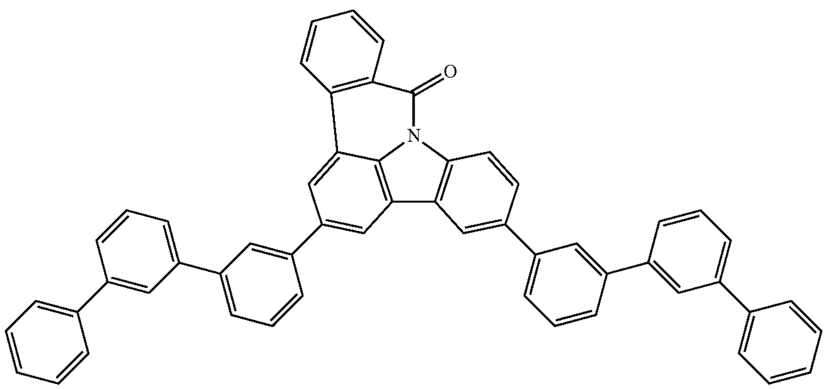
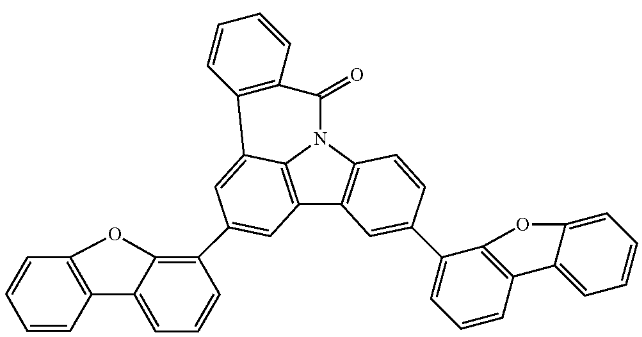
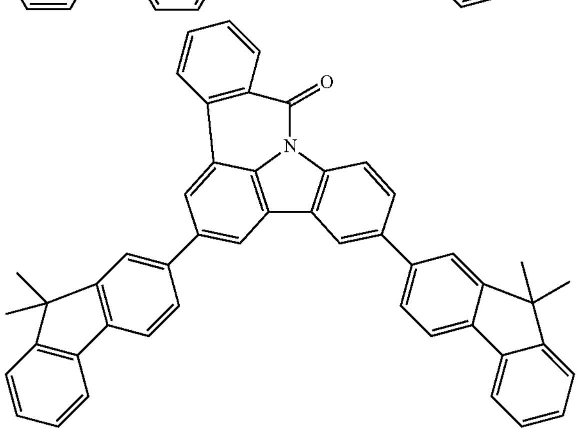
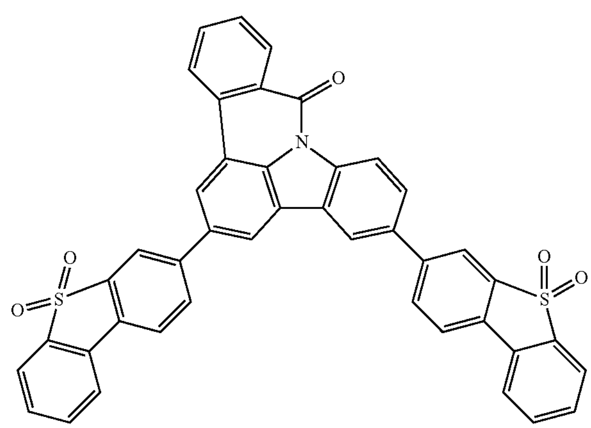

-continued
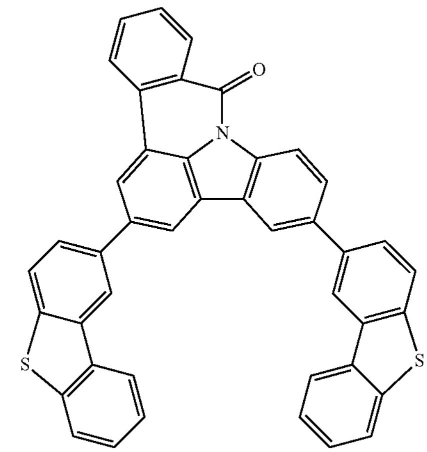
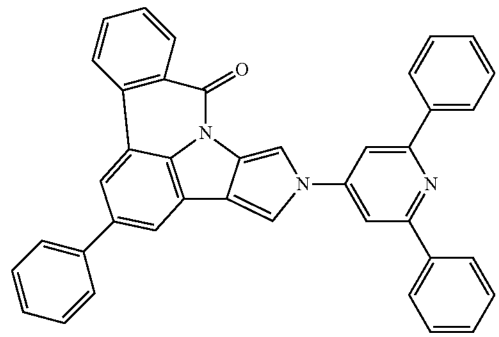
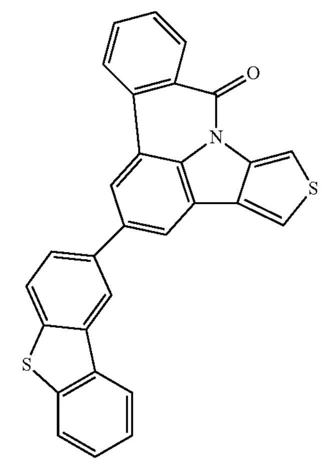
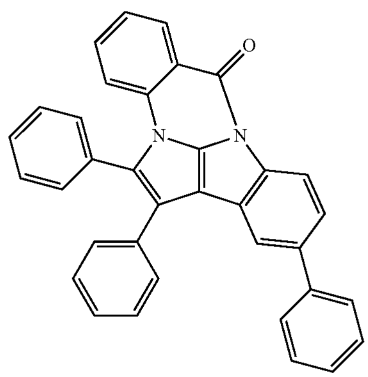
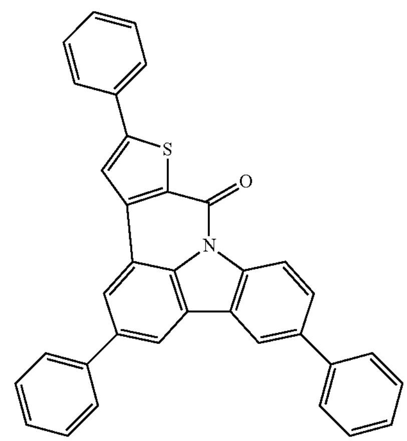
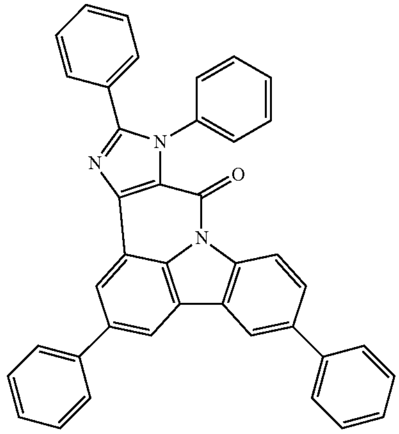
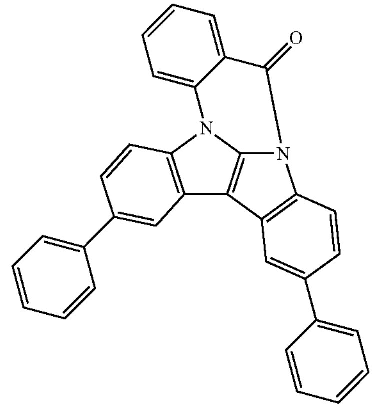

-continued
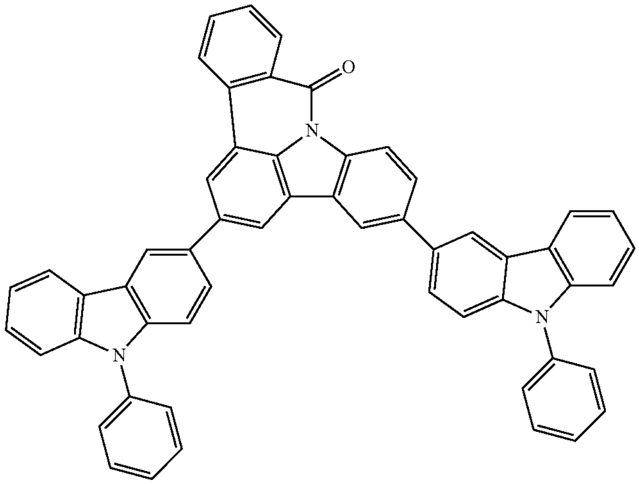
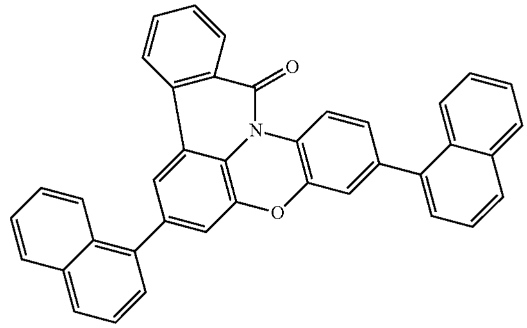
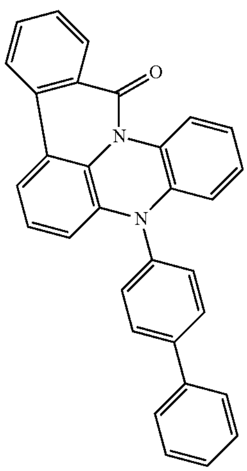
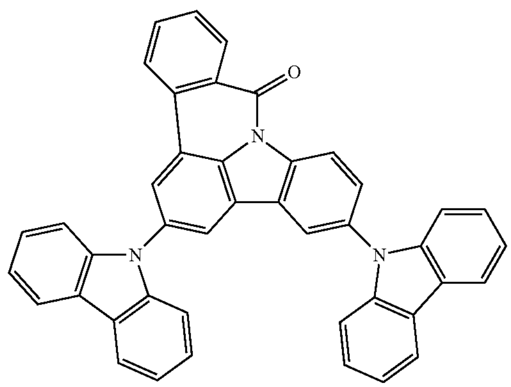
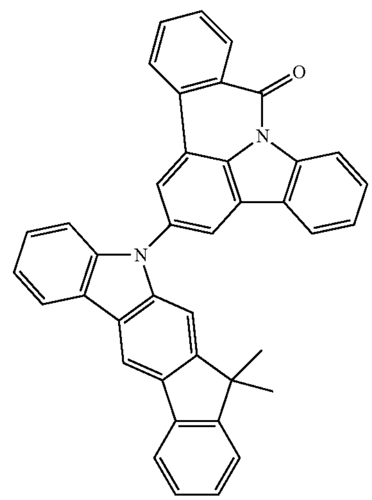
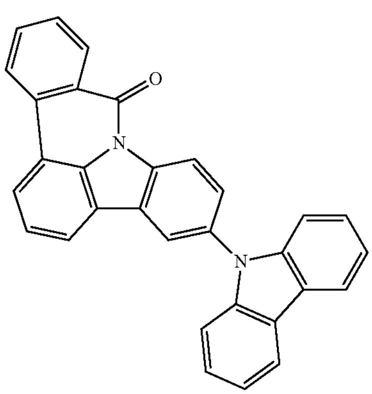
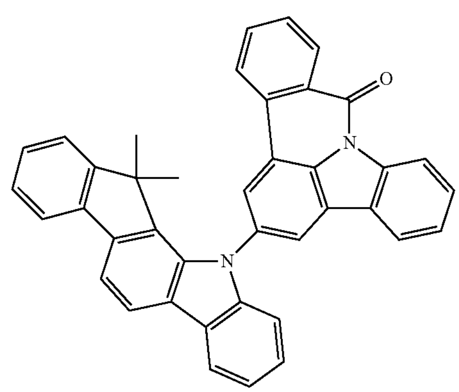
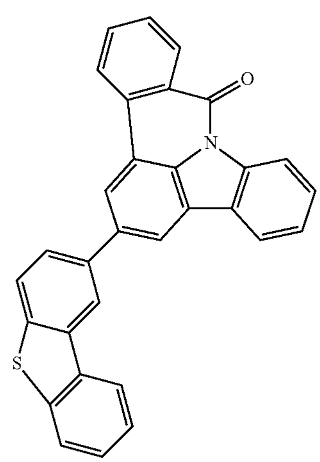

-continued
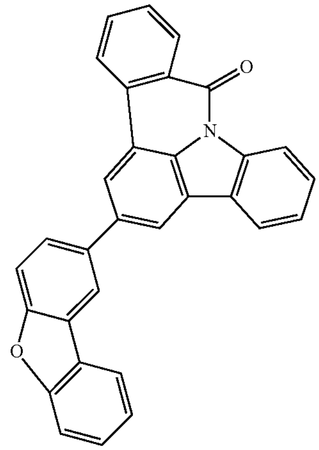
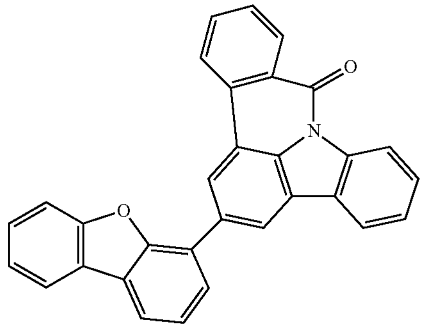
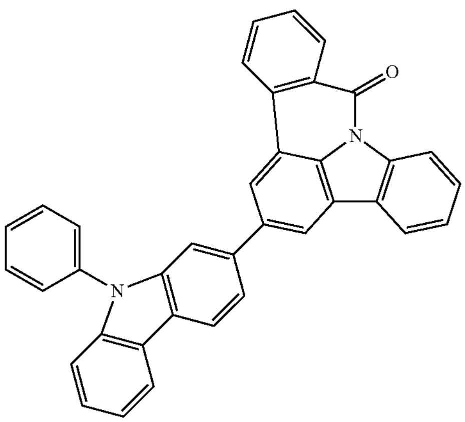
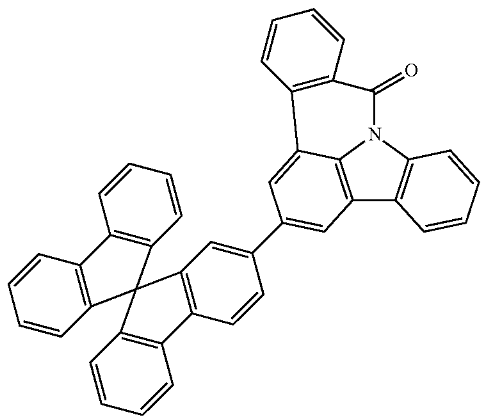
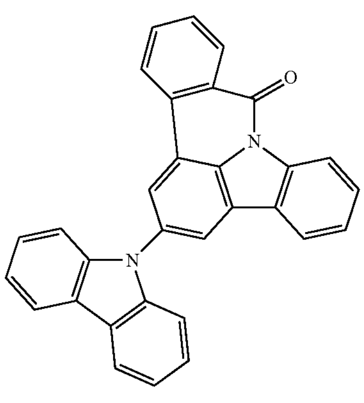
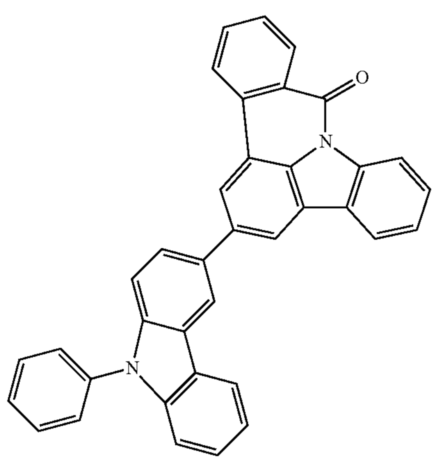

-continued
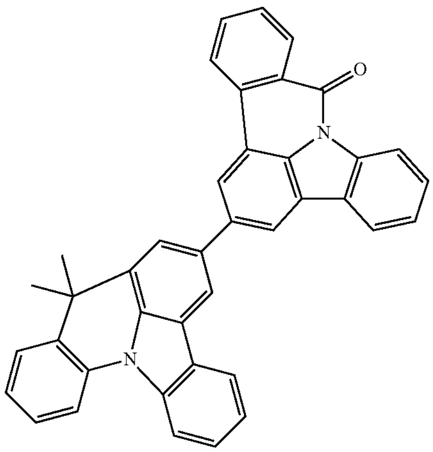
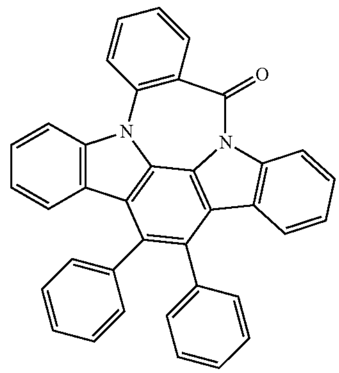
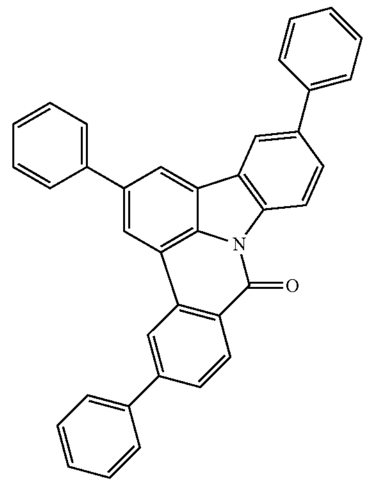
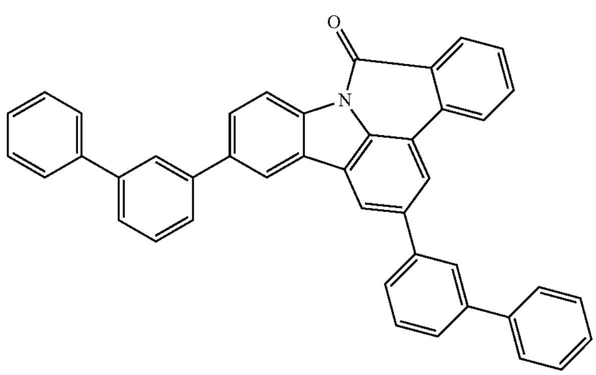
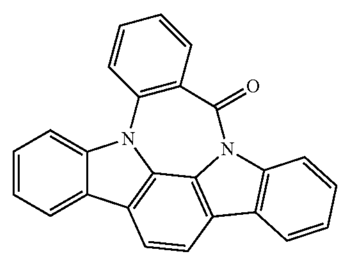
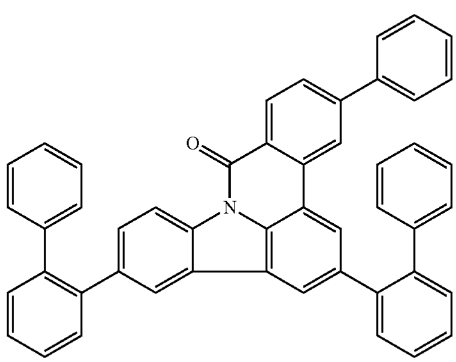
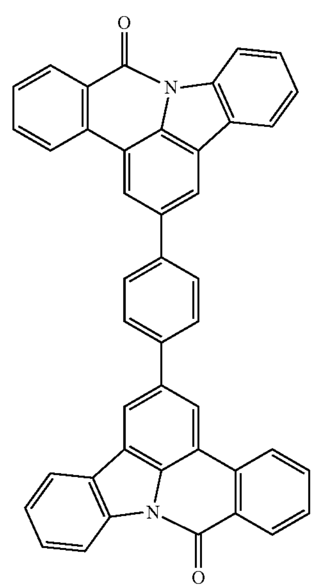
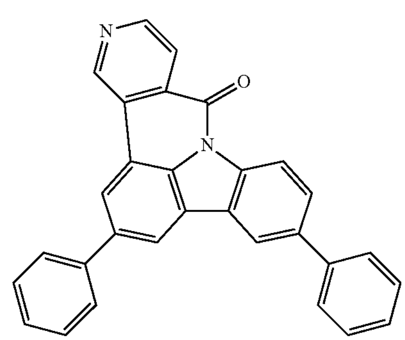

-continued
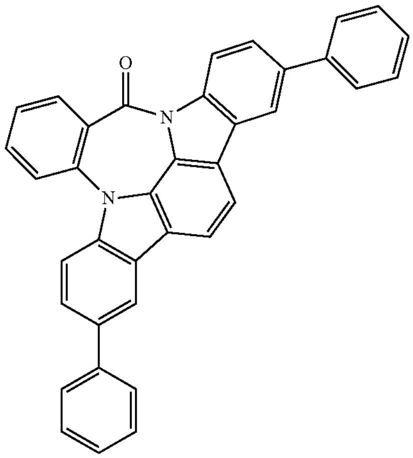
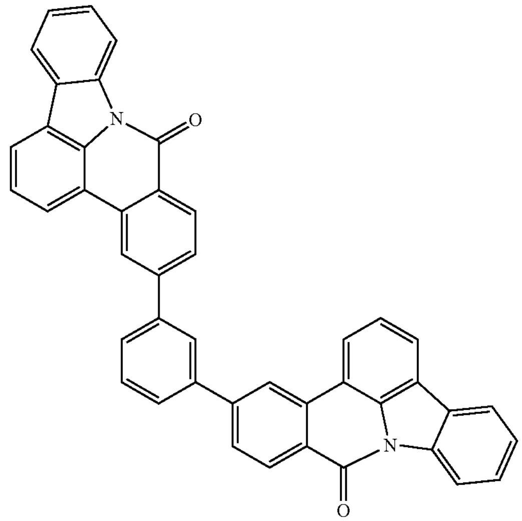
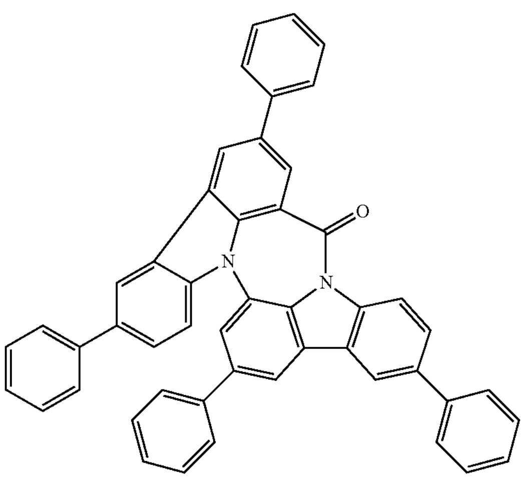
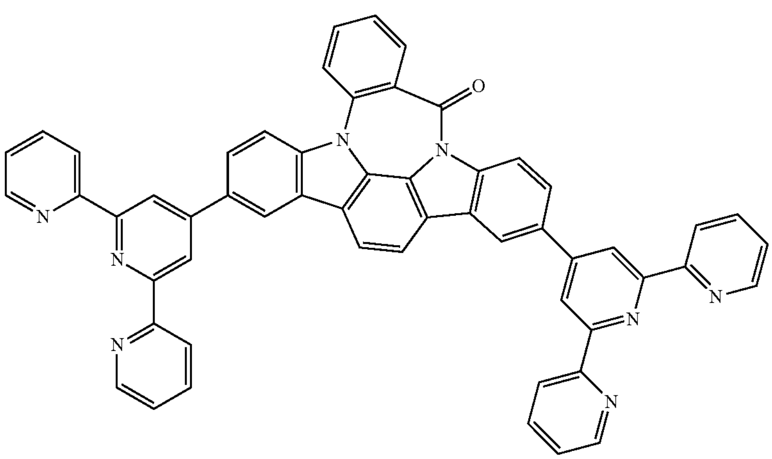

-continued
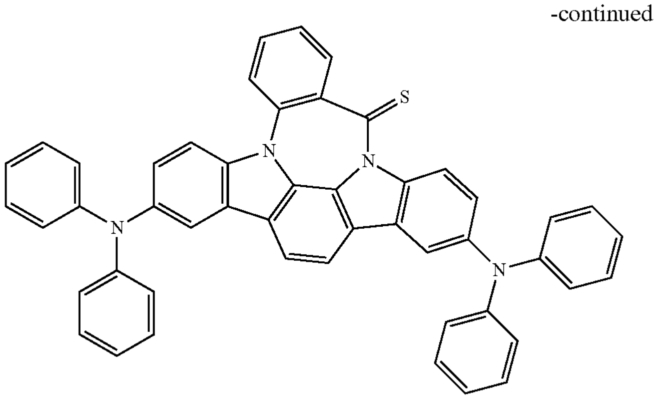
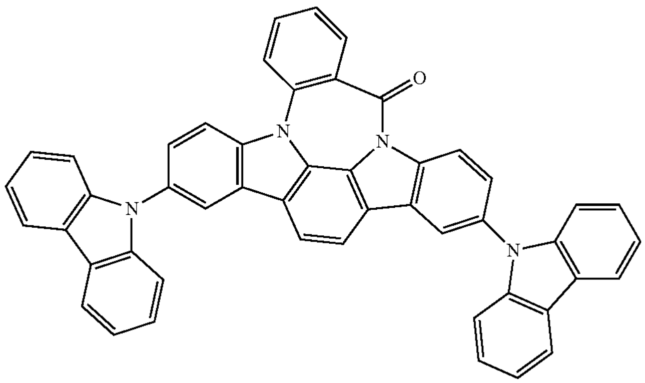
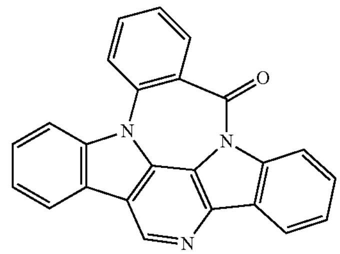
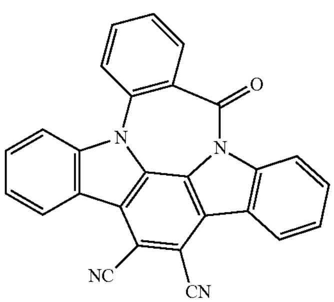
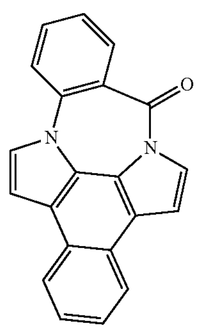
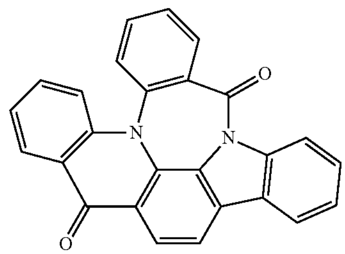
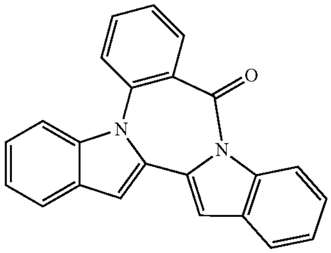
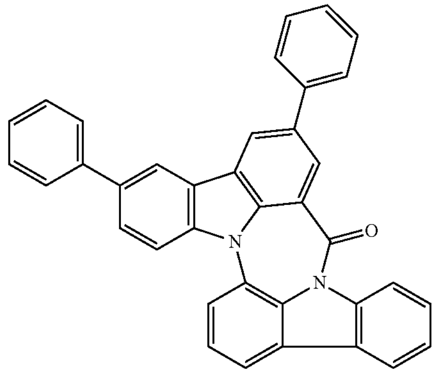

-continued
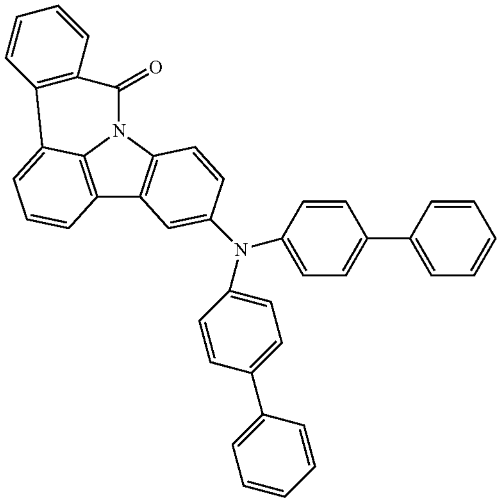
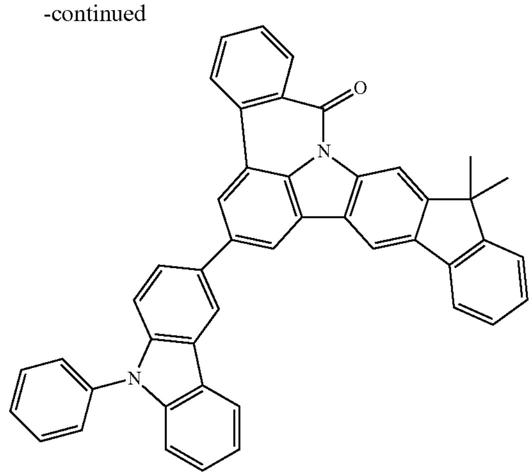
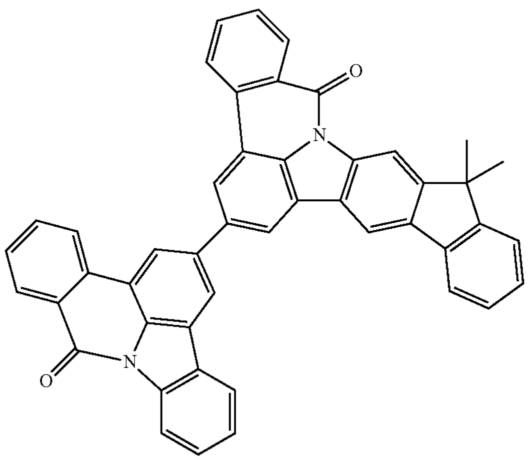
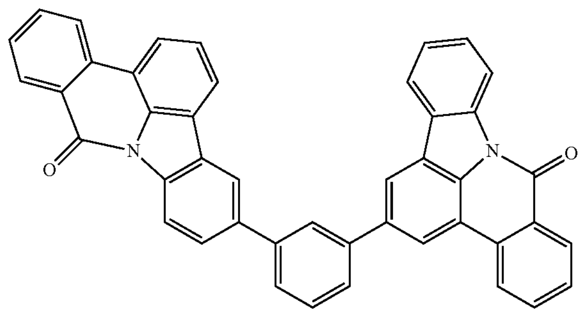
Examples of ketones which can be used as electron-transporting matrix materials are the following compounds:
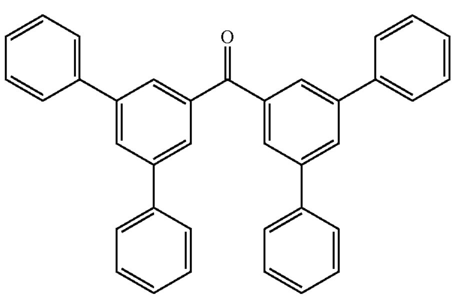
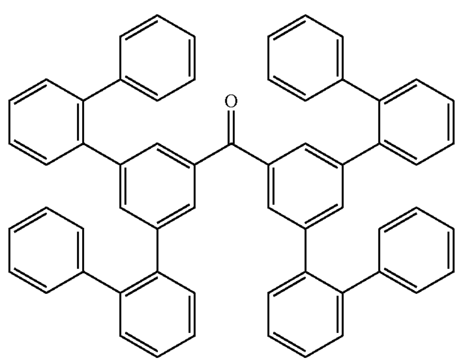

-continued
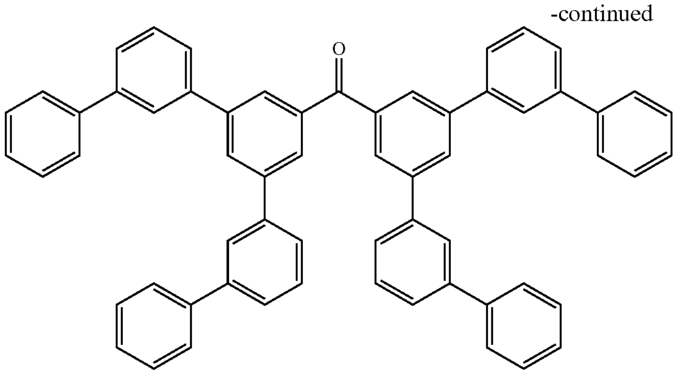
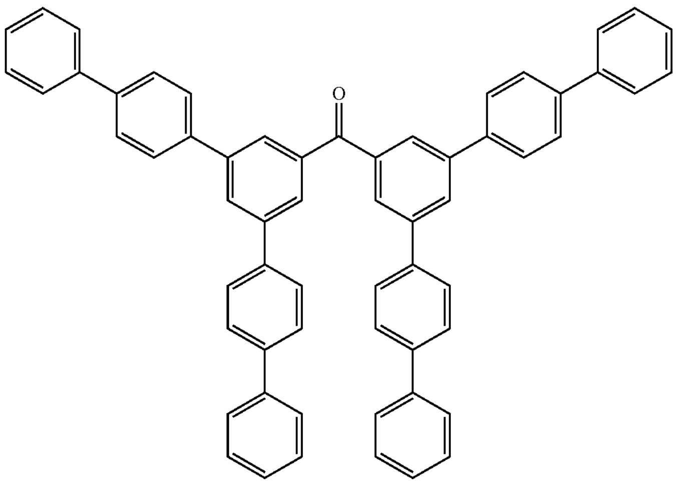
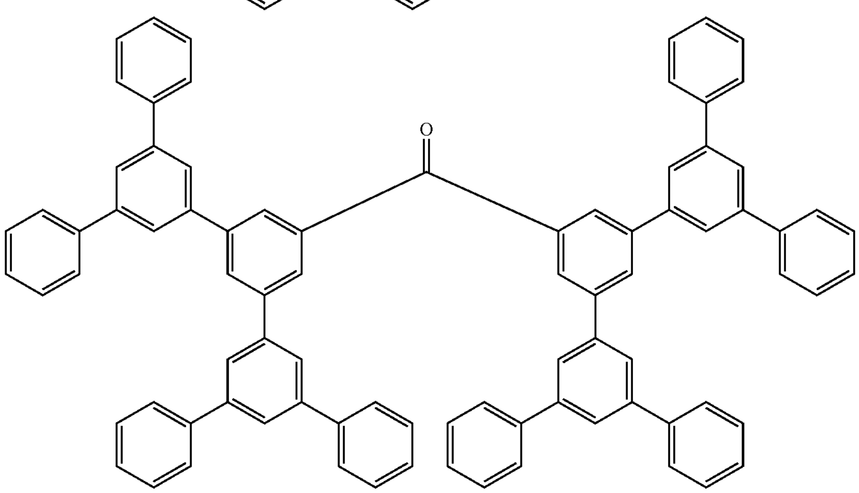
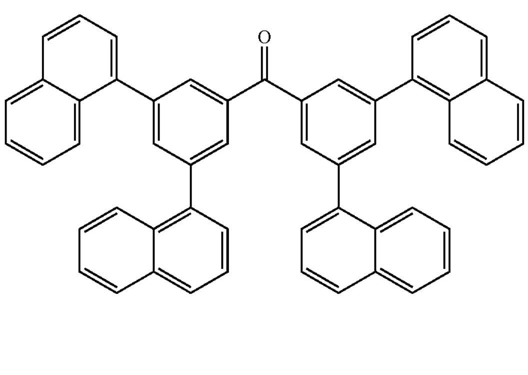
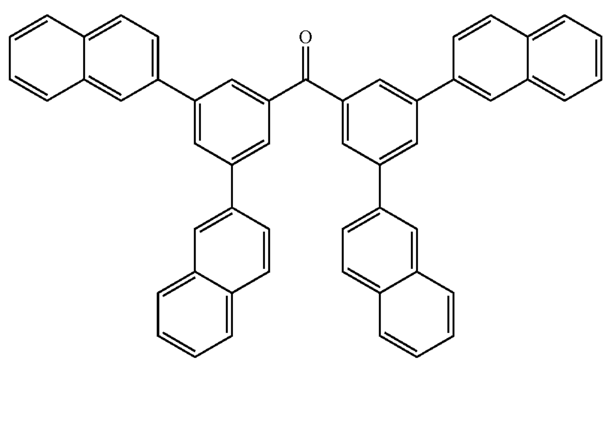

-continued
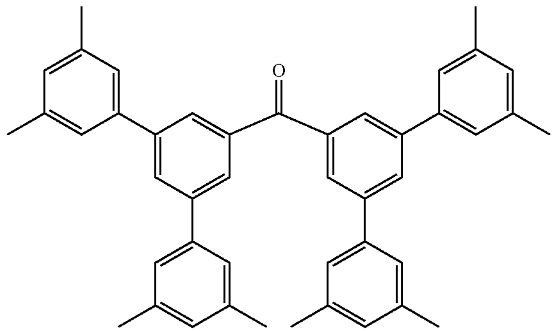
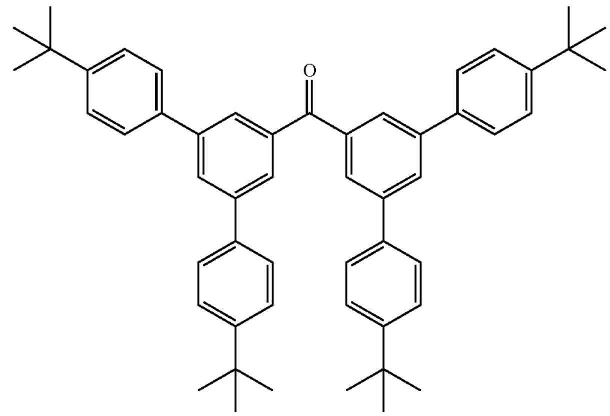
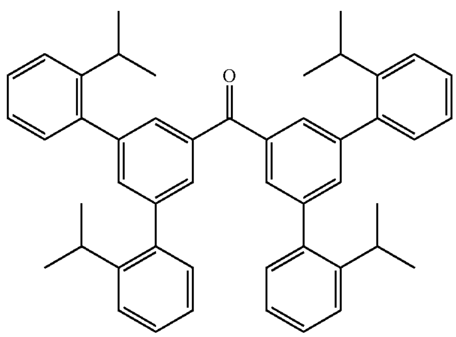
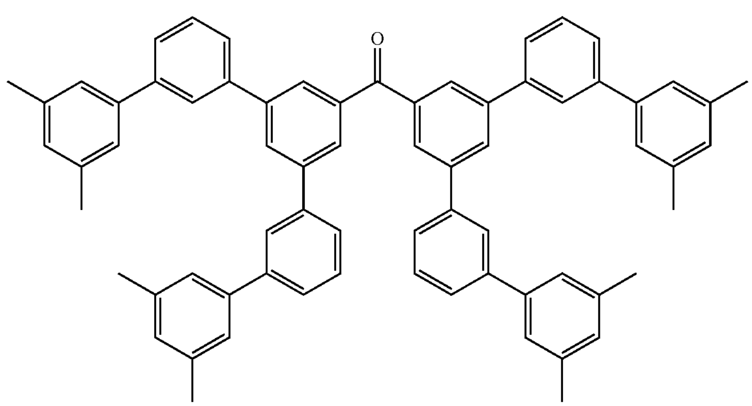
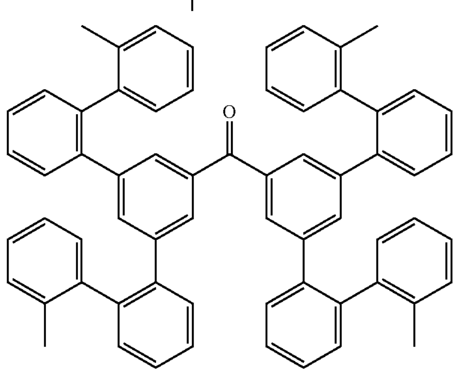
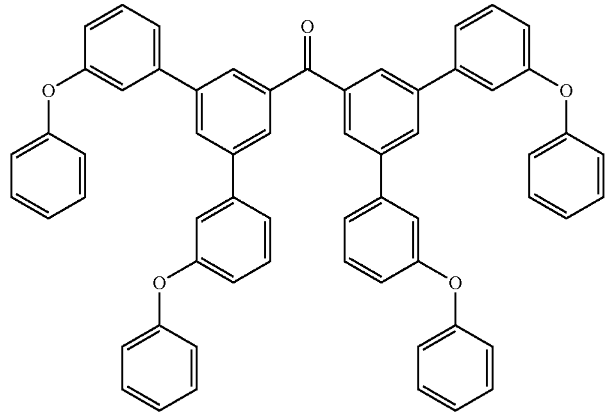

-continued
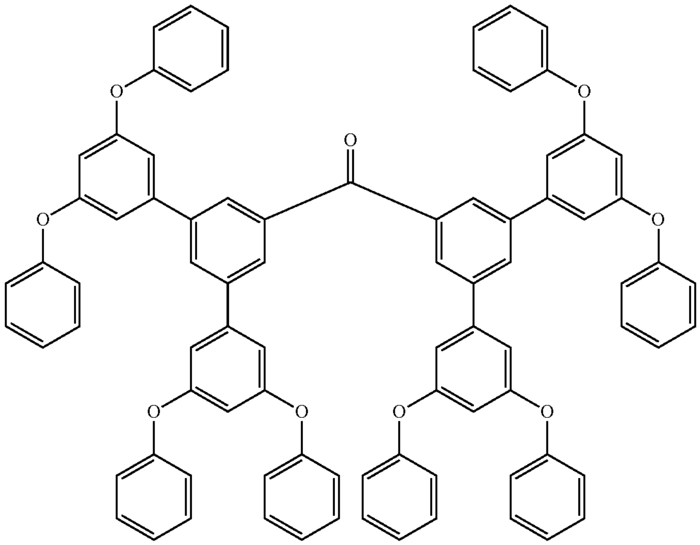
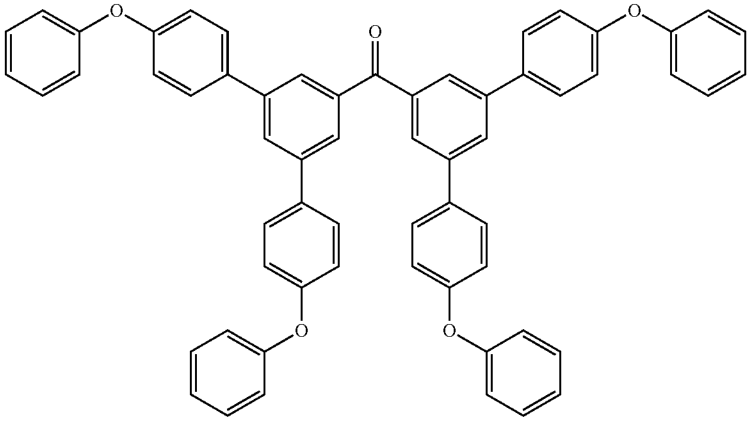
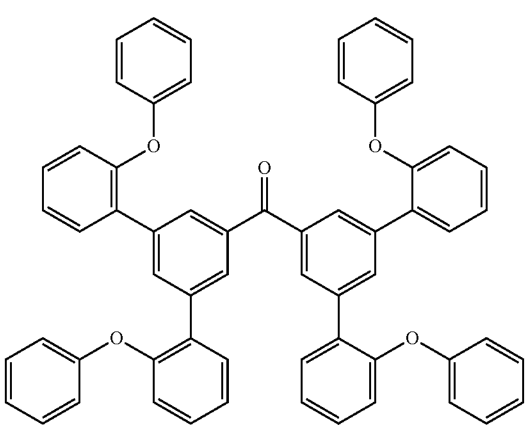

-continued
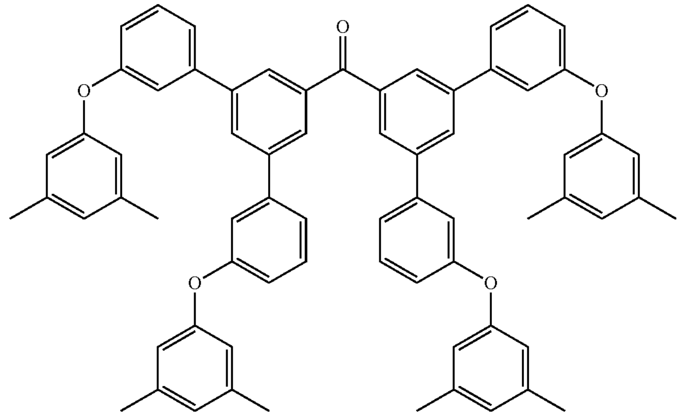
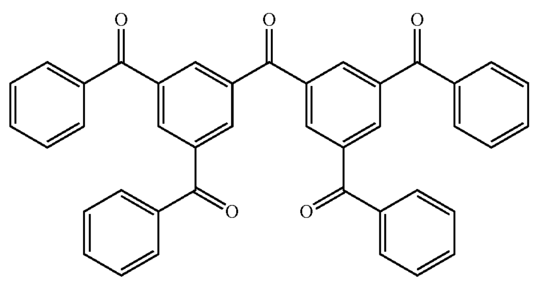
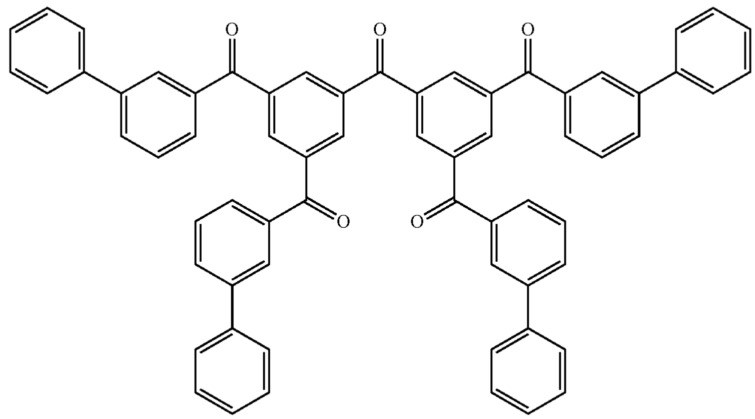
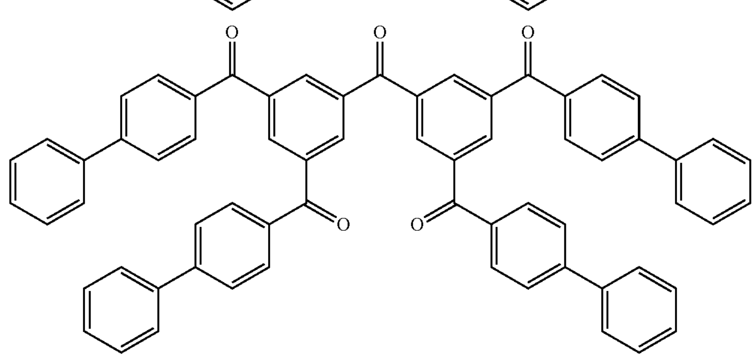

-continued
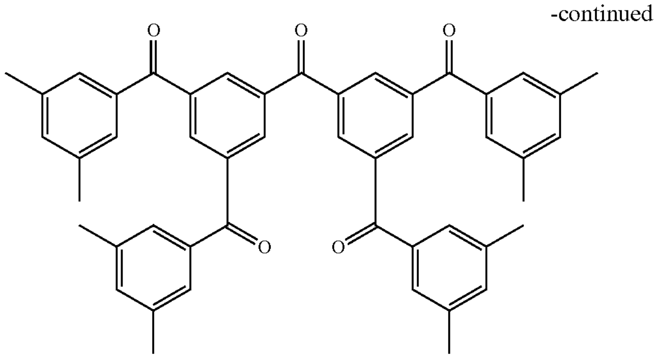
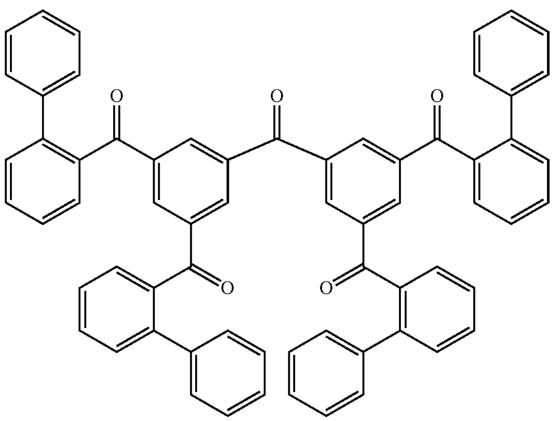
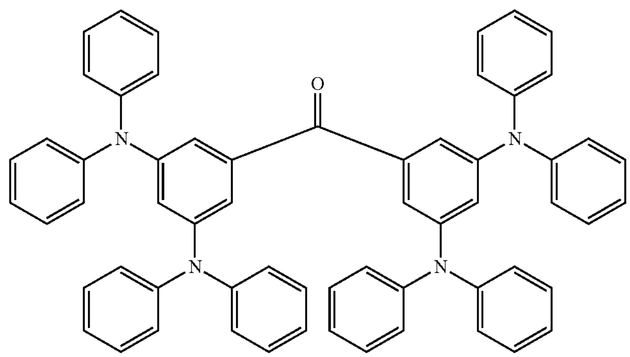
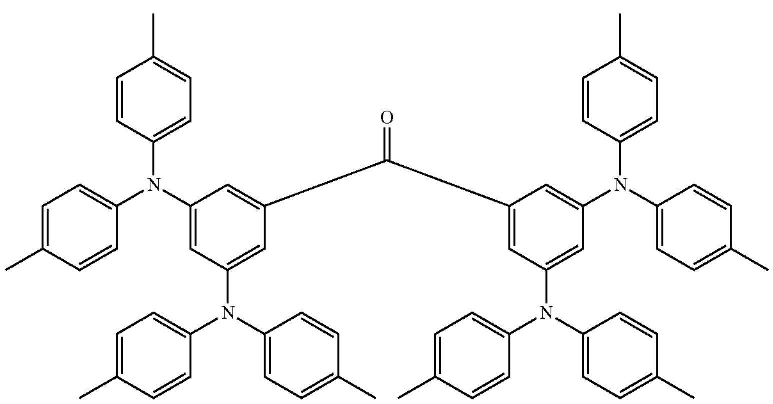
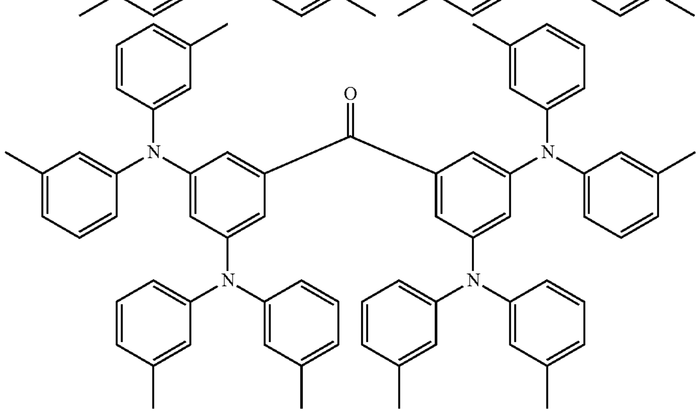

-continued
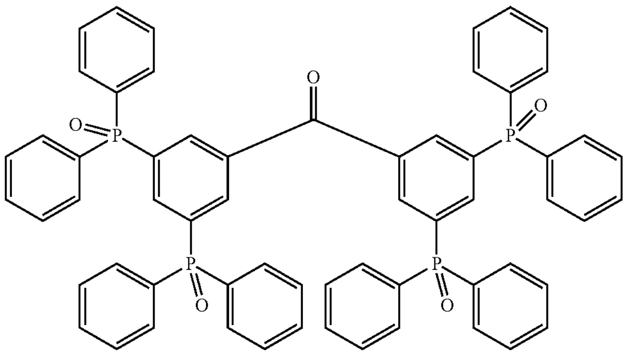
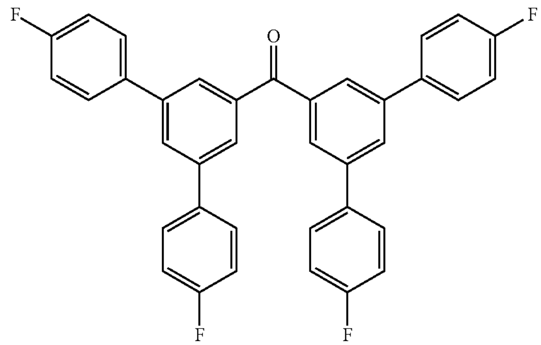
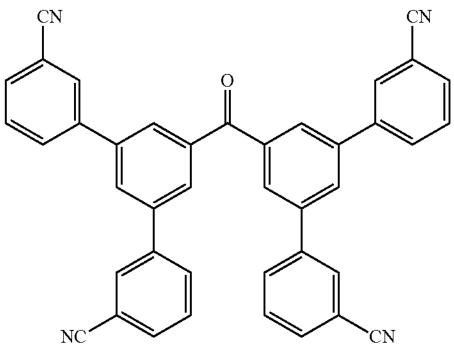
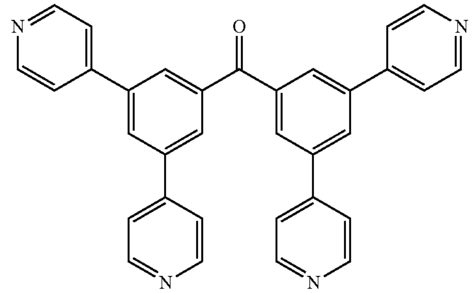
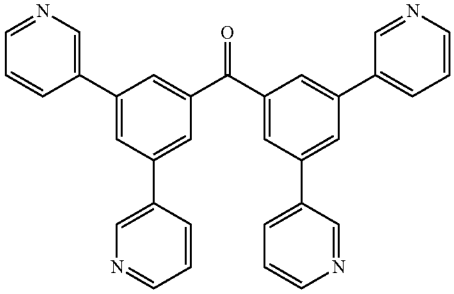
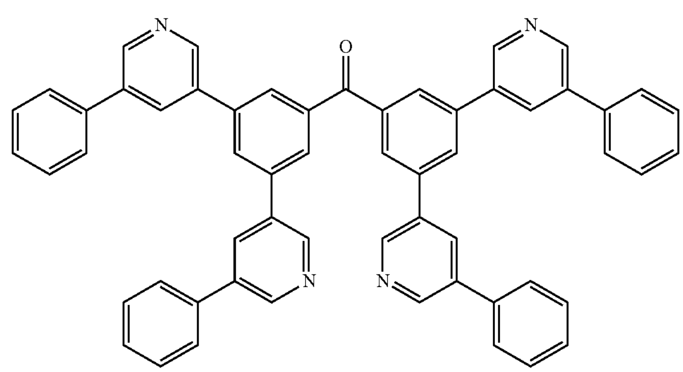
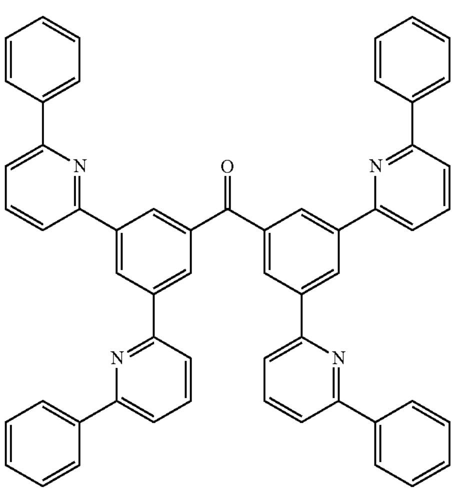
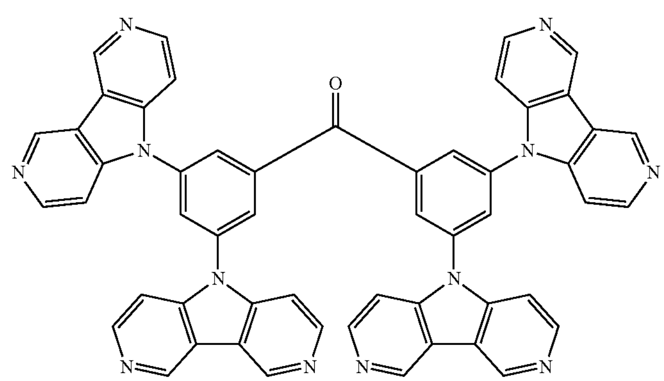

-continued
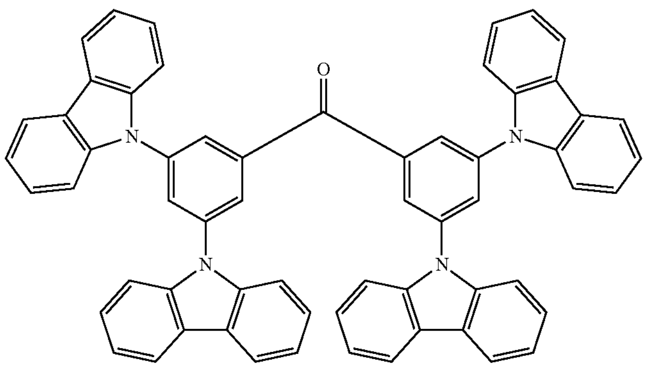
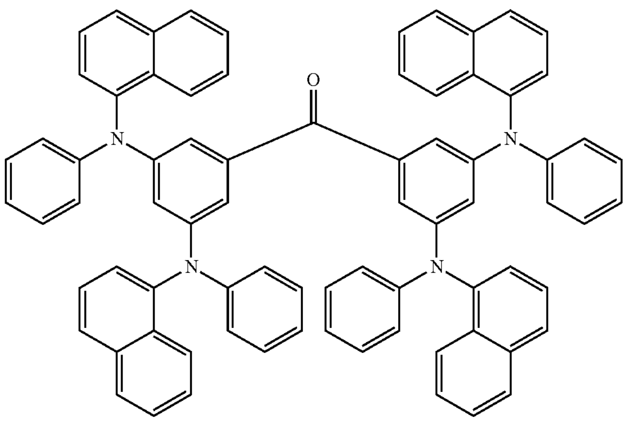
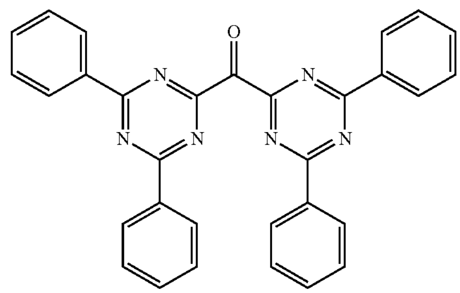
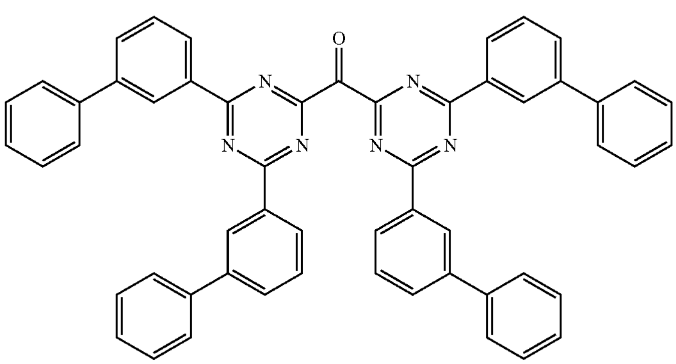
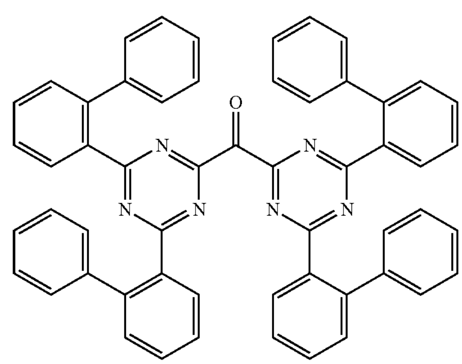
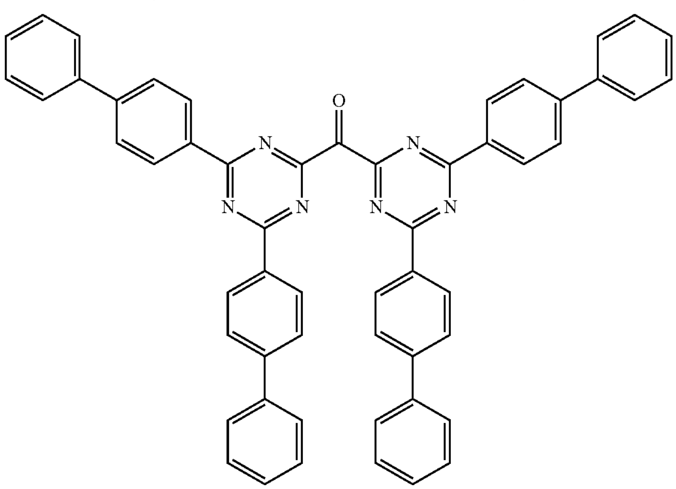

-continued
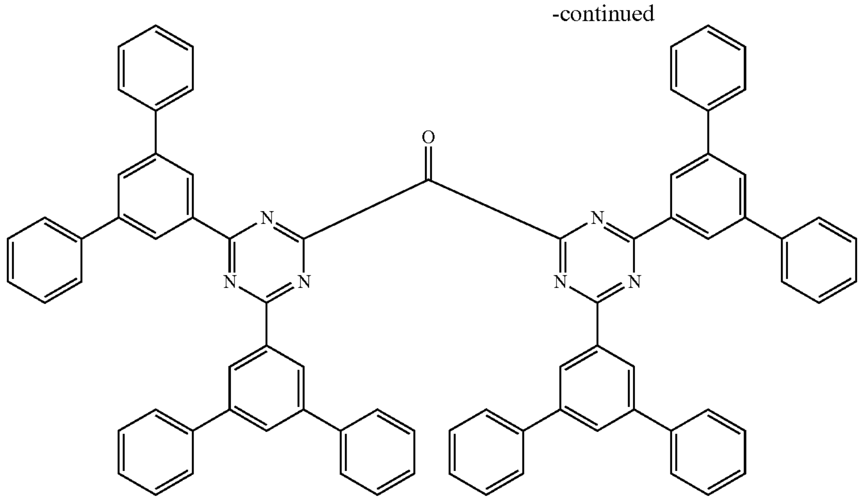
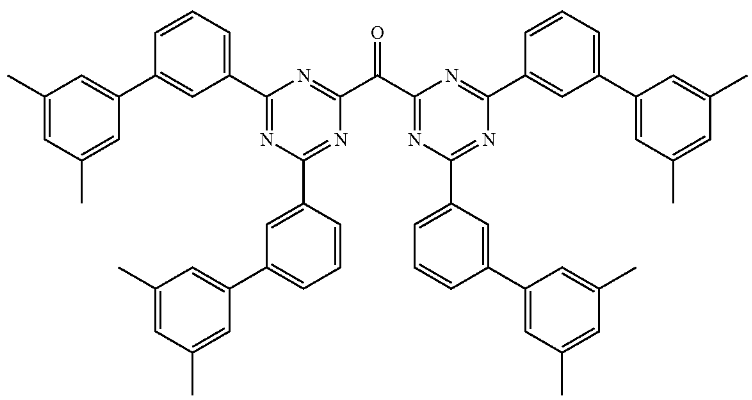
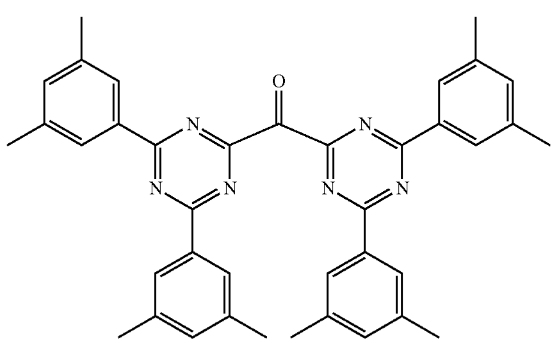
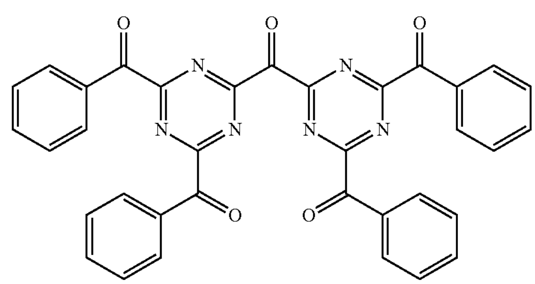
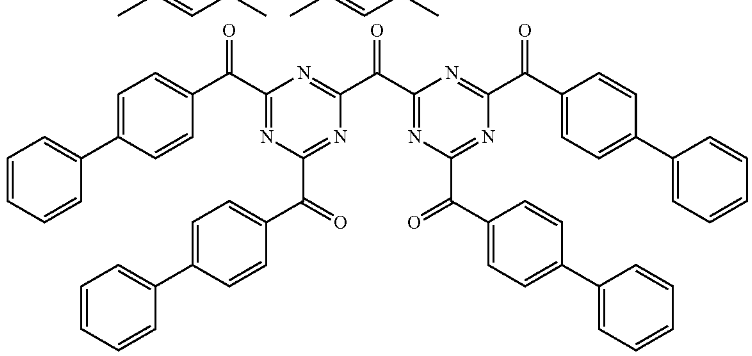

-continued
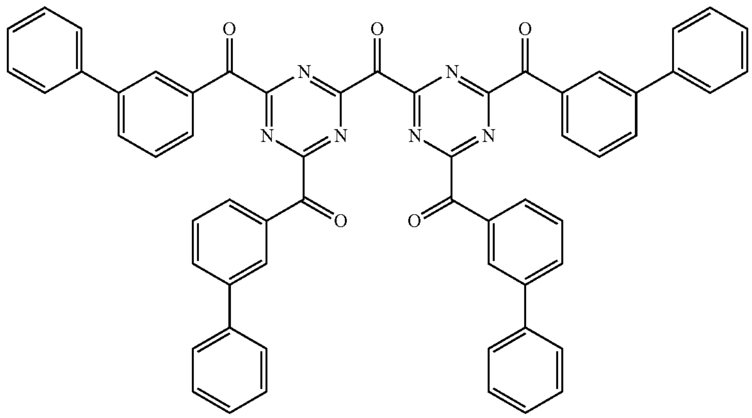
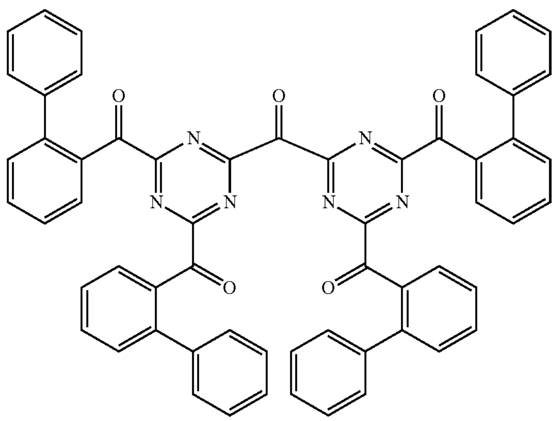
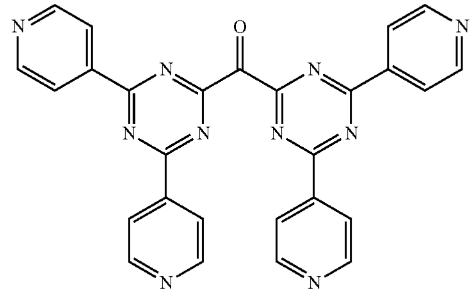
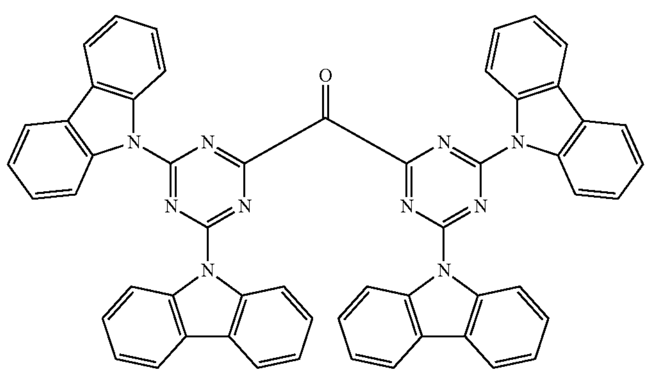
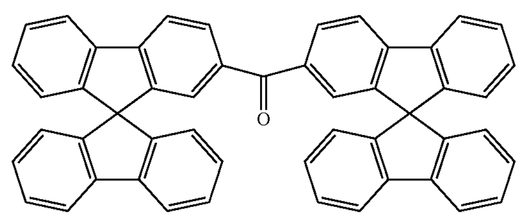
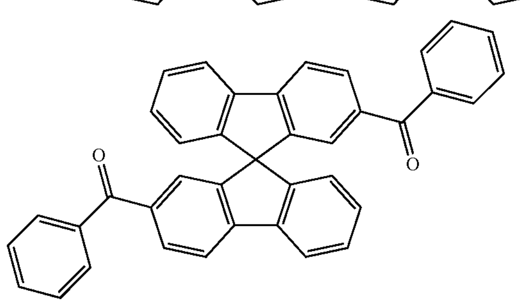
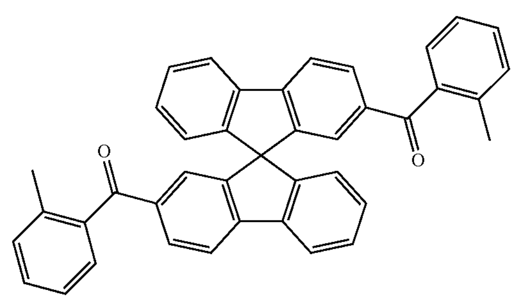

-continued
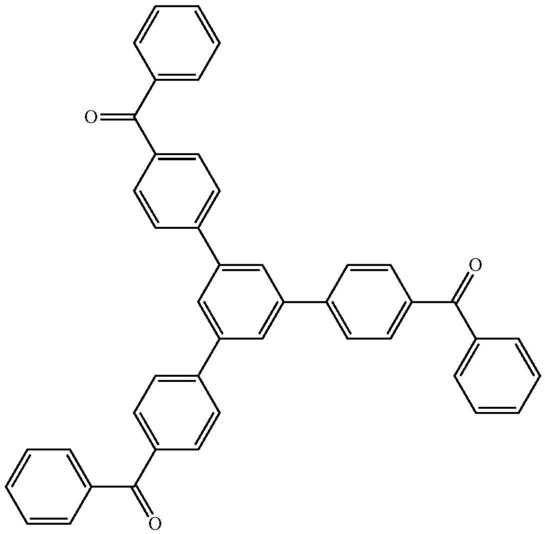
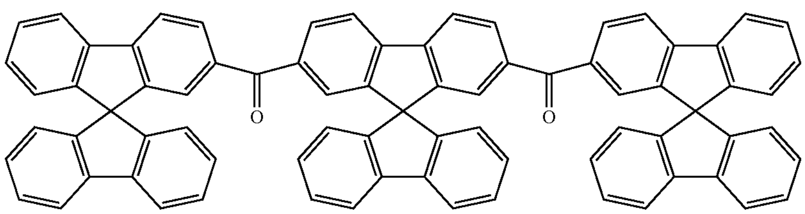
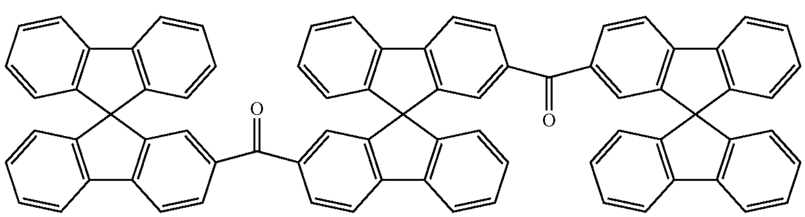
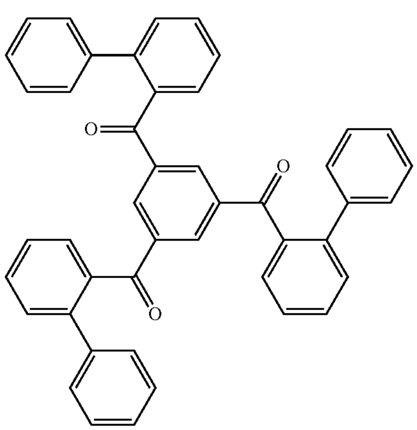
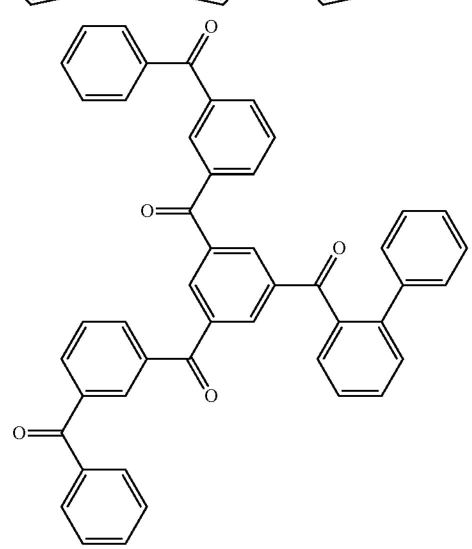

-continued
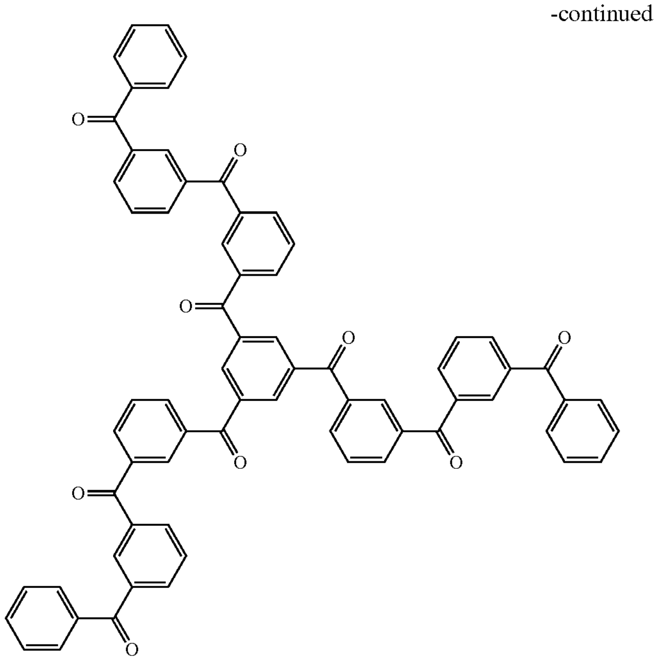
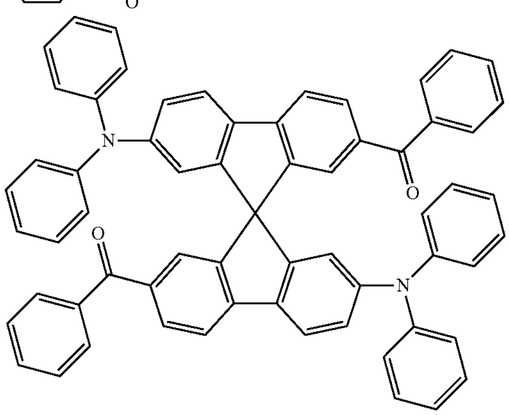
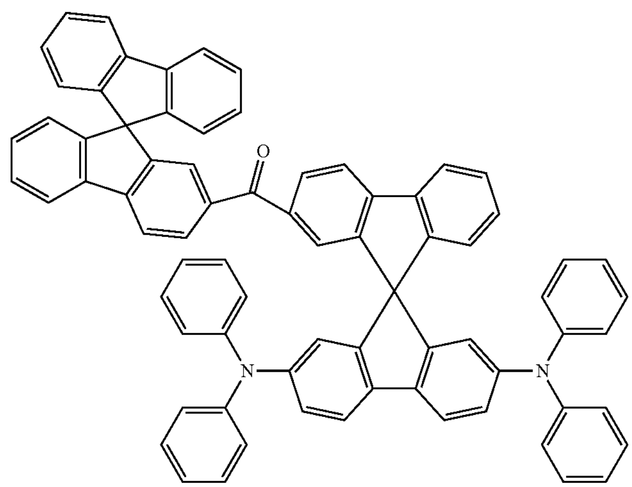
Examples of metal complexes which can be used as electron-transporting matrix materials are the following compounds:
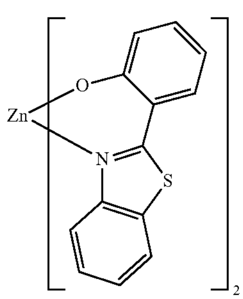
-continued
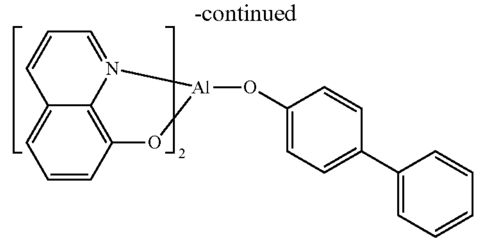
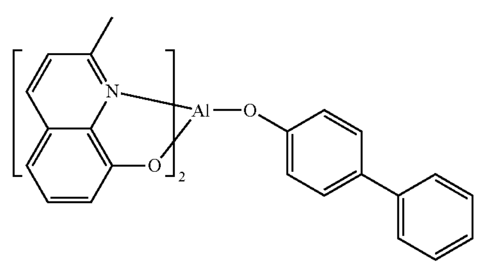

-continued
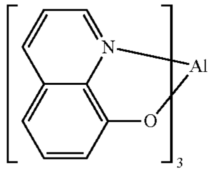
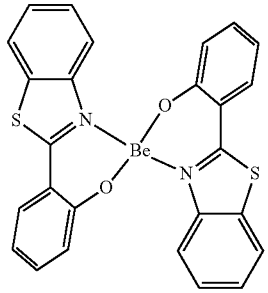
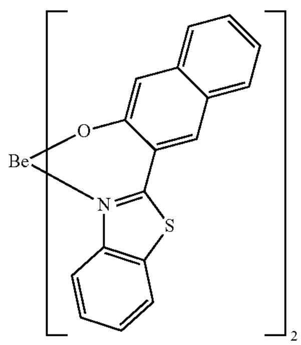
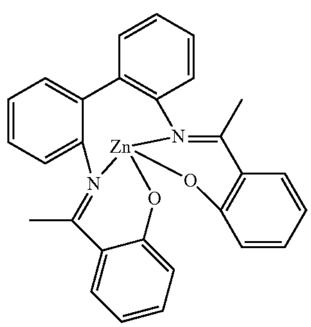
-continued
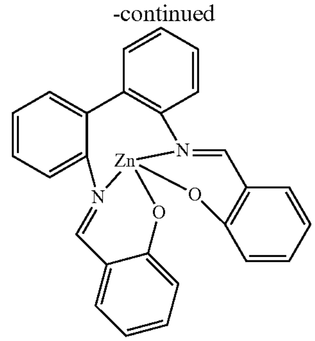
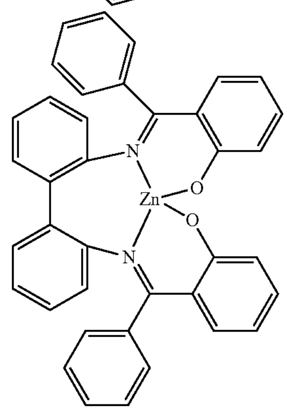
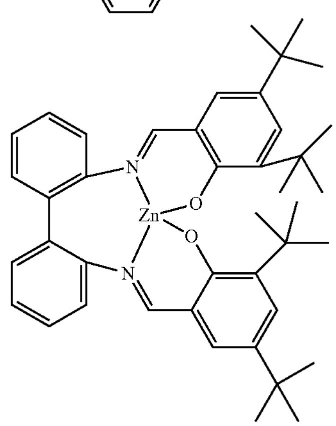
Examples of phosphine oxides which can be used as electron-transporting matrix materials are the following compounds:
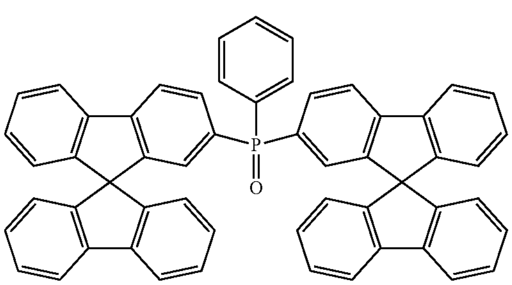
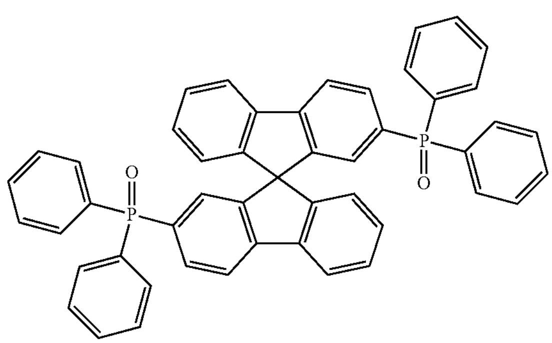

-continued
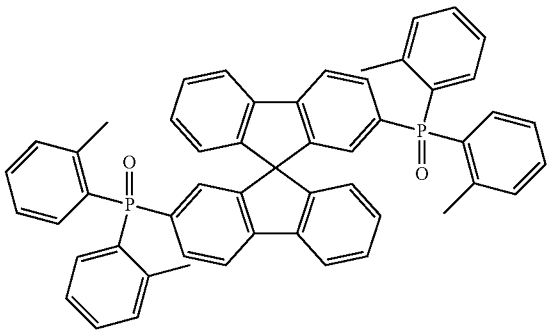
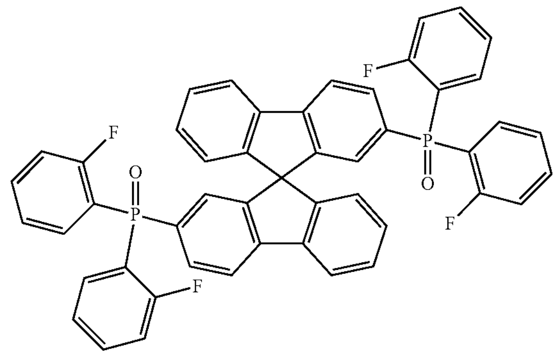
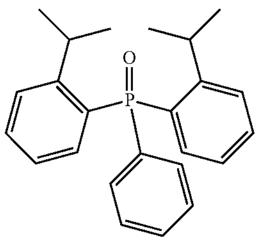
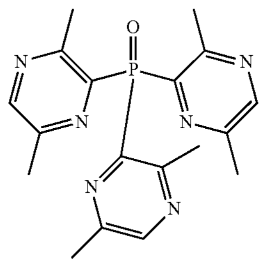
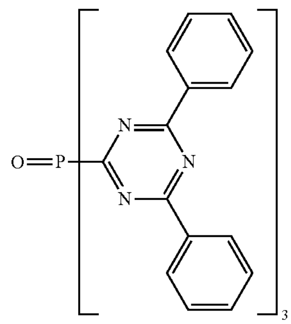
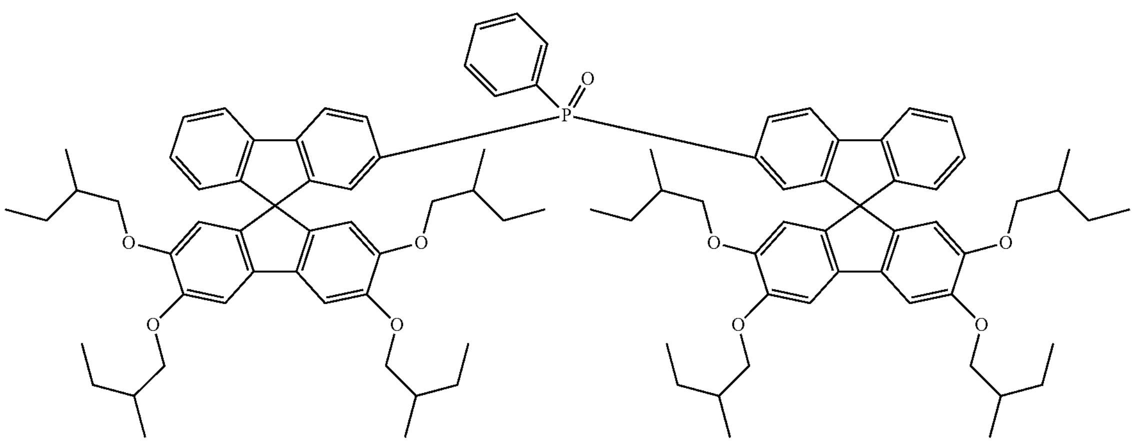
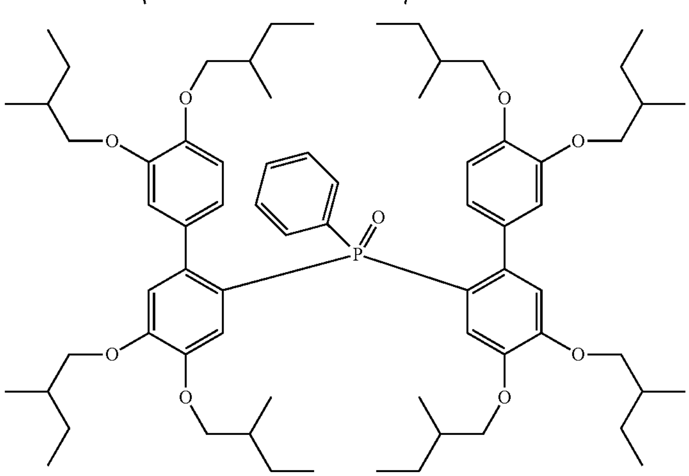
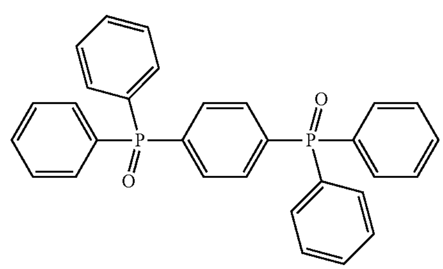

-continued
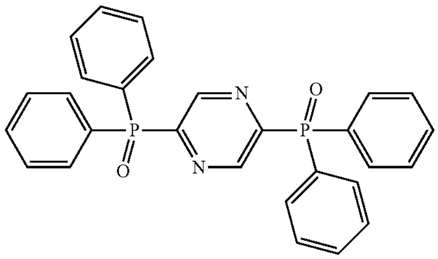
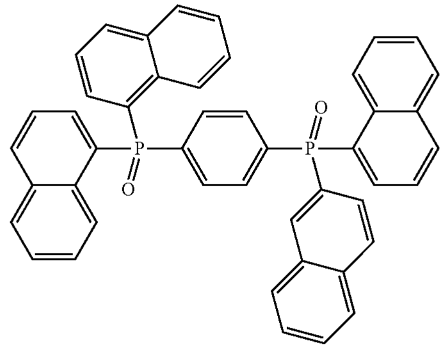
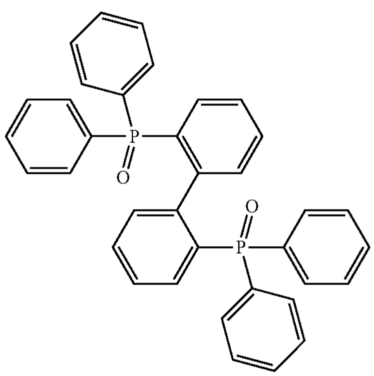
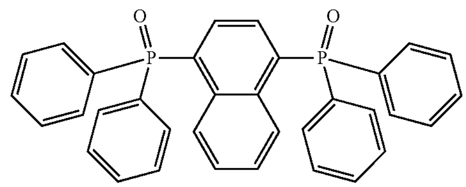
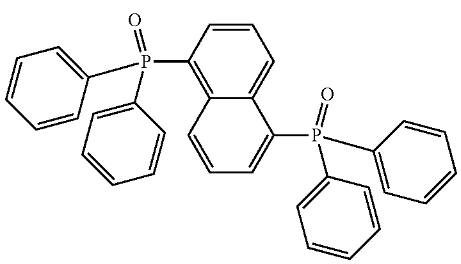
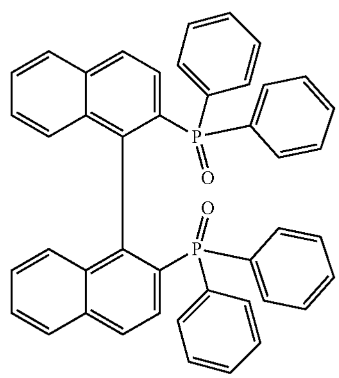
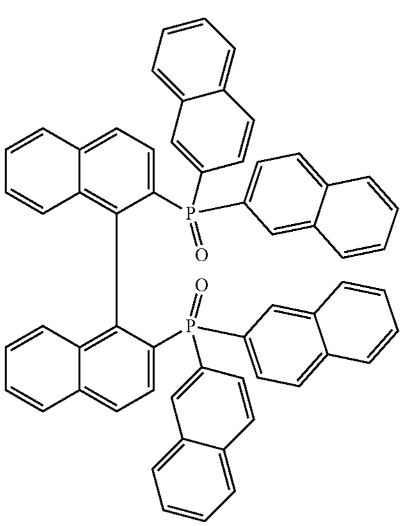
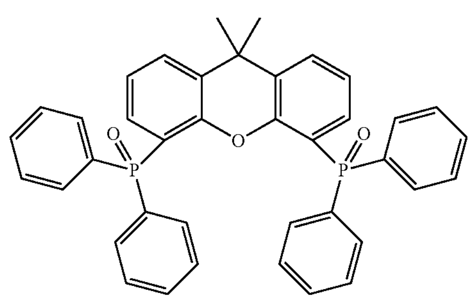

Examples of indolo- and indenocarbazole derivatives in the broadest sense which can be used as hole- or electron-transporting matrix materials according to the substitution pattern are the following compounds:
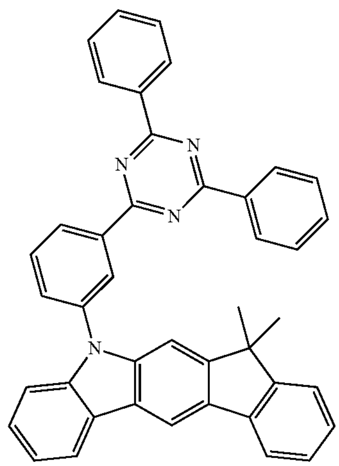
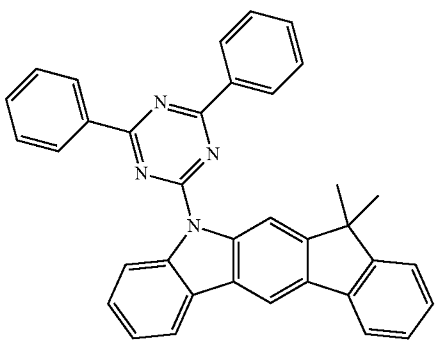
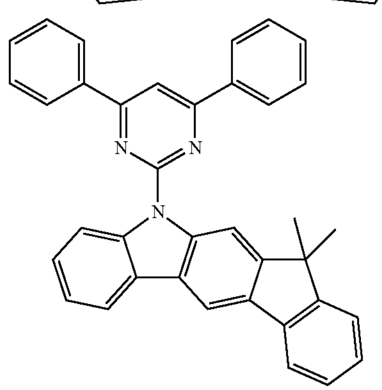
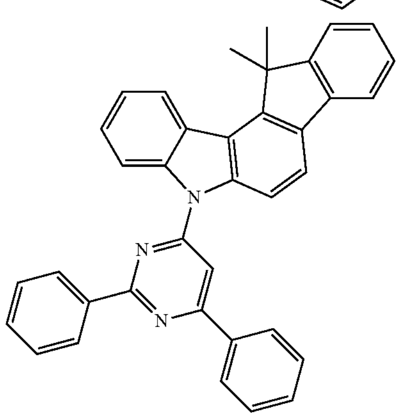
-continued
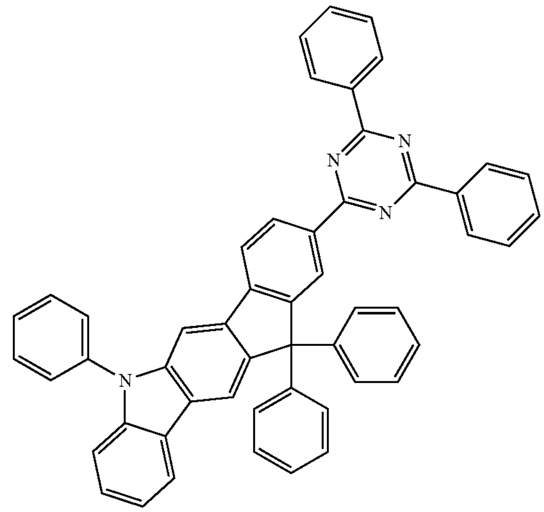
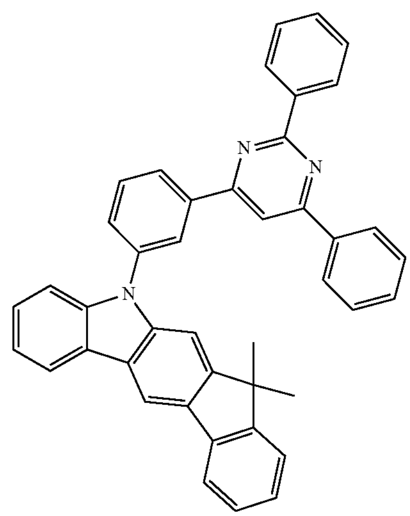
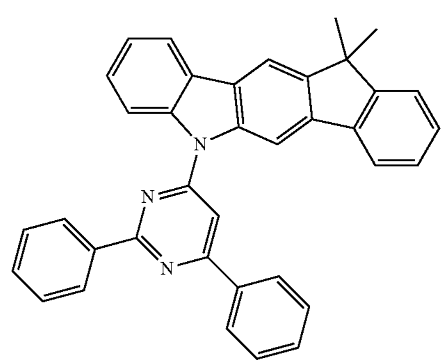

-continued
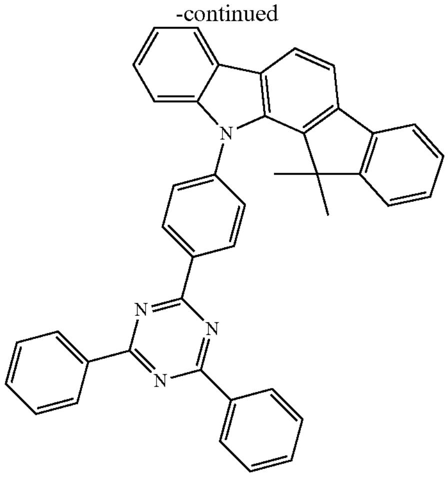
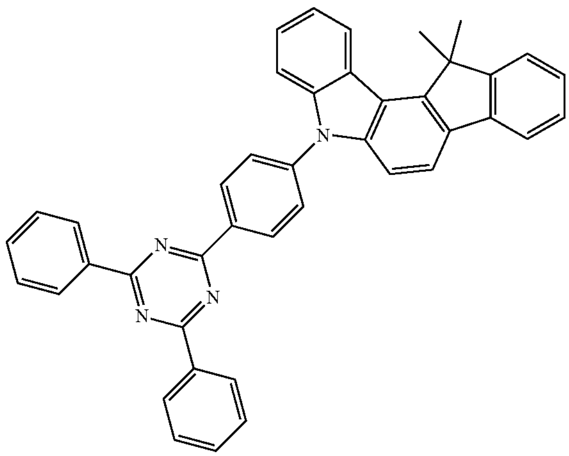
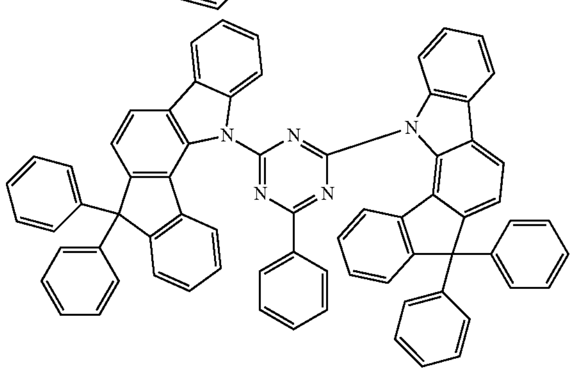
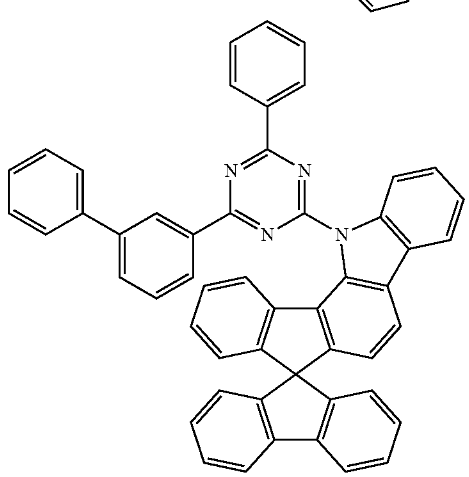
-continued
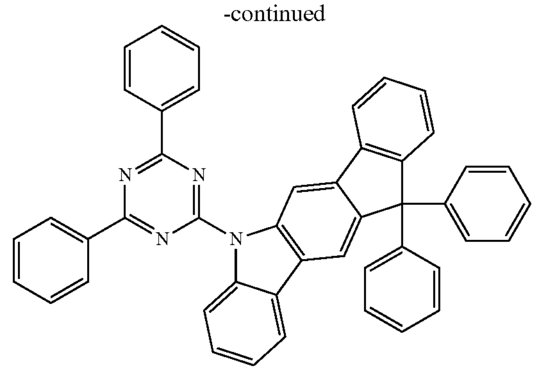
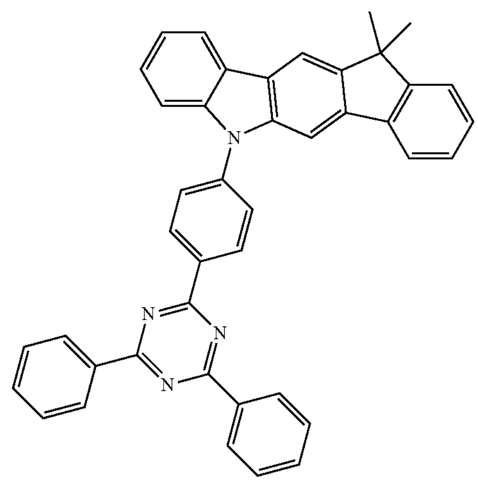
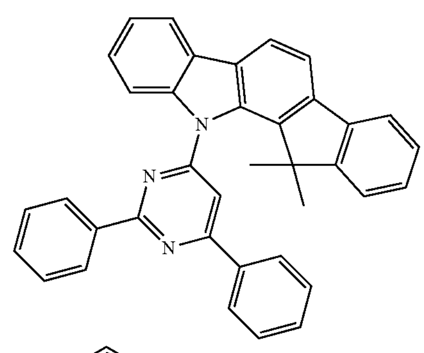
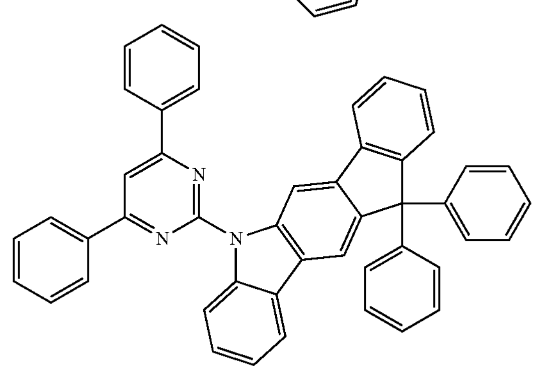

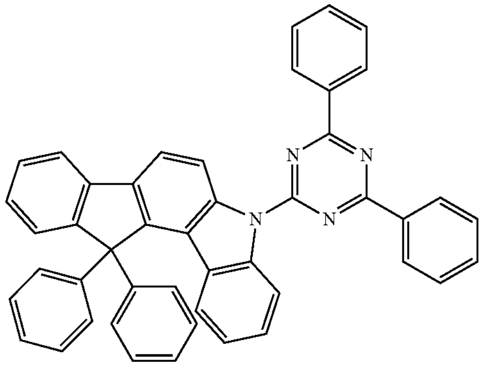
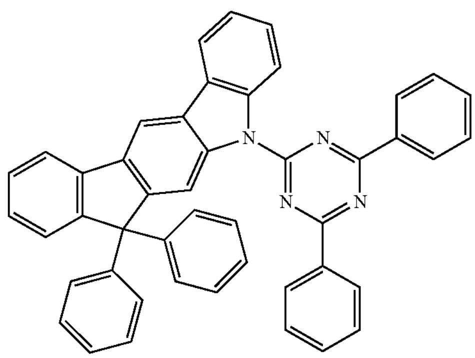
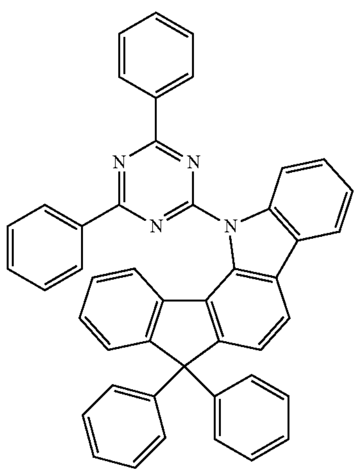
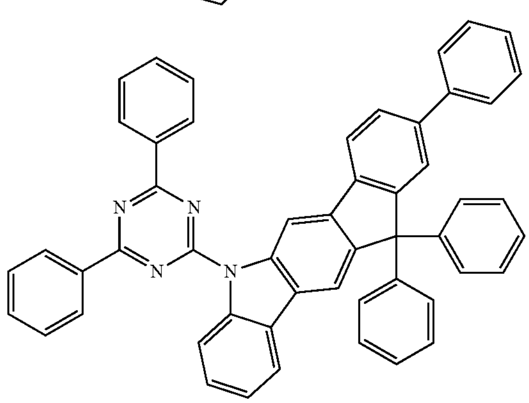
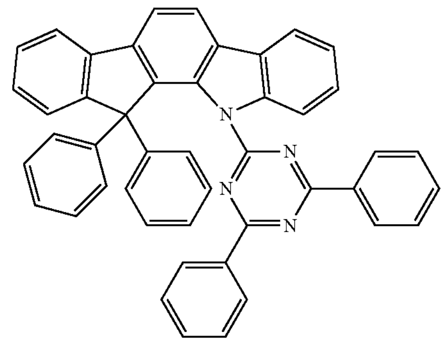
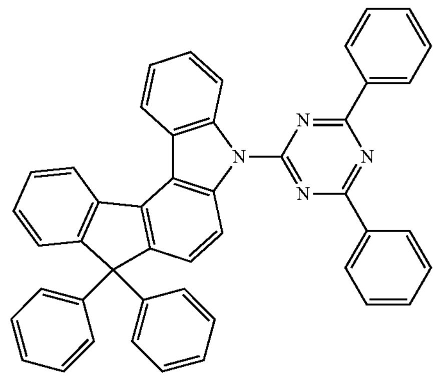
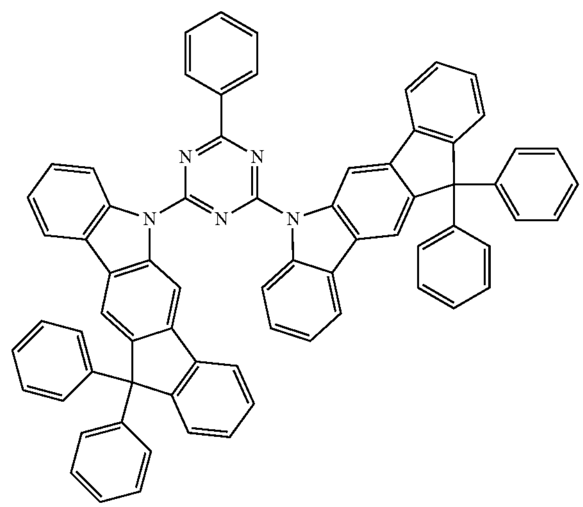
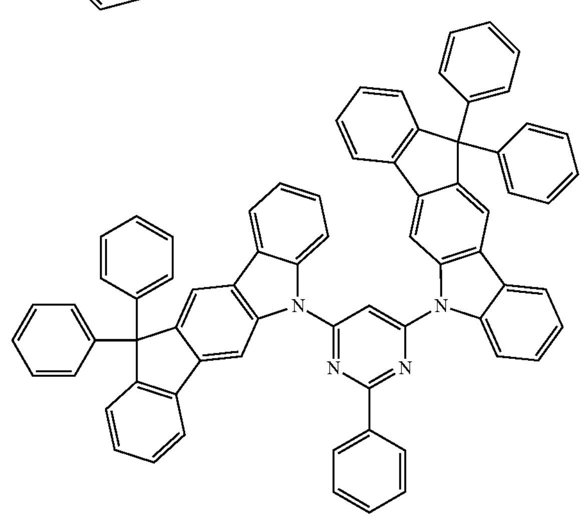

-continued
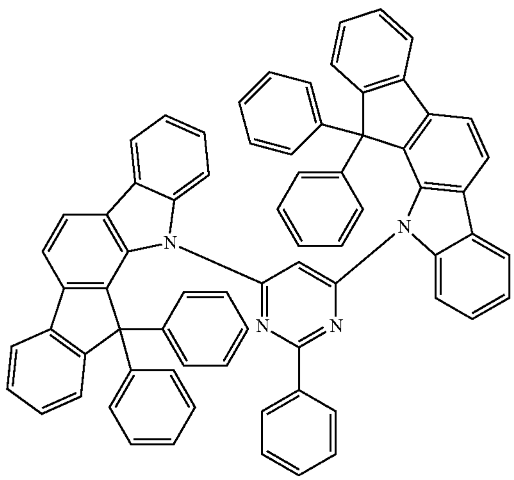
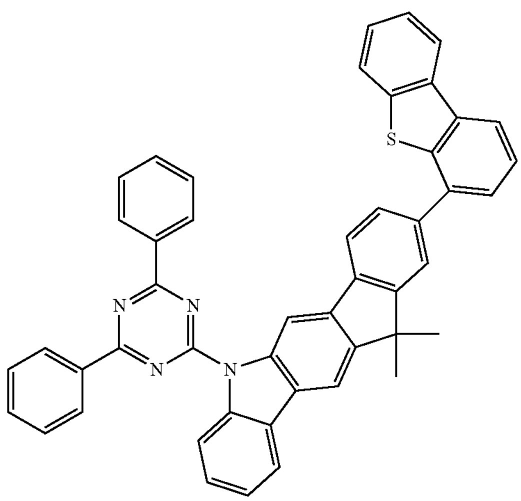
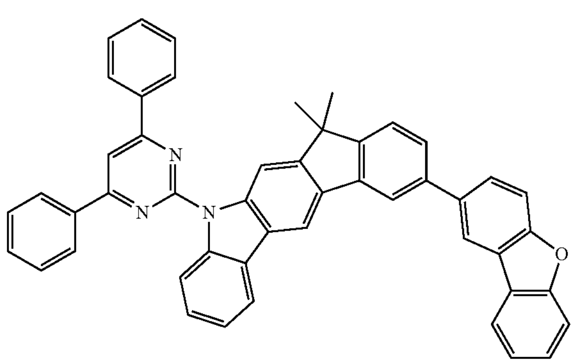
-continued
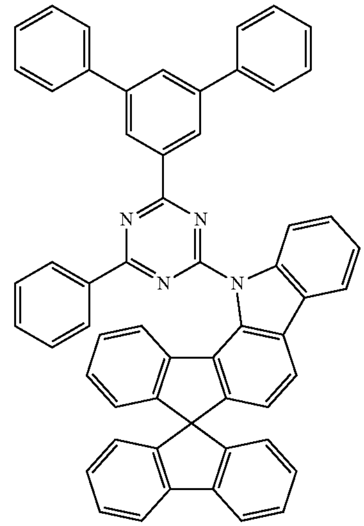
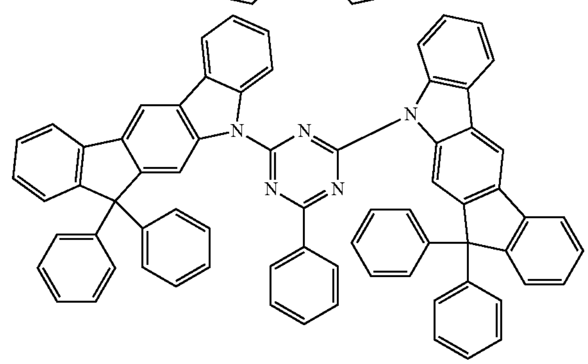
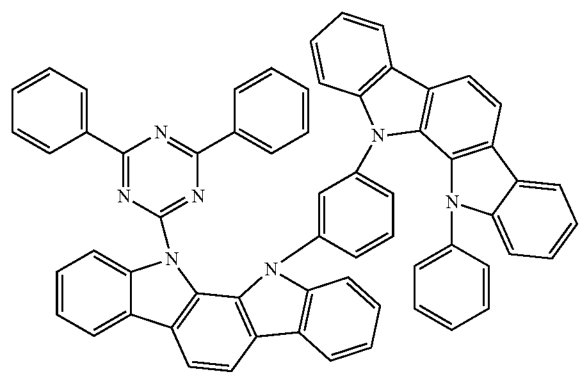
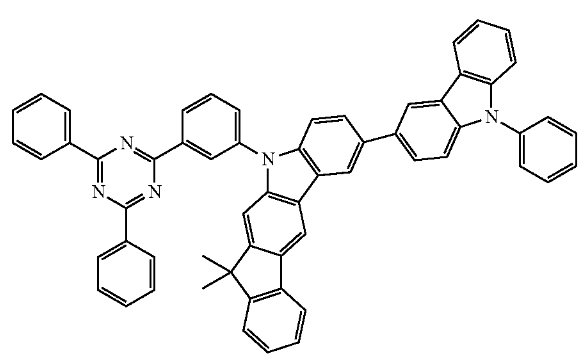

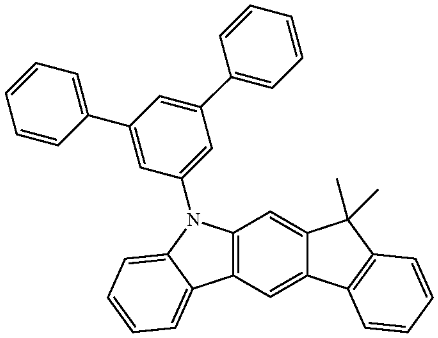
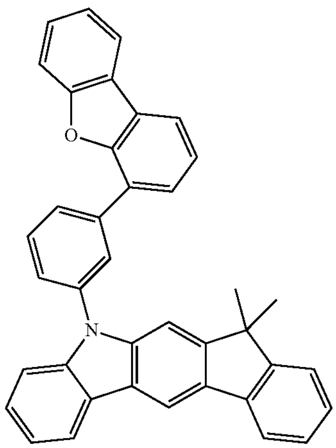
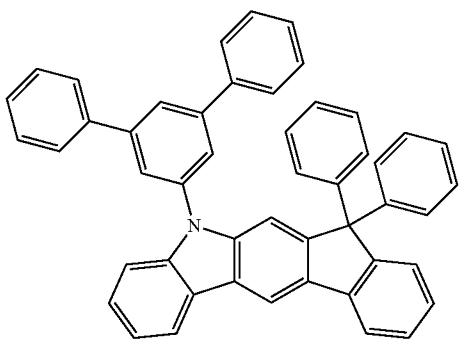
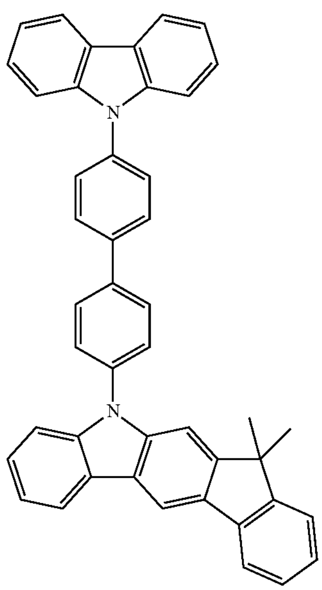
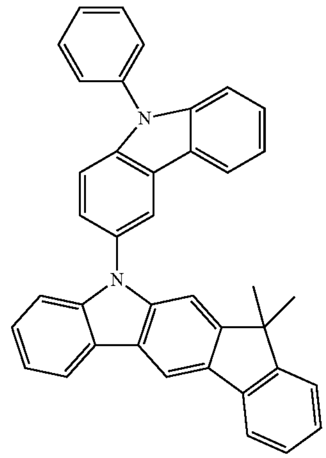
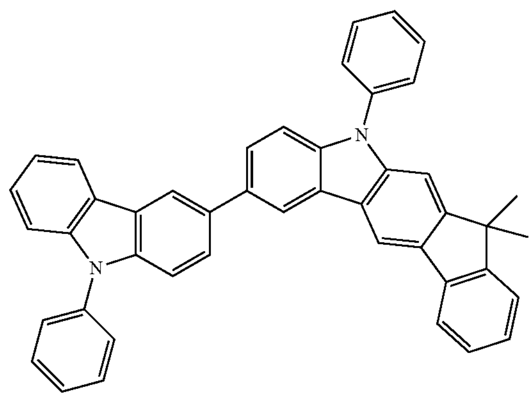
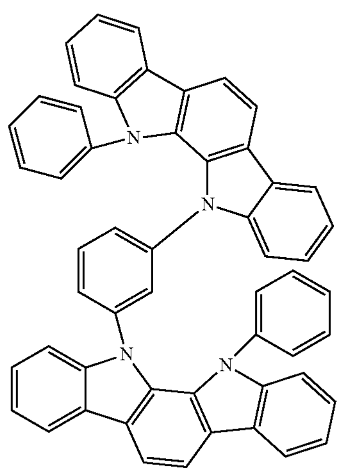

-continued
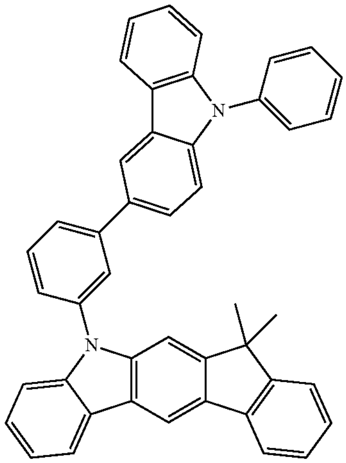
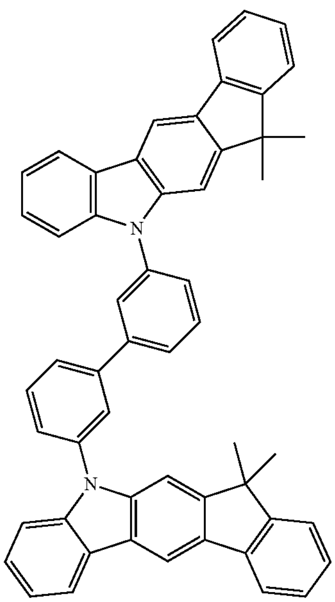
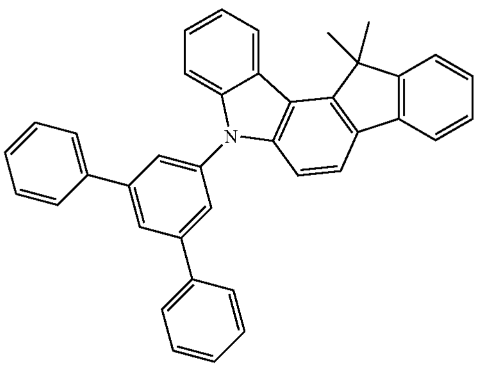
-continued
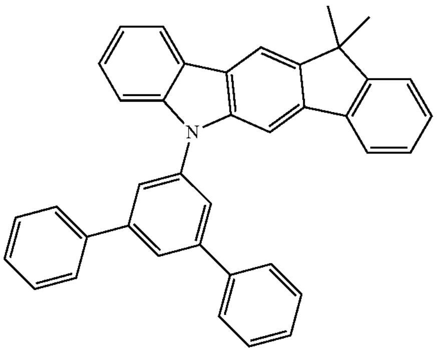
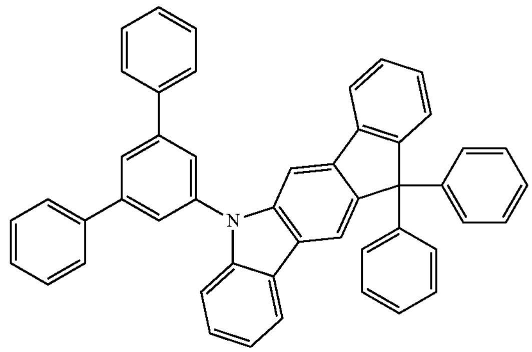
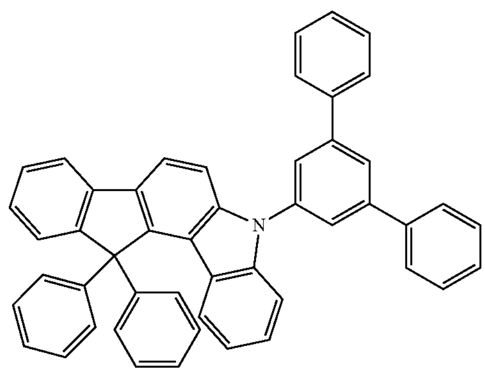
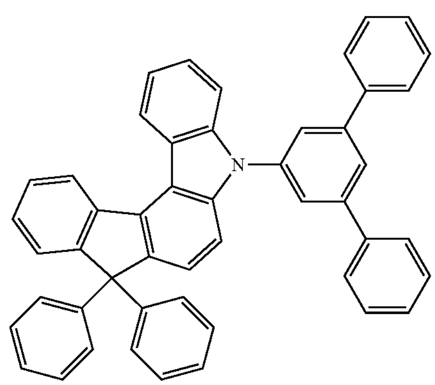

-continued
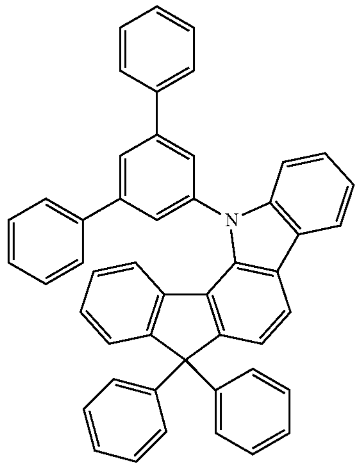
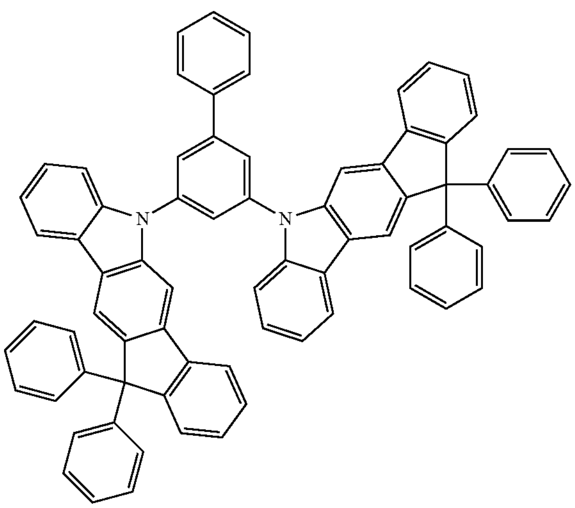
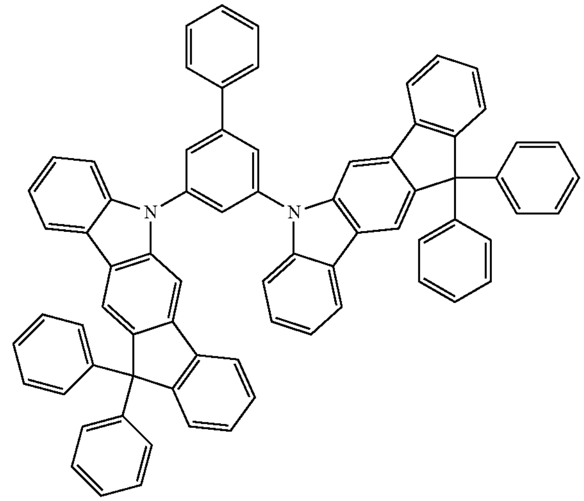
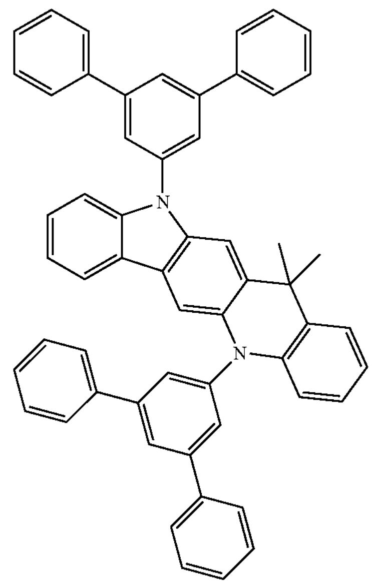
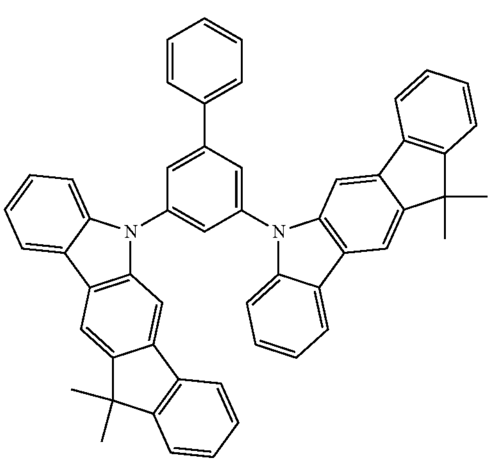
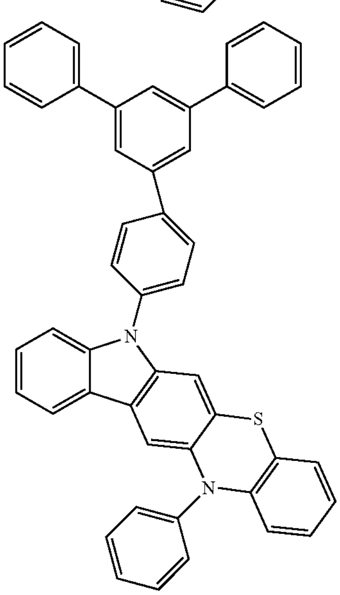
-continued -continued
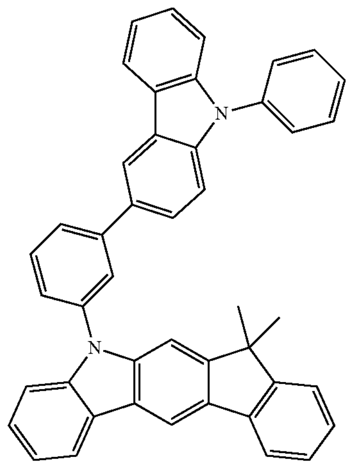
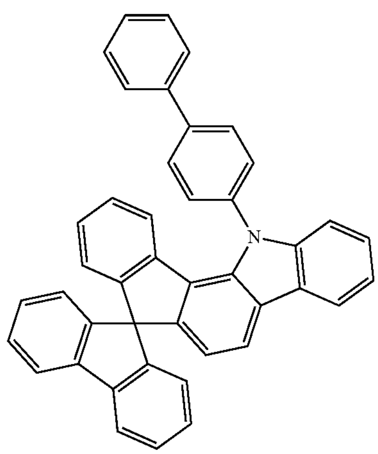
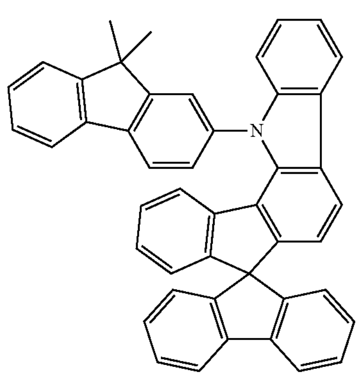
-continued
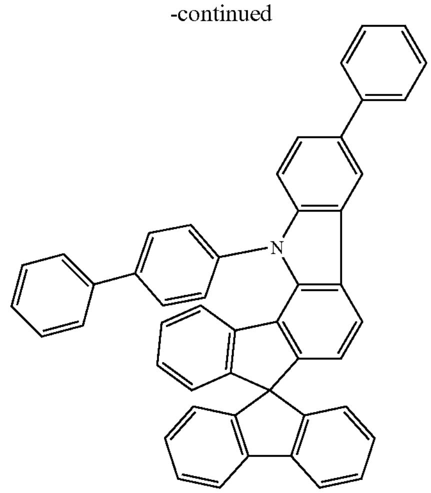
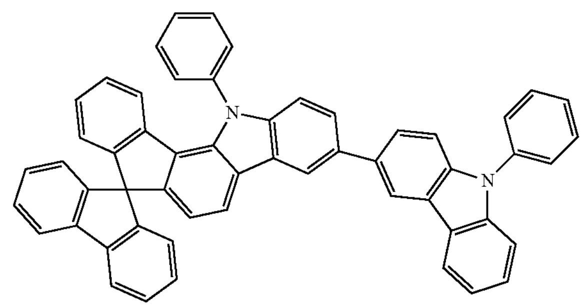
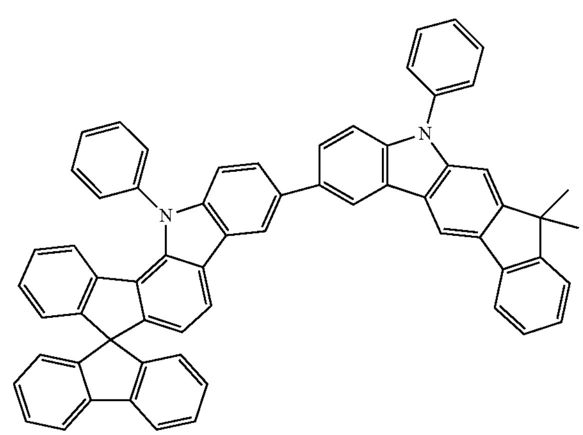

-continued
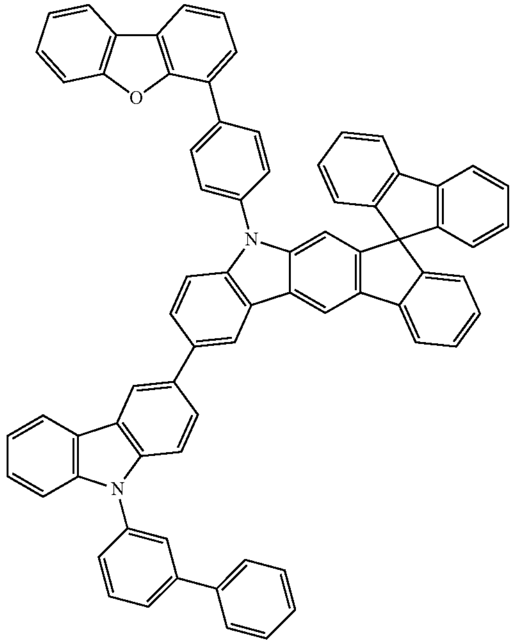
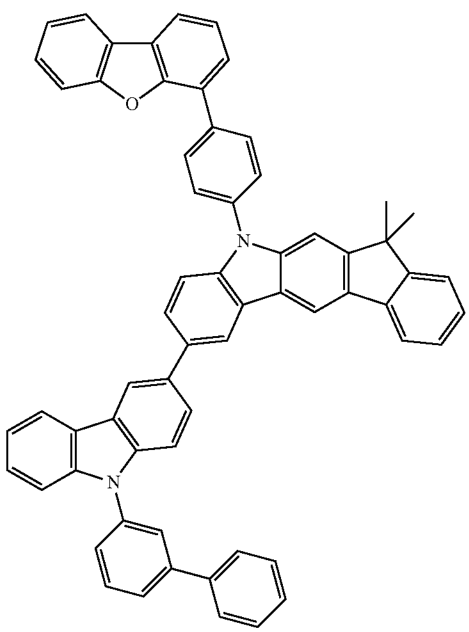
-continued
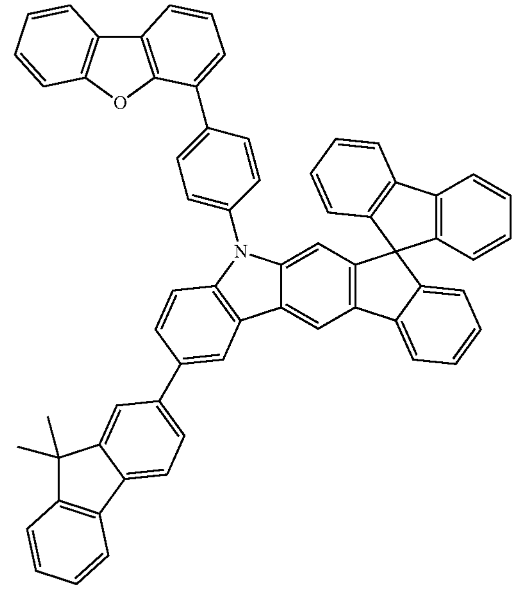
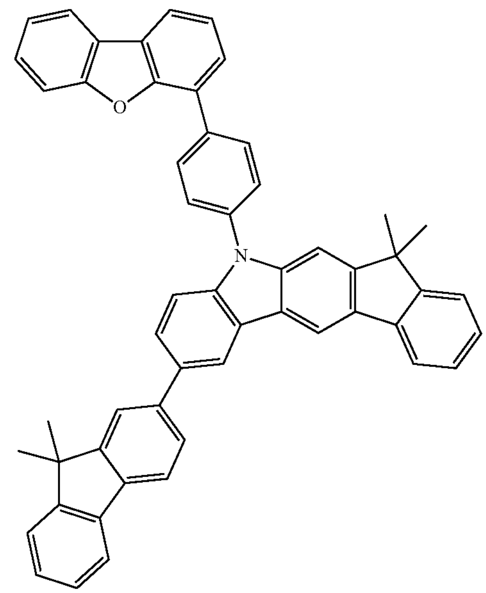
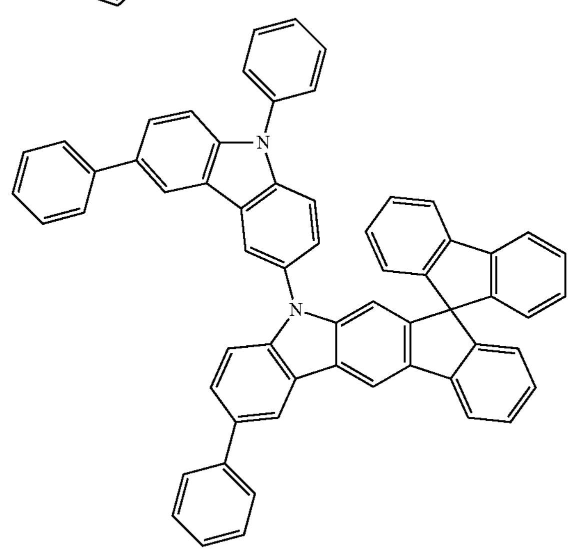

-continued
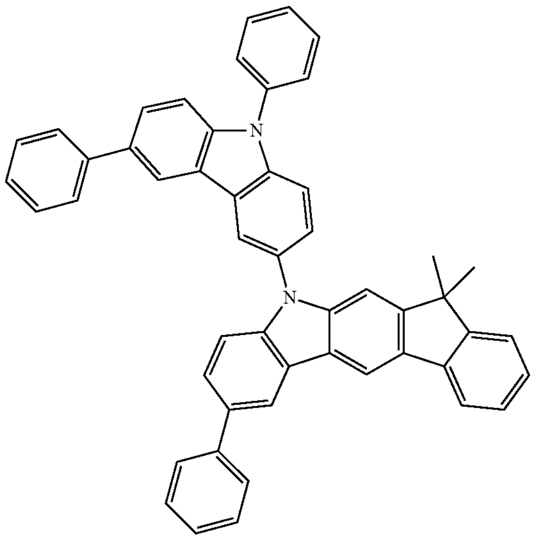
-continued
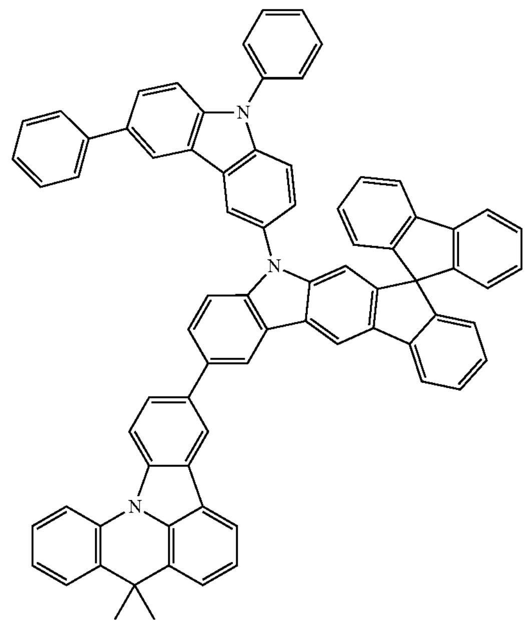
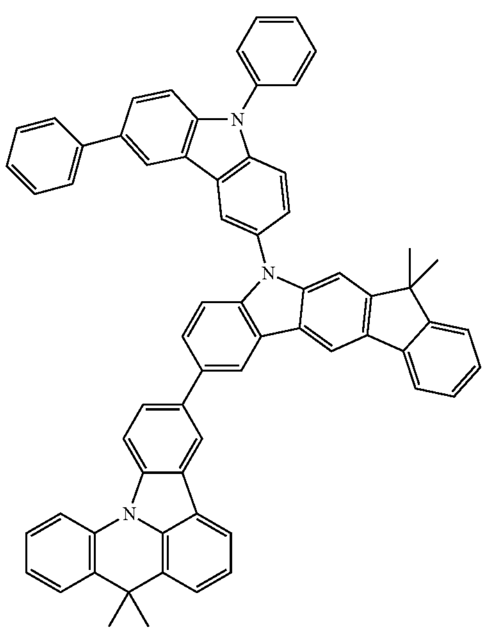
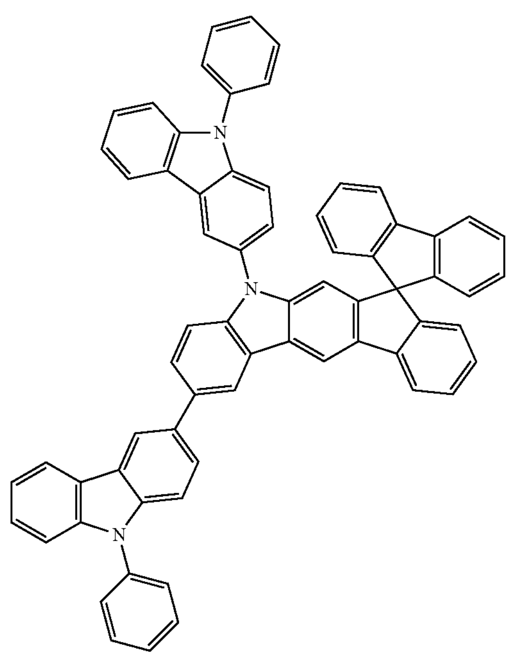

-continued
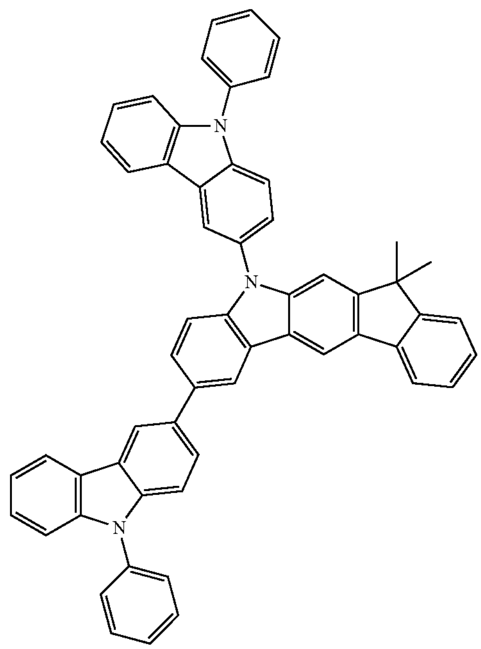
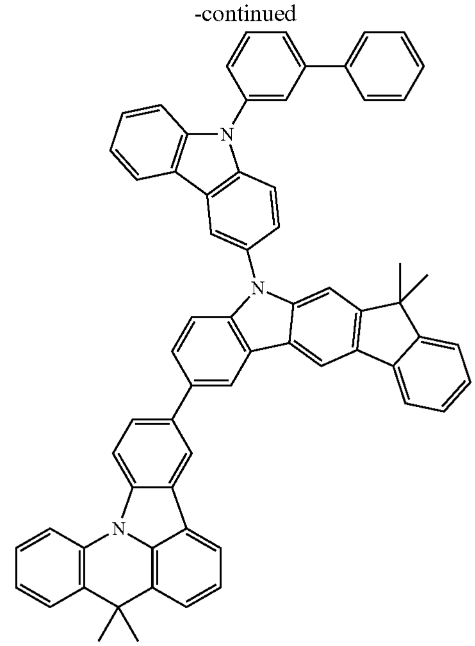
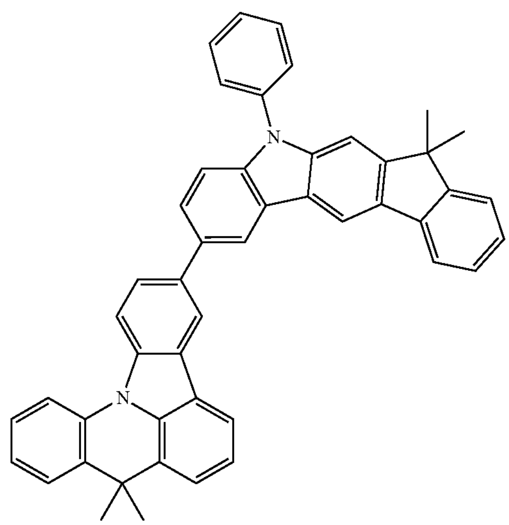
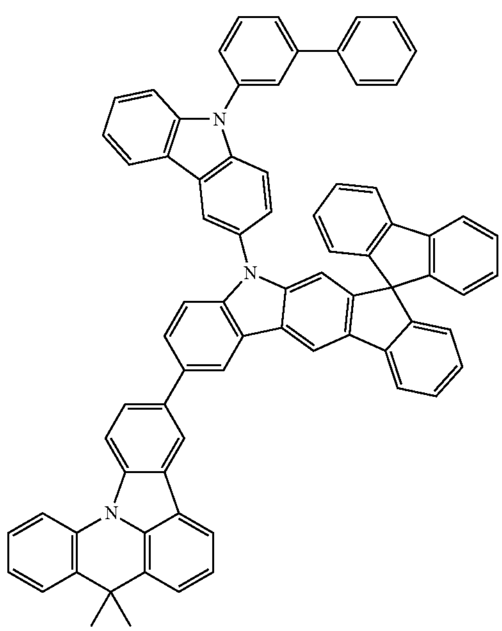
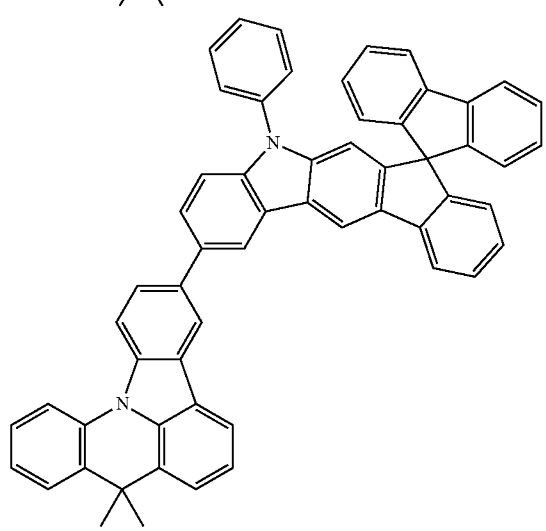

-continued
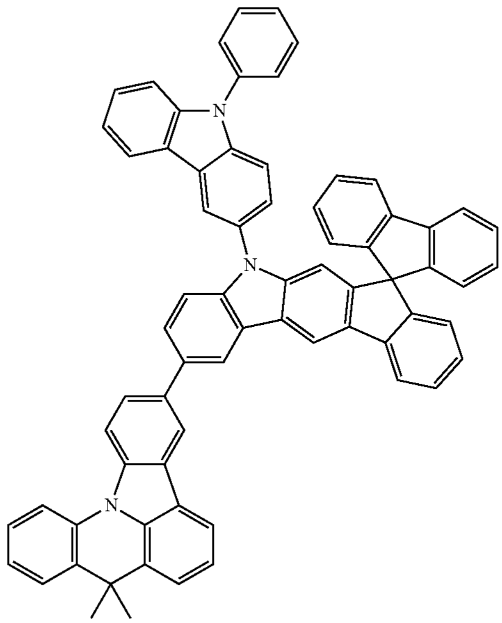
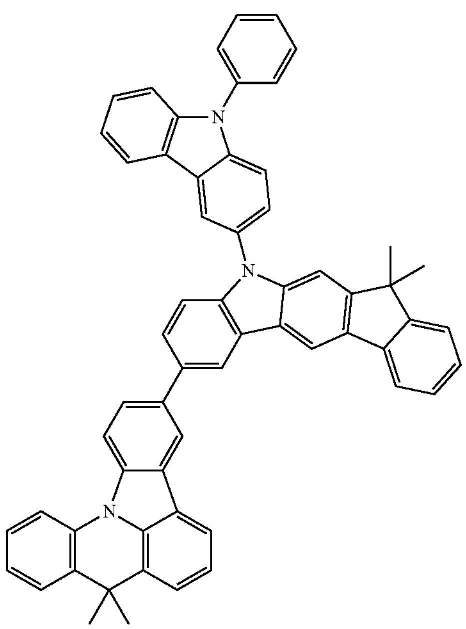
Examples of carbazole derivatives which can be used as hole- or electron-transporting matrix materials according to the substitution pattern are the following compounds:
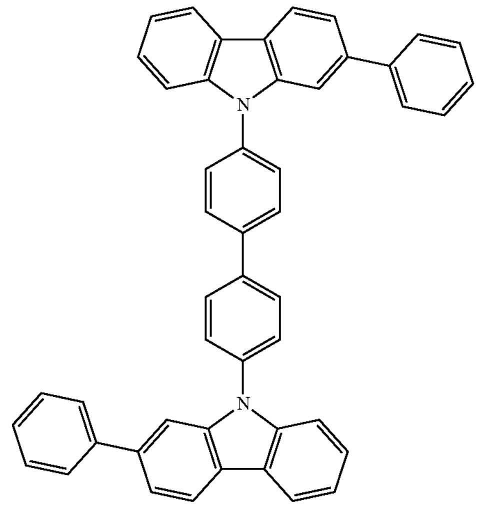
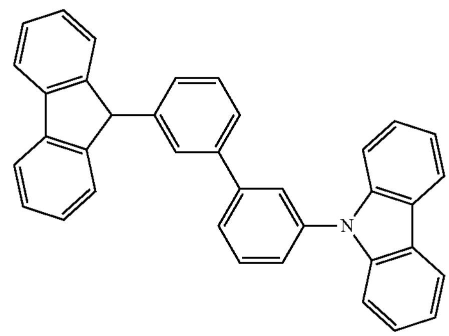
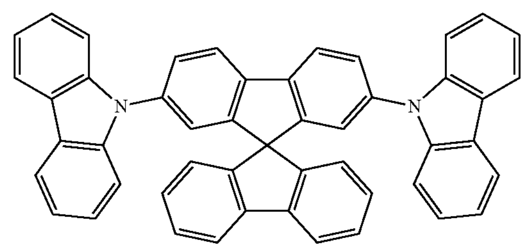
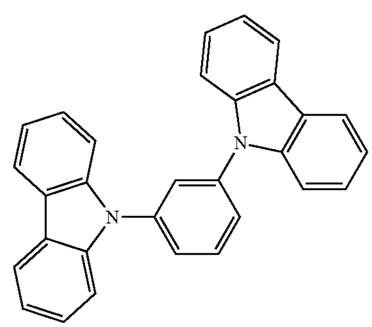
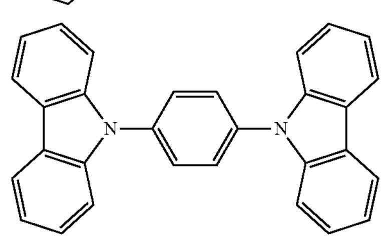

-continued
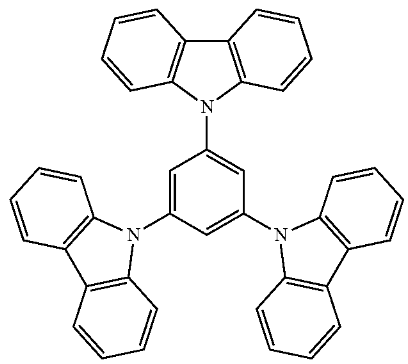
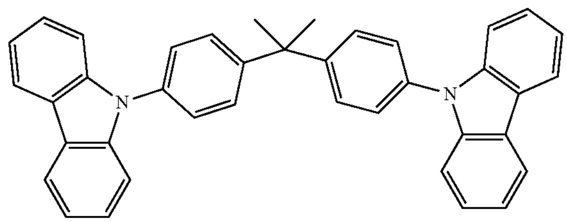
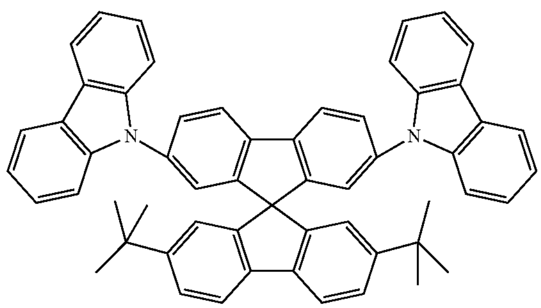
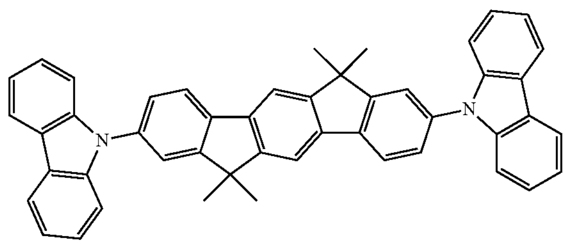
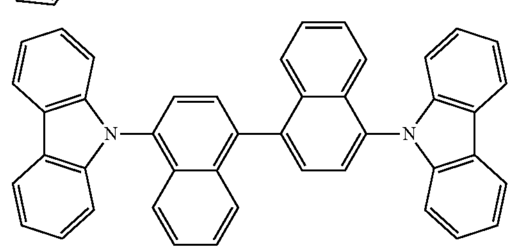
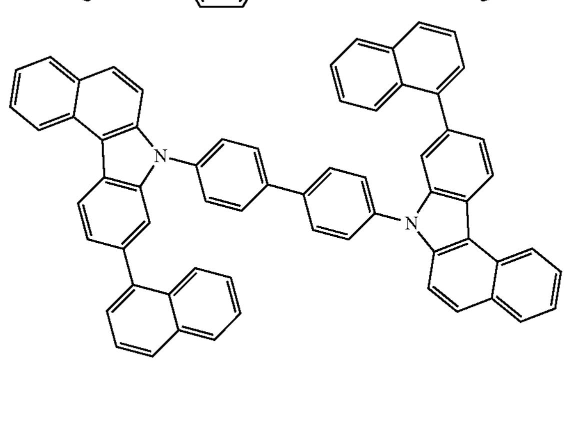
-continued
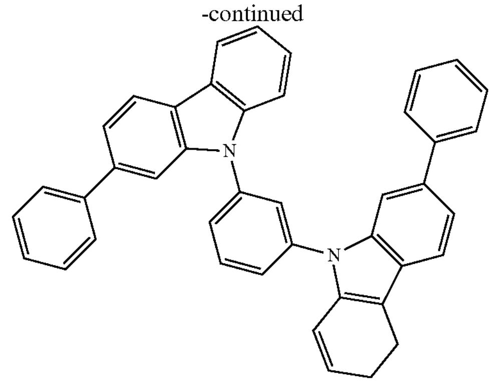
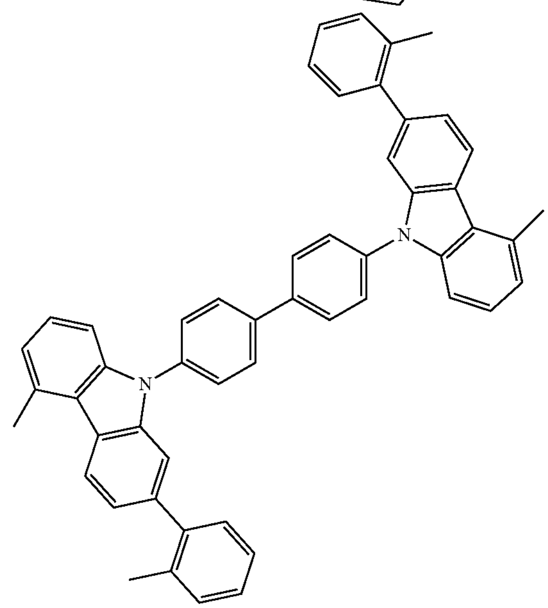
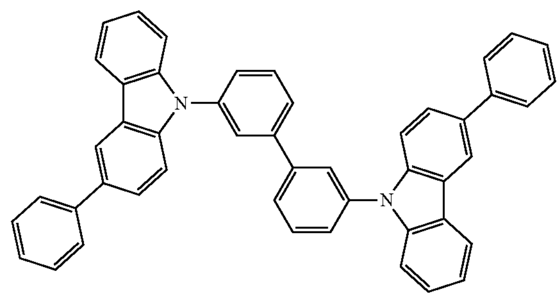
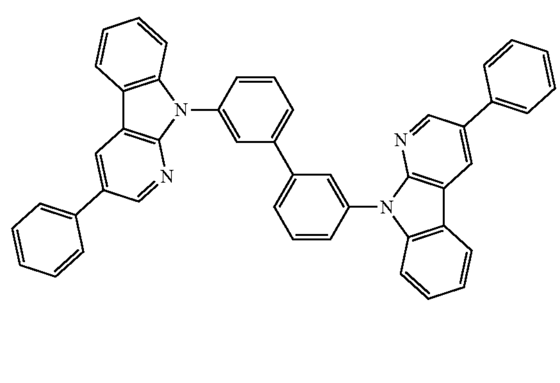

-continued
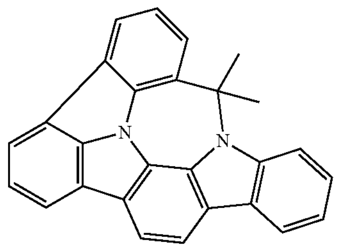
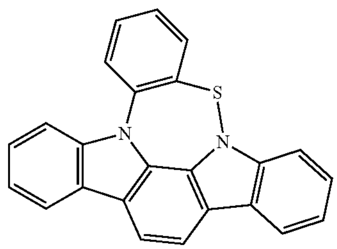
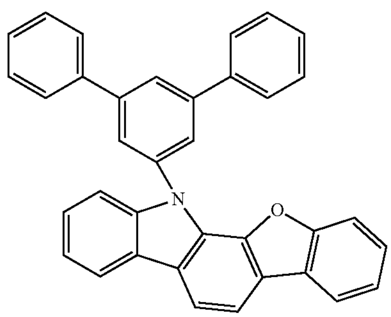
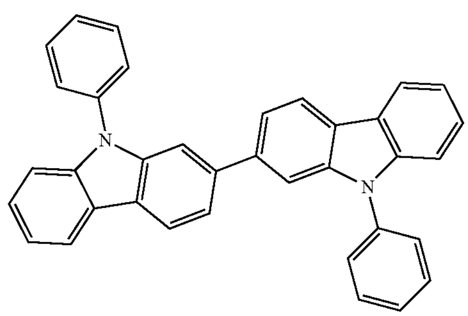
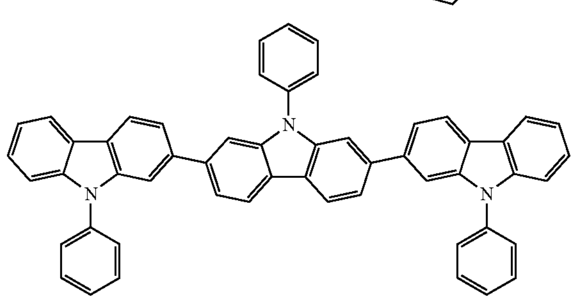
-continued
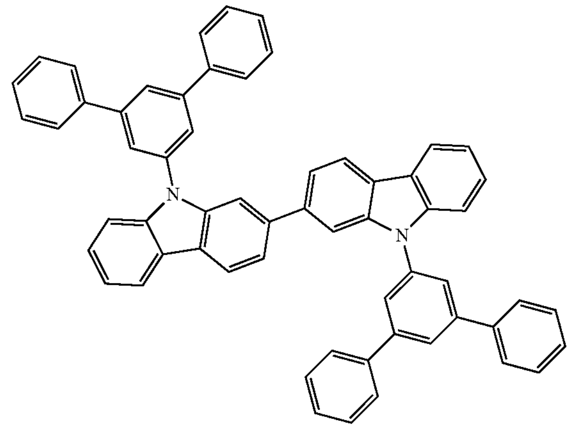
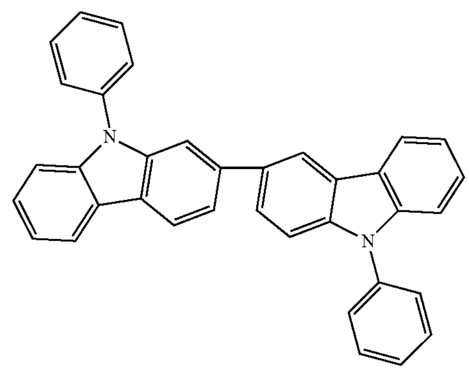
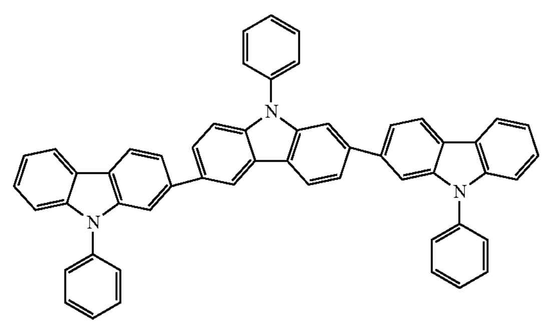
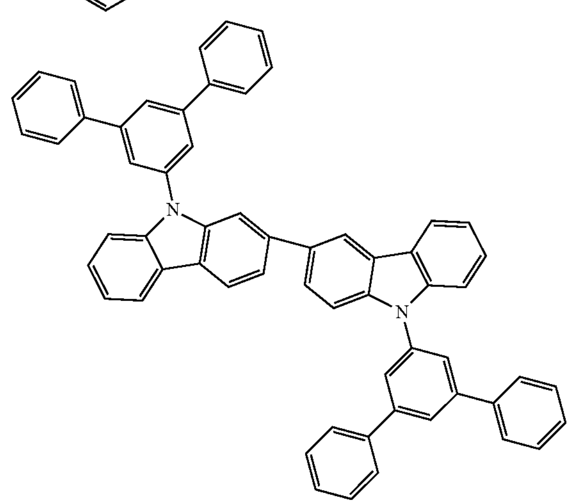

-continued
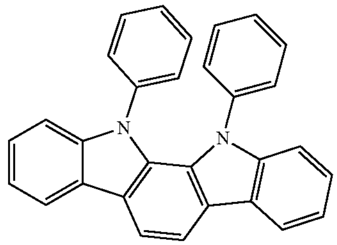
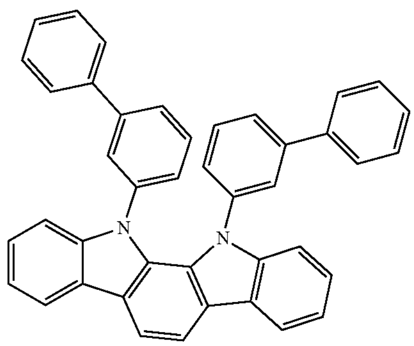
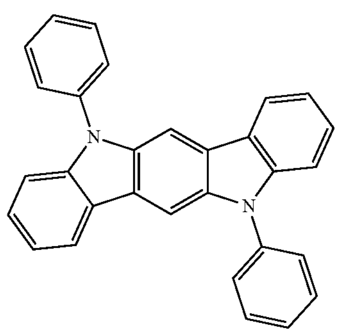
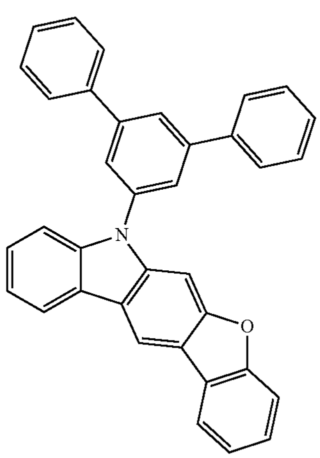
-continued
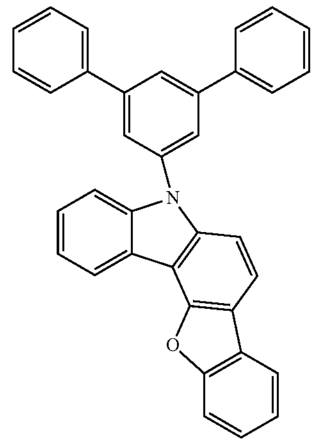
Examples of bridged carbazole derivatives which can be used as hole-transporting matrix materials are the following compounds:
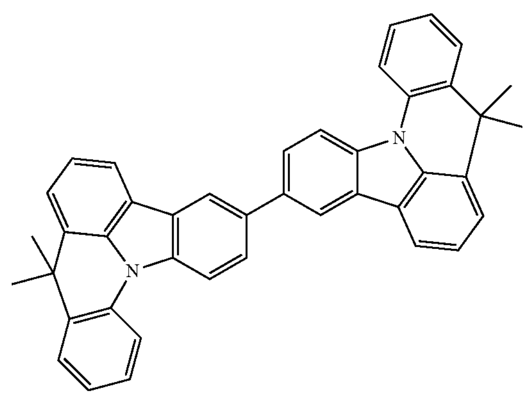
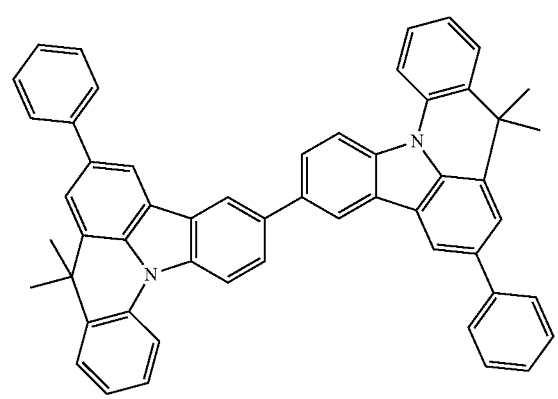

-continued
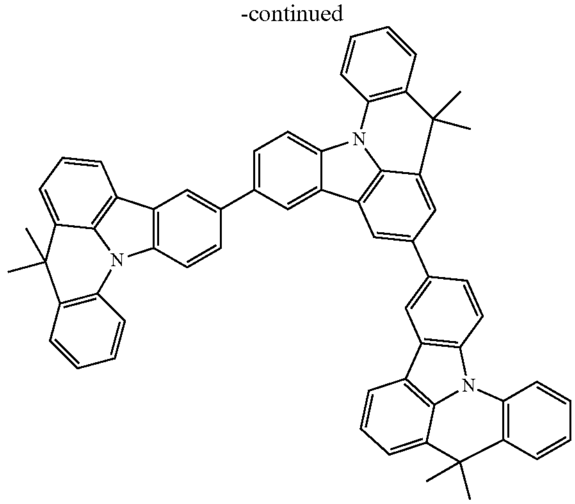
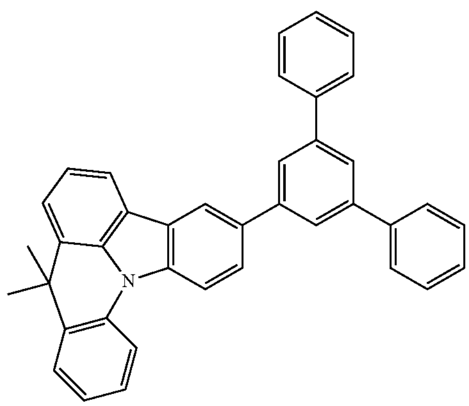
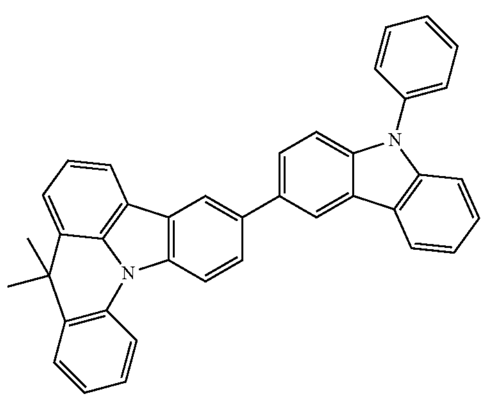
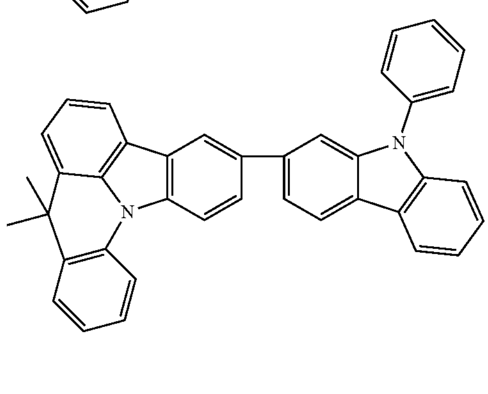
-continued
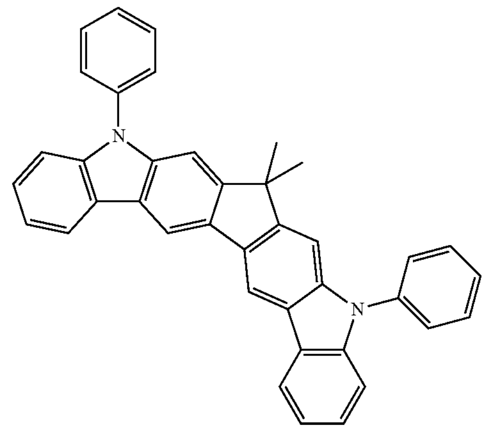
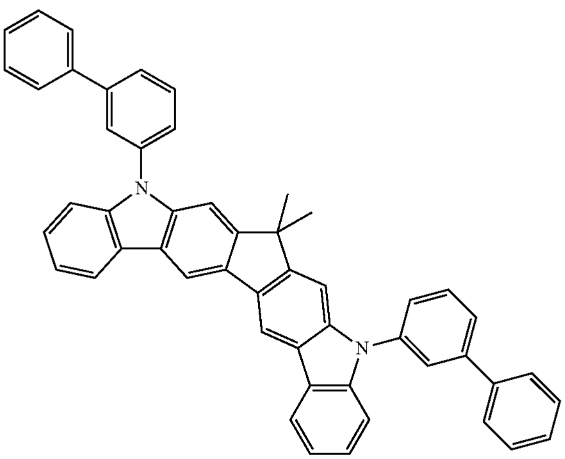
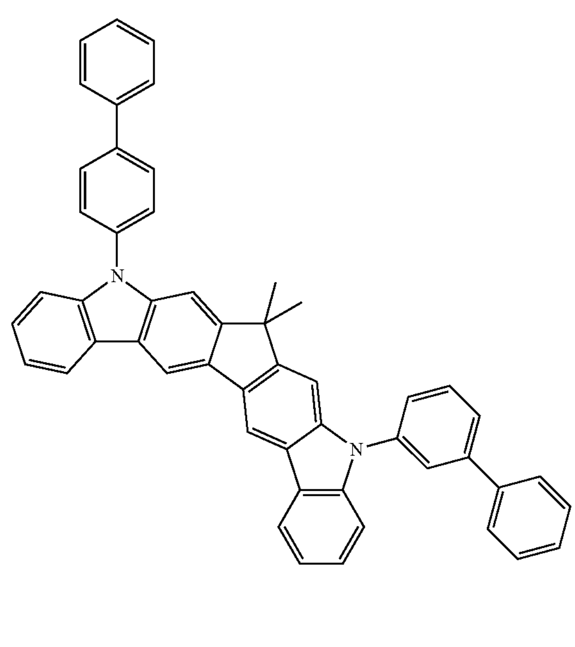

-continued
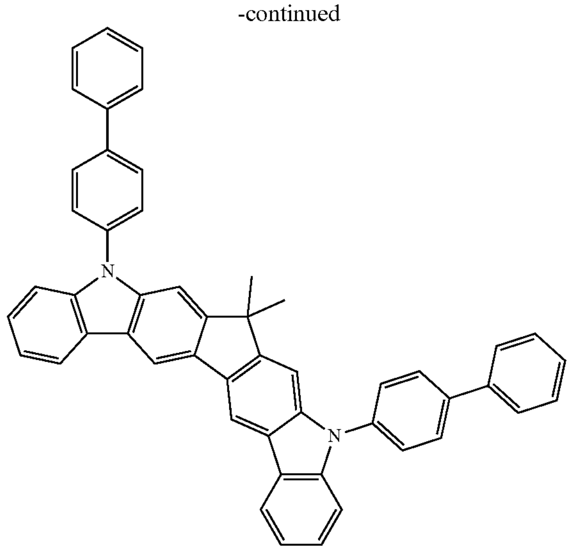
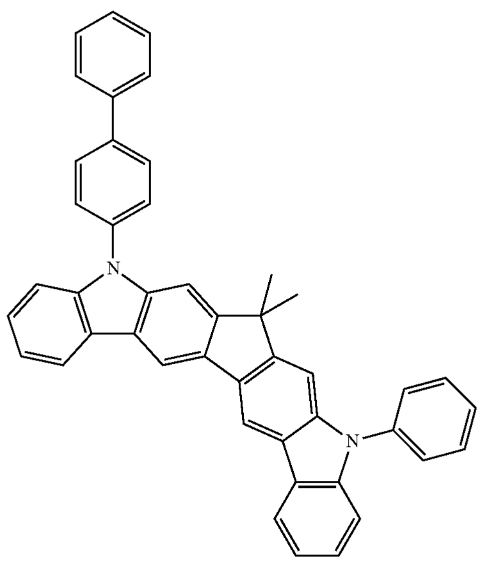
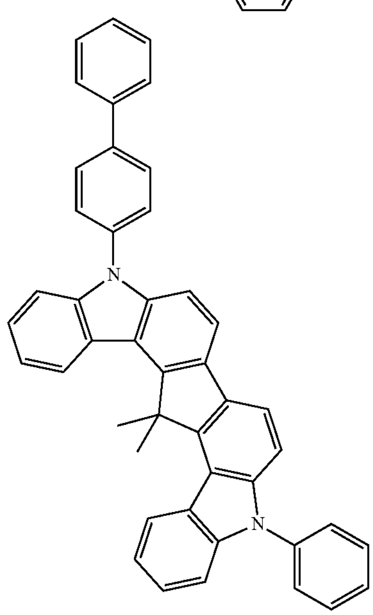
-continued
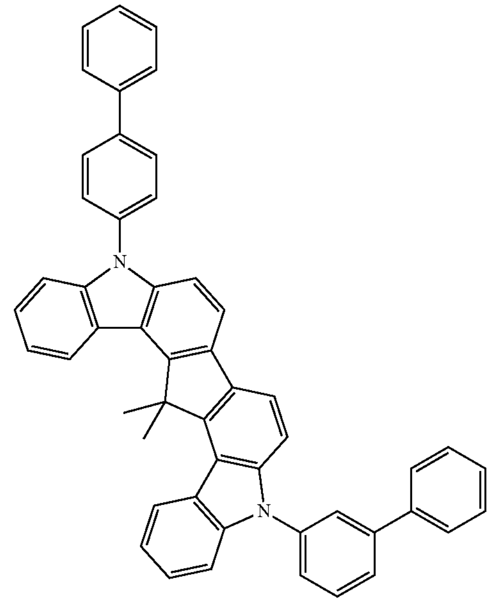
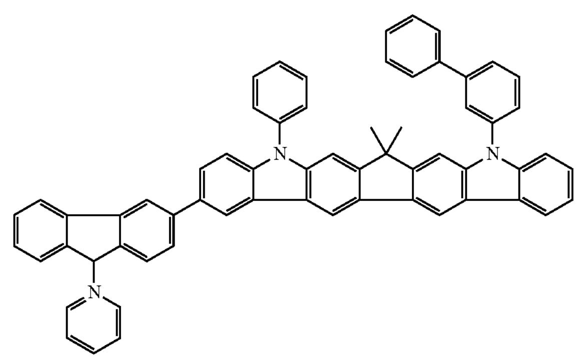
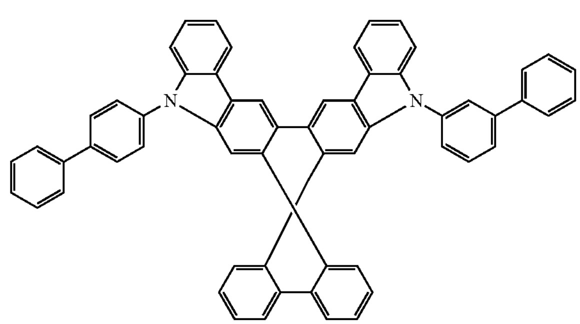
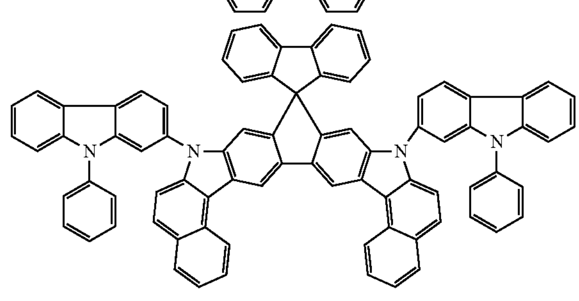

-continued
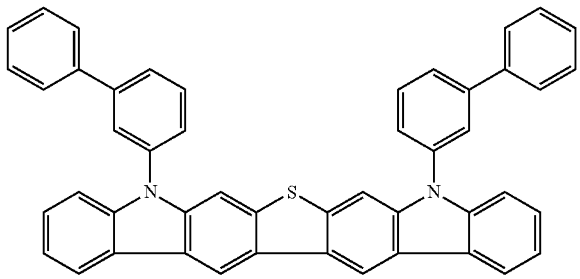
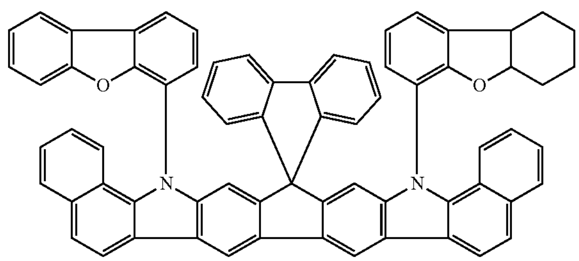
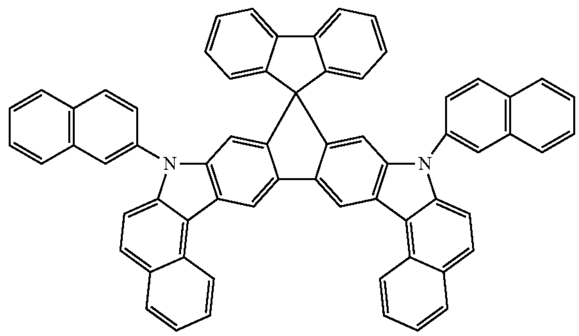
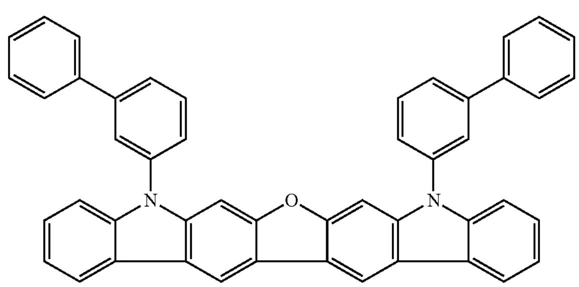
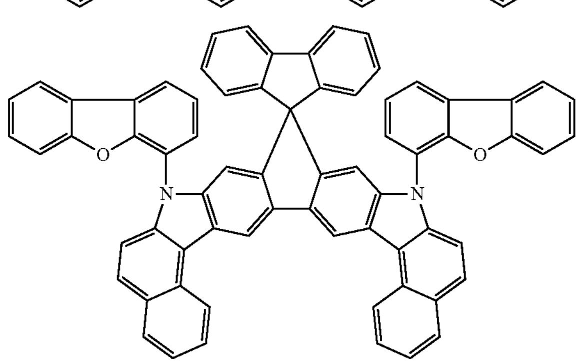
-continued
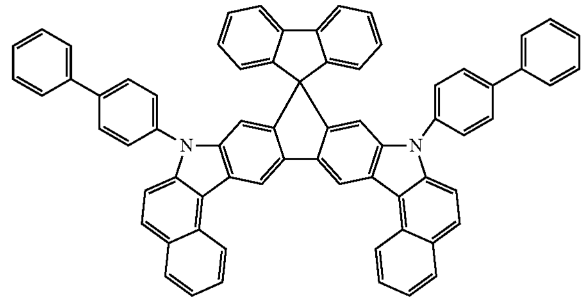
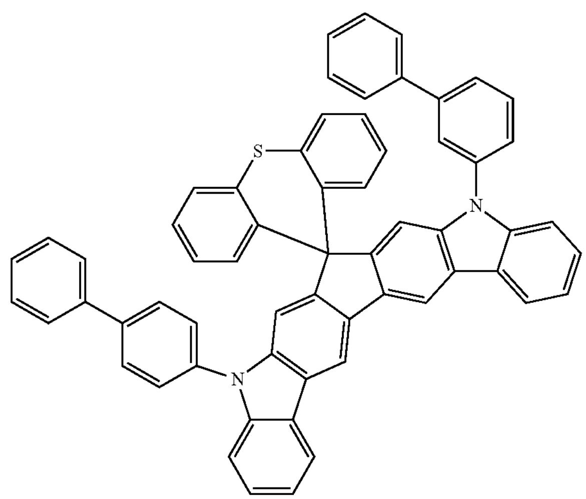
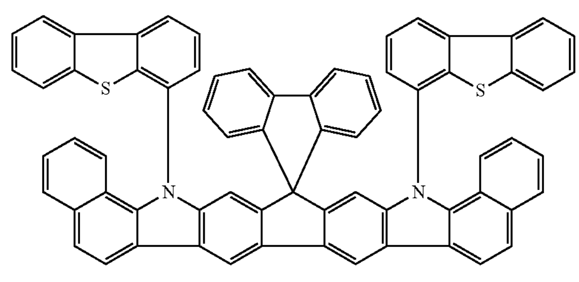
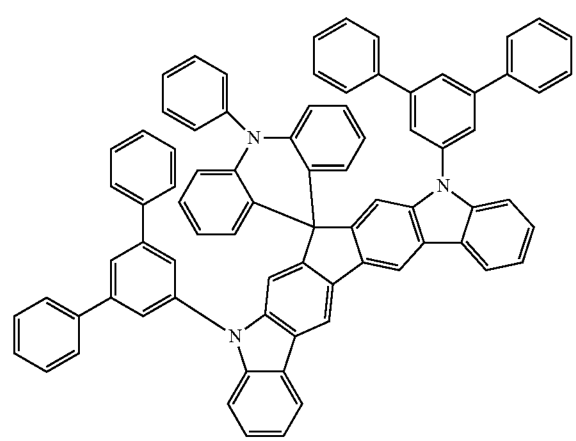

-continued
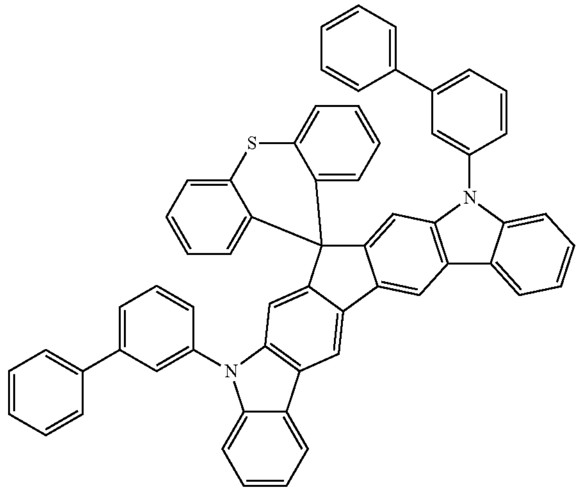
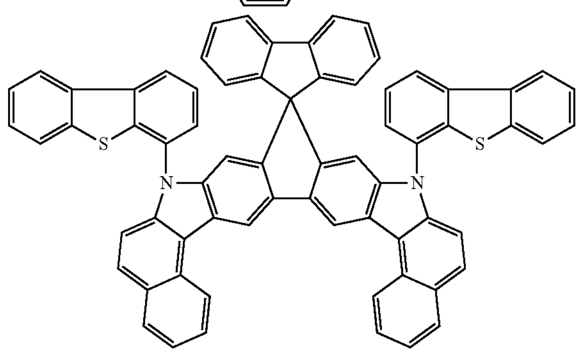
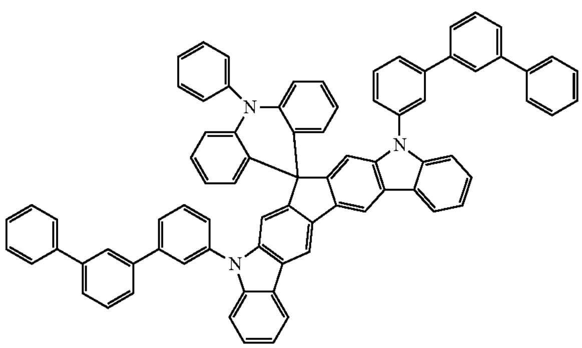
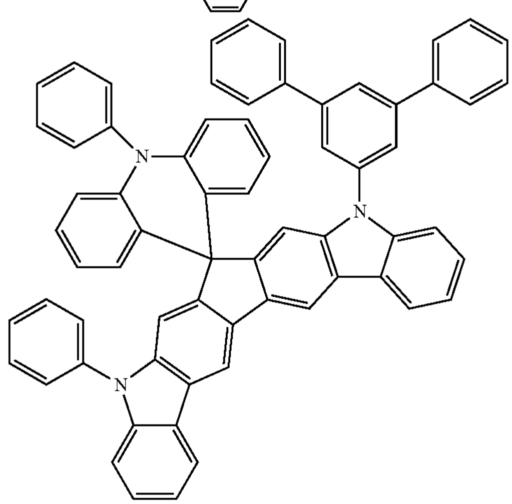
-continued
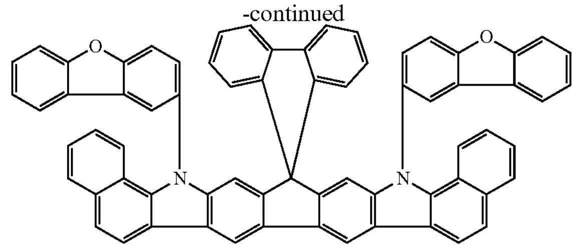
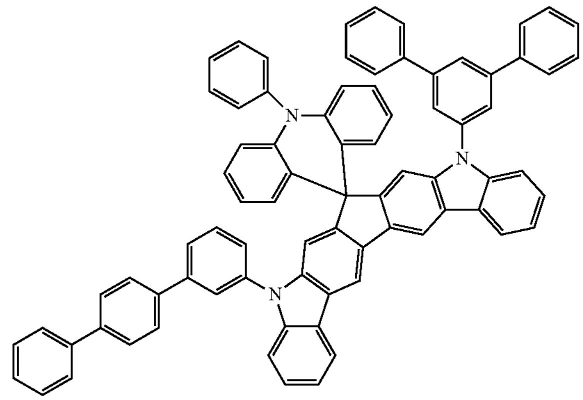
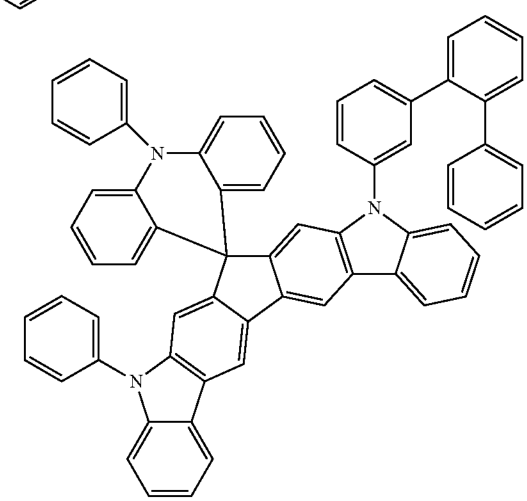
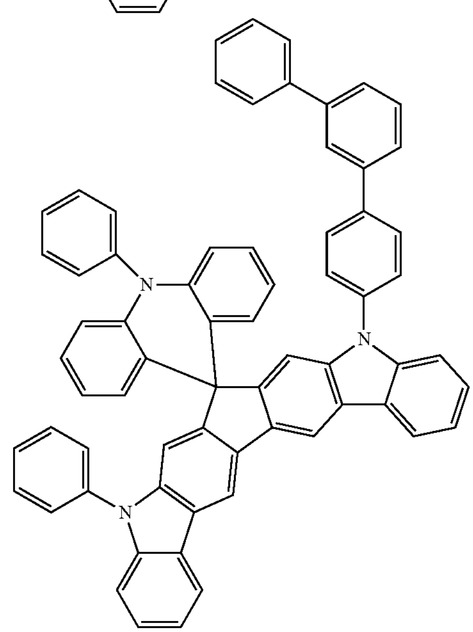

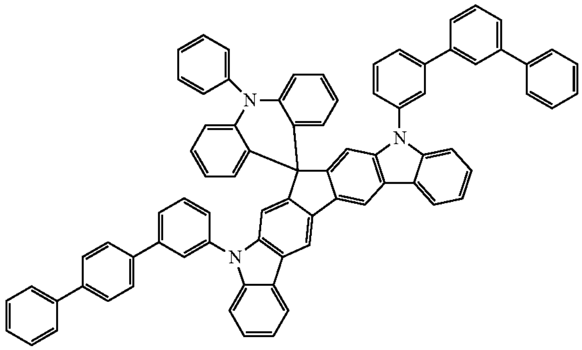
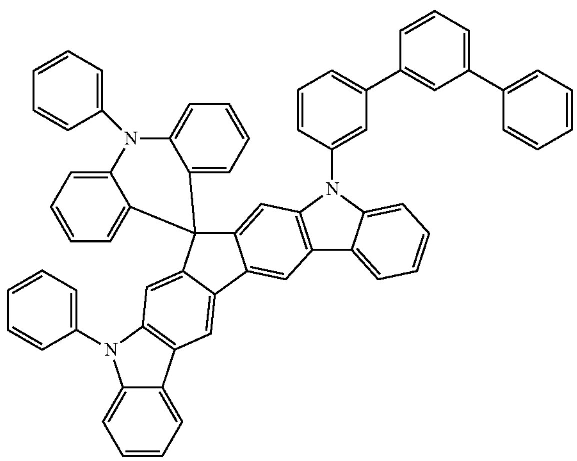
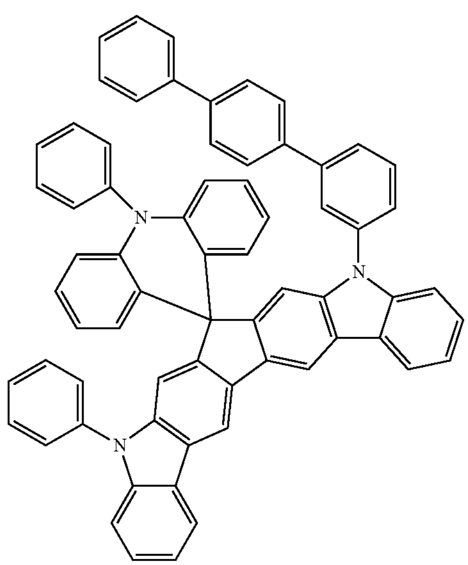
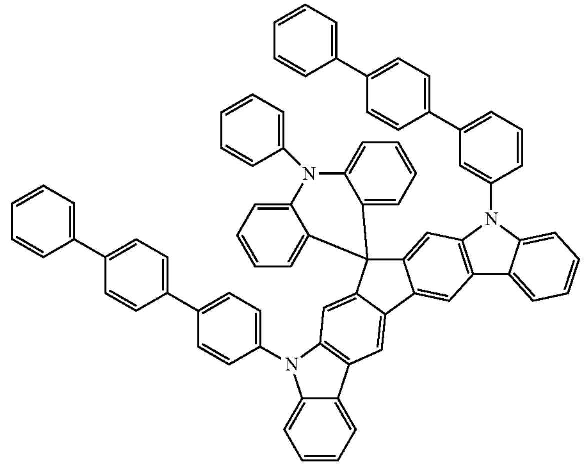
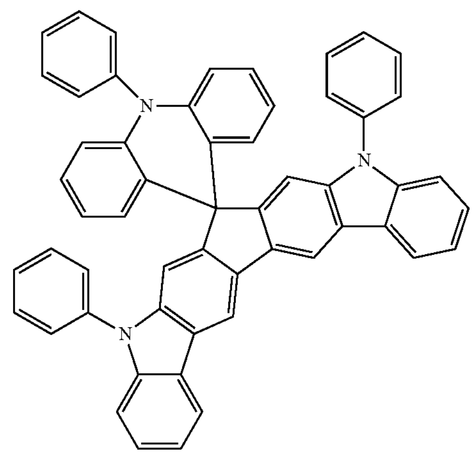
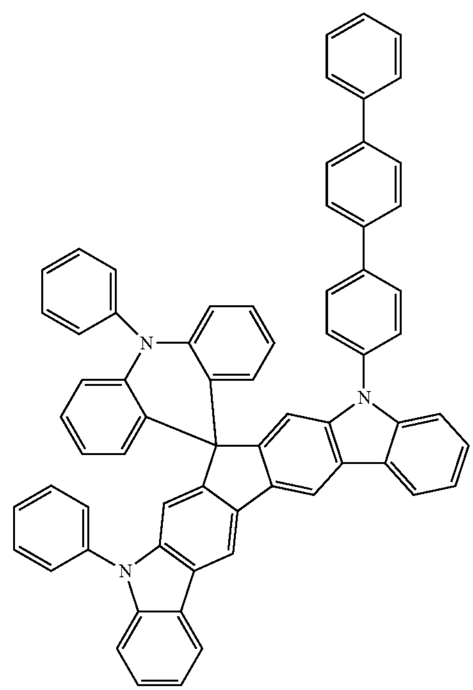

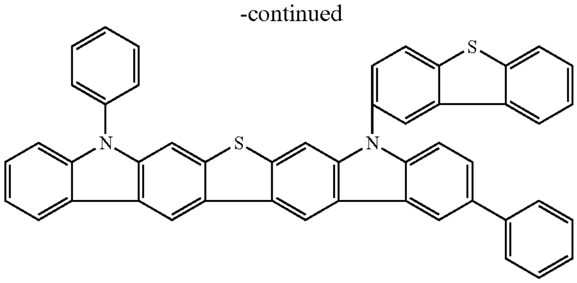
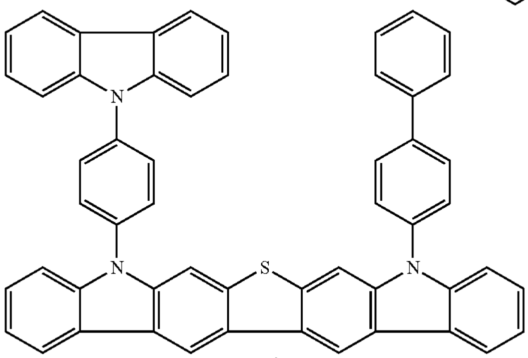
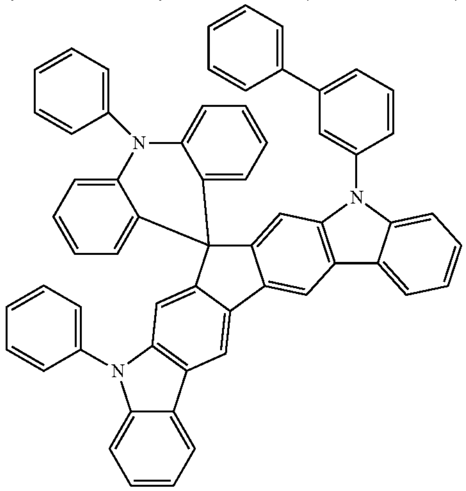
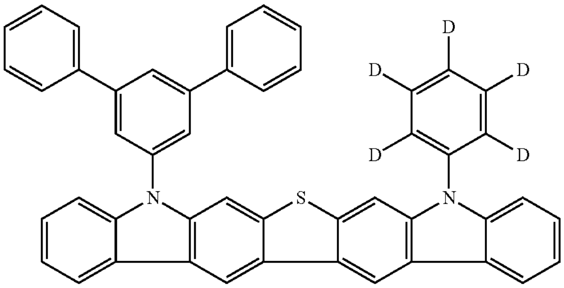
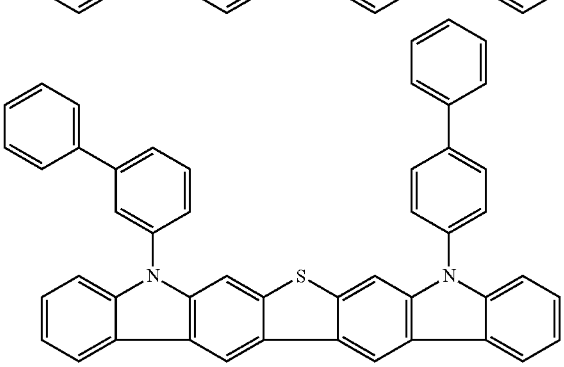
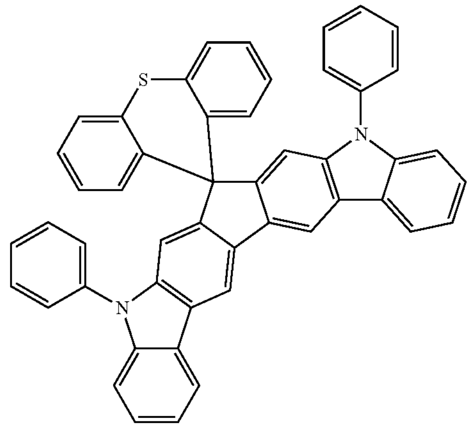
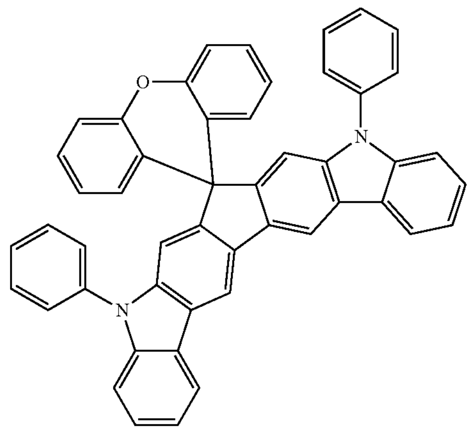
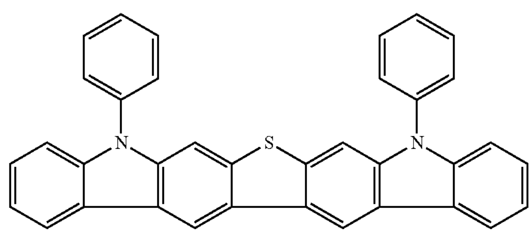
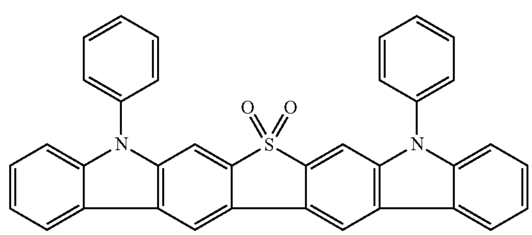

-continued
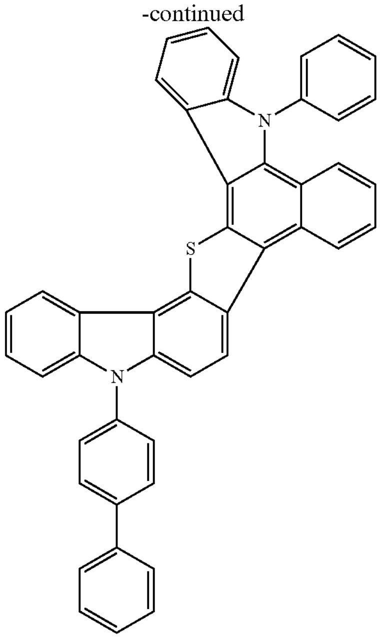
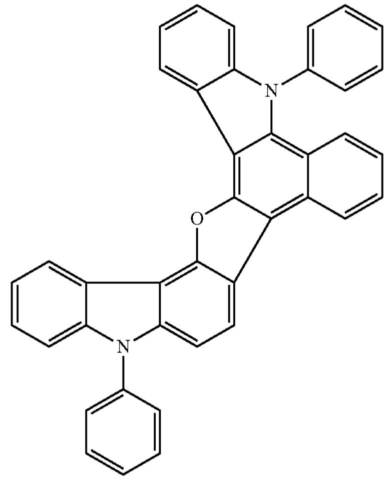
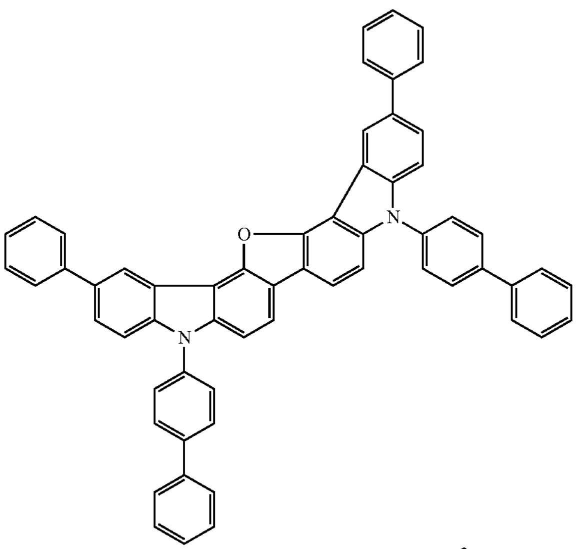
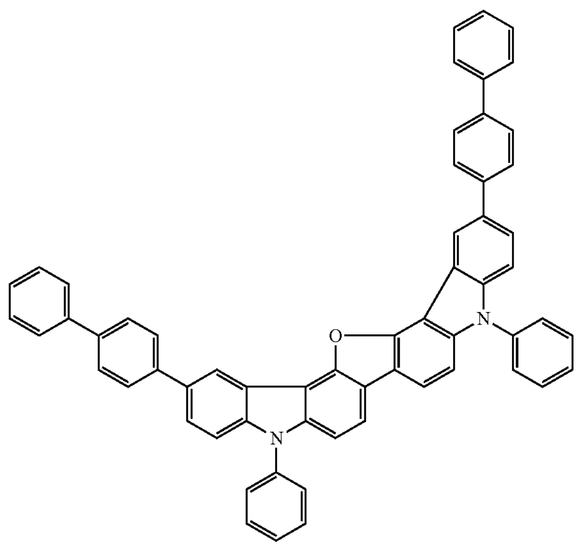
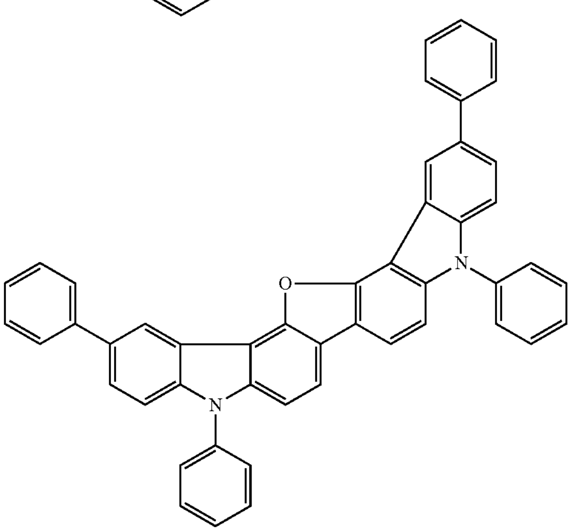
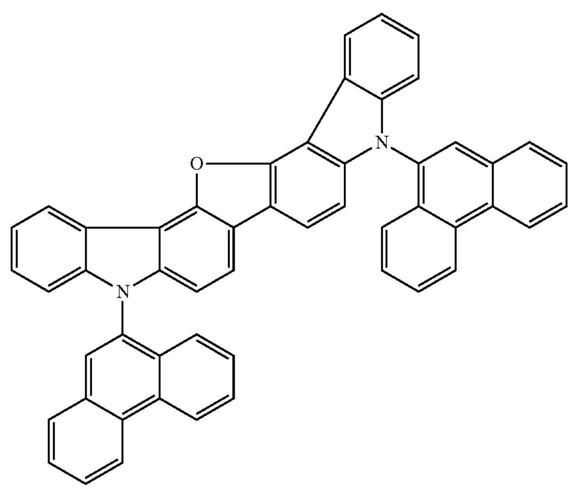
-continued -continued
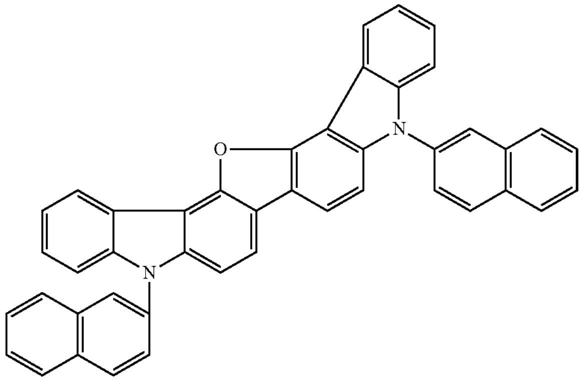
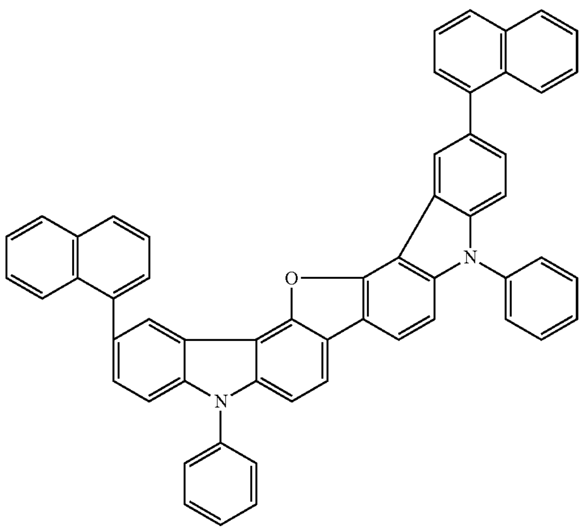
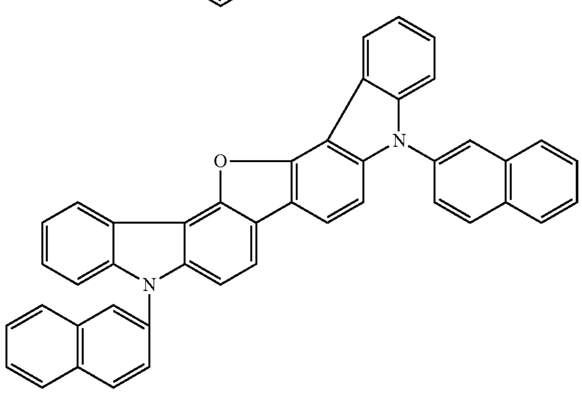
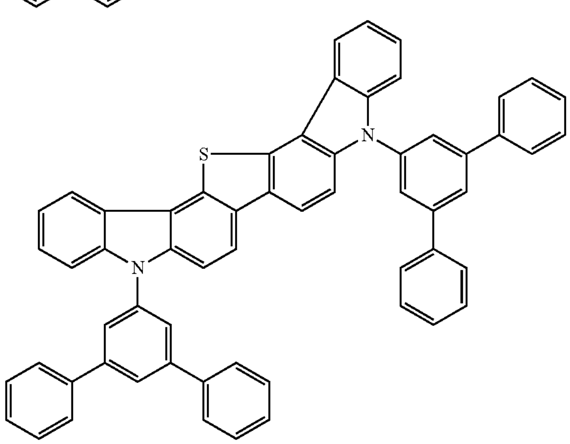
-continued
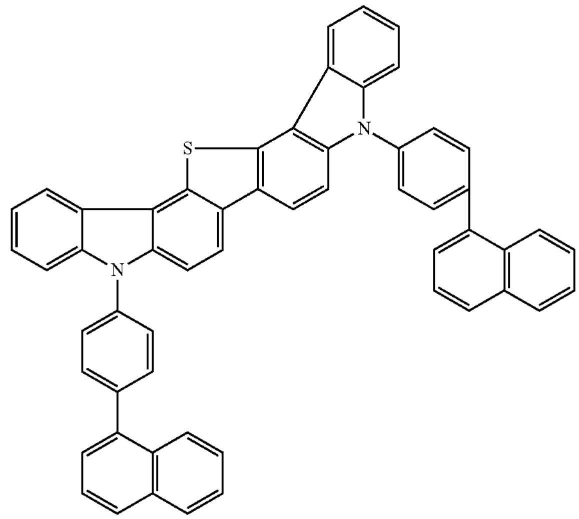
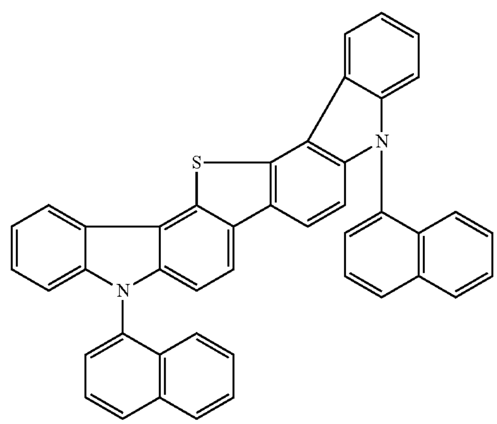
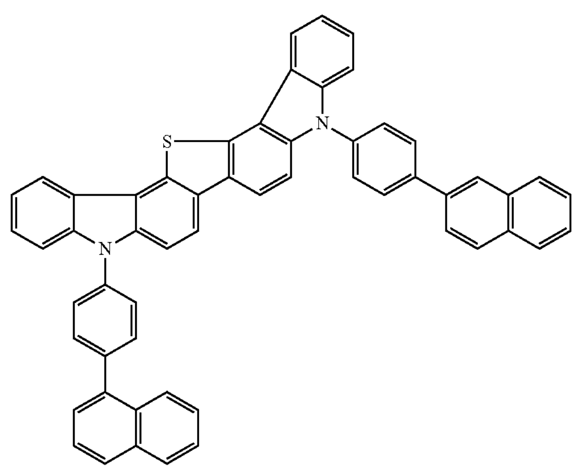

-continued
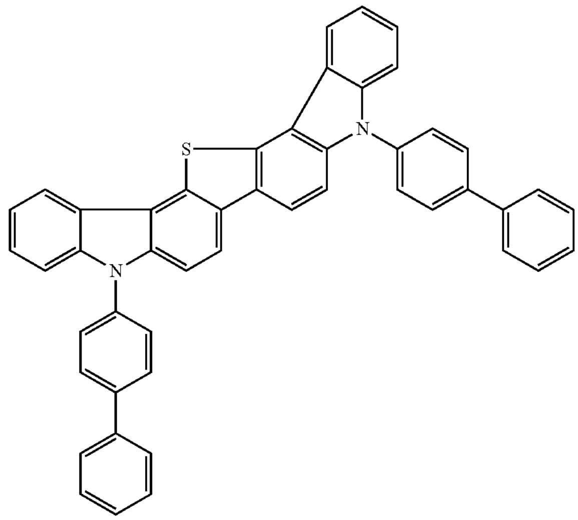
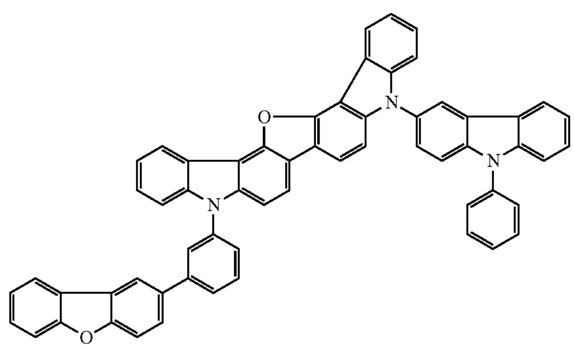
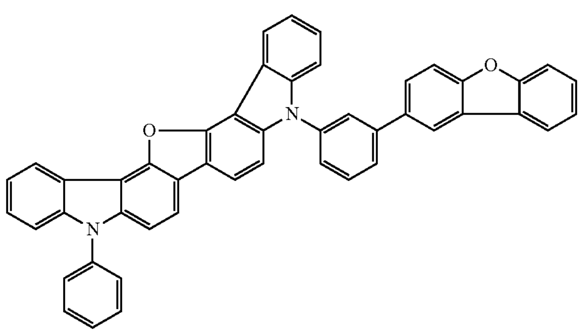
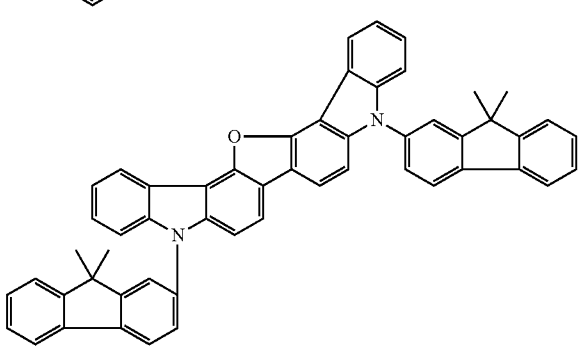
-continued
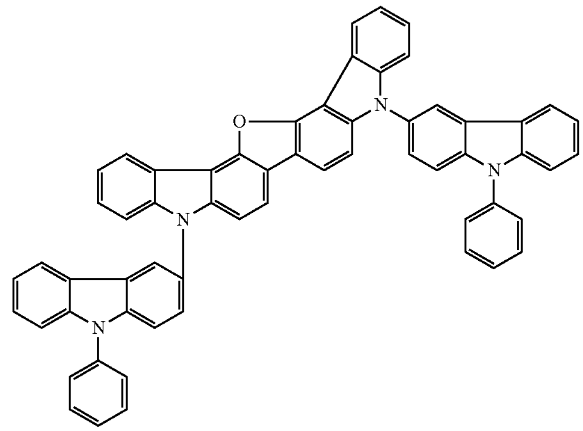
Examples of biscarbazoles which can be used as hole-transporting matrix materials are the following compounds:
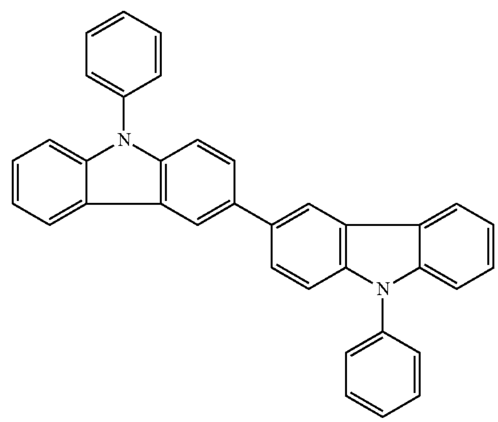
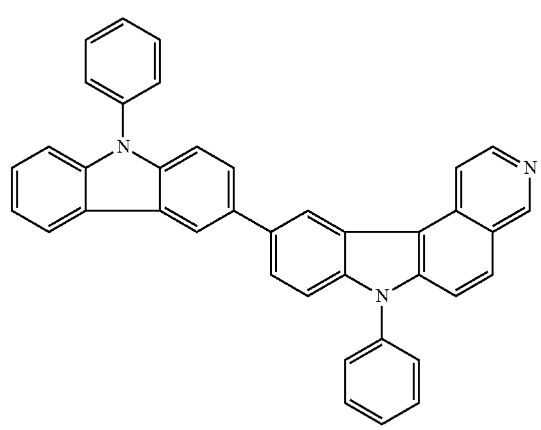

-continued
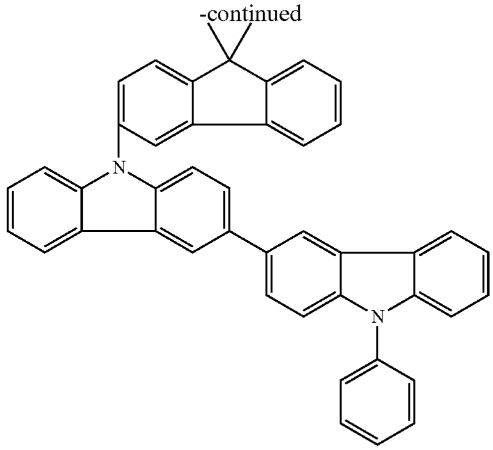
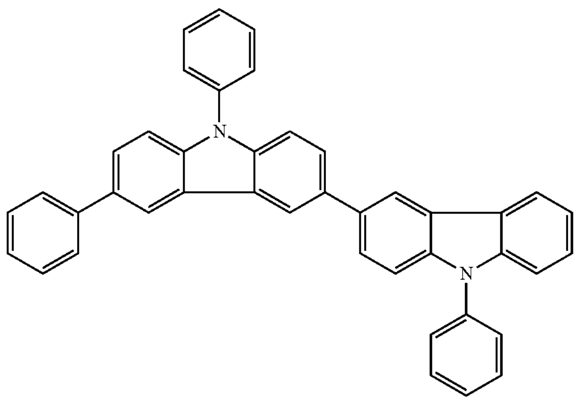
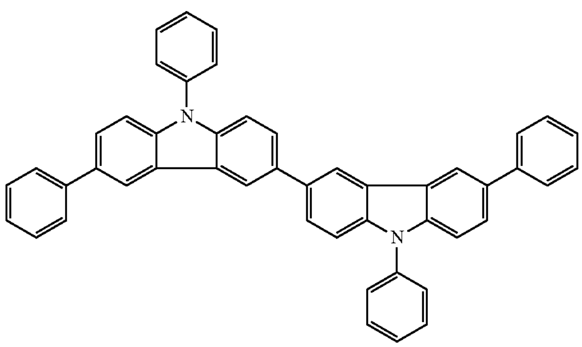
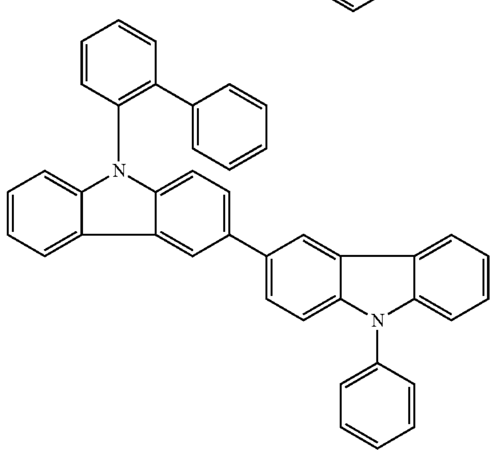
-continued
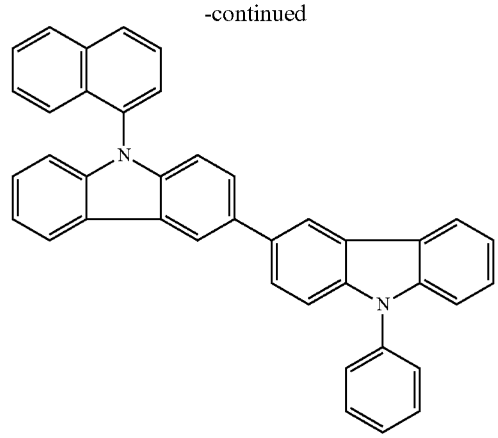
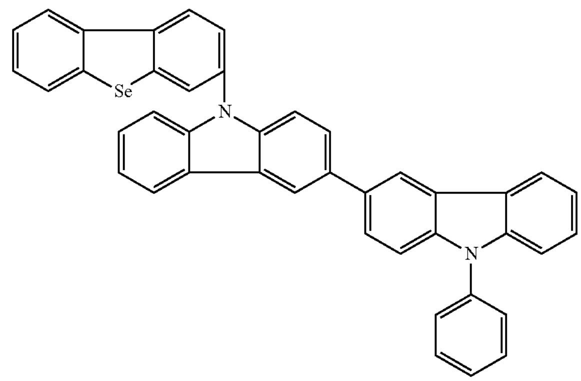
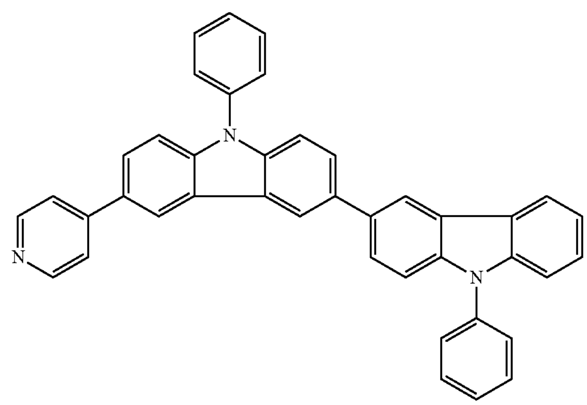
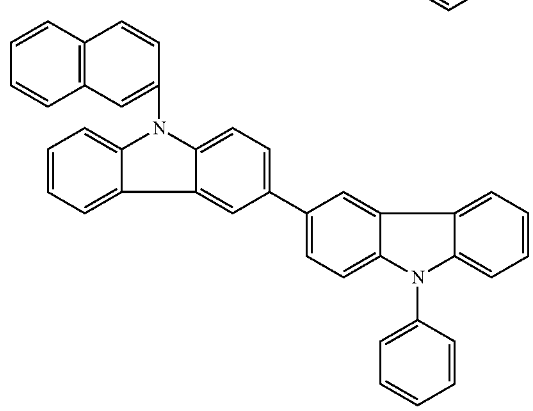

-continued
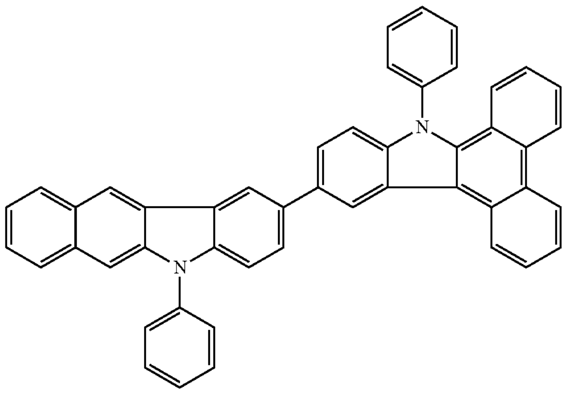
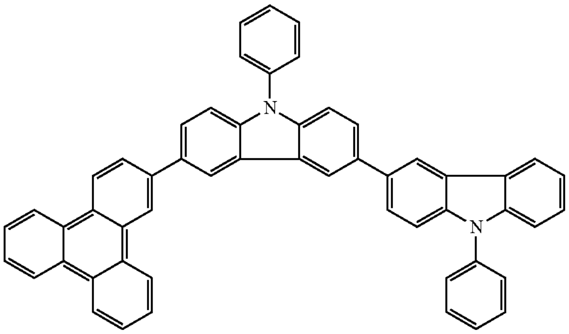
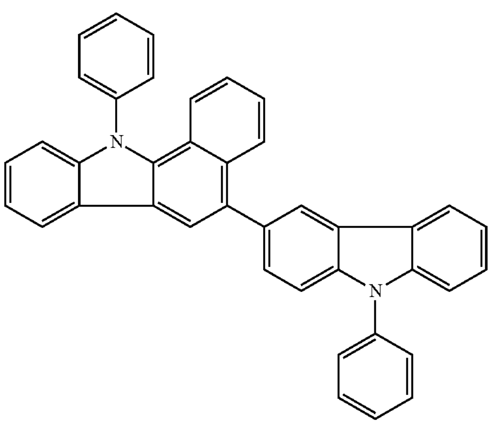
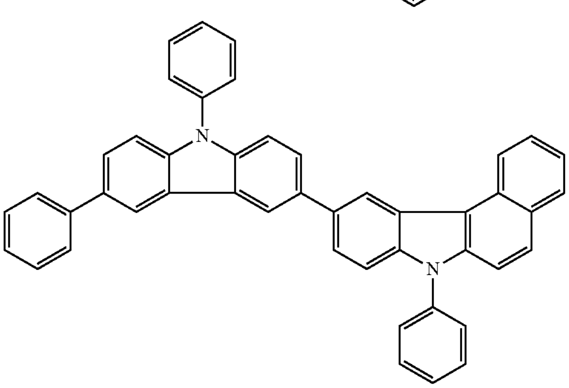
-continued
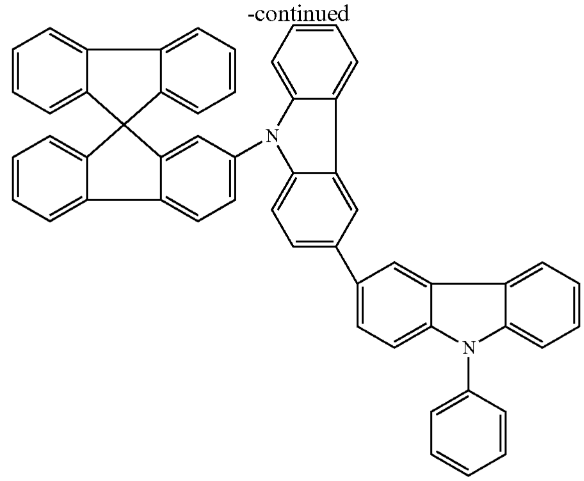
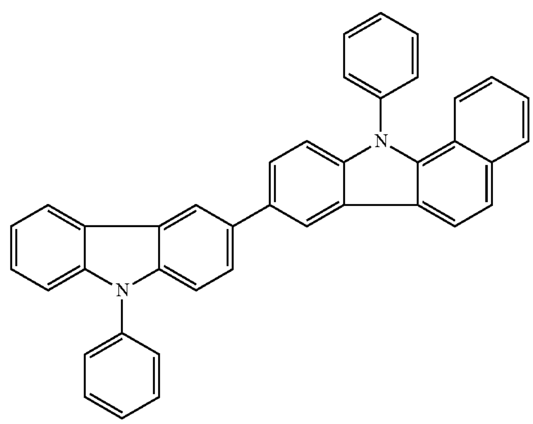
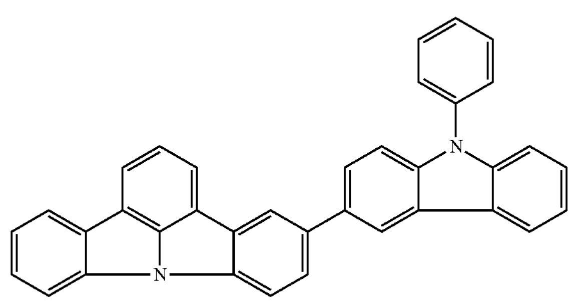

-continued
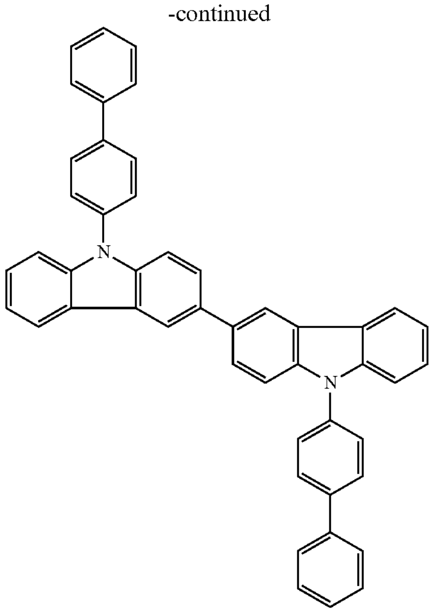
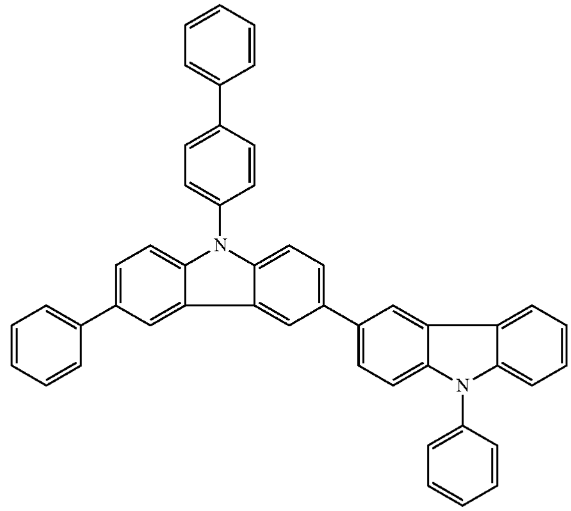
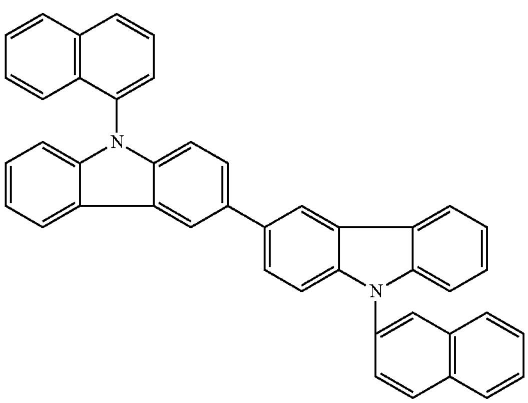
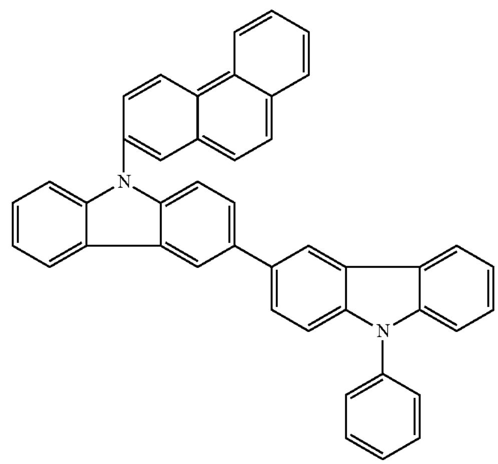
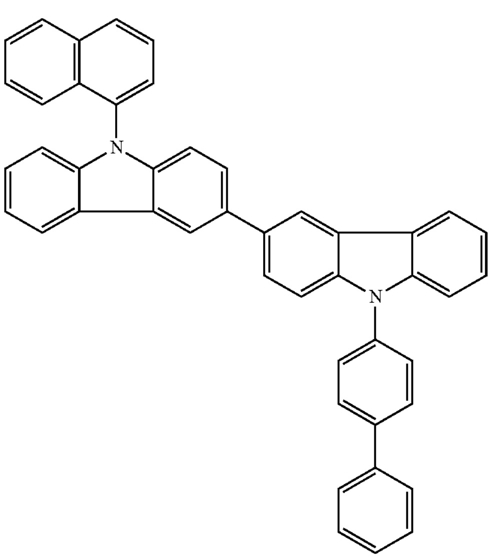
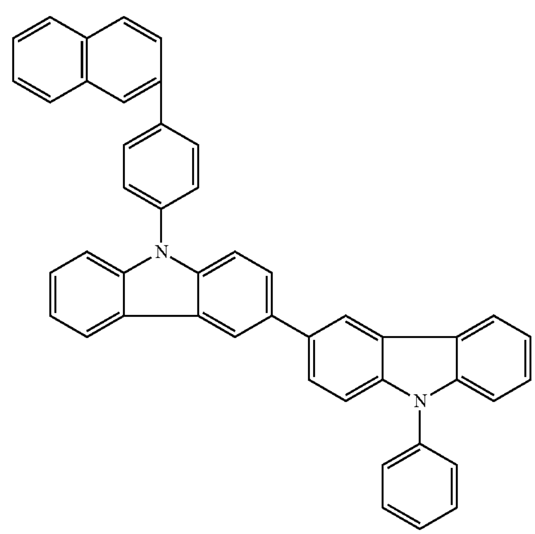

-continued
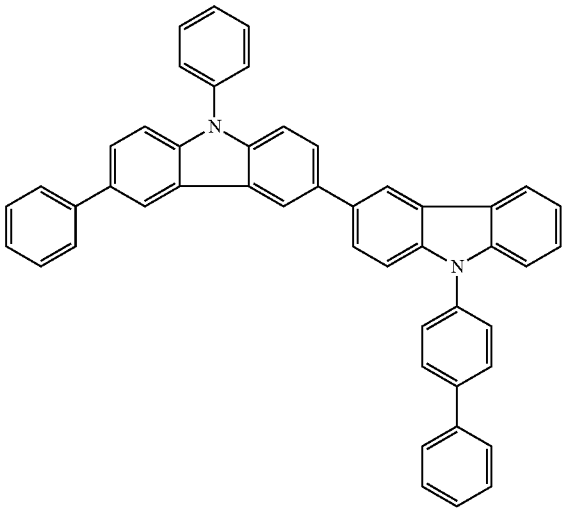
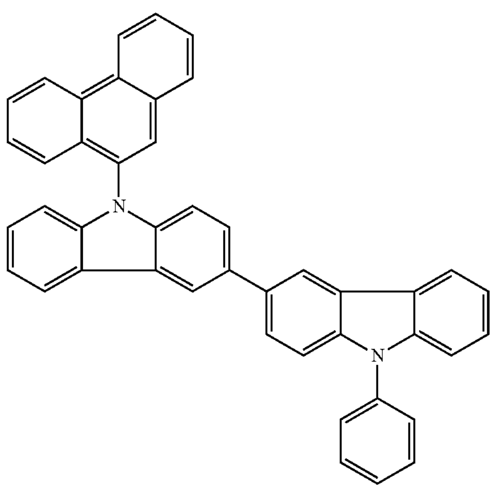
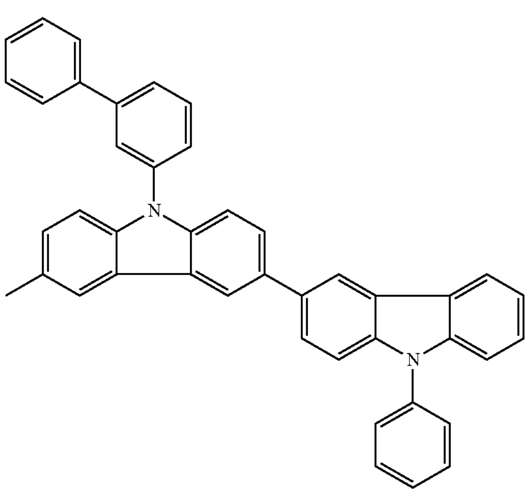
-continued
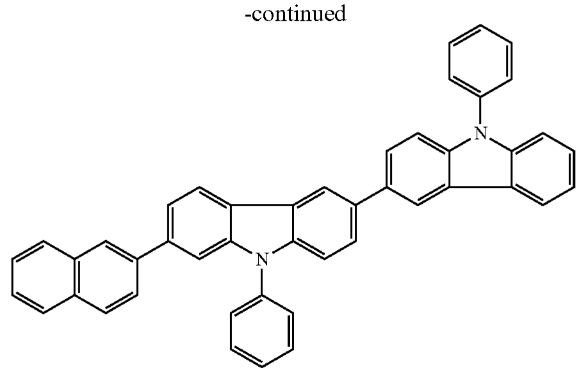
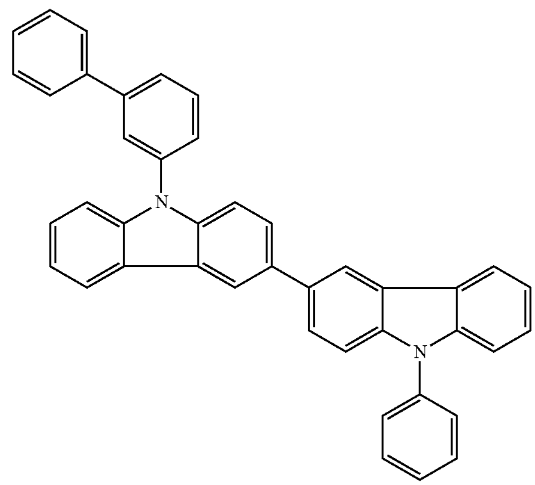
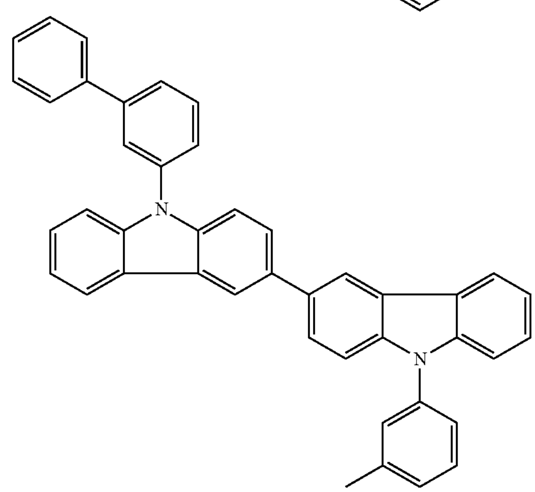
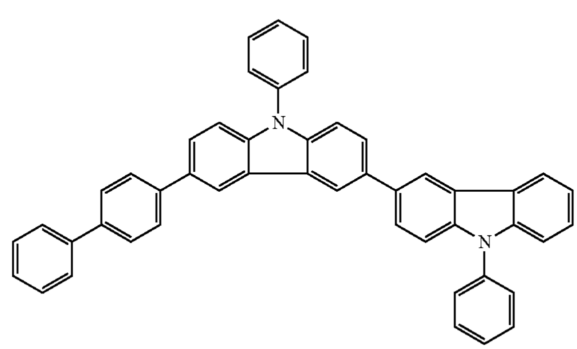

-continued
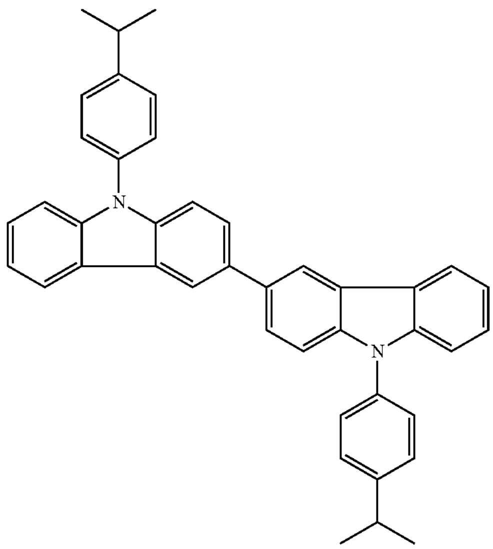
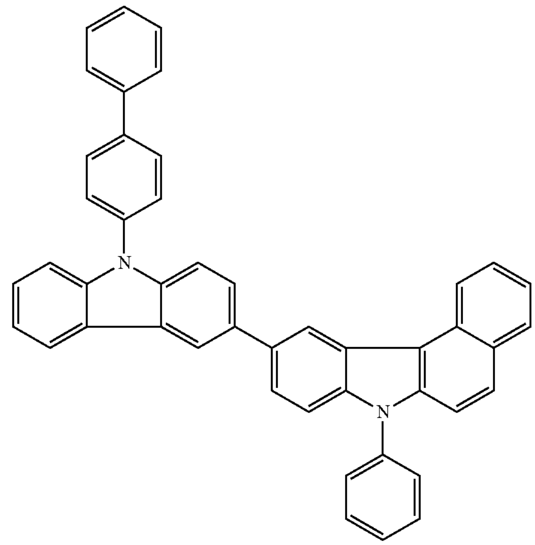
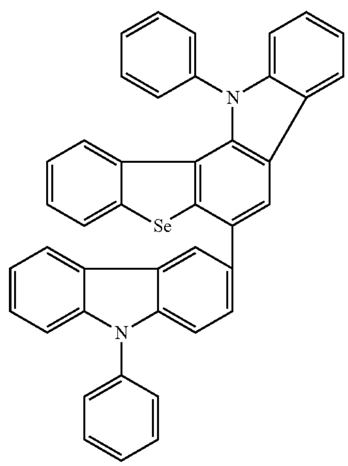
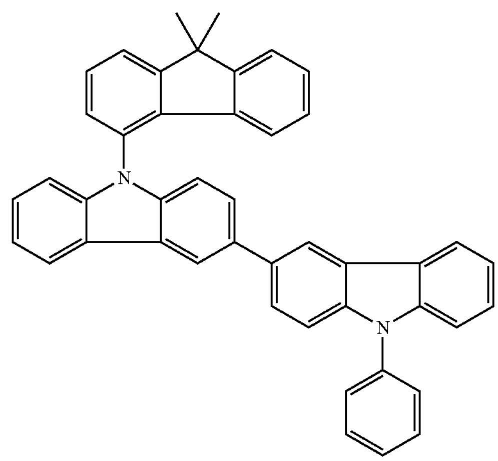
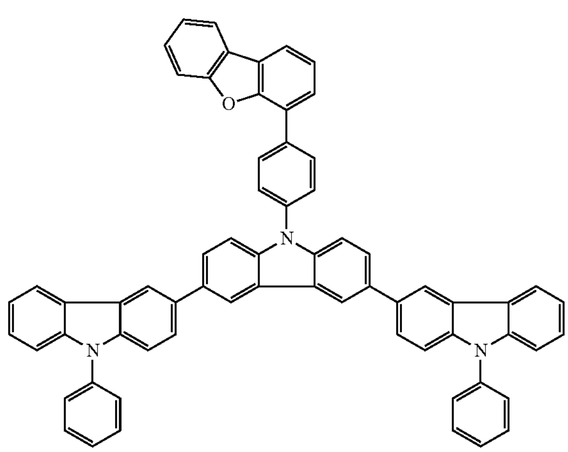
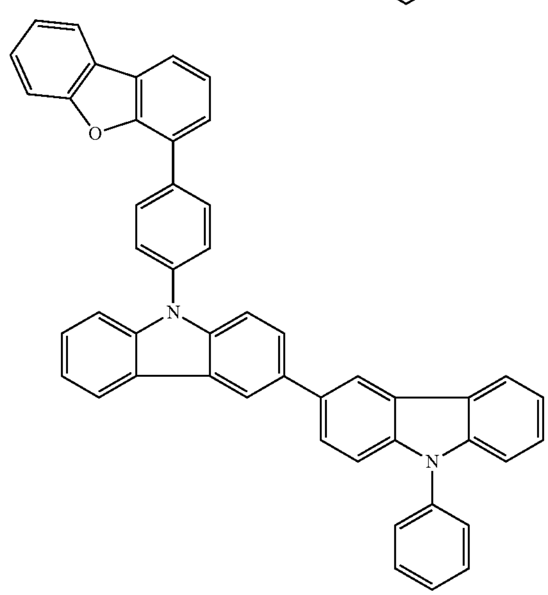

-continued
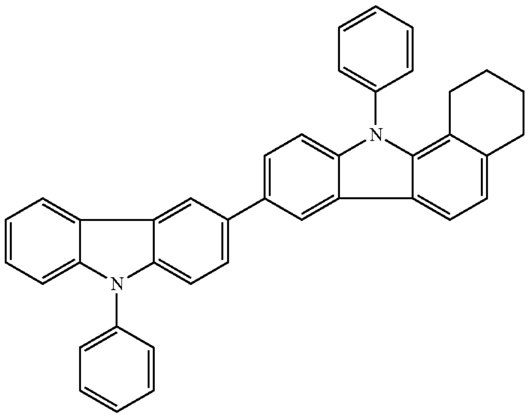
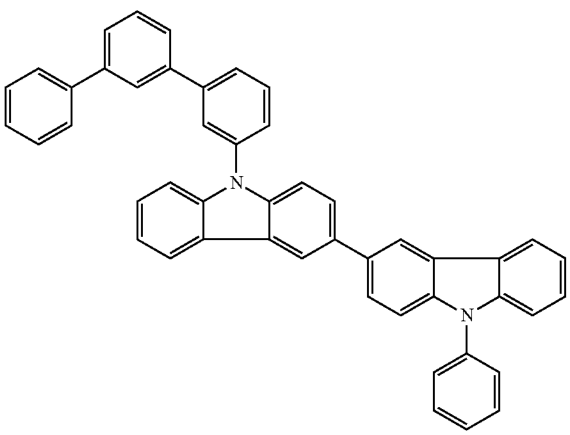
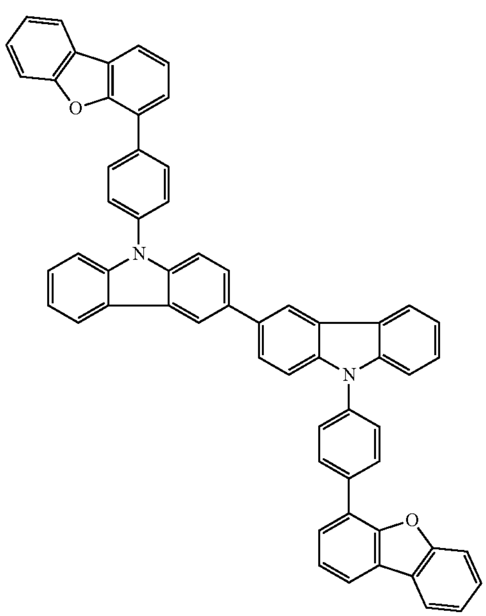
-continued
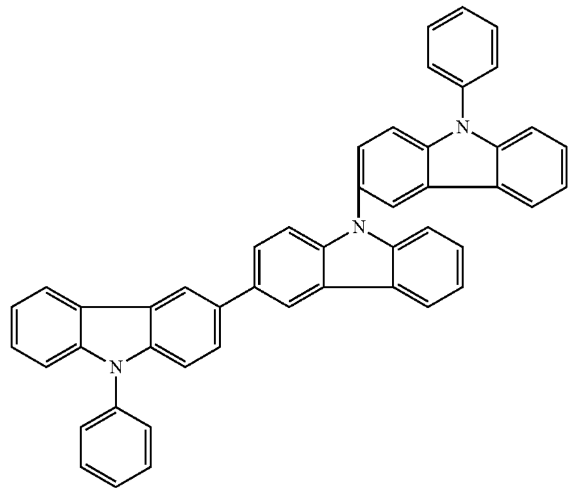
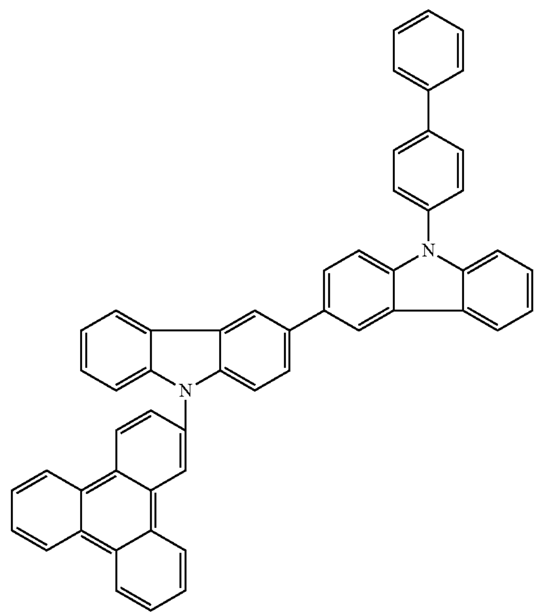
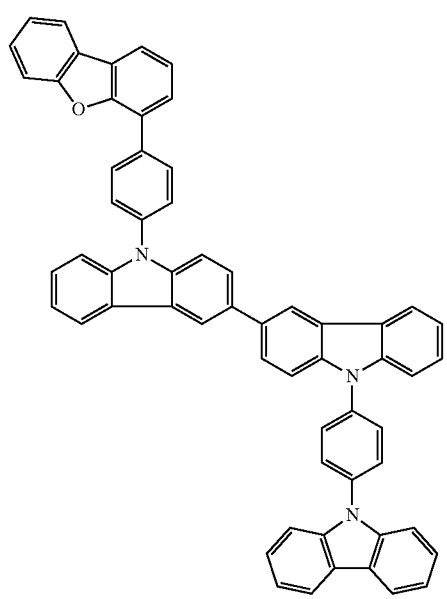

-continued
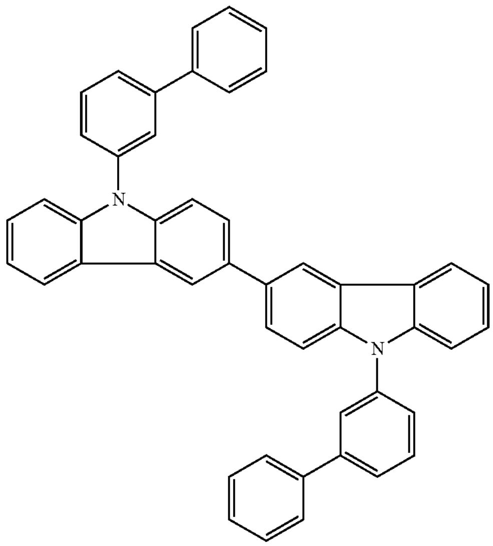
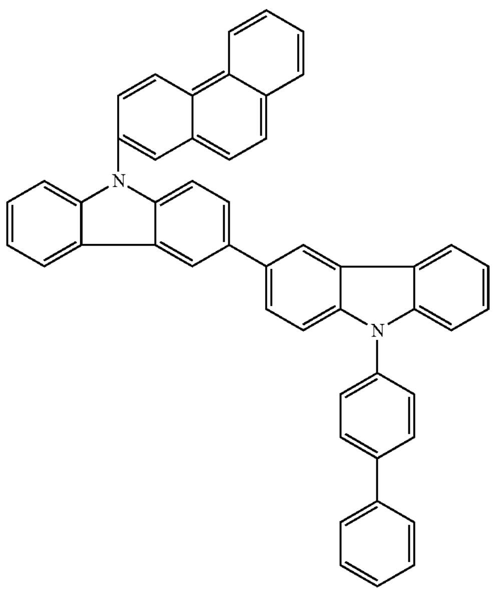
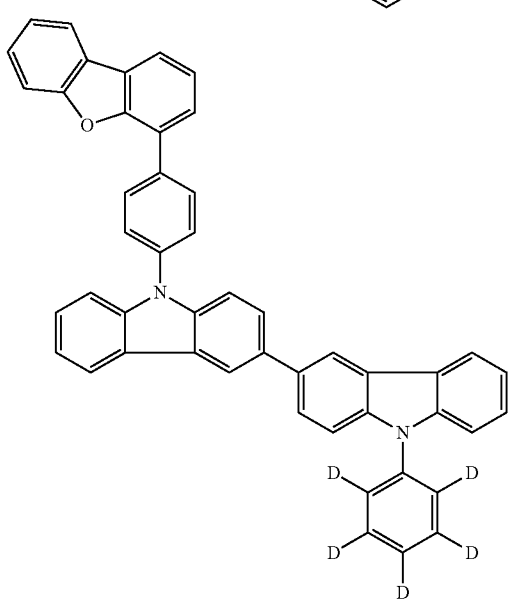
-continued
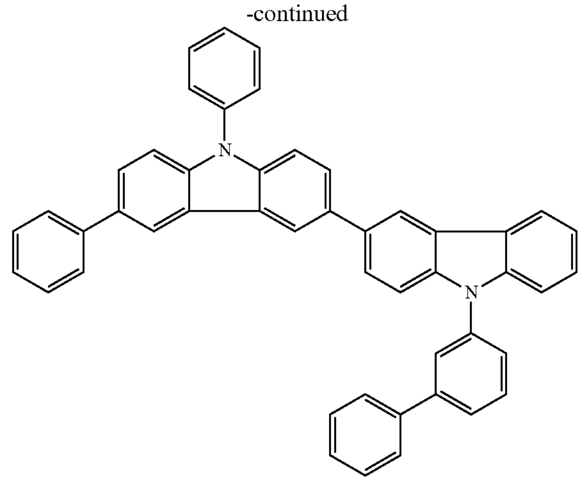
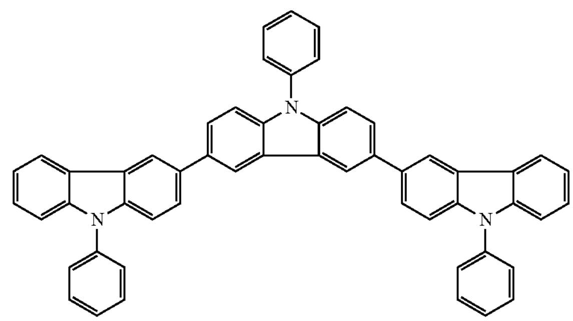
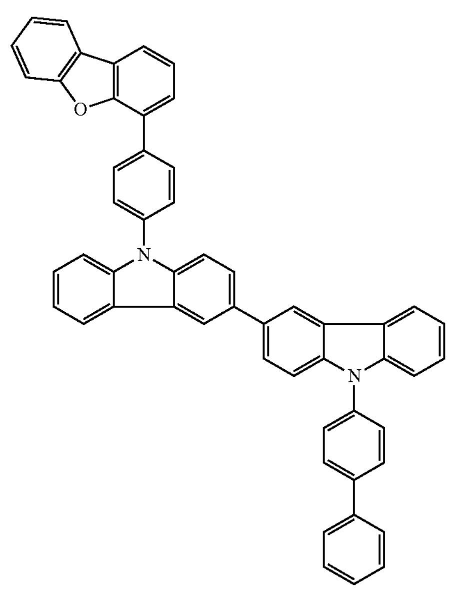

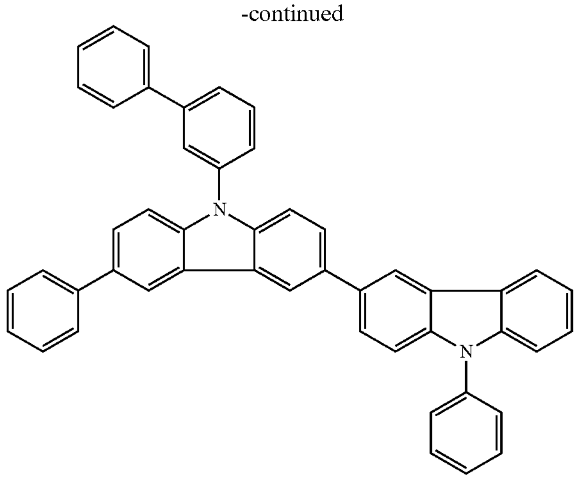
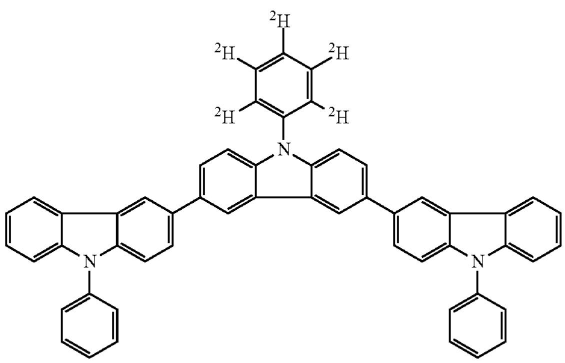
N
N
N
2H
2H
2H
2H
2H
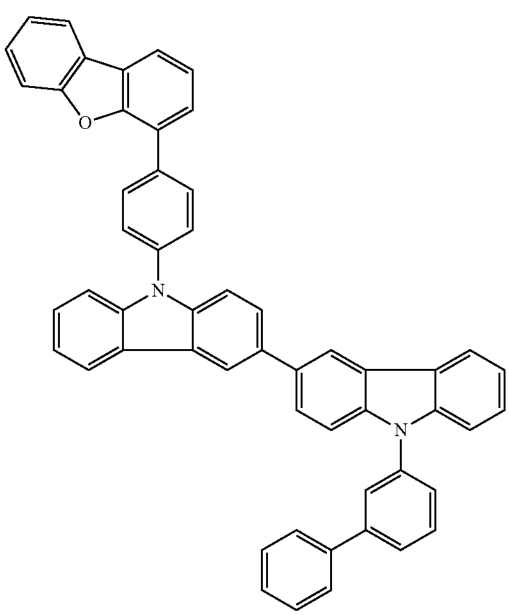
O
N
N
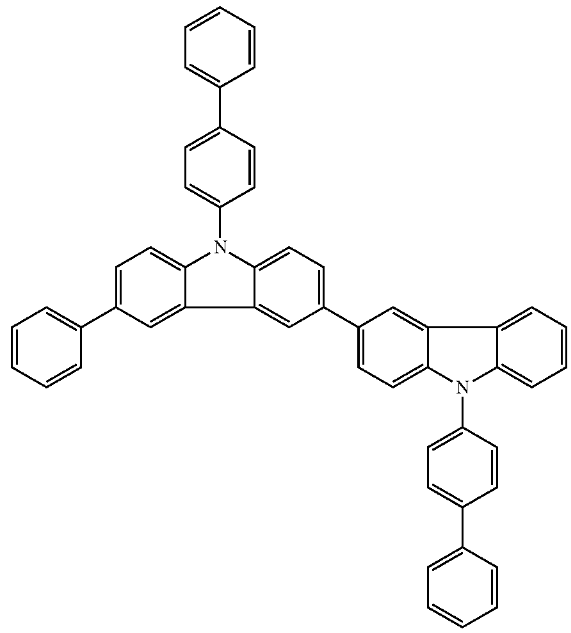
N
N
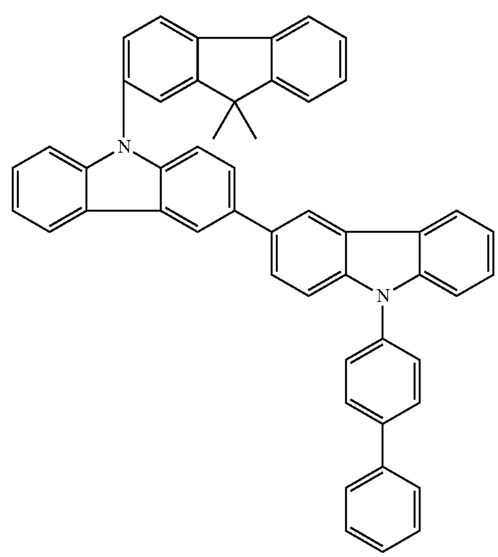
N
N -continued
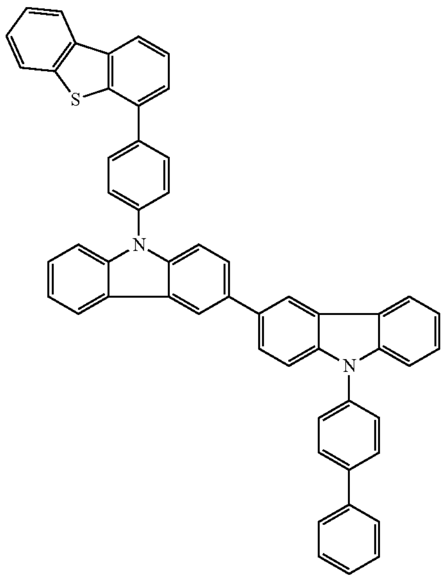
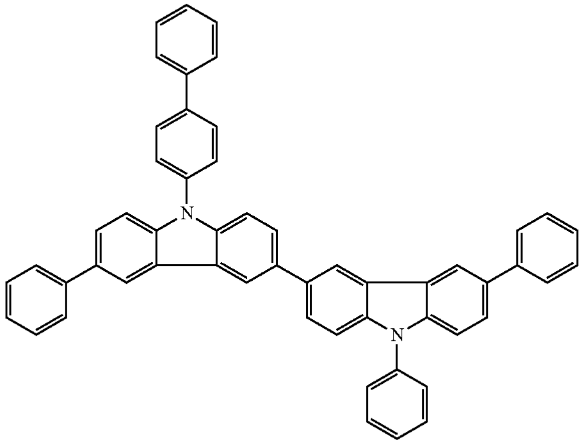
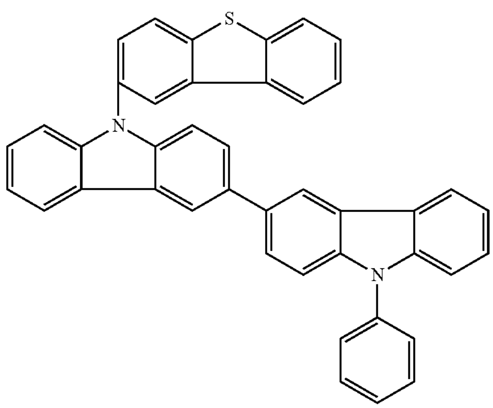
-continued
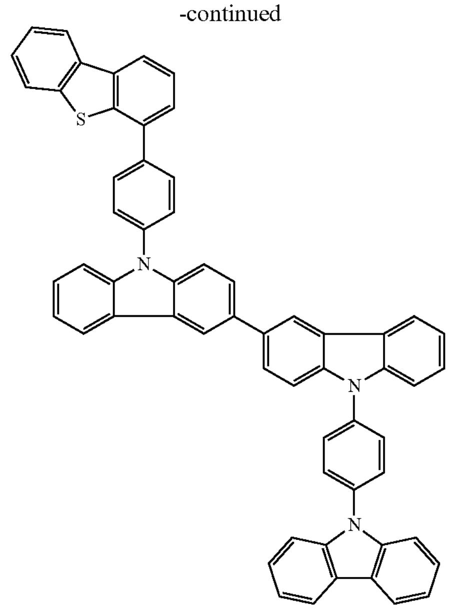
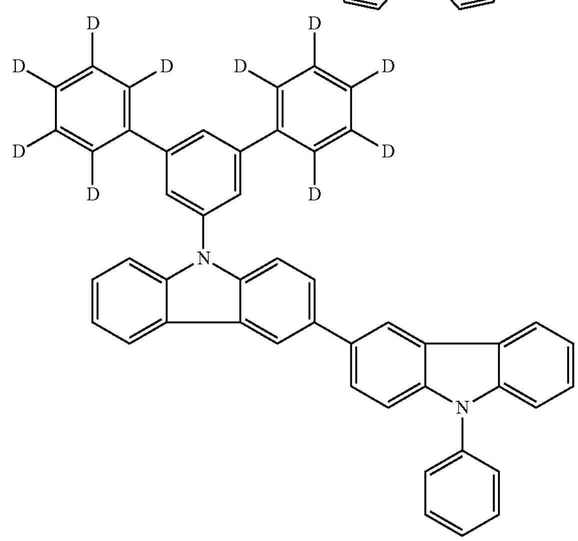
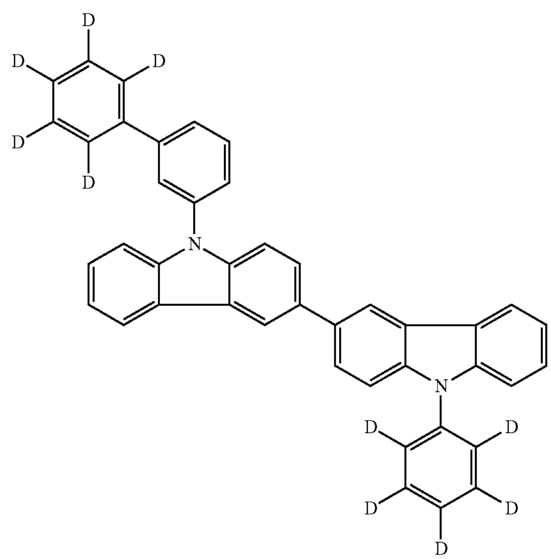

-continued
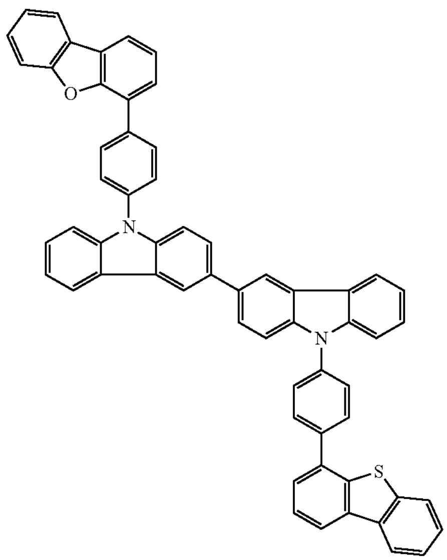
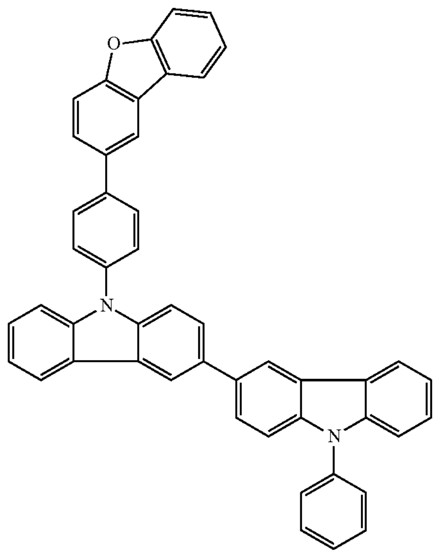
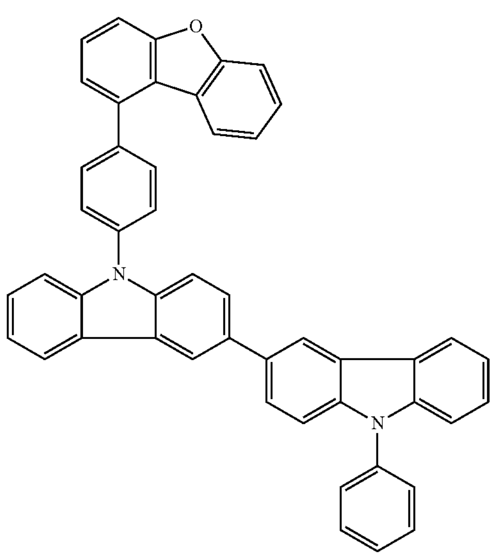
-continued
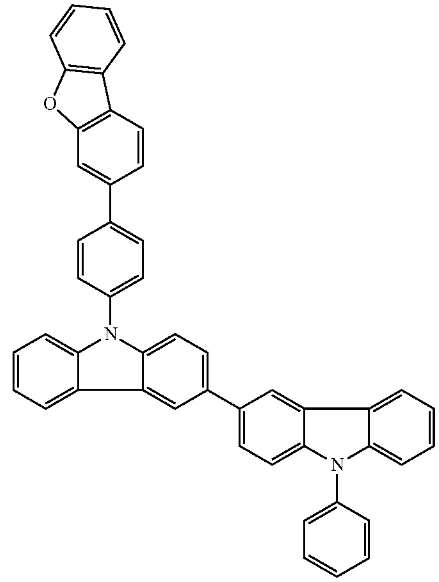
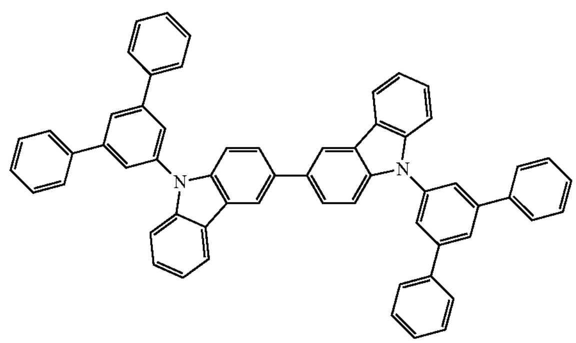
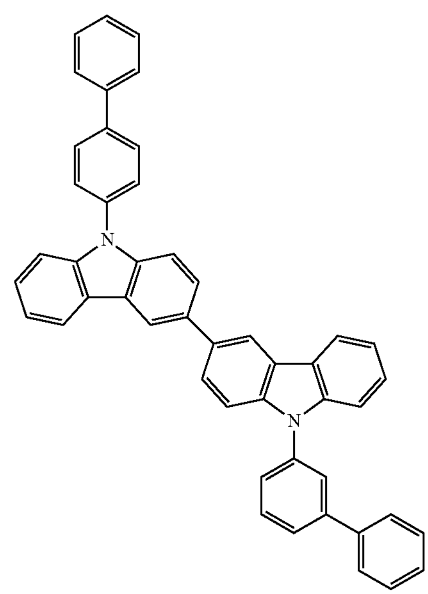

-continued
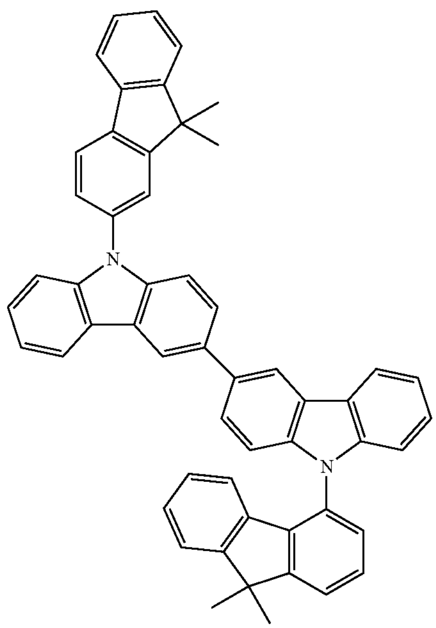 [SMILES: CC1(C)c2ccccc2-c2ccc(-n3c4ccccc4c4cc(-c5ccc6c(c5)c5ccccc5n6-c5cccc6c5-c5ccccc5C6(C)C)ccc43)cc21]
Examples of amines which can be used as hole-transporting matrix materials are the following compounds:
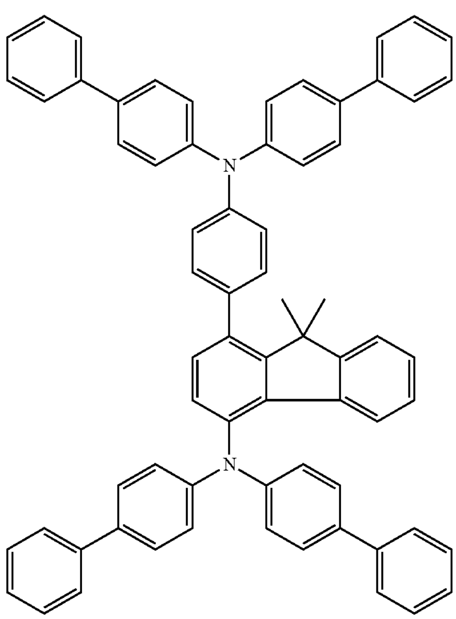
-continued
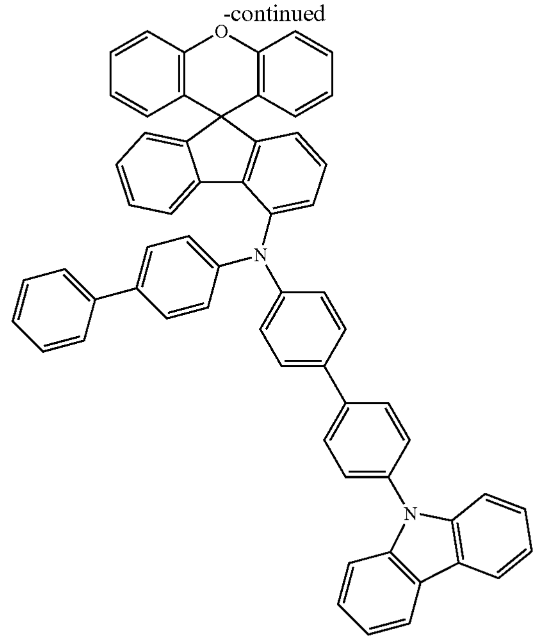
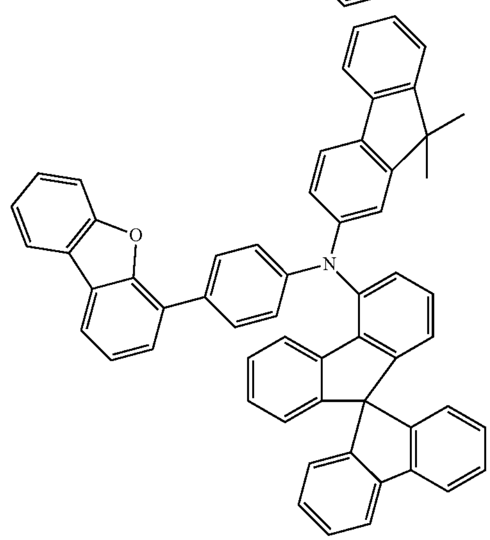
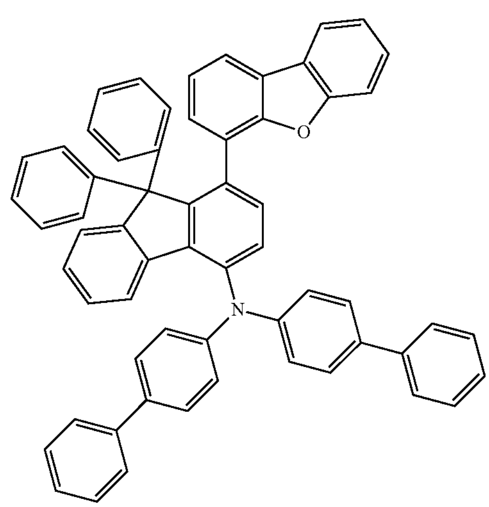

-continued
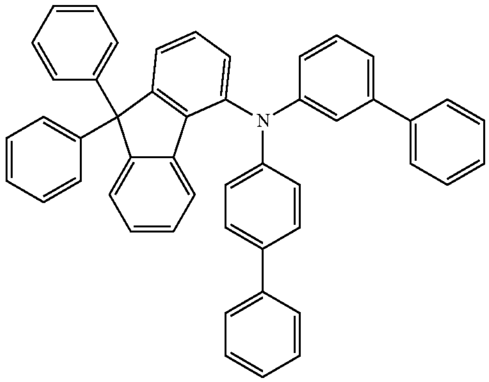
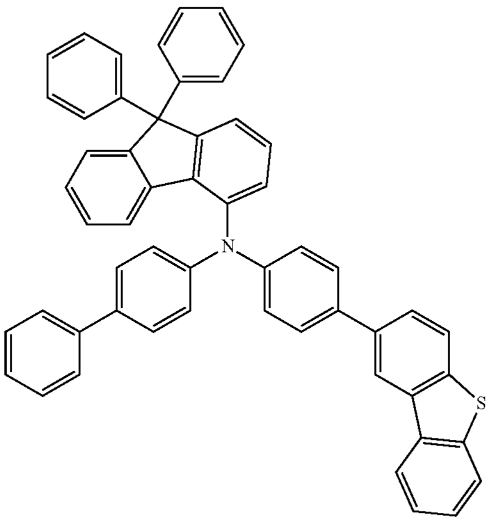
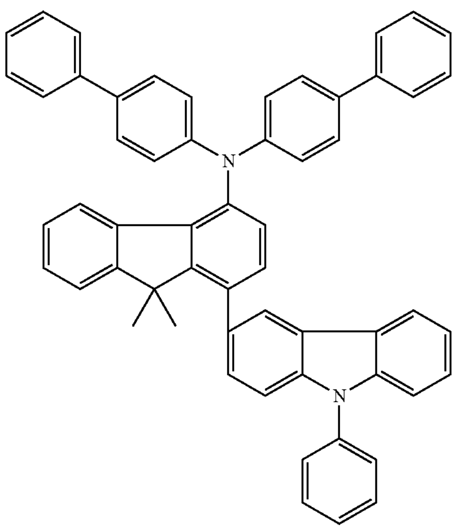
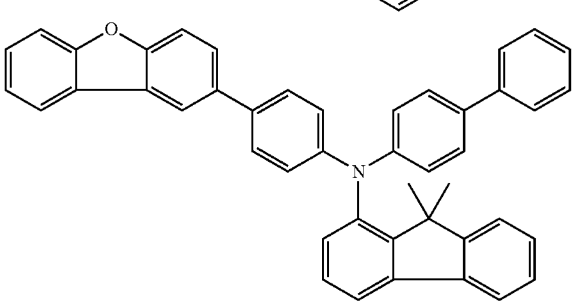
-continued
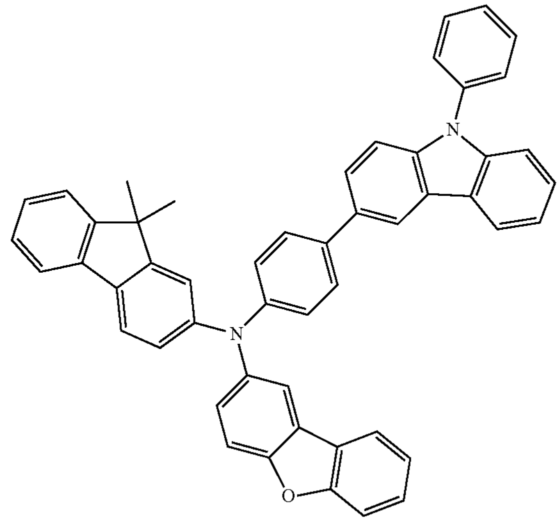
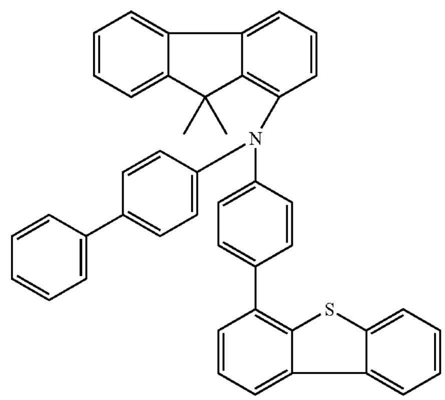
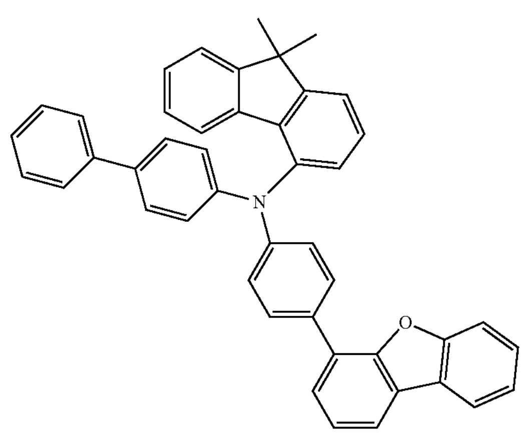

-continued
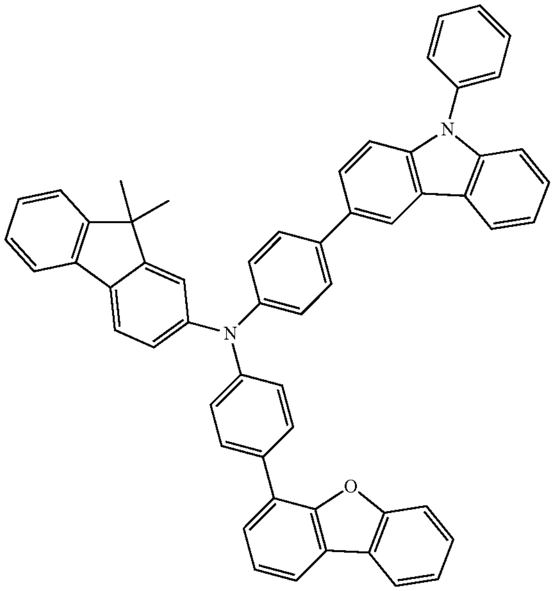
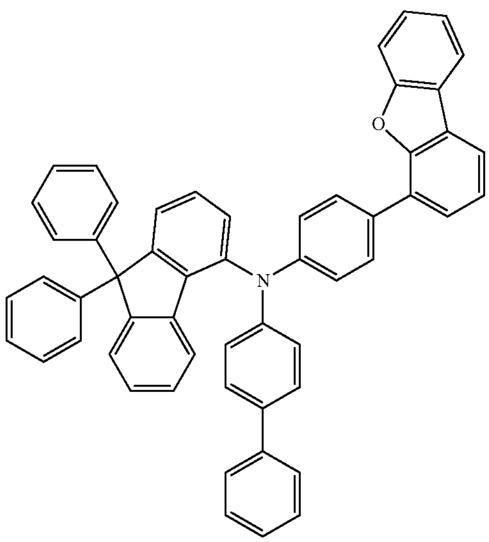
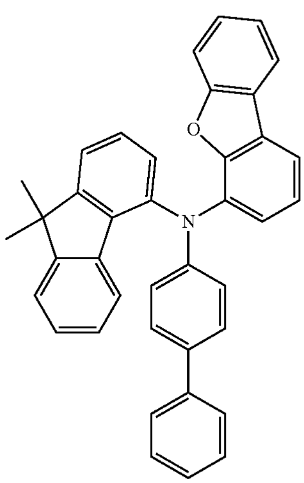
-continued
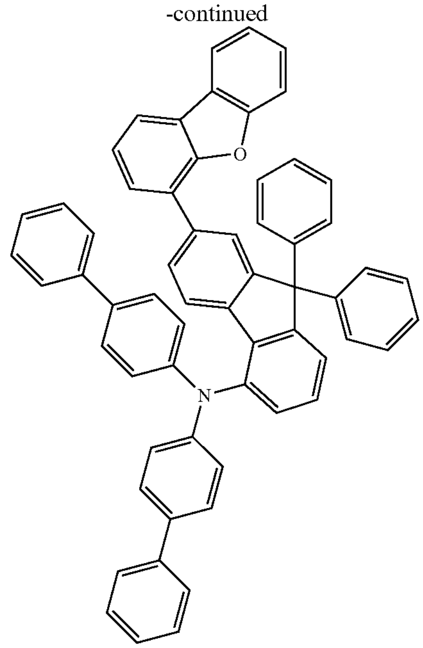
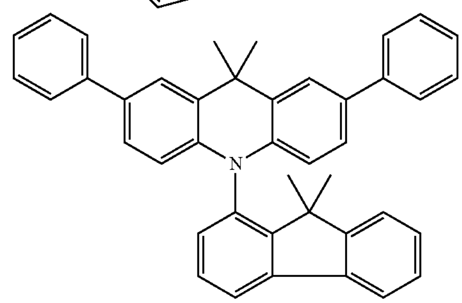
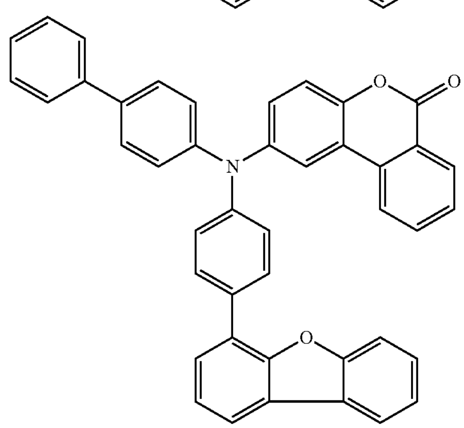
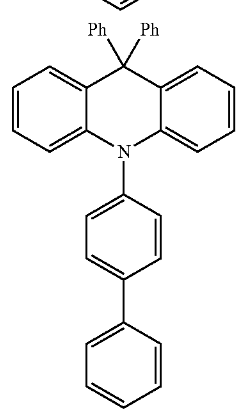

-continued
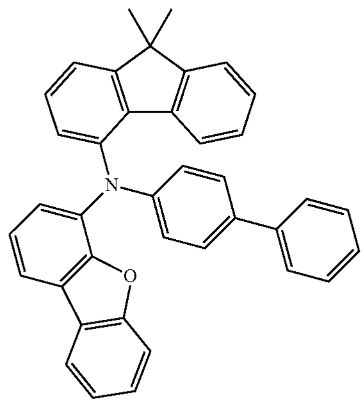
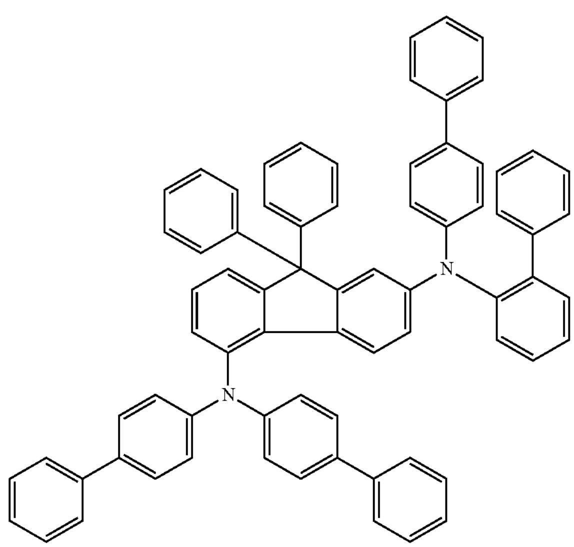
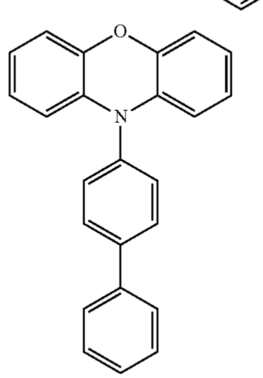
-continued
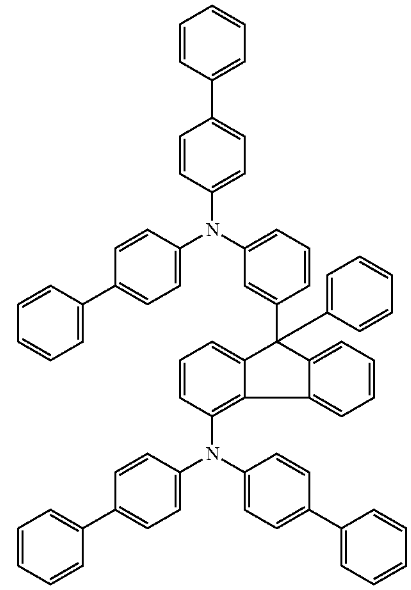
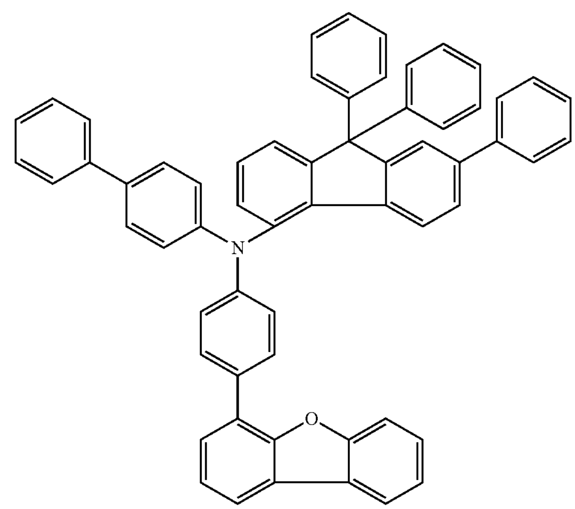
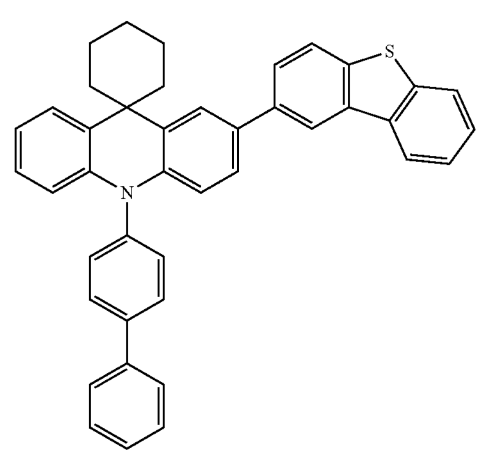

-continued
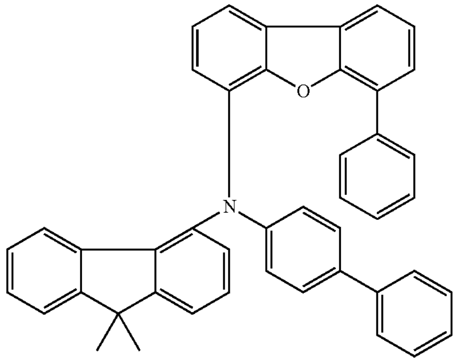
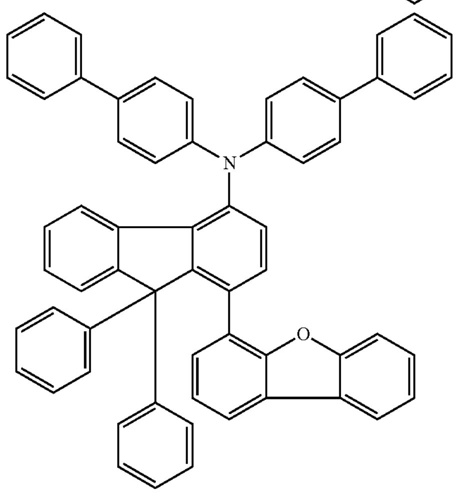
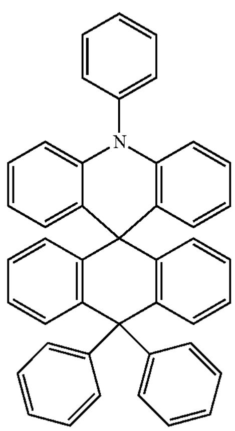
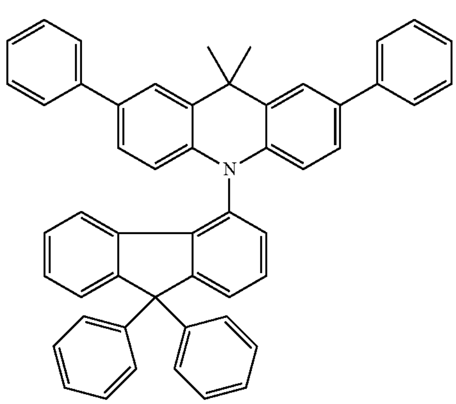
-continued
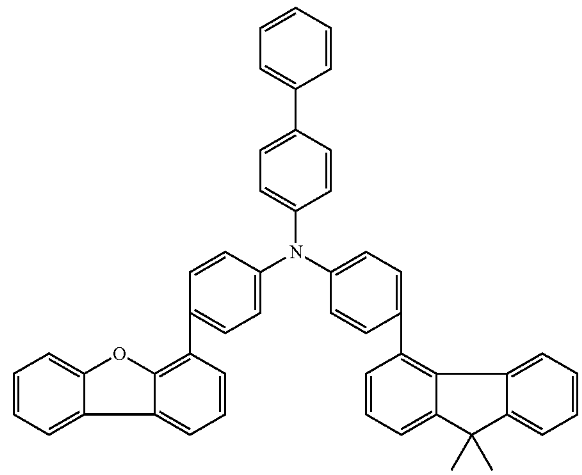
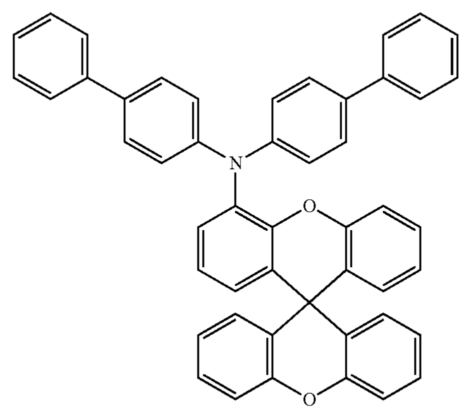
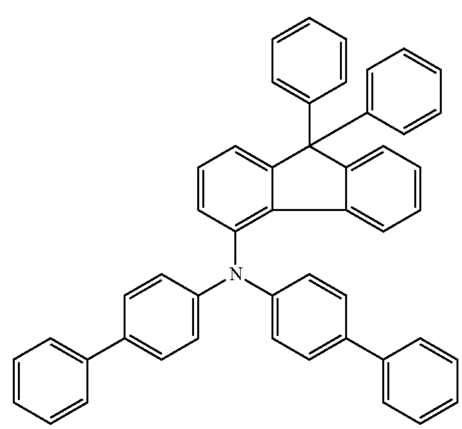

-continued
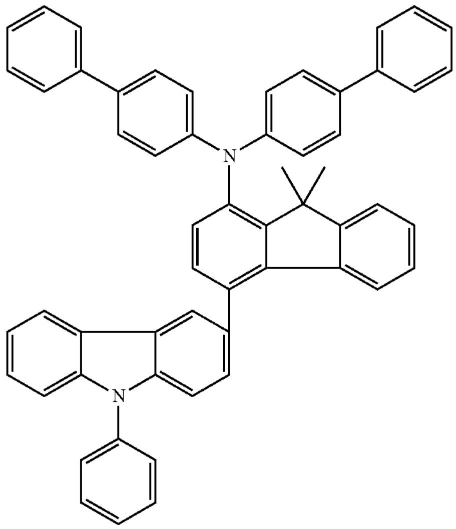
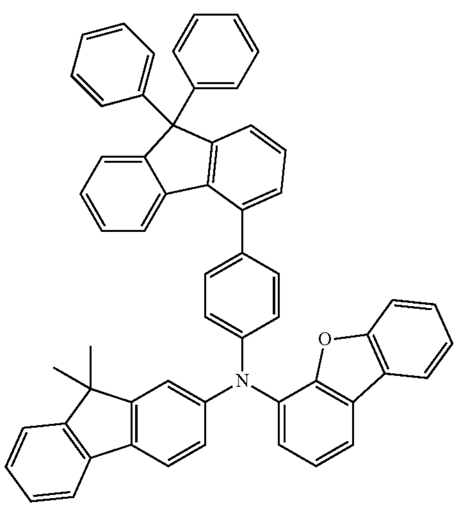
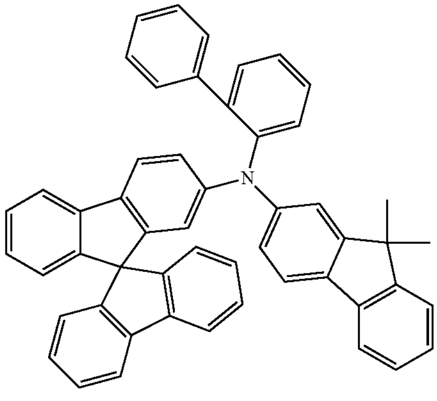
-continued
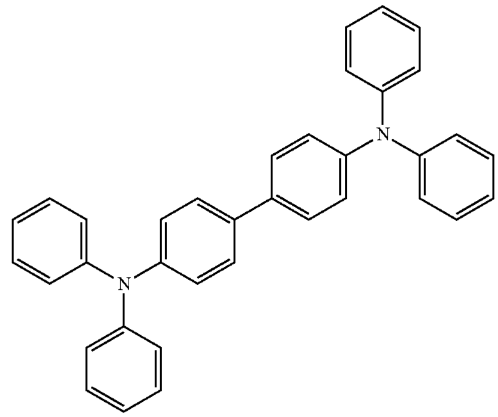
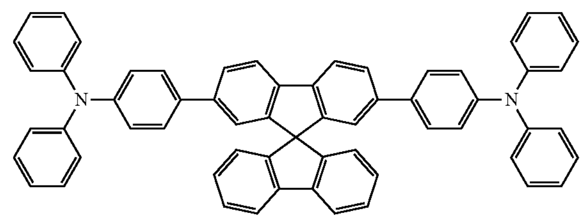
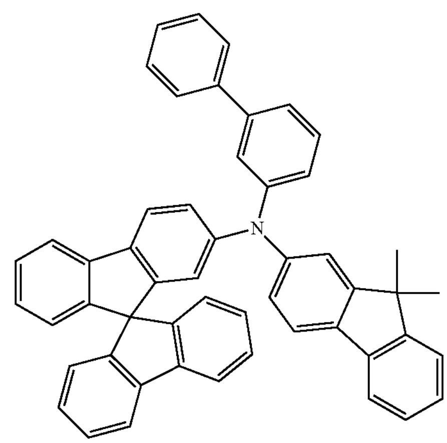
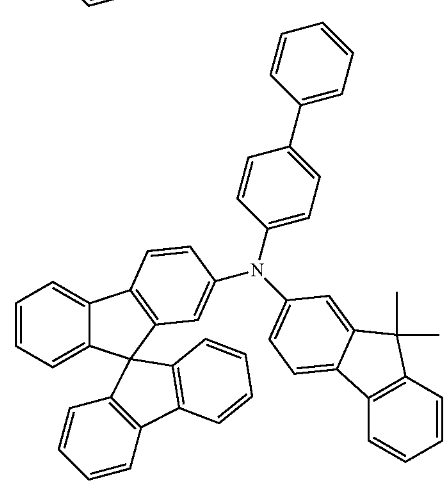

-continued
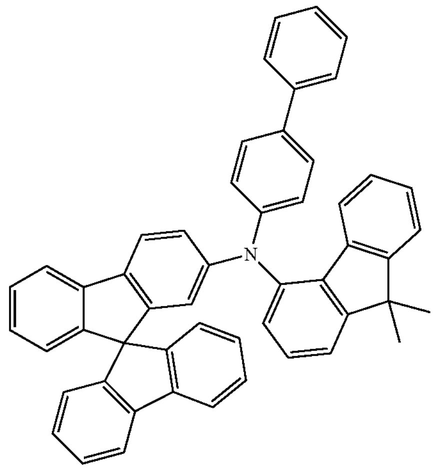
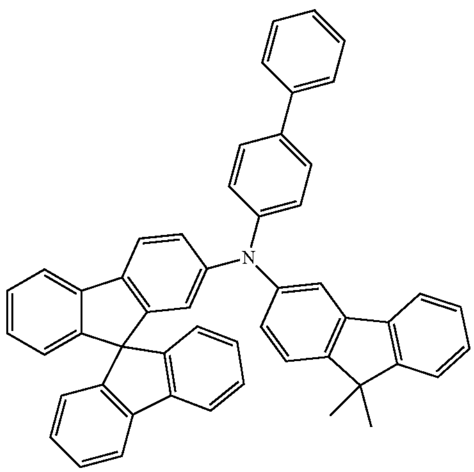
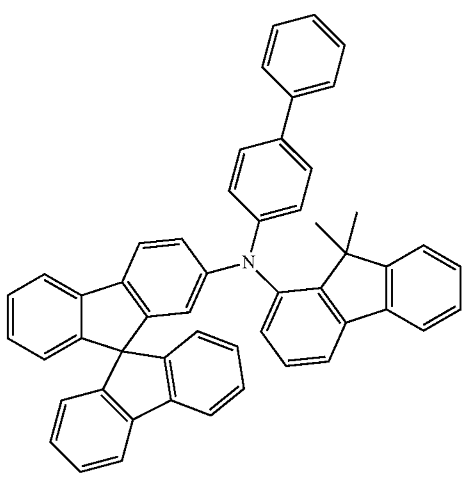
-continued
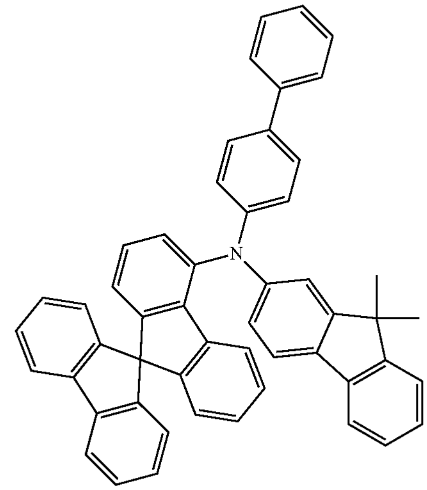
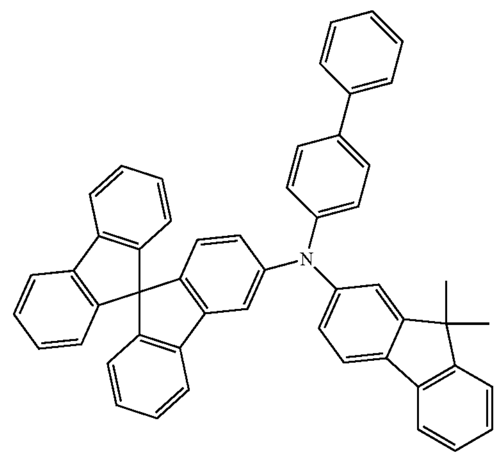
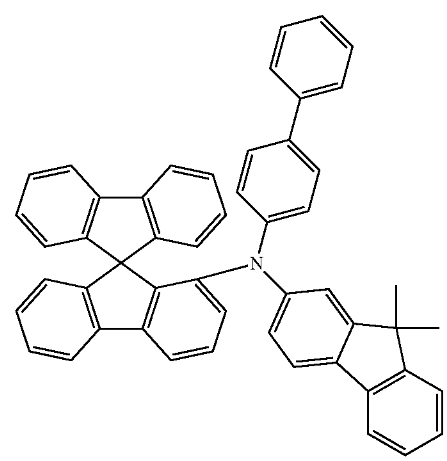

-continued
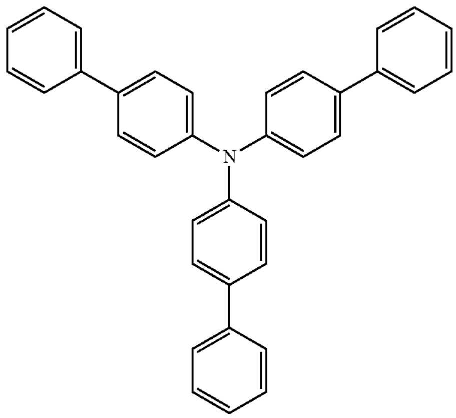
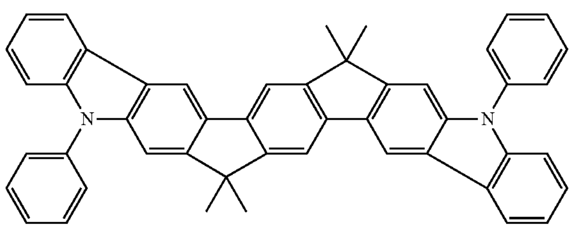
-continued
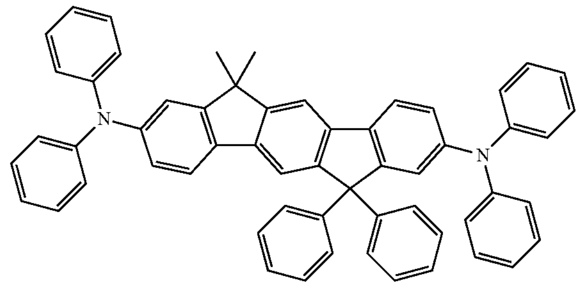
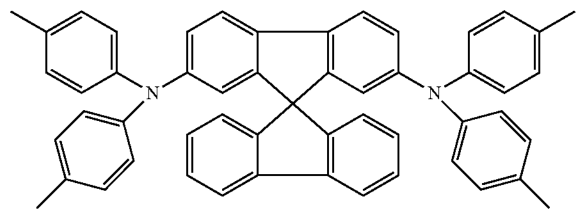
Examples of materials which can be used as wide band-gap matrix materials are the following compounds:
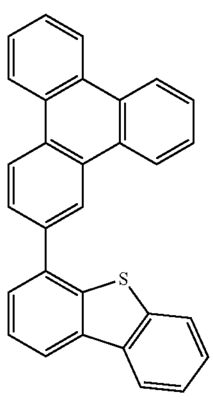
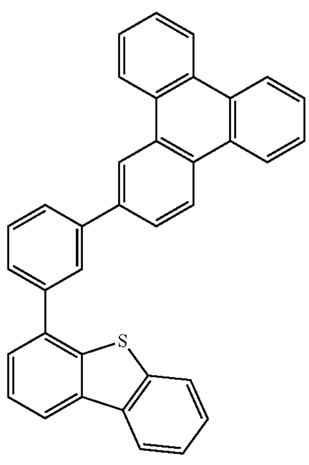
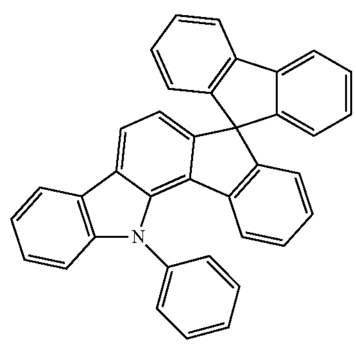

-continued
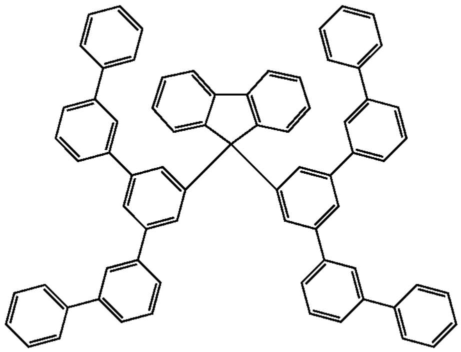
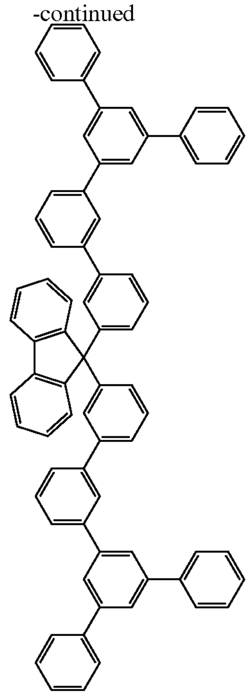
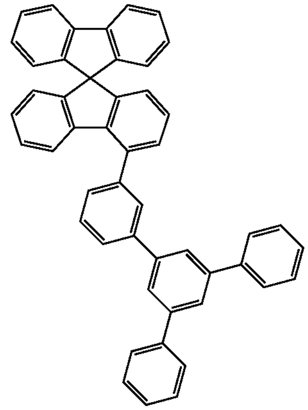
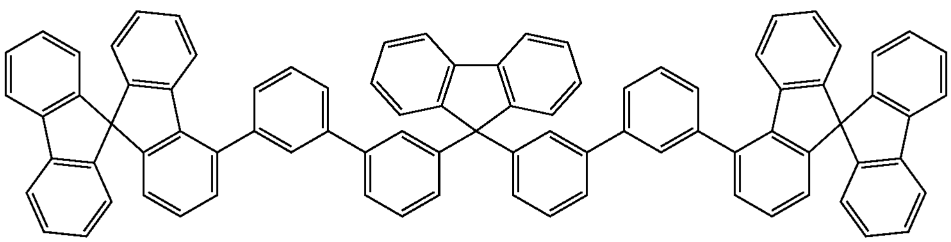
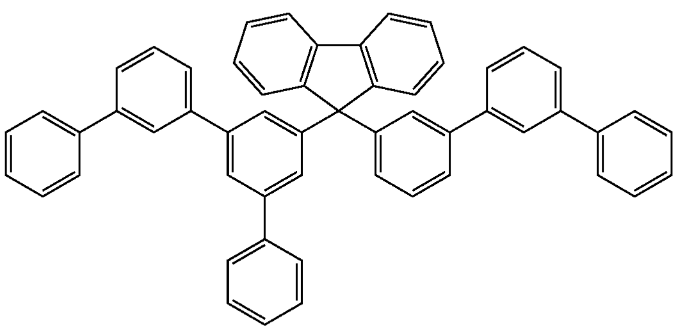
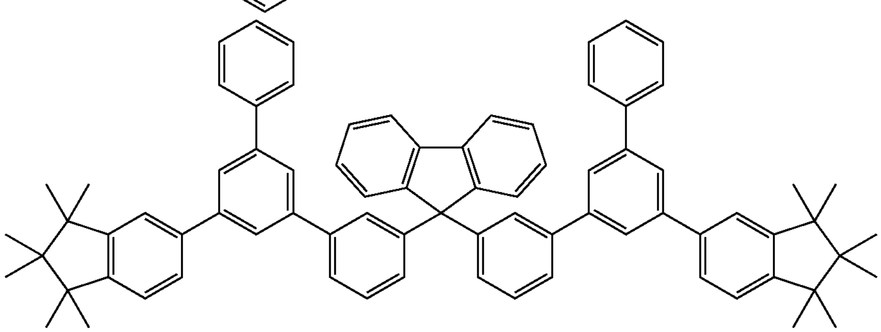

-continued
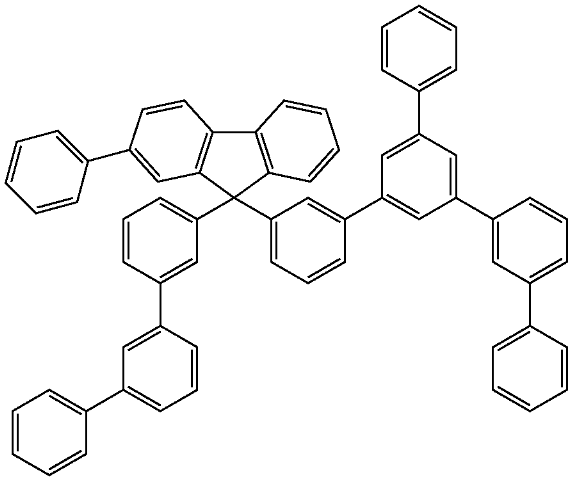
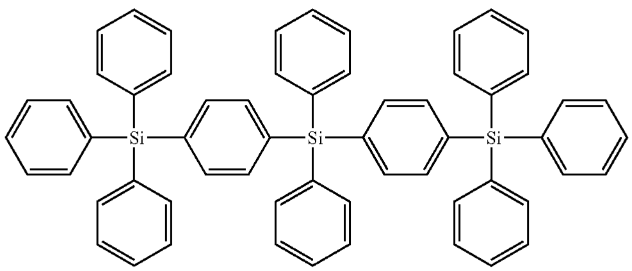
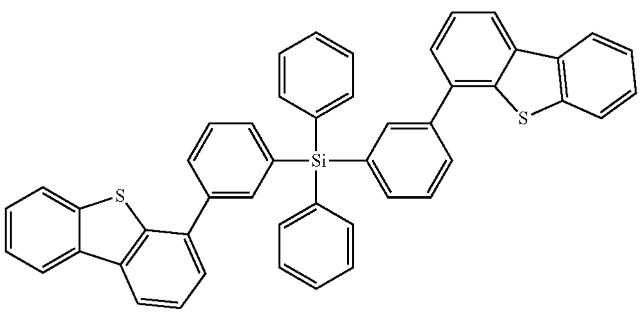
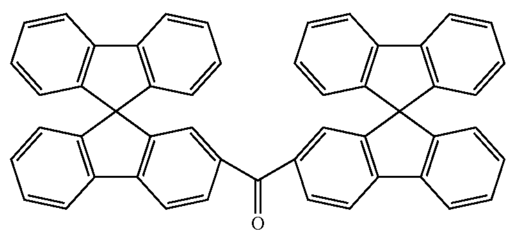
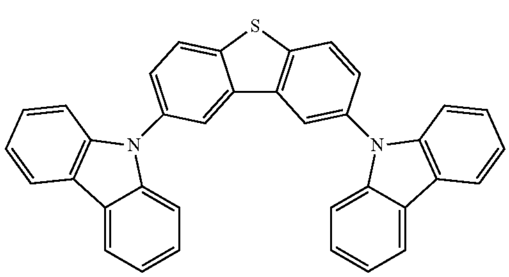
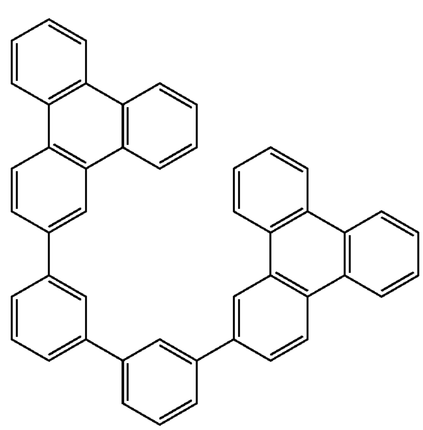

It is further preferable to use a mixture of two or more triplet emitters together with a matrix. In this case, the triplet emitter having the shorter-wave emission spectrum serves as co-matrix for the triplet emitter having the longer-wave emission spectrum. For example, it is possible to use the metal complexes of the invention as co-matrix for longer-wave-emitting triplet emitters, for example for green- or red-emitting triplet emitters. In this case, it may also be preferable when both the shorter-wave- and the longer-wave-emitting metal complex is a compound of the invention. Suitable compounds for this purpose are especially also those disclosed in WO 2016/124304 and WO 2017/032439.

Examples of suitable triplet emitters that may be used as co-dopants for the compounds of the invention are depicted in the table below.

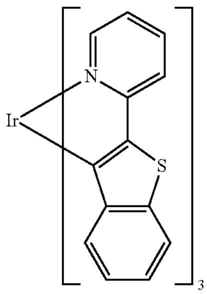
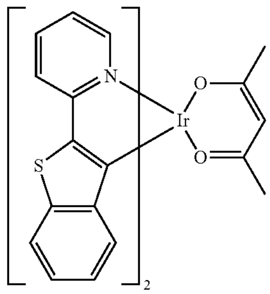
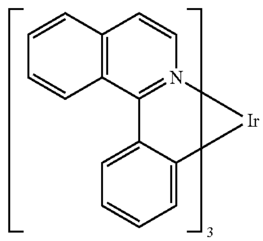
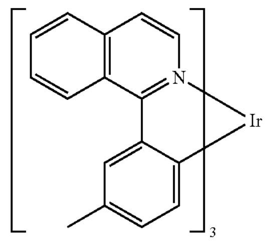
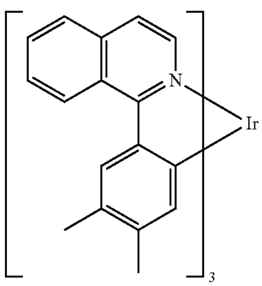
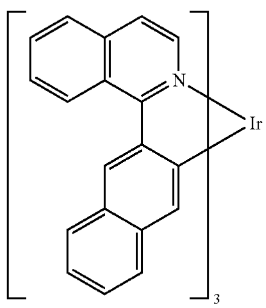
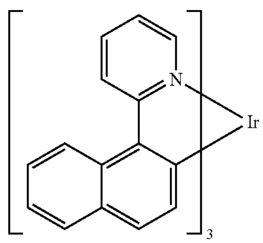
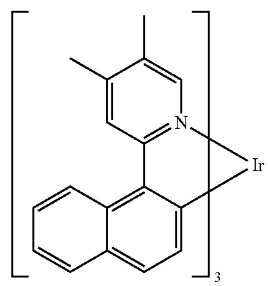
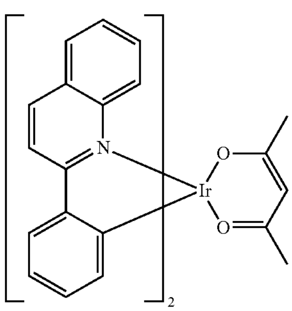
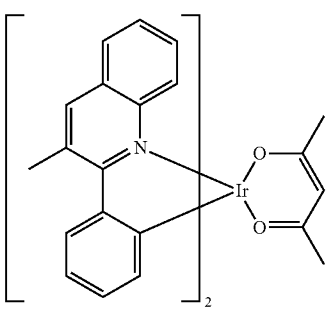
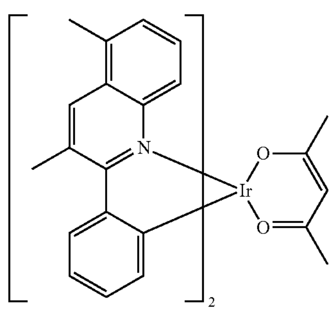
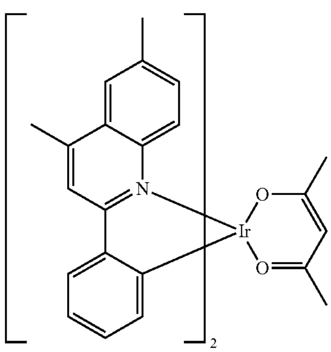
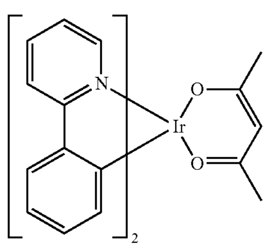
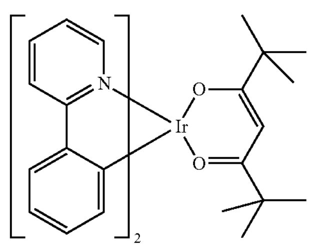

-continued
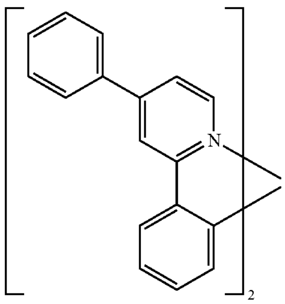
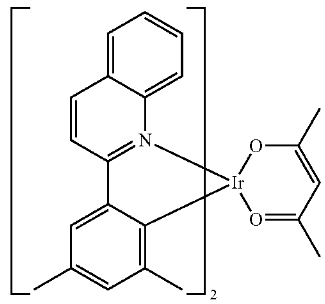
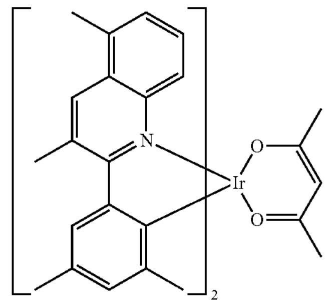
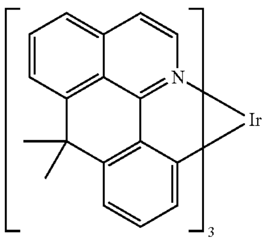
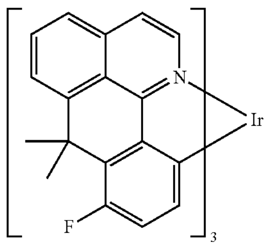
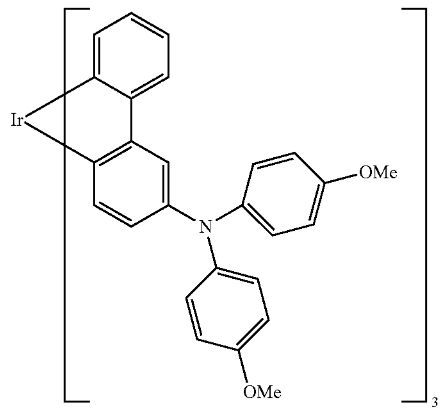
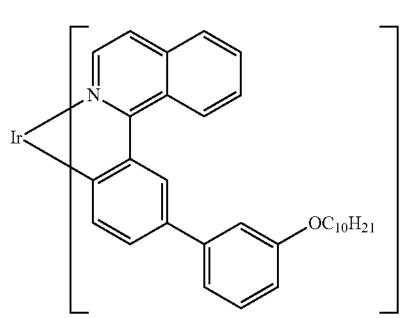
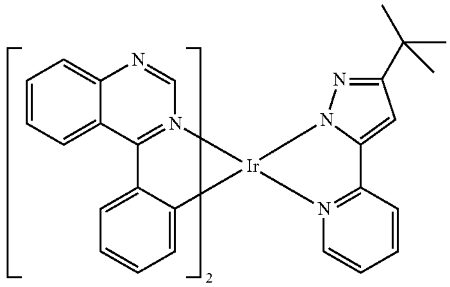
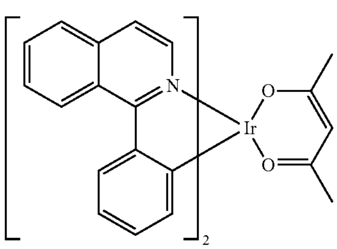
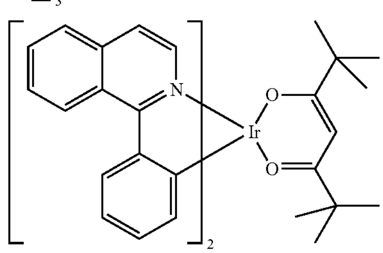
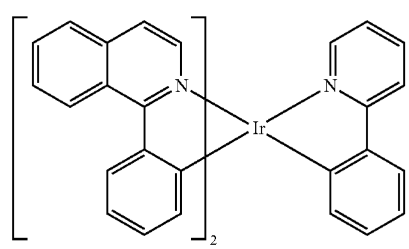
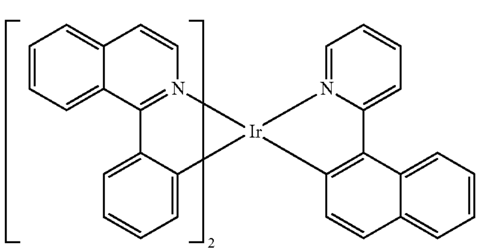
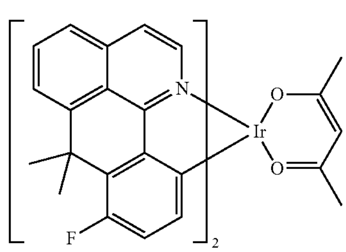
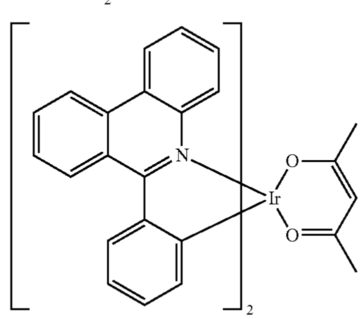

-continued
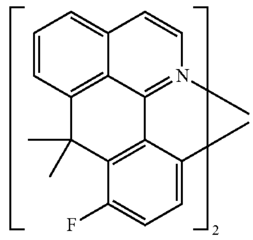
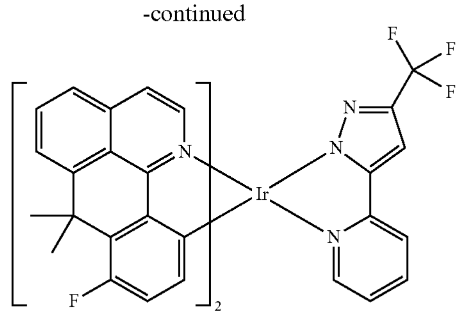
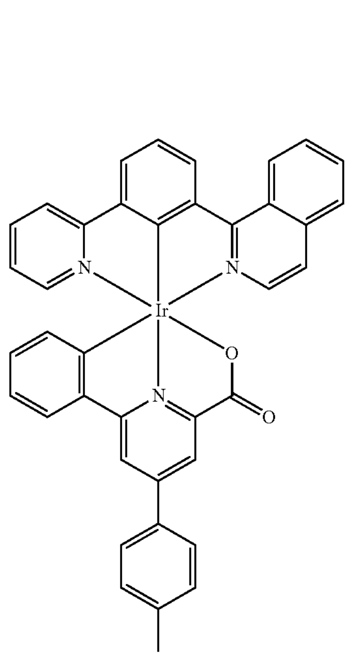
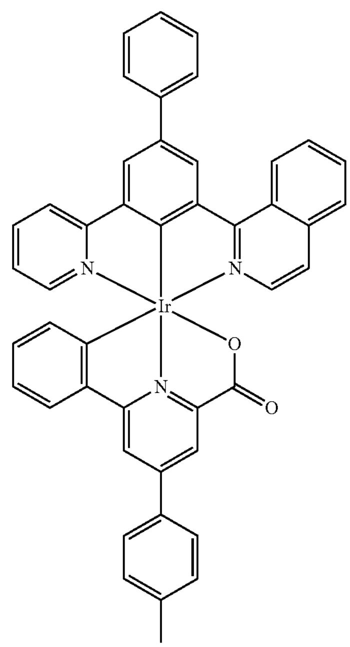
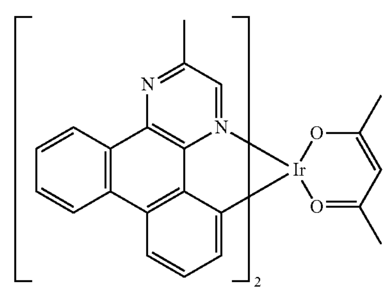
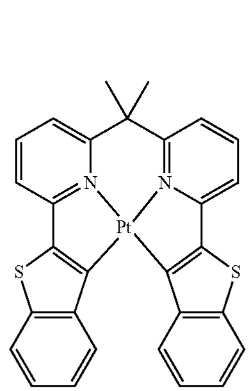
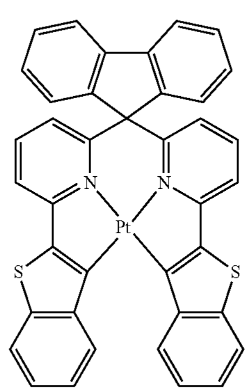
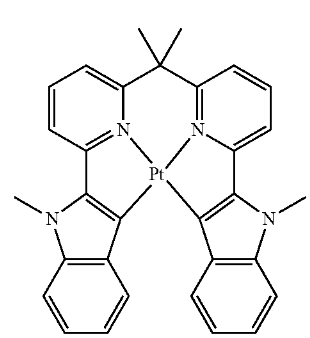
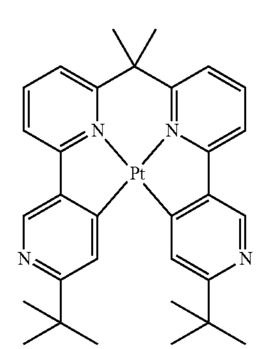

-continued
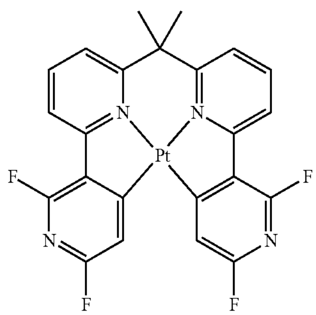
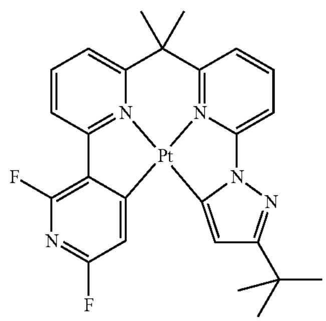
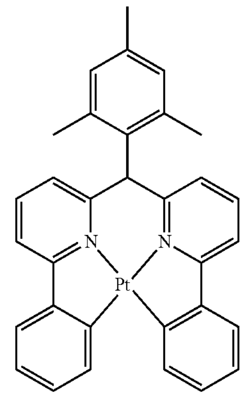
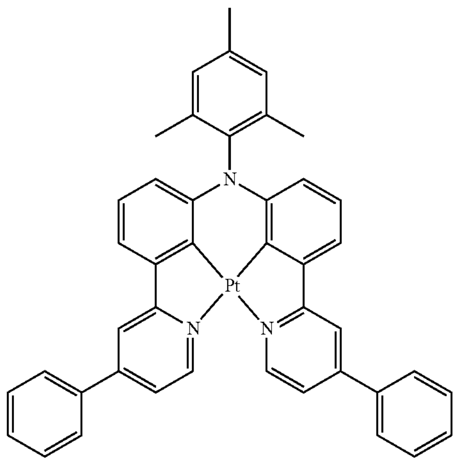
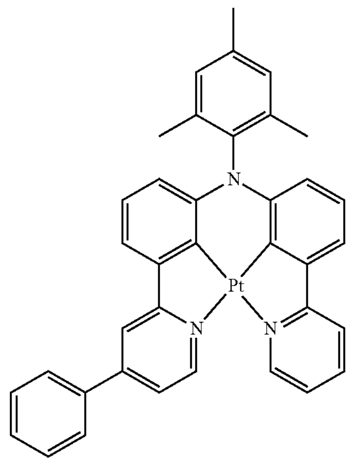
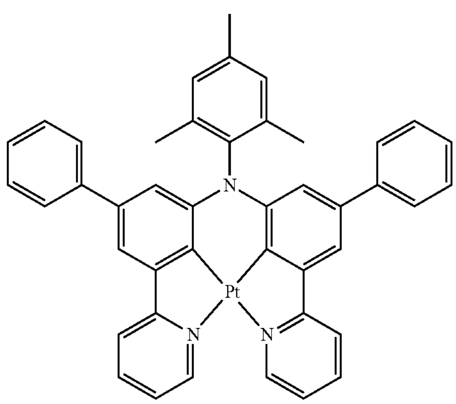
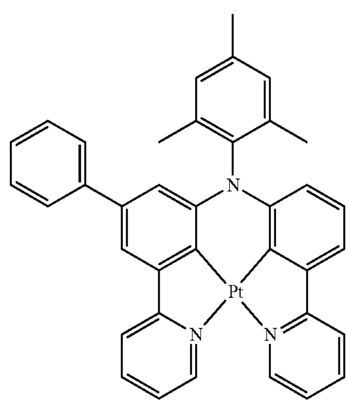
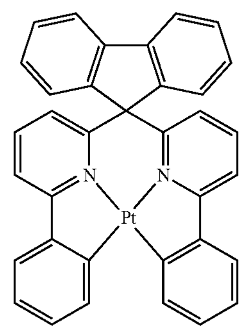
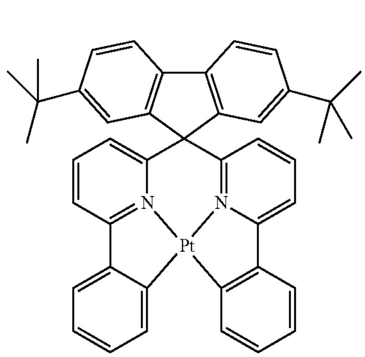
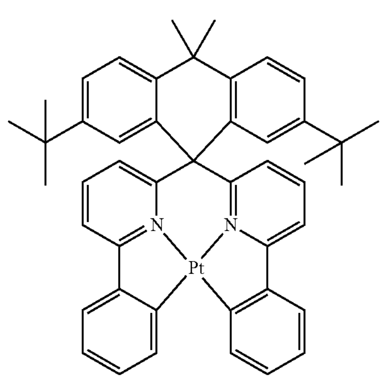
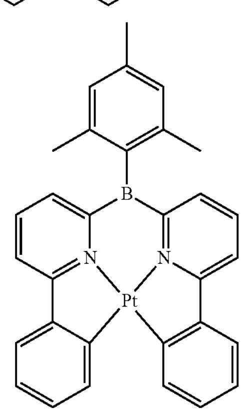

-continued
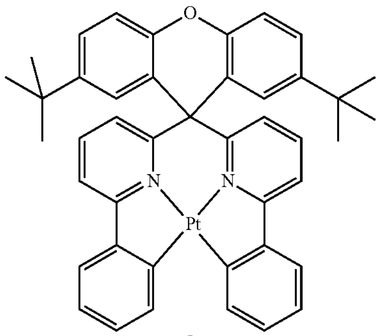
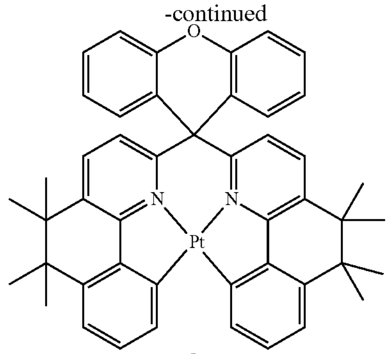
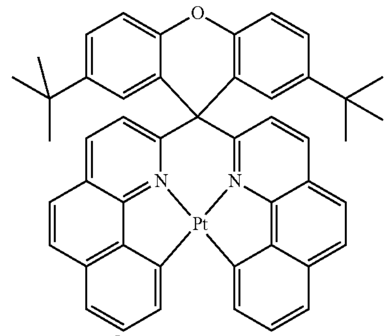
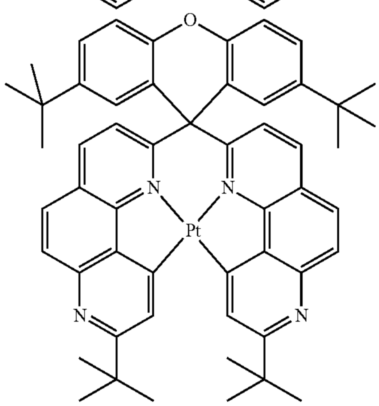
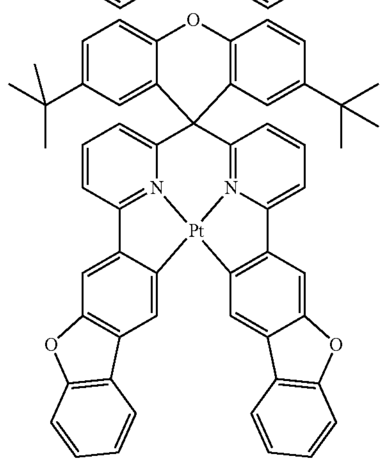
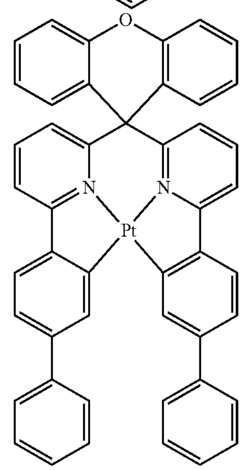
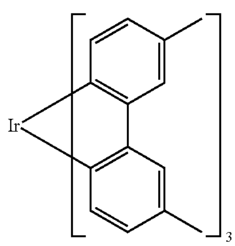
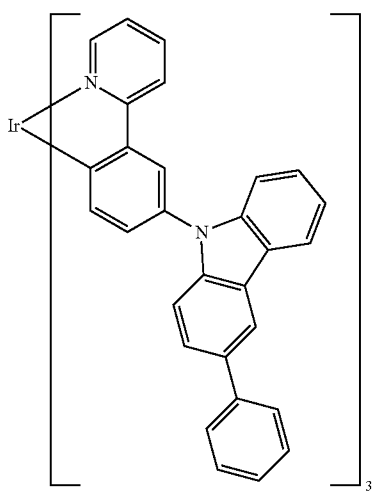
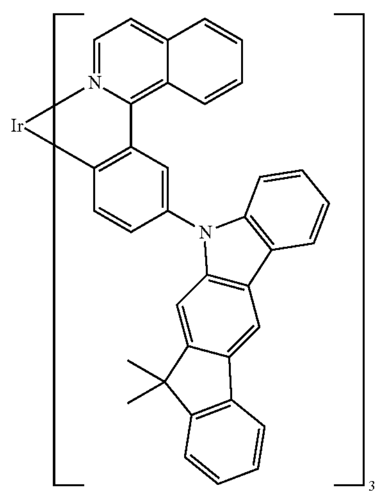
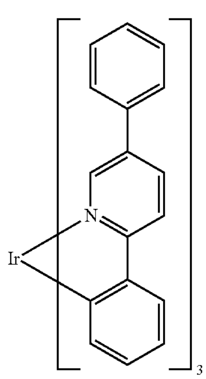
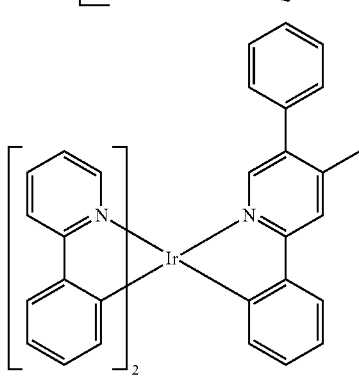
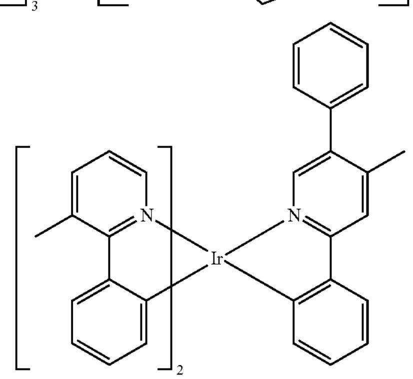

-continued
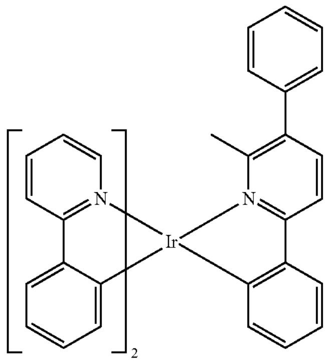
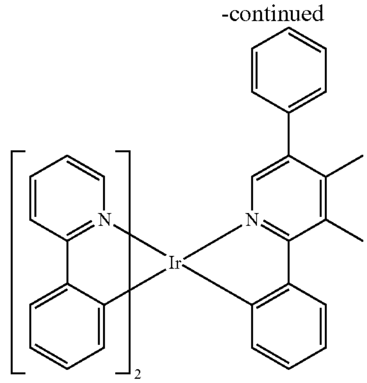
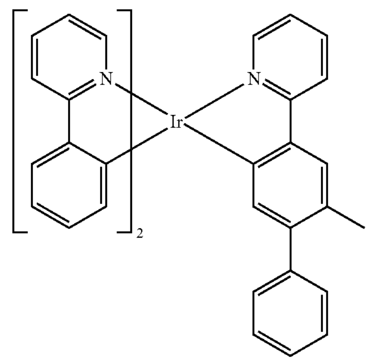
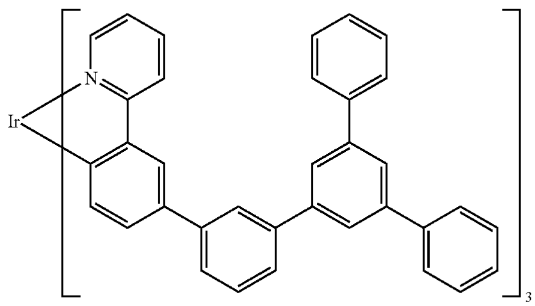
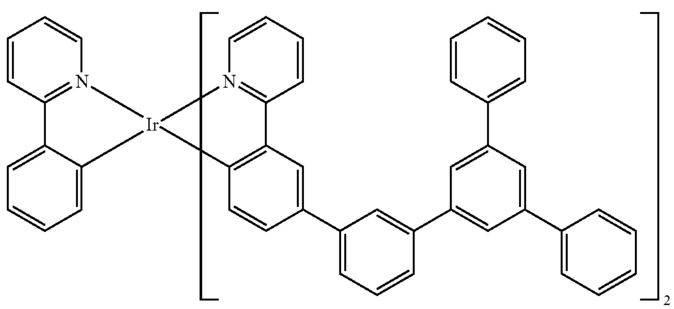
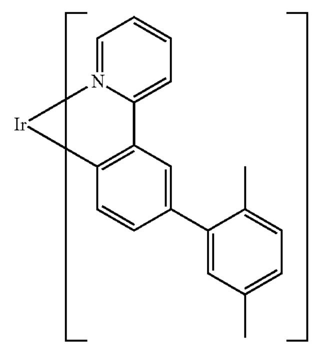
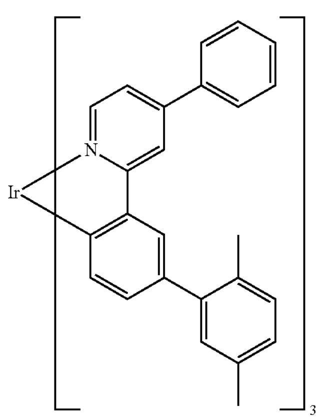
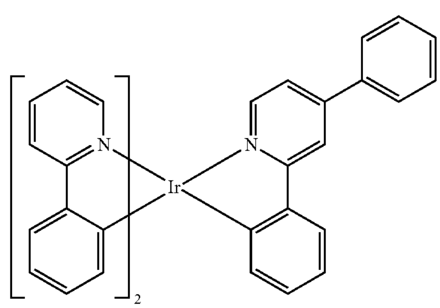

-continued
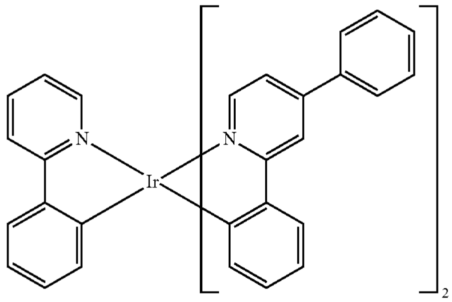
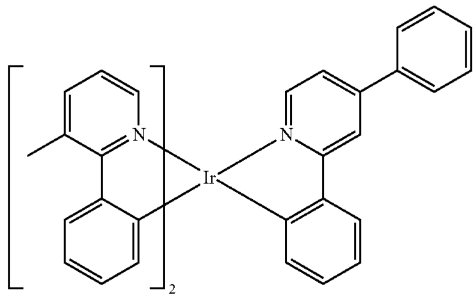
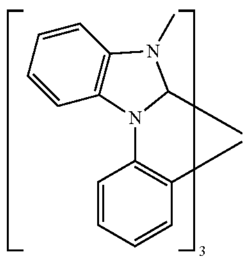
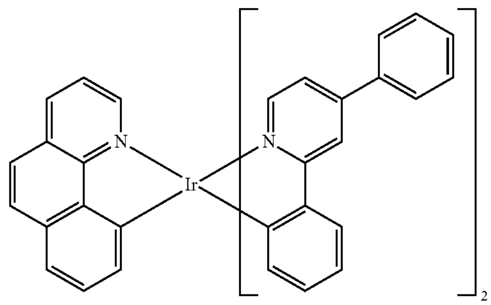
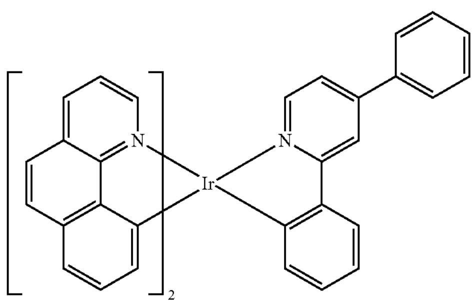
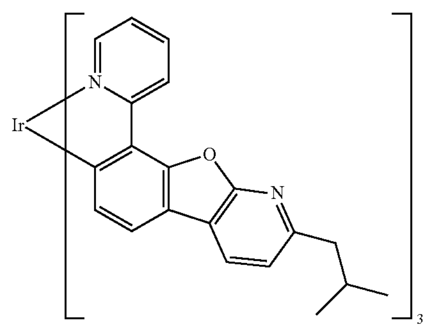
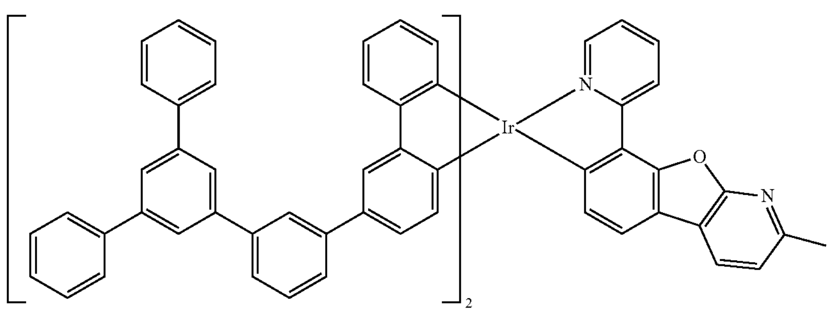
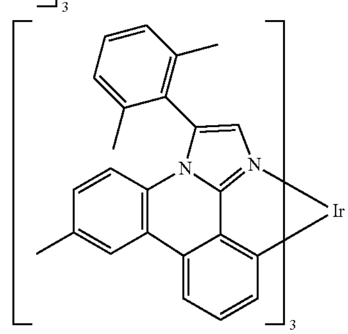
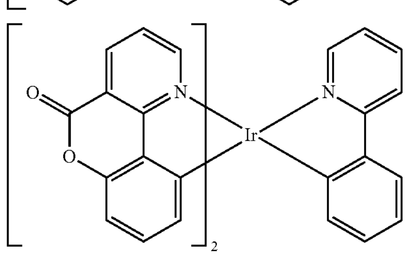
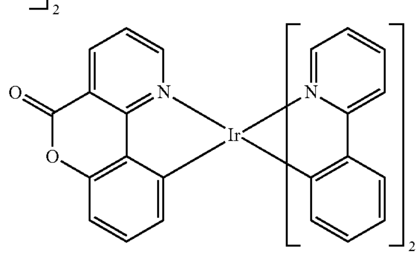

-continued
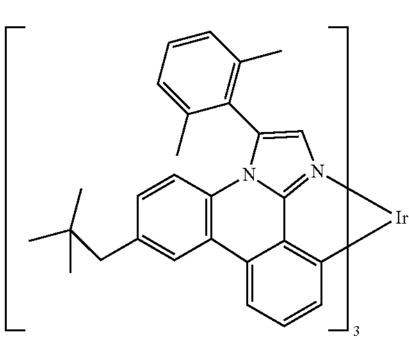
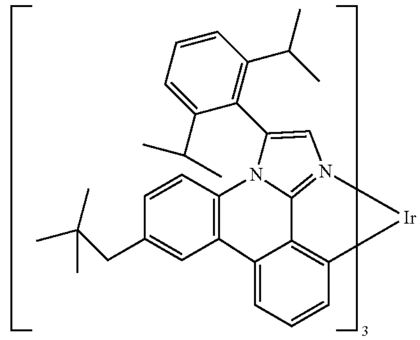
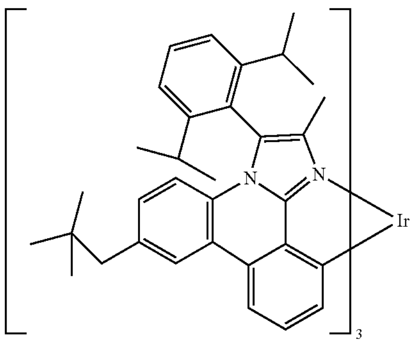
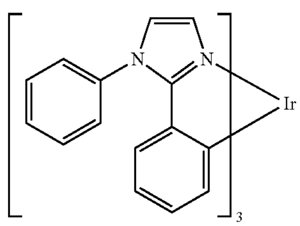
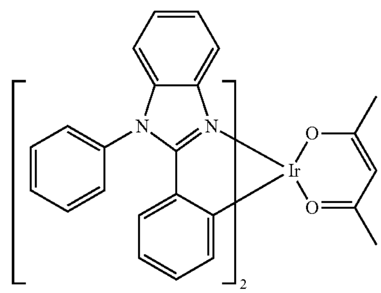
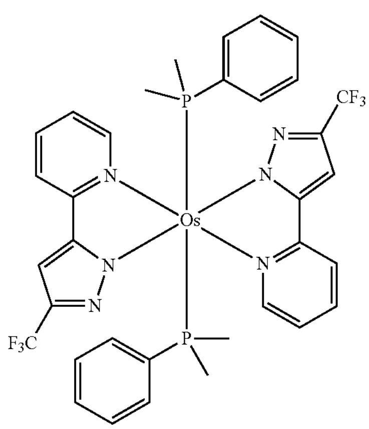
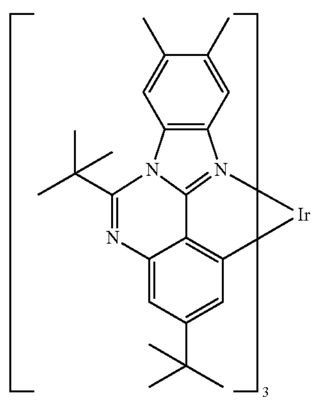
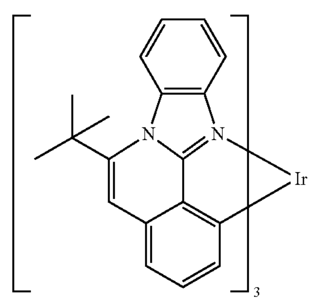
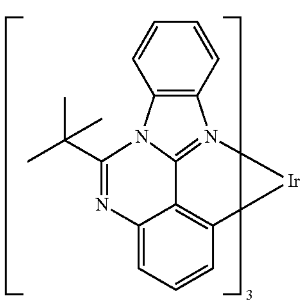
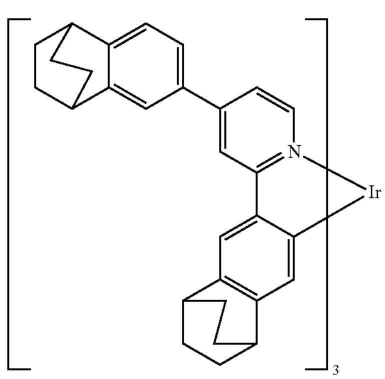
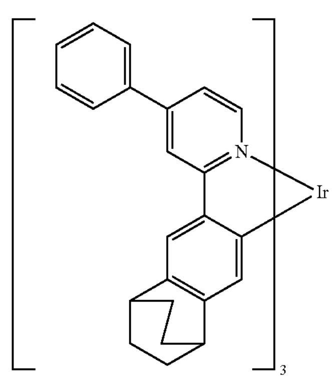

-continued
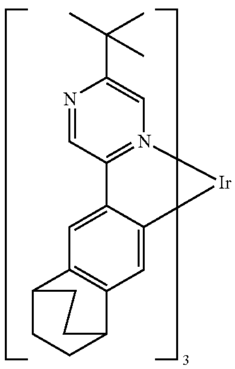
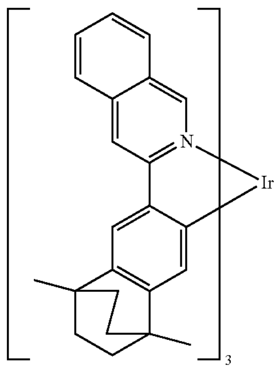
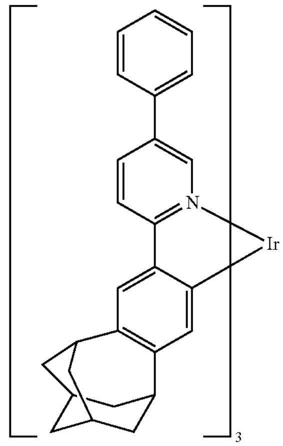
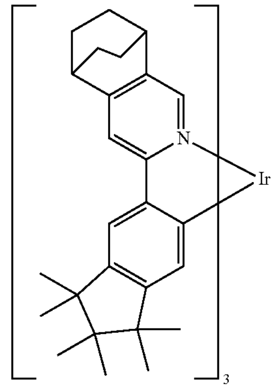
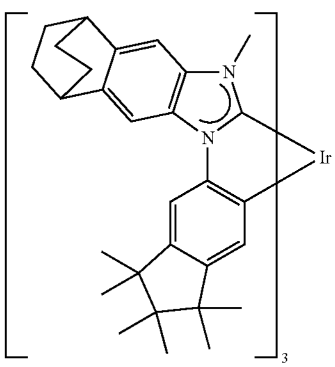
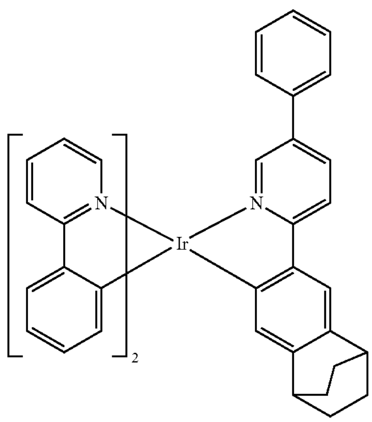
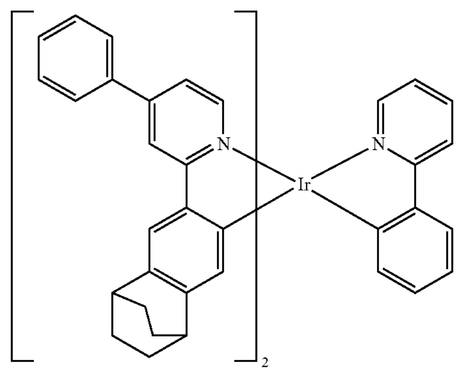
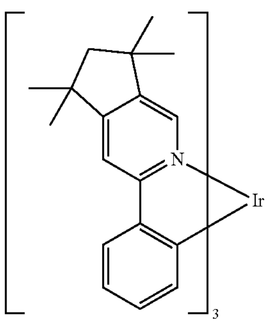
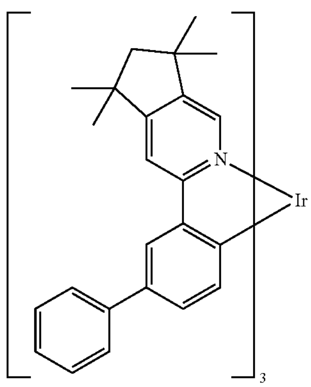
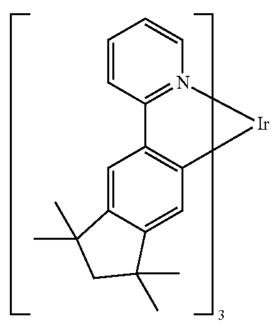
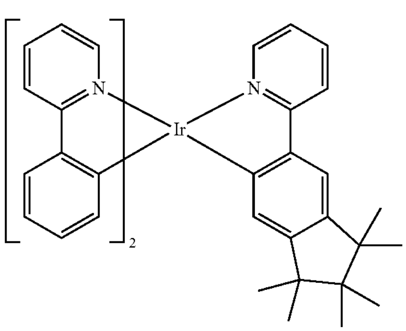
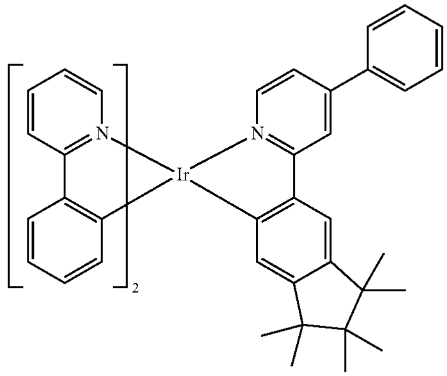

-continued
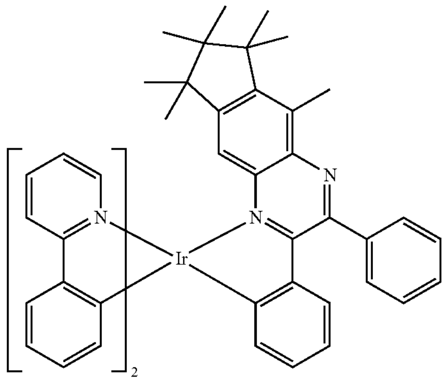
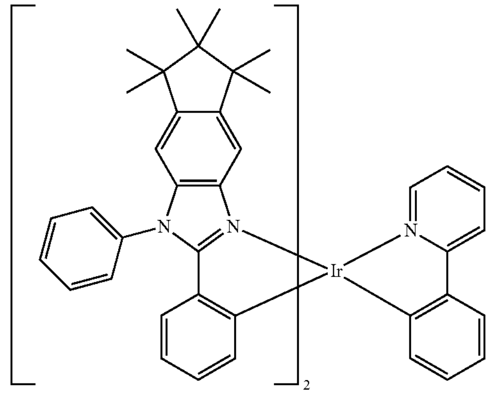
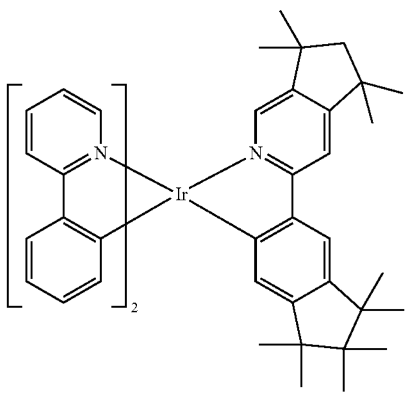
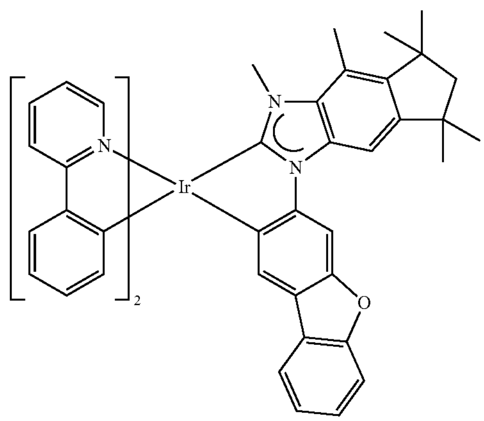
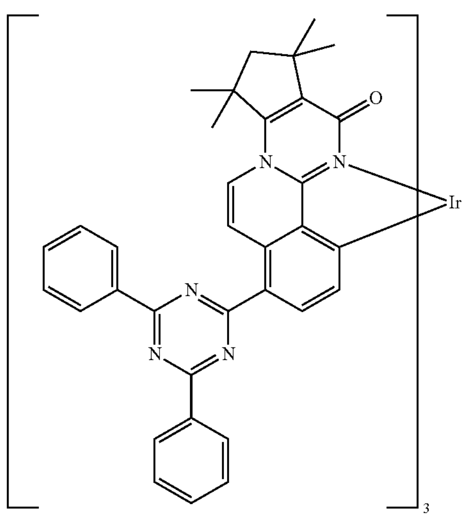
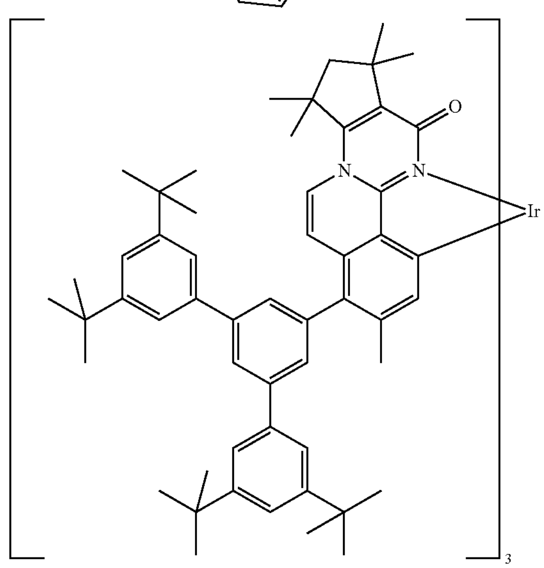
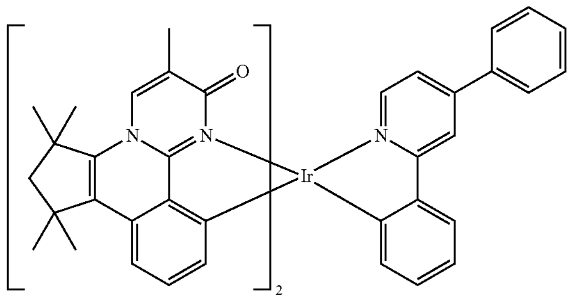

-continued
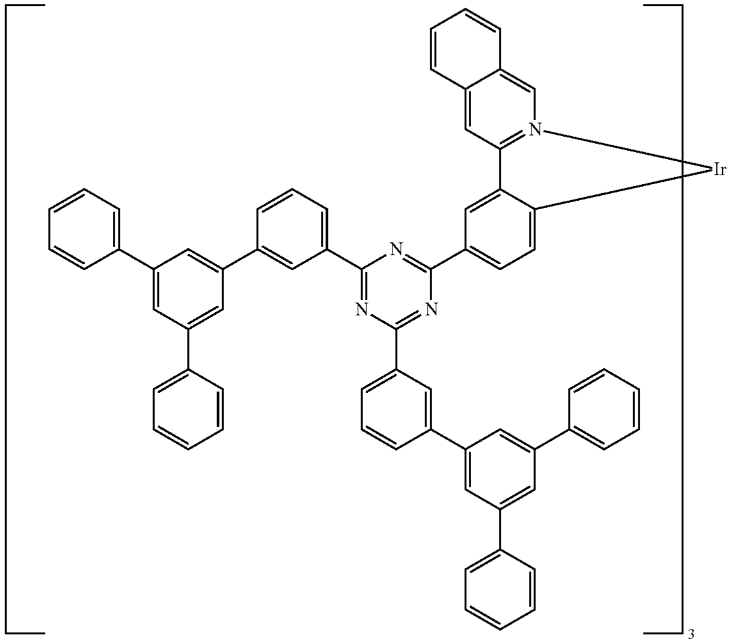
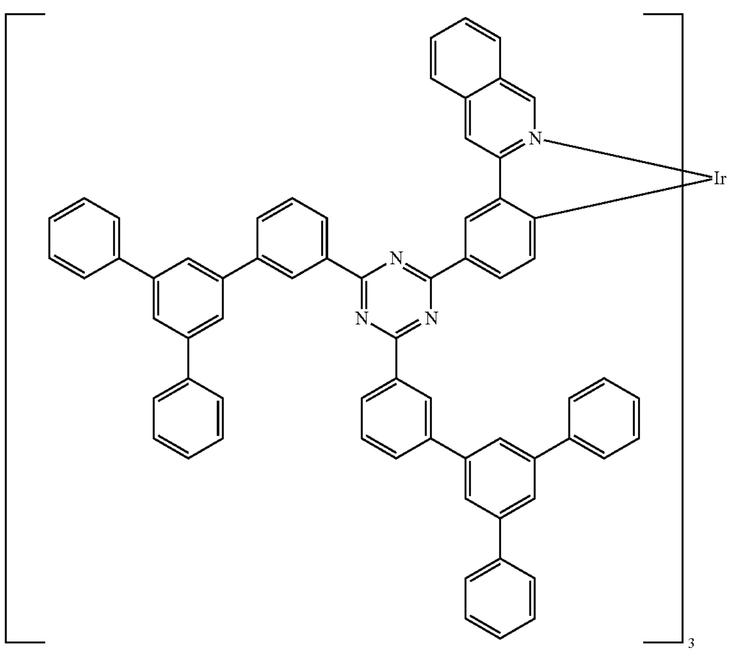

-continued
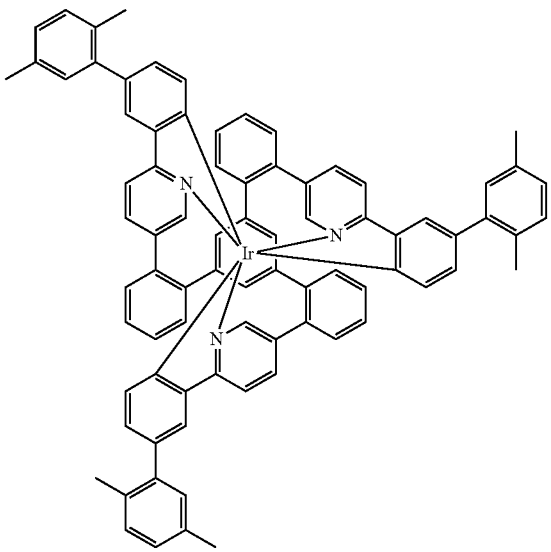
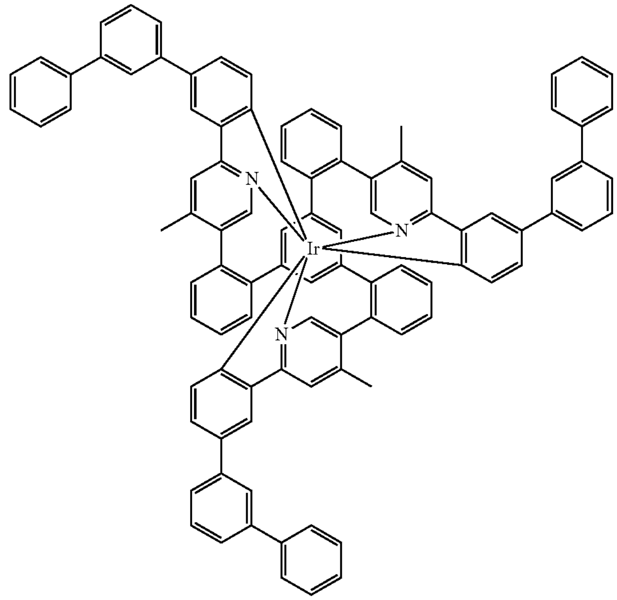
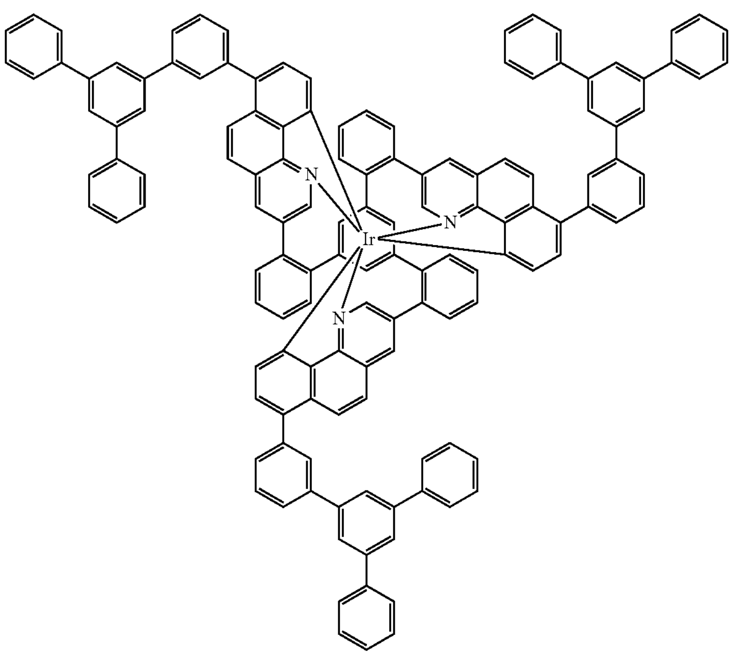

-continued
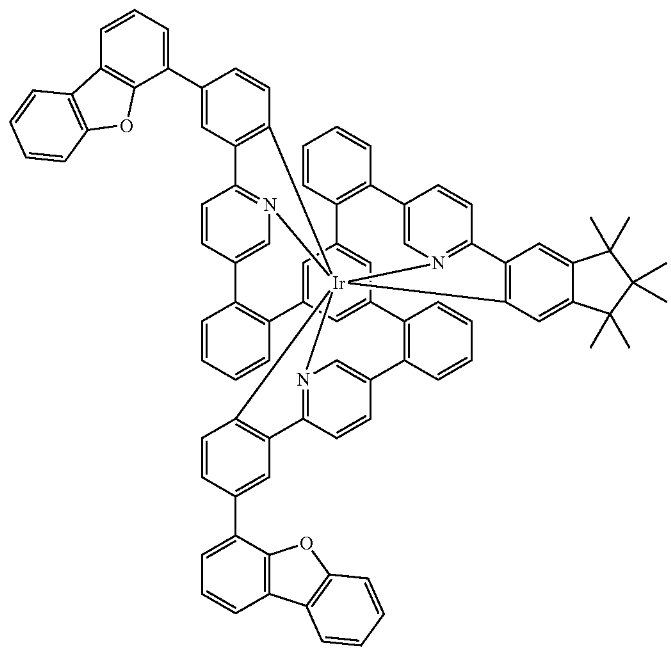
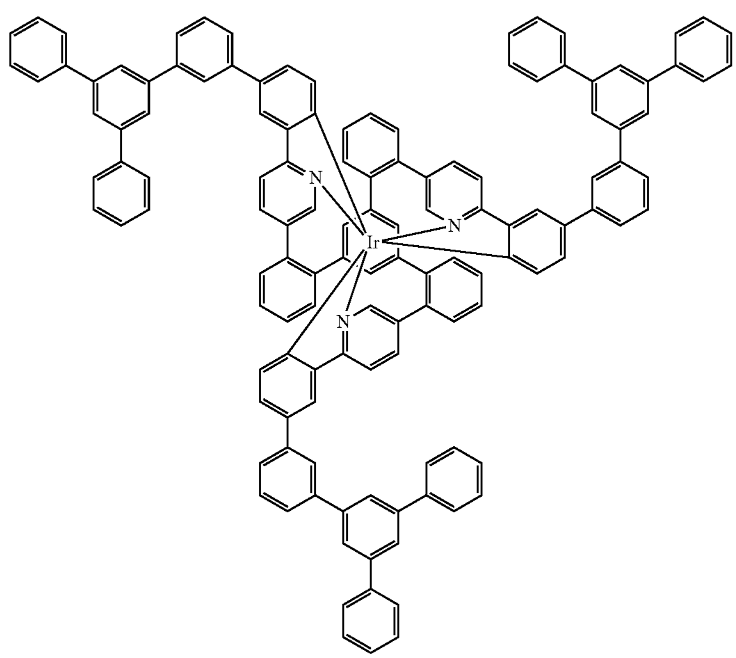

-continued
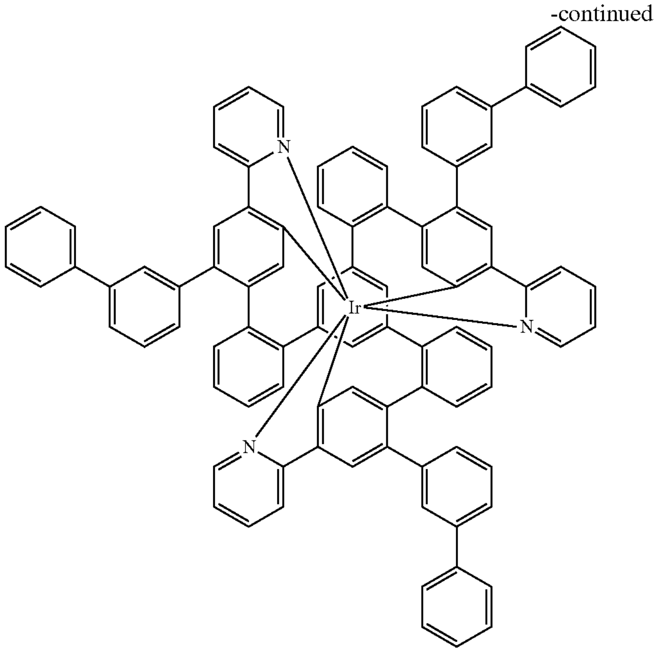
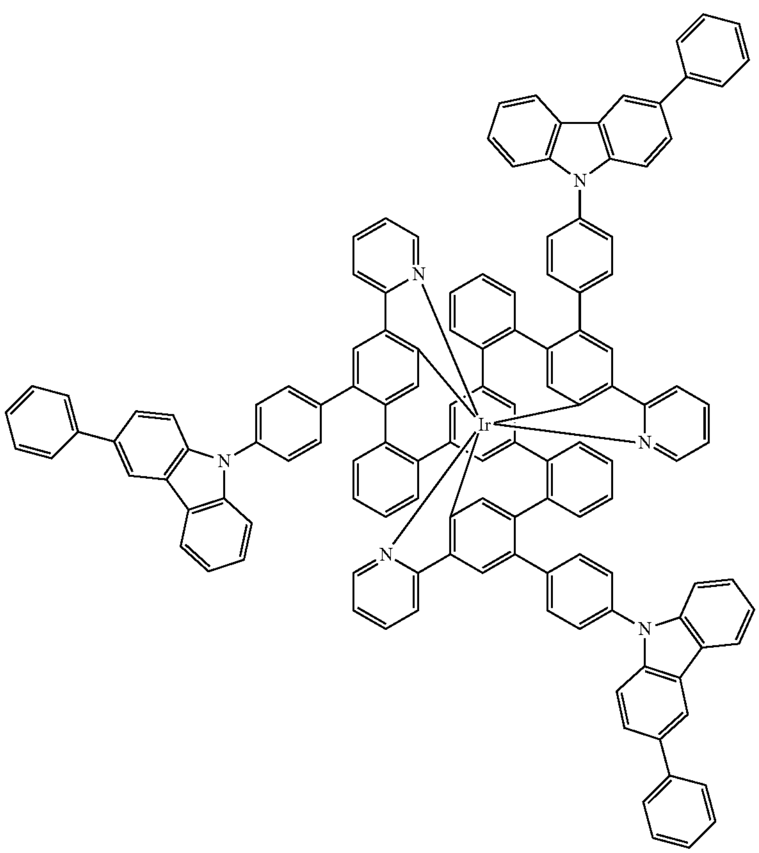

-continued
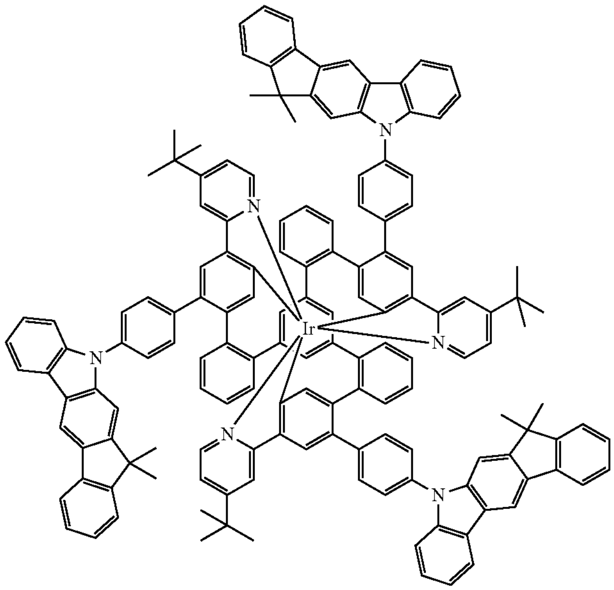
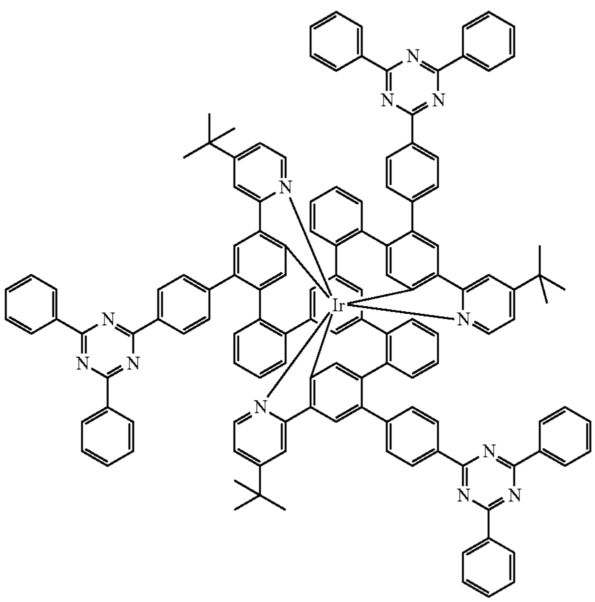

-continued
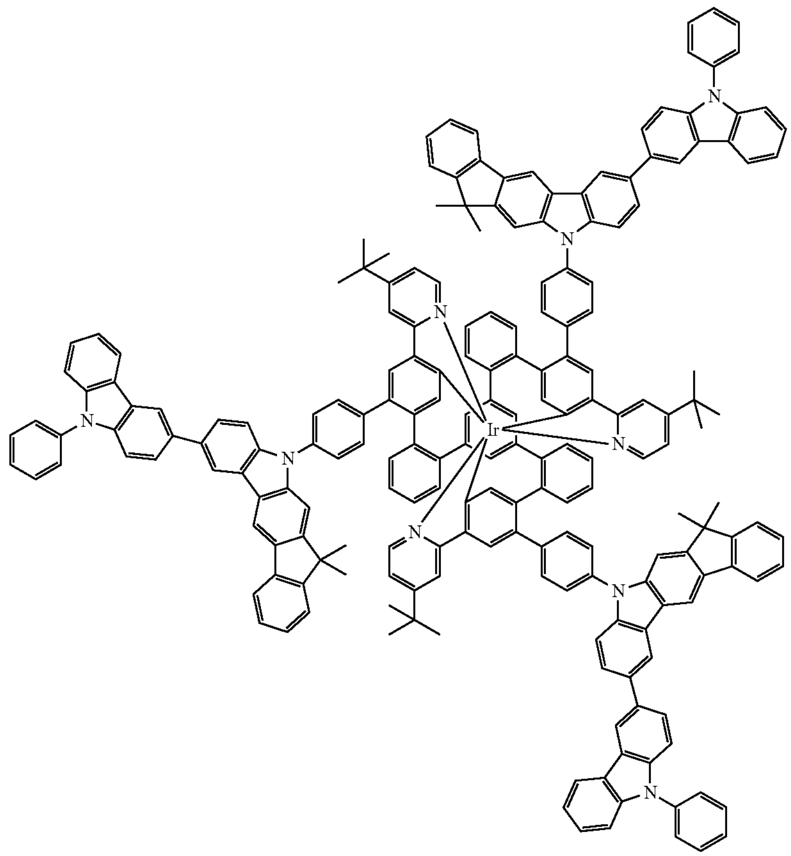
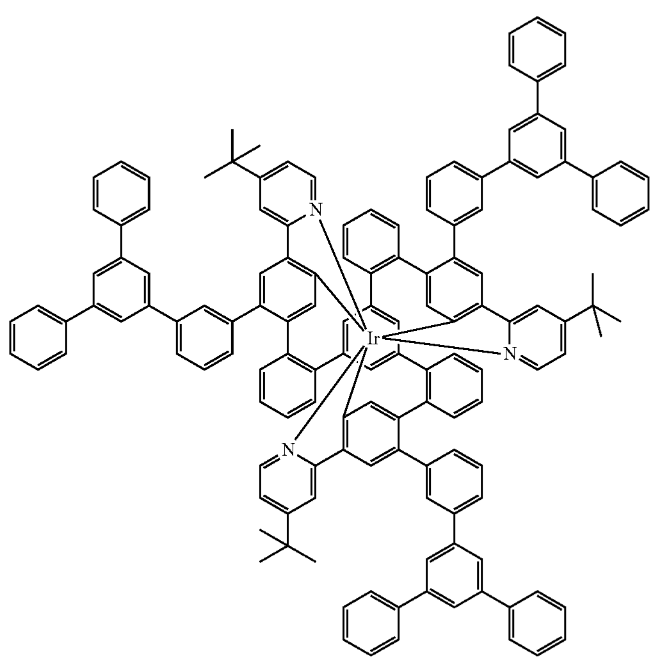

-continued
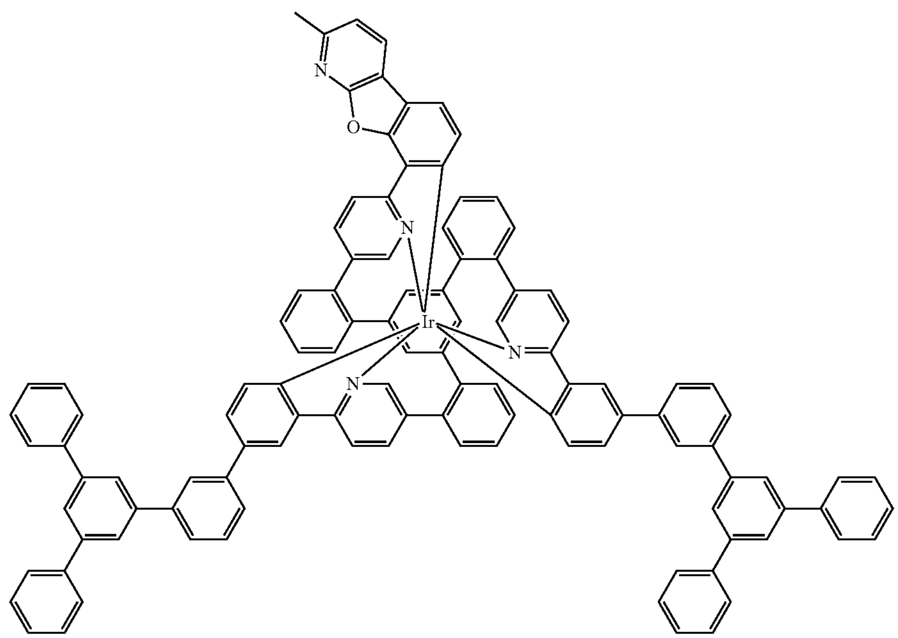
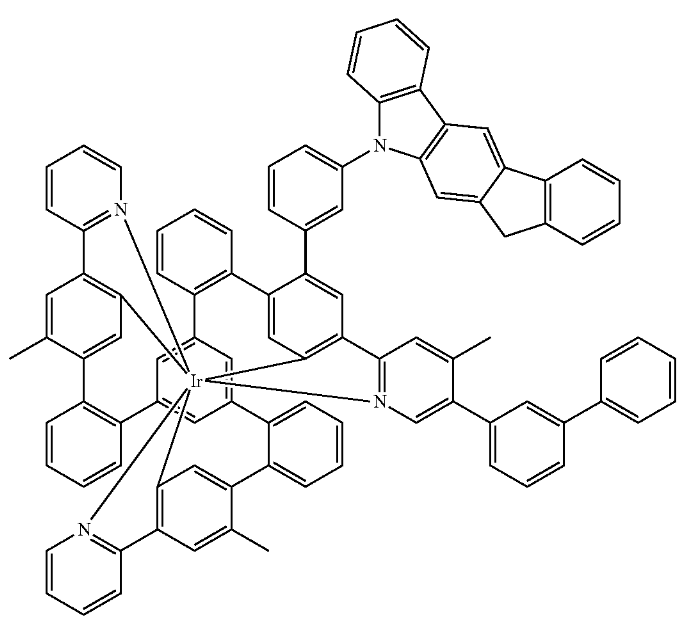

-continued
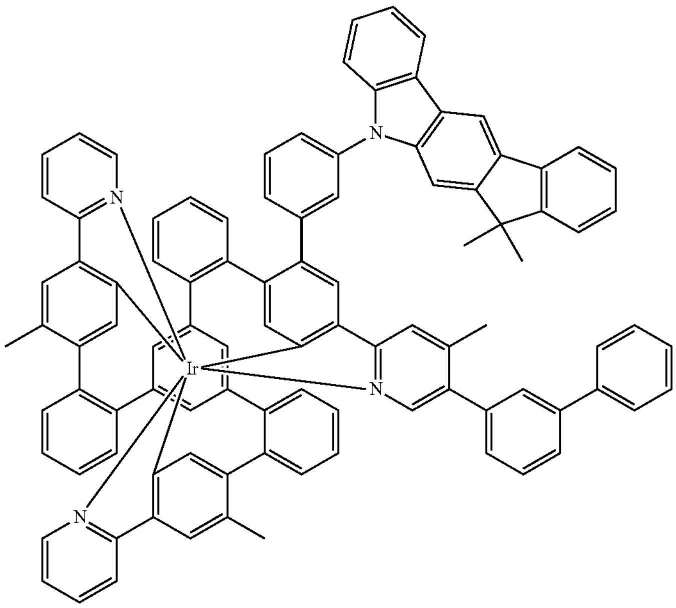
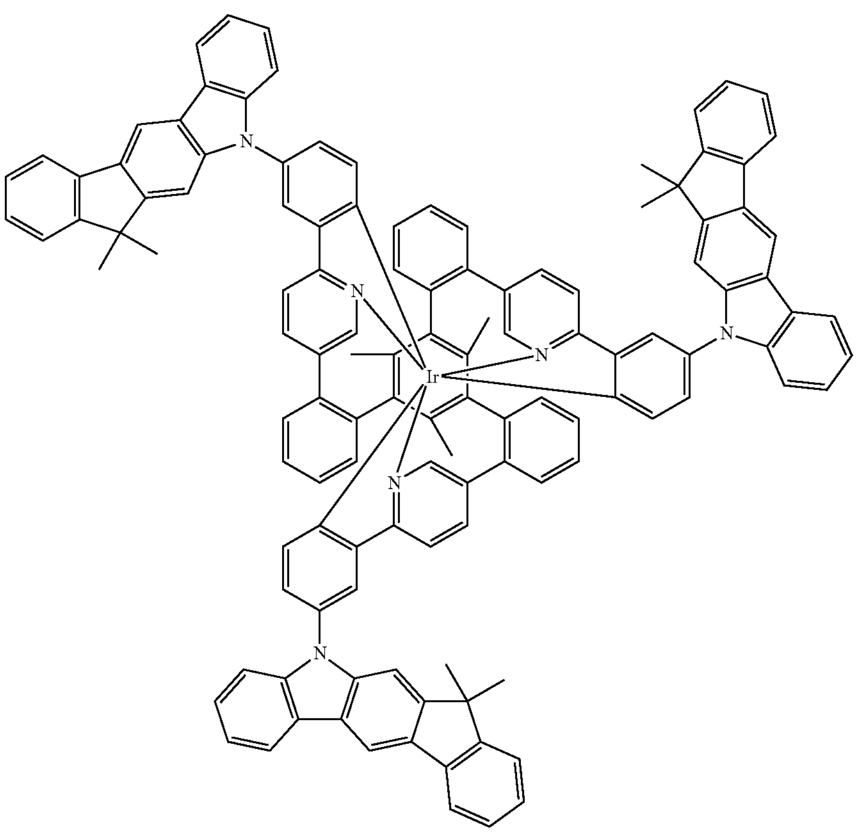

-continued
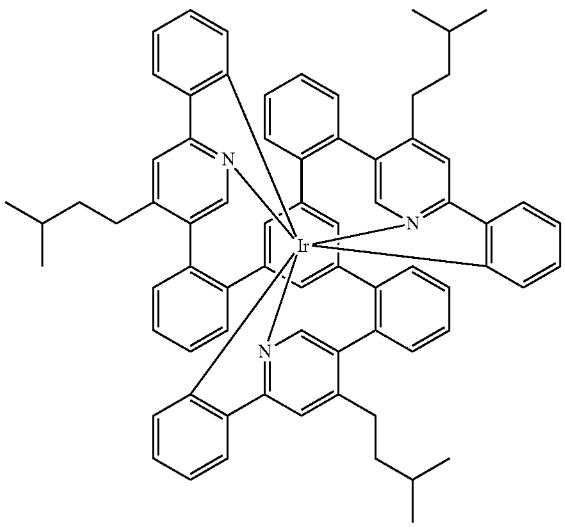
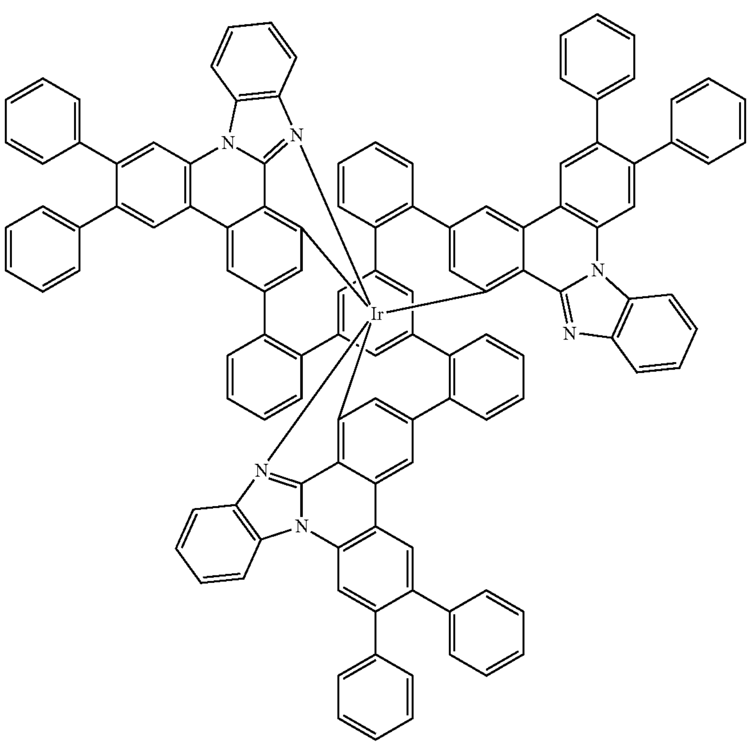

-continued

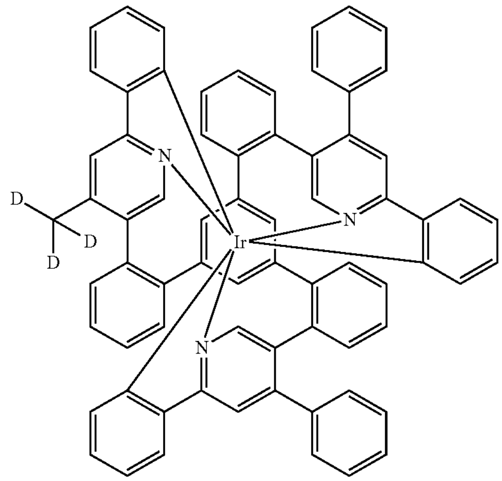

The metal complexes of the invention can also be used in other functions in the electronic device, for example as hole transport material in a hole injection or transport layer, as charge generation material, as electron blocker material, as hole blocker material or as electron transport material, for example in an electron transport layer, according to the structure of the ligand. It is likewise possible to use the metal complexes of the invention as matrix material for other phosphorescent metal complexes in an emitting layer.

Preferred cathodes are metals having a low work function, metal alloys or multilayer structures composed of various metals, for example alkaline earth metals, alkali metals, main group metals or lanthanoids (e.g. Ca, Ba, Mg, Al, In, Mg, Yb, Sm, etc.). Additionally suitable are alloys composed of an alkali metal or alkaline earth metal and silver, for example an alloy composed of magnesium and silver. In the case of multilayer structures, in addition to the metals mentioned, it is also possible to use further metals having a relatively high work function, for example Ag, in which case combinations of the metals such as Mg/Ag, Ca/Ag or Ba/Ag, for example, are generally used. It may also be preferable to introduce a thin interlayer of a material having a high dielectric constant between a metallic cathode and the organic semiconductor. Examples of useful materials for this purpose are alkali metal or alkaline earth metal fluorides, but also the corresponding oxides or carbonates (e.g. LiF, $Li_2O$, $BaF_2$, MgO, NaF, CsF, $Cs_2CO_3$, etc.). Likewise useful for this purpose are organic alkali metal complexes, e.g. Liq (lithium quinolinate). The layer thickness of this layer is preferably between 0.5 and 5 nm.

Preferred anodes are materials having a high work function. Preferably, the anode has a work function of greater than 4.5 eV versus vacuum. Firstly, metals having a high redox potential are suitable for this purpose, for example Ag, Pt or Au. Secondly, metal/metal oxide electrodes (e.g. Al/Ni/$NiO_x$, Al/$PtO_x$) may also be preferred. For some applications, at least one of the electrodes has to be transparent or partly transparent in order to enable either the irradiation of the organic material (O-SC) or the emission of light (OLED/PLED, O-LASER). Preferred anode materials here are conductive mixed metal oxides. Particular preference is given to indium tin oxide (ITO) or indium zinc oxide (IZO). Preference is further given to conductive doped organic materials, especially conductive doped polymers, for example PEDOT, PANI or derivatives of these polymers. It is further preferable when a p-doped hole transport material is applied to the anode as hole injection layer, in which case suitable p-dopants are metal oxides, for example $MoO_3$ or $WO_3$, or (per)fluorinated electron-deficient aromatic systems. Further suitable p-dopants are HAT-CN (hexacyanohexaazatriphenylene) or the compound NPD9 from Novaled. Such a layer simplifies hole injection into materials having a low HOMO, i.e. a large HOMO in terms of magnitude.

In the further layers, it is generally possible to use any materials as used according to the prior art for the layers, and the person skilled in the art is able, without exercising inventive skill, to combine any of these materials with the materials of the invention in an electronic device.

The device is correspondingly (according to the application) structured, contact-connected and finally hermetically sealed, since the lifetime of such devices is severely shortened in the presence of water and/or air.

Additionally preferred is an organic electroluminescent device, characterized in that one or more layers are coated by a sublimation process. In this case, the materials are applied by vapor deposition in vacuum sublimation systems at an initial pressure of typically less than $10^{-5}$ mbar, preferably less than $10^{-6}$ mbar. It is also possible that the initial pressure is even lower or even higher, for example less than $10^{-7}$ mbar.

Preference is likewise given to an organic electroluminescent device, characterized in that one or more layers are coated by the OVPD (organic vapor phase deposition) method or with the aid of a carrier gas sublimation. In this case, the materials are applied at a pressure between $10^{-5}$ mbar and 1 bar. A special case of this method is the OVJP (organic vapor jet printing) method, in which the materials are applied directly by a nozzle and thus structured.

Preference is additionally given to an organic electroluminescent device, characterized in that one or more layers are produced from solution, for example by spin-coating, or by any printing method, for example screen printing, flexographic printing, offset printing or nozzle printing, but more preferably LITI (light-induced thermal imaging, thermal transfer printing) or inkjet printing. For this purpose, soluble compounds are needed, which are obtained, for example, through suitable substitution. In a preferred embodiment of the invention, the layer comprising the compound of the invention is applied from solution.

The organic electroluminescent device can also be produced as a hybrid system by applying one or more layers from solution and applying one or more other layers by vapor deposition. For example, it is possible to apply an emitting layer comprising a metal complex of the invention and a matrix material from solution, and to apply a hole blocker layer and/or an electron transport layer thereto by vapor deposition under reduced pressure.

These methods are known in general terms to those skilled in the art and can be applied by those skilled in the art without difficulty to organic electroluminescent devices comprising compounds of formula (1) or the above-detailed preferred embodiments. The layer comprising the complexes of the invention is more preferably applied from solution.

The electronic devices of the invention, especially organic electroluminescent devices, are notable for one or more of the following surprising advantages over the prior art:

1. The compounds of the invention have a very high photoluminescence quantum yield. When used in an organic electroluminescent device, this leads to excellent efficiencies.
2. The compounds of the invention, when used in an organic electroluminescent device, lead to very long lifetimes.
3. The compounds of the invention have very narrow spectra, which, when used in an organic electroluminescent device, leads to greater color purity.

These abovementioned advantages are not accompanied by a deterioration in the further electronic properties.

The invention is illustrated in more detail by the examples which follow, without any intention of restricting it thereby. The person skilled in the art will be able to use the details given, without exercising inventive skill, to produce further electronic devices of the invention and hence to execute the invention over the entire scope claimed.

EXAMPLES

The syntheses which follow, unless stated otherwise, are conducted under a protective gas atmosphere in dried solvents. The metal complexes are additionally handled with exclusion of light or under yellow light. The solvents and reagents can be purchased, for example, from Sigma-ALDRICH or ABCR. The respective figures in square brackets or the numbers quoted for individual compounds relate to the CAS numbers of the compounds known from the literature.

Synthesis of the Synthons S

Example S1

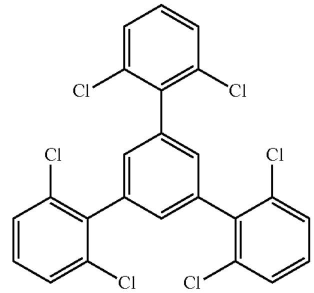 [SMILES: Clc1cccc(Cl)c1-c1cc(-c2c(Cl)cccc2Cl)cc(-c2c(Cl)cccc2Cl)c1]

A mixture of 20.9 g (100 mmol) of 1,3,5-benzenetriboronic acid [89641-21-4], 81.3 (360 mmol) of 1,3-dichloro-2-bromobenzene [19821-80-8], 79.5 g (750 mmol) of sodium carbonate, 2.6 g (10 mmol) of triphenylphosphine, 750 mg (3.3 mmol) of palladium(II) acetate, 500 ml of ethylene glycol dimethyl ether and 500 ml of water is heated at internal temperature 65° C. for 60 h. After cooling, the reaction mixture is worked up by extraction in a separating funnel. For this purpose, the organic phase is removed and the aqueous phase is extracted twice with 200 ml each time of ethyl acetate. Subsequently, the combined organic phases are washed twice with 300 ml each time of water and once with 200 ml of saturated sodium chloride solution, dried over sodium sulfate and concentrated to dryness. The residue is subjected to flash chromatography (Torrent automated column system from A. Semrau). The solids obtained are recrystallized from acetonitrile. Yield 9.2 g (18 mmol), 18%. Purity 95% by $^{1}$H NMR.

B: Synthesis of the Ligands

Example L1

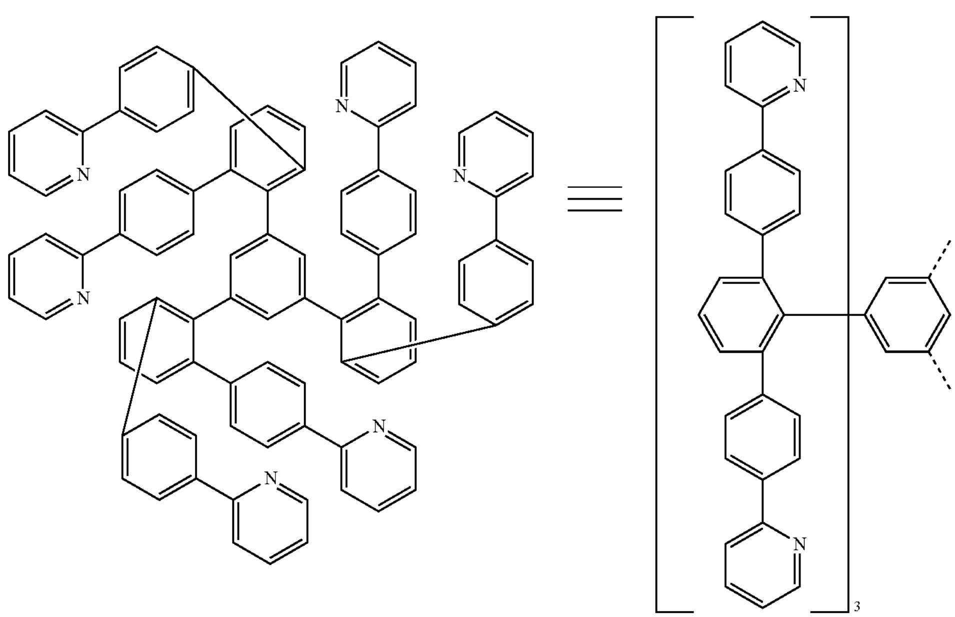

A mixture of 5.1 g (10 mmol) of 51, 22.5 g (80 mmol) of 2-[4-(4,4,5,5-tetramethyl-1,3,2-dioxaborolan-2-yl)phenyl] pyridine [908350-80-1], 38.2 g (180 mmol) of tripotassium phosphate, 507 mg (0.6 mmol) of (2-dicyclohexylphosphino-2',4',6'-triisopropyl-1,1'-biphenyl)[2-(2'-amino-1,1'-biphenyl)]palladium(II) methanesulfonate [1445085-55-1], 300 ml of THF and 100 ml of water is heated to 65° C. with good stirring for 48 h. After cooling, the mixture is diluted with 500 ml of toluene, washed three times with 200 ml each time of water and once with saturated sodium chloride solution and dried over magnesium sulfate. After the toluene has been removed, the crude product is dissolved in 300 ml of dichloromethane and filtered through a silica gel bed in the form of a slurry. The silica gel bed is washed through three times with 200 ml each time of dichloromethane/ethyl acetate 1:1. The filtrate is concentrated to dryness. The residue is chromatographed on silica gel with an ethyl acetate/heptanol eluent mixture (automated flash column system from Axel-Semrau). Yield: 7.0 g (4.8 mmol), 48%. Purity: about 95% by $^1$H NMR.

The following compounds can be prepared in an analogous manner:

| Ex. | Boromic ester/acid | Product | Yield |
|---|---|---|---|
| L2 | 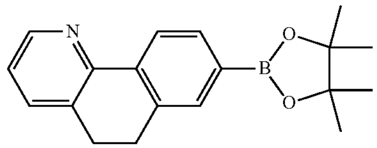 1989597-10-5 | 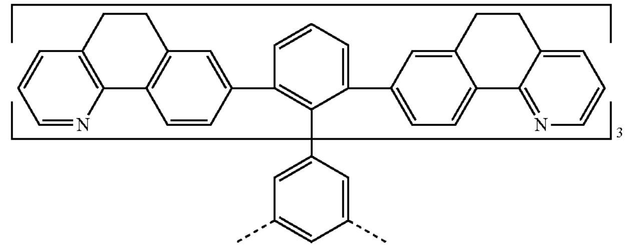 | 36% |
| L3 | 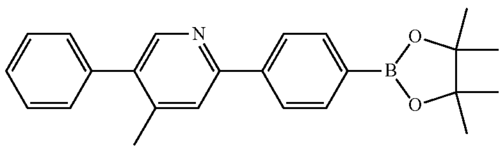 1989597-15-0 | 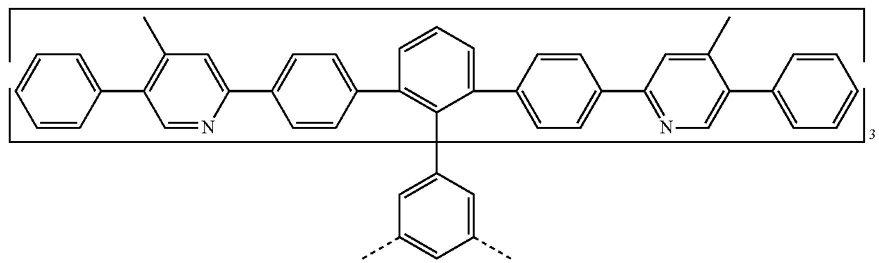 | 28% |
| L4 | 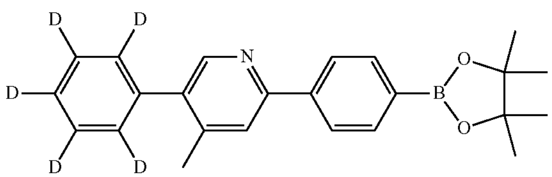 1989597-17-2 | 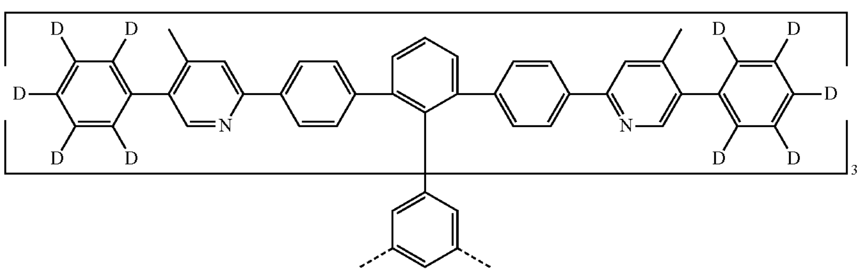 | 32% |
| L5 | 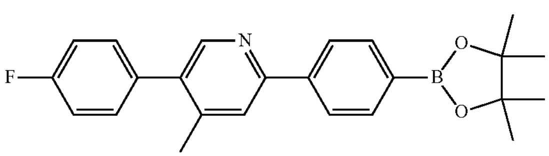 1989597-19-4 | 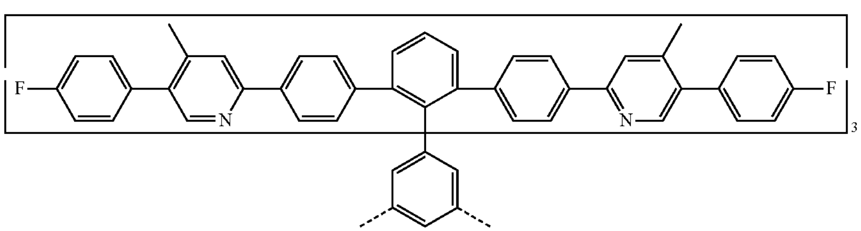 | 33% |

-continued
| Ex. | Boromic ester/acid | Product | Yield |
| --- | --- | --- | --- |
| L6 | 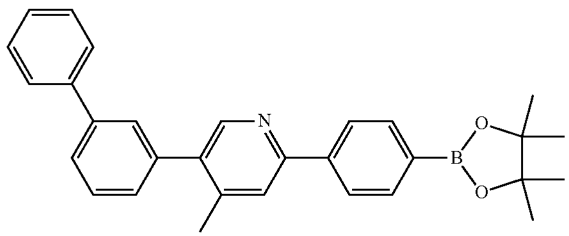 1989597-25-2 | 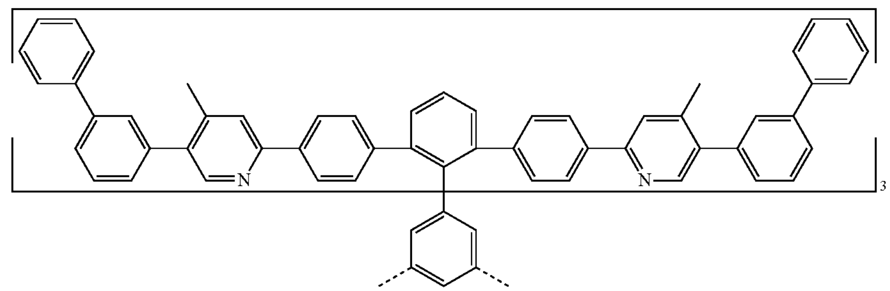 | 30% |
| L7 | 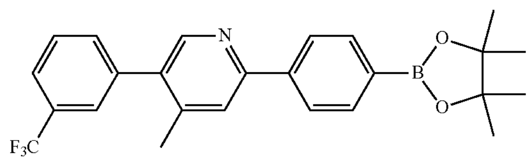 1989596-23-0 | 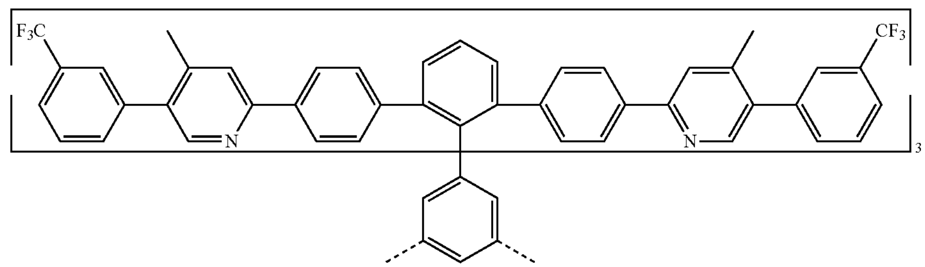 | 28% |
| L8 | 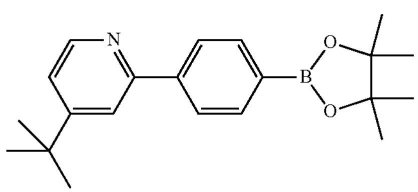 1989596-74-8 | 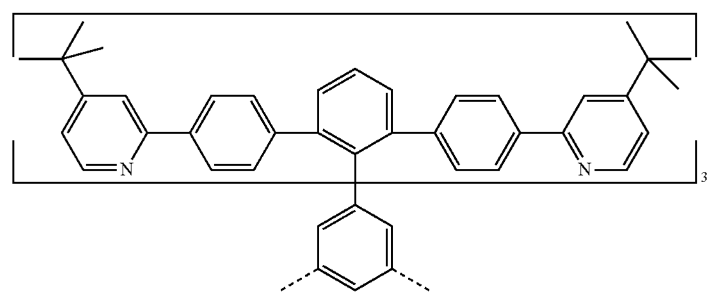 | 34% |

-continued
| Ex. | Boromic ester/acid | Product | Yield |
|---|---|---|---|
| L9 | 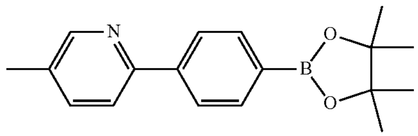 1391090-36-0 | 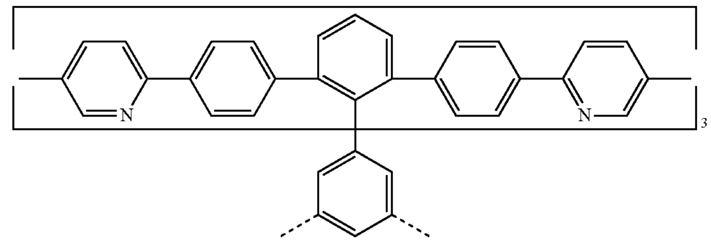 | 37% |
| L10 | 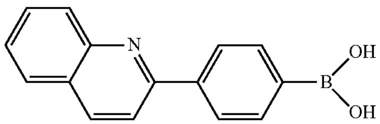 1103778-52-4 | 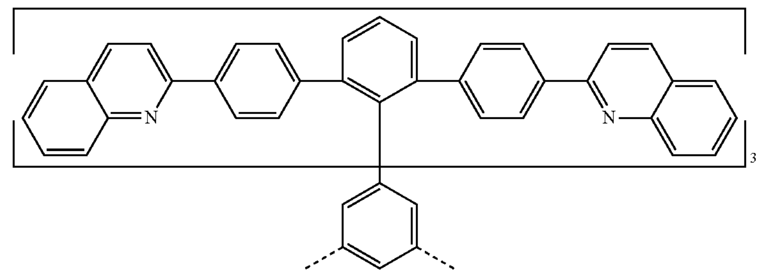 | 25% |
| L11 | 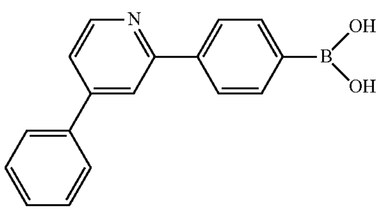 1714084-48-6 | 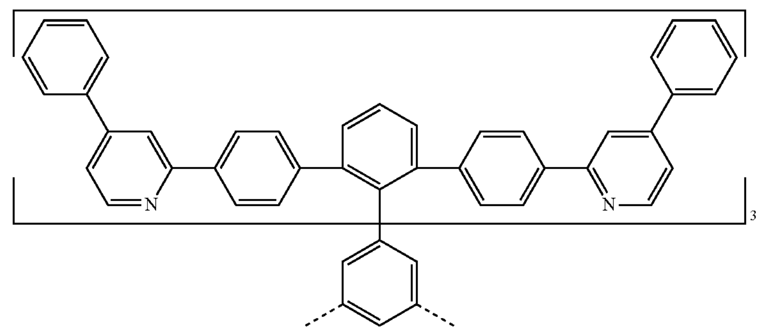 | 36% |

-continued
| Ex. | Boromic ester/acid | Product | Yield |
| --- | --- | --- | --- |
| L12 | 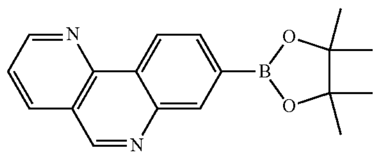 1989596-53-3 | 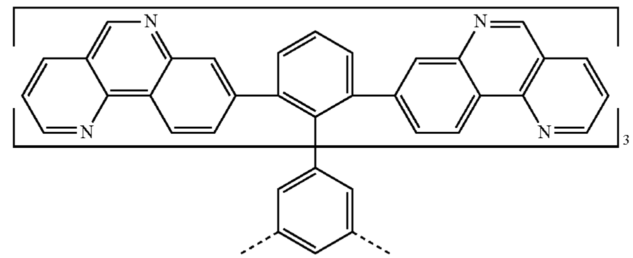 | 29% |
| L13 | 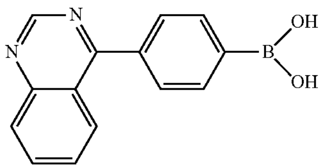 1807910-77-5 | 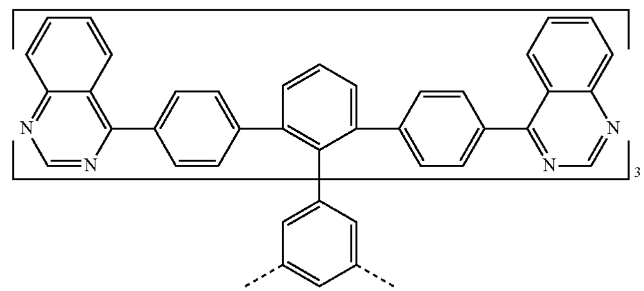 | 30% |
| L14 | 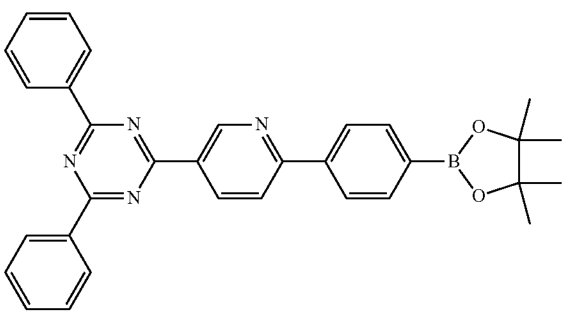 1989603-25-9 | 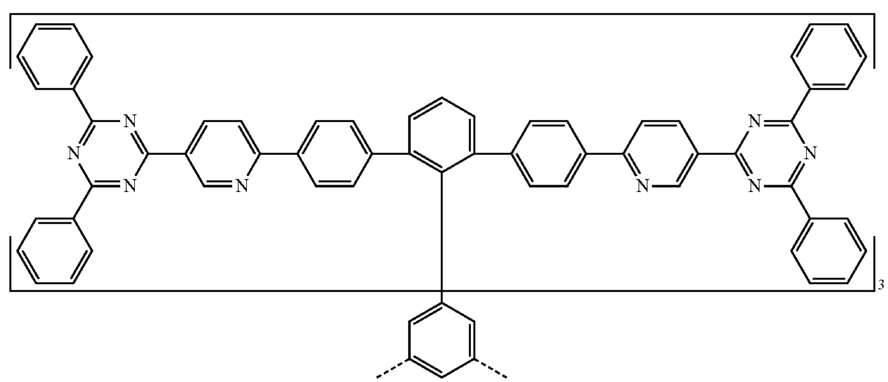 | 23% |

-continued
| Ex. | Boromic ester/acid | Product | Yield |
|---|---|---|---|
| L15 | 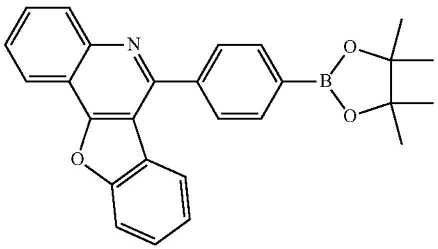 1848992-66-4 | 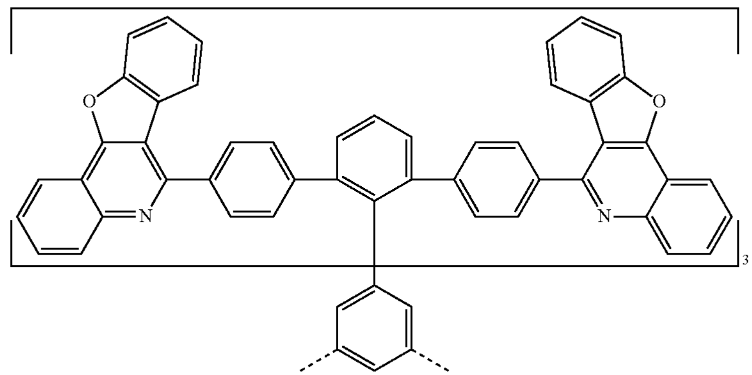 | 26% |
| L16 | 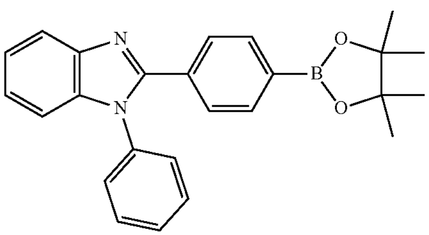 1146340-38-6 | 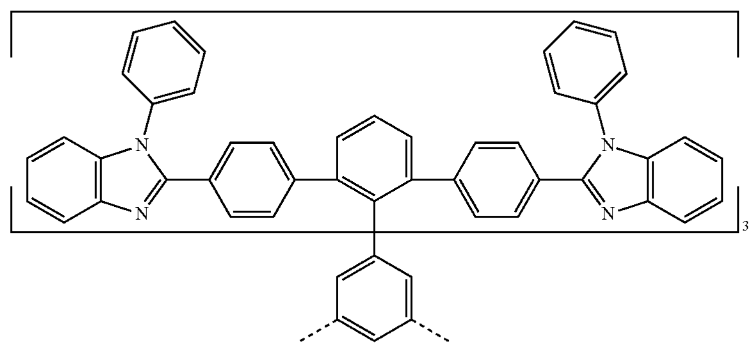 | 39% |
| L17 | 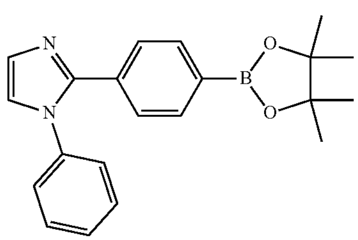 1621467-82-0 | 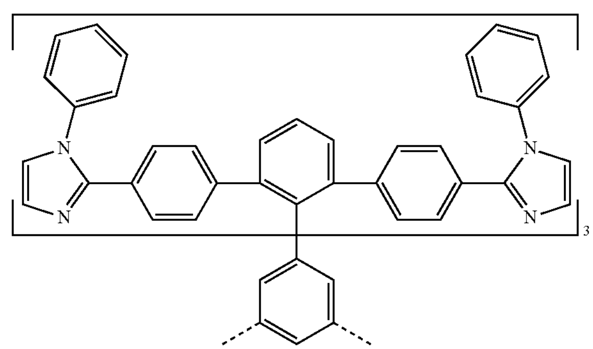 | 37% |

-continued
| Ex. | Boromic ester/acid | Product | Yield |
|---|---|---|---|
| L18 | 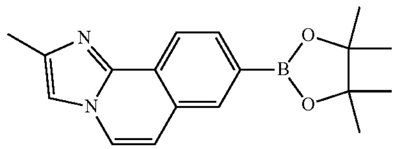 1989597-11-6 | 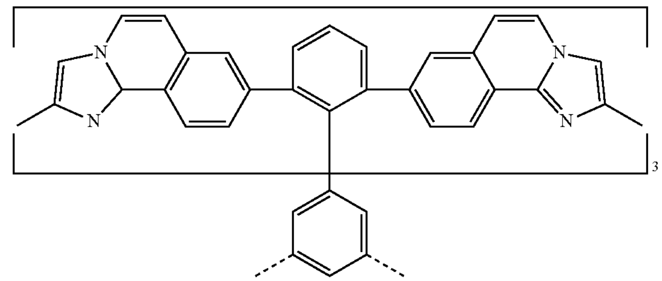 | 31% |
| L19 | 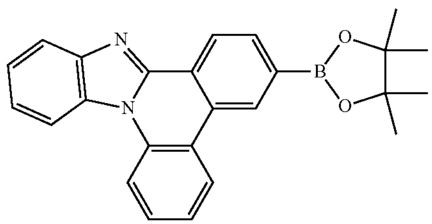 1228267-13-7 | 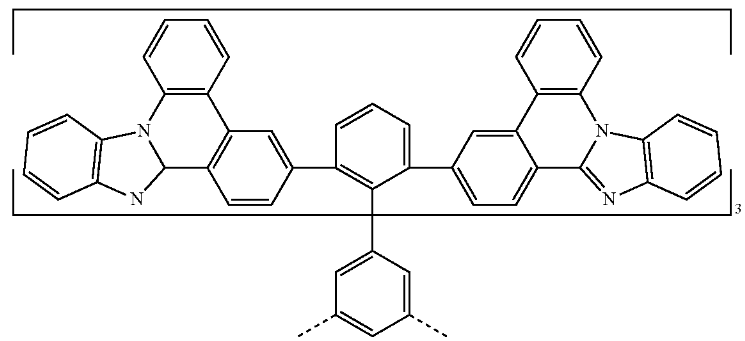 | 28% |
| L20 | 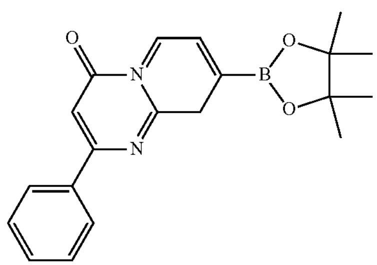 1989596-82-8 | 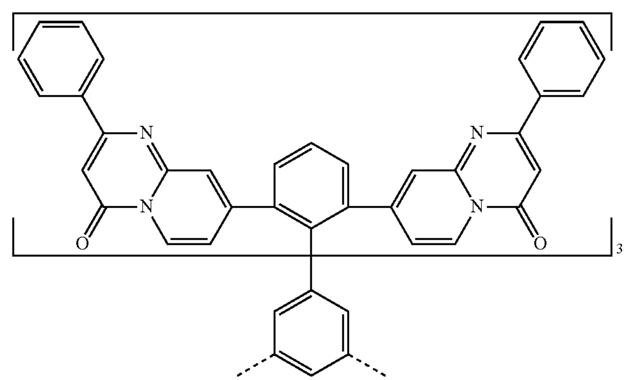 | 43% |

-continued
| Ex. | Boromic ester/acid | Product | Yield |
| --- | --- | --- | --- |
| L21 | 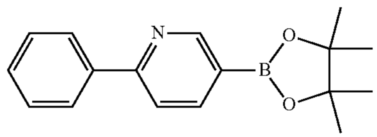 879291-27-7 | 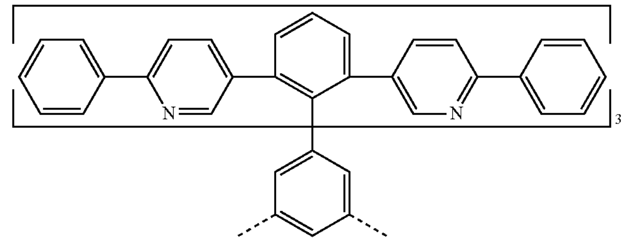 | 45% |
| L22 | 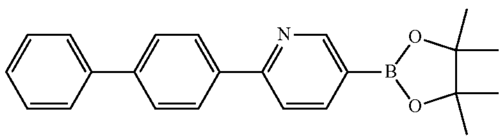 1989596-33-9 | 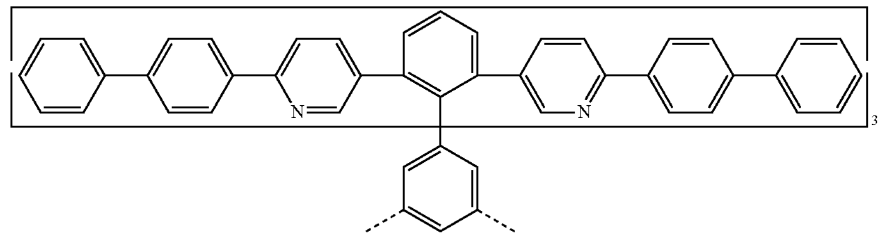 | 37% |
| L23 | 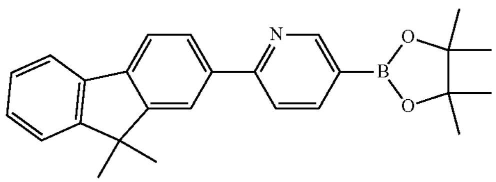 1946760-64-0 | 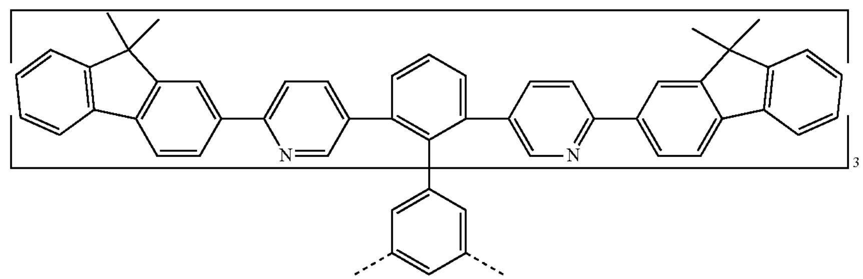 | 34% |
| L24 | 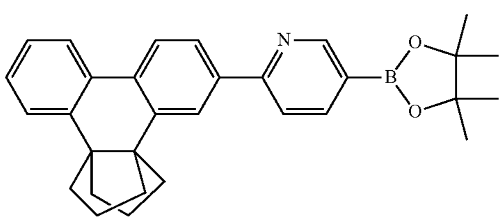 1889203-21-7 | 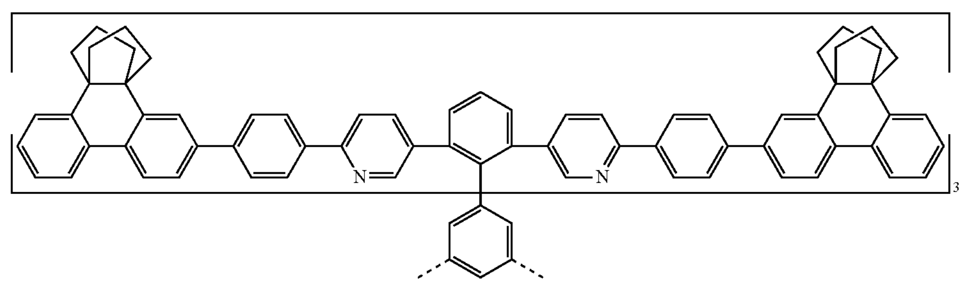 | 30% |

-continued
| Ex. | Boromic ester/acid | Product | Yield |
|---|---|---|---|
| L25 | 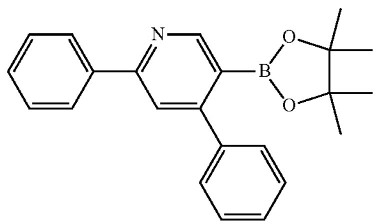 1989596-45-3 | 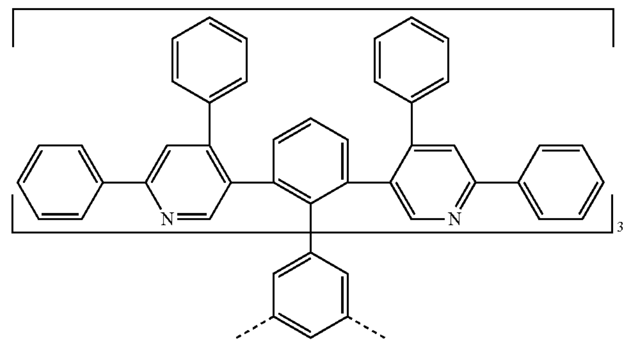 | 35% |
| L26 | 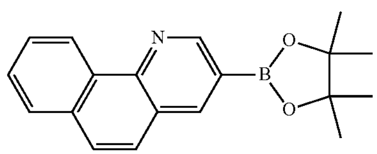 1989596-48-6 | 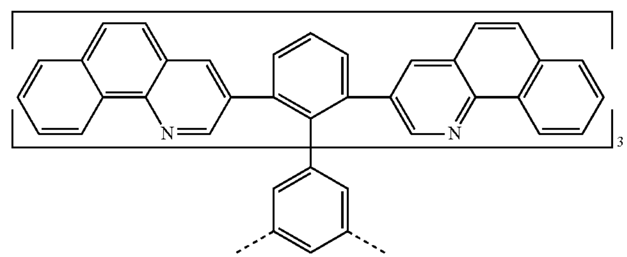 | 31% |
| L27 | 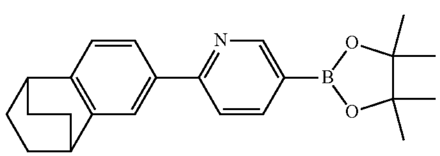 1989596-41-9 | 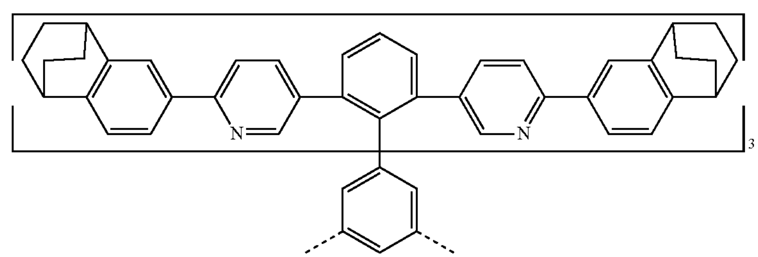 | 36% |

-continued
| Ex. | Boromic ester/acid | Product | Yield |
| --- | --- | --- | --- |
| L28 | 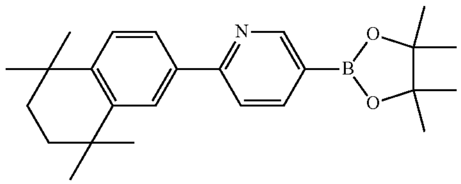 1989596-39-5 | 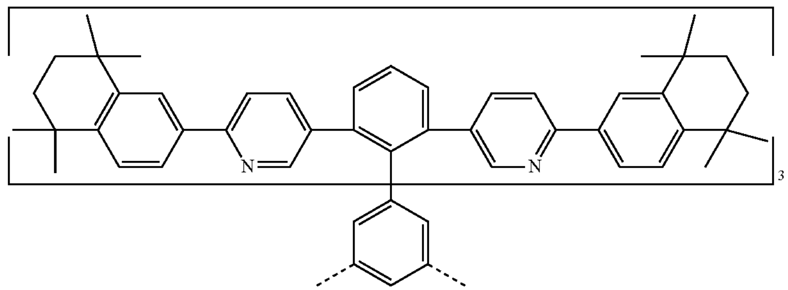 | 35% |
| L29 | 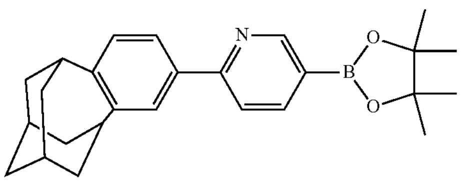 1989596-42-0 | 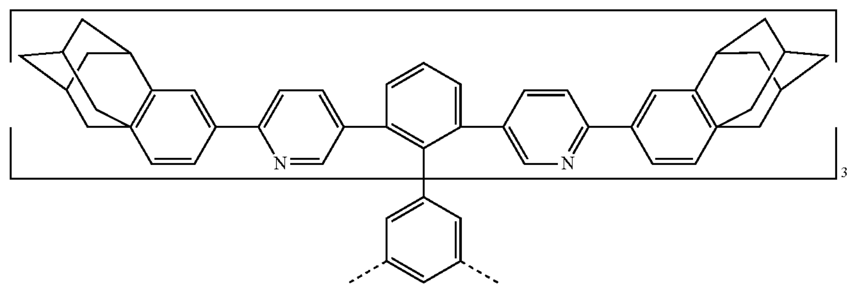 | 39% |
| L30 | 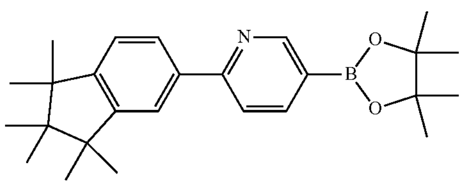 1870010-53-9 | 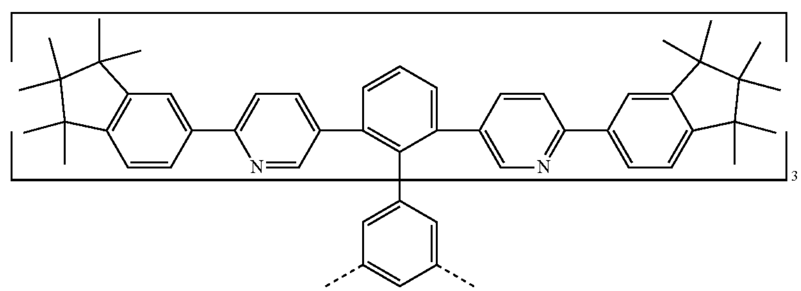 | 34% |

-continued
| Ex. | Boromic ester/acid | Product | Yield |
|---|---|---|---|
| L31 | 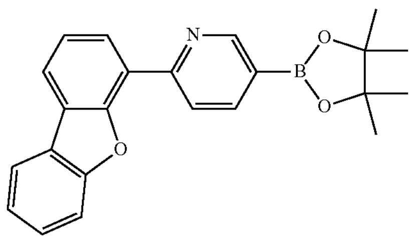 1621690-56-9 | 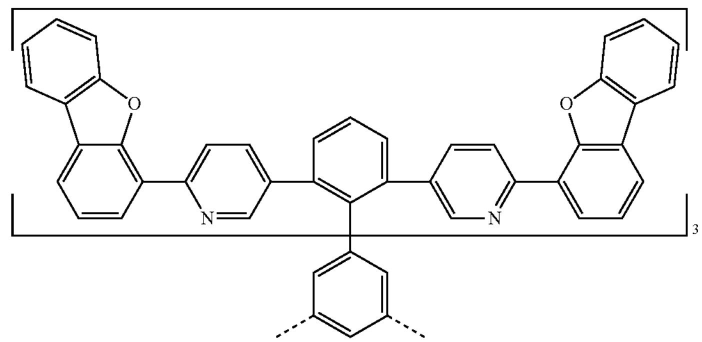 | 38% |
| L32 | 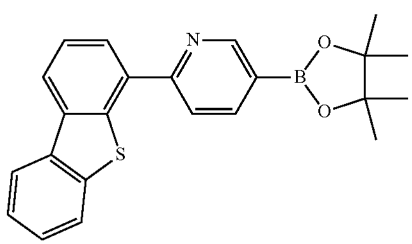 1621690-57-0 | 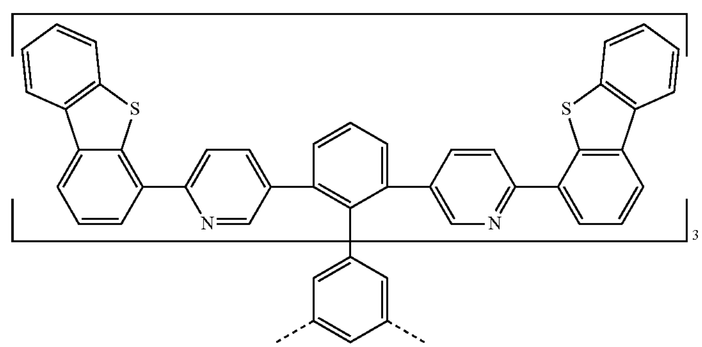 | 38% |

-continued
| Ex. | Boromic ester/acid | Product | Yield |
| --- | --- | --- | --- |
| L33 | 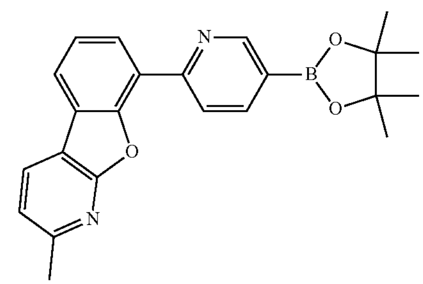 1989596-54-4 | 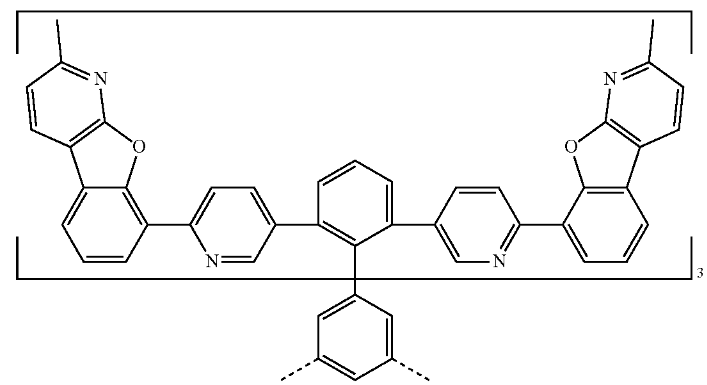 | 35% |
| L34 | 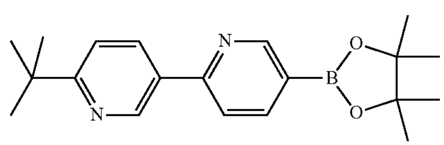 1989596-68-0 | 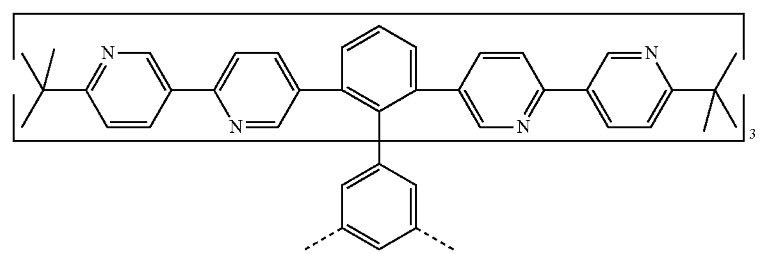 | 29% |

C: Synthesis of the Metal Complexes

Ir2(L1)

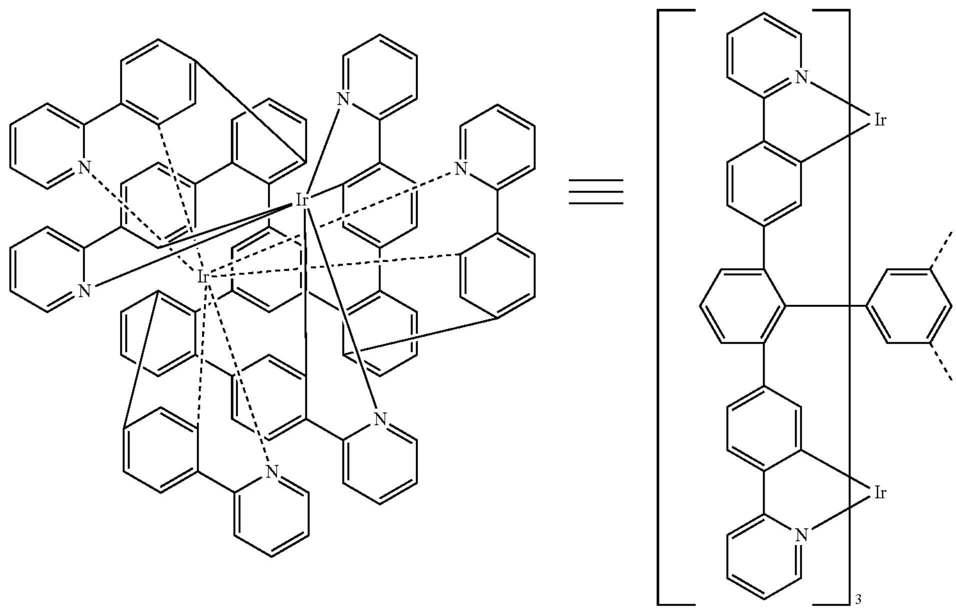

A mixture of 14.5 g (10 mmol) of ligand L1, 9.8 g (20 mmol) of trisacetylacetonatoiridium(III) [15635-87-7] and 100 g of hydroquinone [123-31-9] is initially charged in a 1000 ml two-neck round-bottom flask with a glass-sheathed magnetic bar. The flask is provided with a water separator (for media of lower density than water) and an air condenser with argon blanketing and placed into a metal heating bath. The apparatus is purged with argon from the top via the argon blanketing system for 15 min, allowing the argon to flow out of the side neck of the two-neck flask.

Through the side neck of the two-neck flask, a glass-sheathed Pt-100 thermocouple is introduced into the flask and the end is positioned just above the magnetic stirrer bar. Then the apparatus is thermally insulated with several loose windings of domestic aluminum foil, the insulation being run up to the middle of the riser tube of the water separator. Then the apparatus is heated rapidly with a heated laboratory stirrer system to 250° C., measured with the Pt-100 thermal sensor which dips into the molten stirred reaction mixture. Over the next 2 h, the reaction mixture is kept at 250° C., in the course of which a small amount of condensate is distilled off and collects in the water separator. The reaction mixture is left to cool down to 190° C., then 100 ml of ethylene glycol are added dropwise. The mixture is left to cool down further than to 80° C., and then 500 ml of methanol are added dropwise and the mixture is heated at reflux for 1 h. The suspension thus obtained is filtered through a double-ended frit, and the solids are washed twice with 50 ml of methanol and then dried under reduced pressure. Further purification by hot extraction five times with chlorobenzene (amount initially charged in each case about 300 ml, extraction thimble: standard Soxhlet thimbles made from cellulose from Whatman) with careful exclusion of air and light. Finally, the product is subjected to heat treatment treated at 280° C. under high vacuum. Yield: 10.8 g (6.4 mmol), 64%. Purity: >99.9% by HPLC.

In the case of complexes of the C3 point group, ΔΔ and ΛΛ enantiomers are obtained as a racemate. These can be separated by standard techniques (chromatography on chiral media, reaction with strong chiral acids (e.g. camphorsulfonic acid) and fractional crystallization of the diastereomeric salt pairs). In the case of complexes of the C1 point group, as well as enantiomers, diastereomers can also occur, which can likewise be separated by chromatography or by fractional crystallization.

The metal complexes shown below can in principle be purified by chromatography (typically use of an automated column system (Torrent from Axel Semrau), recrystallization or hot extraction). Residual solvents can be removed by heat treatment under high vacuum at typically 250-330° C.

The following compounds can be synthesized in an analogous manner:

| Ex. | Reactants variant | Product Reaction time/temperture* Hot extraction solvent* | Yield |
|---|---|---|---|
| $Ir_2$(L2) | L2 | 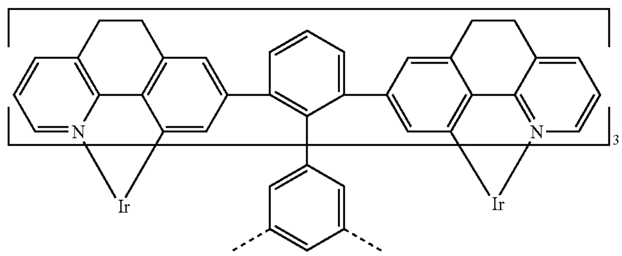 dichlormethane (DCM) | 60% |
| $Ir_2$(L3) | L3 | 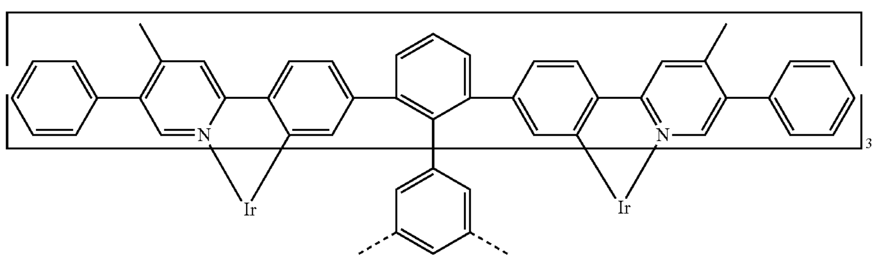 DCM | 56% |
| $Ir_2$(L4) | L4 | $Ir_2$(L4) DCM | 58% |
| $Ir_2$(L5) | L5 | $Ir_2$(L5) DCM | 55% |
| $Ir_2$(L6) | L6 | $Ir_2$(L6) toluene | 60% |
| $Ir_2$(L7) | L7 | $Ir_2$(L7) DCM | 63% |
| $Ir_2$(L8) | L8 | $Ir_2$(L8) o-Xylene | 67% |
| $Ir_2$(L9) | L9 | $Ir_2$(L9) DCM | 61% |
| $Ir_2$(L10) | L10 | 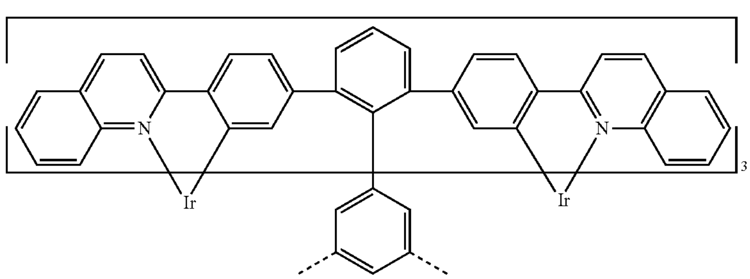 $Ir_2$(L10) mesitylene | 34% |
| $Ir_2$(L11) | L11 | $Ir_2$(L11) toluene | 58% |
| $Ir_2$(L12) | L12 | $Ir_2$(L12) | 62% |
| $Ir_2$(L13) | L13 | $Ir_2$(L13) | 55% |
| $Ir_2$(L14) | L14 | $Ir_2$(L14) Butyl acetare | 59% |
| $Ir_2$(L15) | L15 | $Ir_2$(L15) | 60% |

-continued
| Ex. | Reactants variant | Product Reaction time/temperture* Hot extraction solvent* | Yield |
| --- | --- | --- | --- |
| $Ir_2$(L16) | L16 | 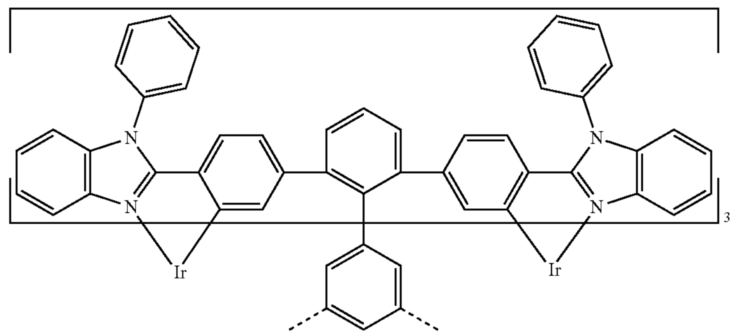 $Ir_2$(L16) | 72% |
| $Ir_2$(L17) | L17 | $Ir_2$(L17) o-xylene | 64% |
| $Ir_2$(L18) | L18 | 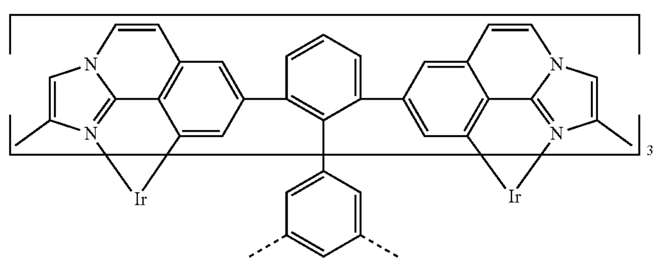 $Ir_2$(L18) 2 h/260° C. DCM | 44% |
| $Ir_2$(L19) | L19 | $Ir_2$(L19) 2 h/260° C. | 41% |
| $Ir_2$(L20) | L20 | 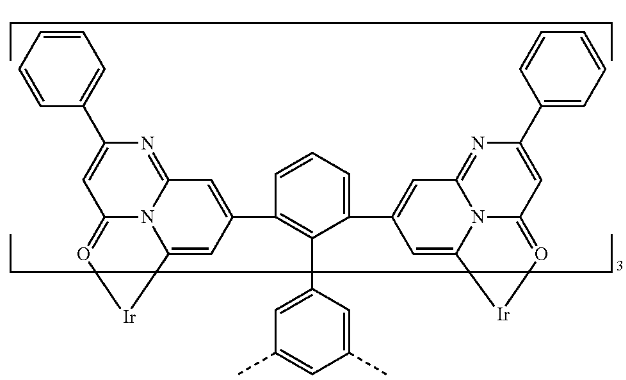 $Ir_2$(L20) | 54% |

-continued

| Ex. | Reactants variant | Product Reaction time/temperture* Hot extraction solvent* | Yield |
|---|---|---|---|
| $Ir_2(L21)$ | L21 | 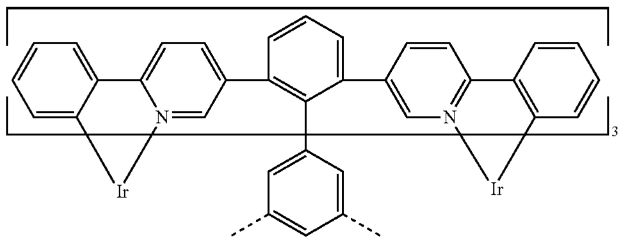 $Ir_2(L21)$ DCM | 69% |
| $Ir_2(L22)$ | L22 | $Ir_2(L22)$ DCM | 66% |
| $Ir_2(L23)$ | L23 | $Ir_2(L23)$ DCM | 63% |
| $Ir_2(L24)$ | L24 | $Ir_2(L24)$ o-dichlorobenzene | 58% |
| $Ir_2(L25)$ | L25 | $Ir_2(L25)$ o-xylene | 58% |
| $Ir_2(L26)$ | L26 | $Ir_2(L26)$ | 60% |
| $Ir_2(L27)$ | L27 | $Ir_2(L27)$ DCM | 64% |
| $Ir_2(L28)$ | L28 | $Ir_2(L28)$ DCM | 62% |
| $Ir_2(L29)$ | L29 | $Ir_2(L29)$ Toluene | 59% |
| $Ir_2(L30)$ | L30 | $Ir_2(L34)$ o-xylene | 57% |
| $Ir_2(L31)$ | L31 | $Ir_2(L31)$ | 64% |
| $Ir_2(L32)$ | L32 | $Ir_2(L32)$ | 49% |
| $Ir_2(L33)$ | L33 | $Ir_2(L33)$ | 58% |
| $Ir_2(L34)$ | L34 | 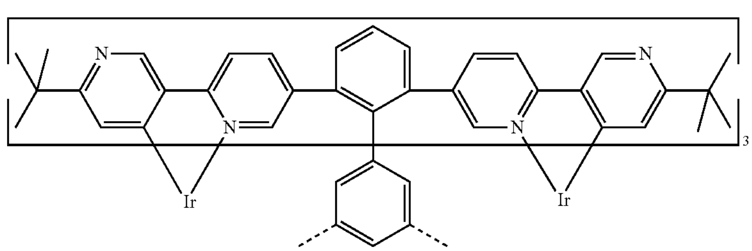 $Ir_2(L34)$ 2 h/260° C. Butyl acetate | 36% |

*if different

In an analogous manner, by sequential addition of first 10 mmol of $Ir(acac)_3$ and conducting the reaction at 250° C. for 1 h and then addition of 10 mmol of $Rh(acac)_3$ [14284-92-5] and continuing the reaction at 250° C. for 1 h and subsequent workup and purification as described above, it is possible to obtain mixed metallic Rh—Ir complexes.

| | | | |
|---|---|---|---|
| Rh-Ir(L1) | L1<br>1)10 mmol<br>$Ir(acac)_3$<br>[15635-87-7]<br>2) 10 mmol<br>$Rh(acac)_3$<br>[14284-92-5] | 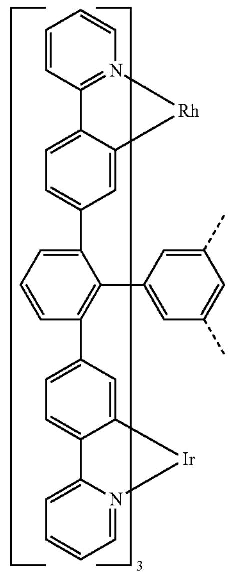<br>I1-Rh-Ir(L1)<br>250° C., 2 h<br>HE:toluene | 14% |
| Rh-Ir(L16) | L16<br>1)10 mmol<br>$Ir(acac)_3$<br>[15635-87-7]<br>2) 10 mmol<br>$Rh(acac)_3$<br>[14284-92-5] | 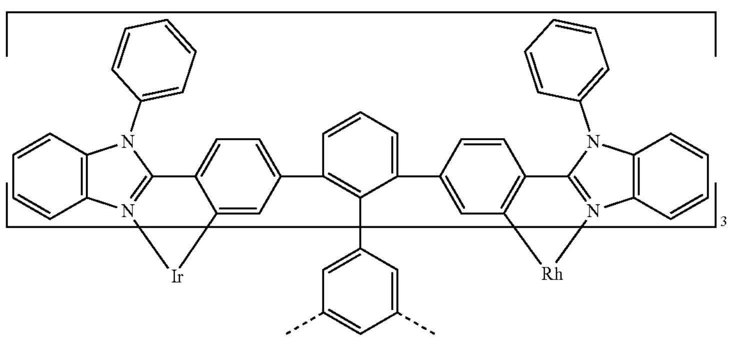<br>I1-Rh-Ir(L16)<br>250° C., 2 h<br>HE: toluene | 17% |

D: Functionalization of the Metal Complexes

1) Halogenation of the Iridium Complexes:

To a solution or suspension of 1 mmol of a complex bearing A×C—H groups (with A=1-6) in the para position to the iridium in the bidentate sub-ligand in 200 ml to 2000 ml of dichloromethane according to the solubility of the metal complexes is added, in the dark and with exclusion of air, at −30 to +30° C., A×1.05 mmol of N-halosuccinimide (halogen: Cl, Br, I), and the mixture is stirred for 20 h. Complexes of sparing solubility in DCM may also be converted in other solvents (TCE, THF, DMF, chlorobenzene, etc.) and at elevated temperature. Subsequently, the solvent is substantially removed under reduced pressure. The residue is extracted by boiling with 30-100 ml of methanol, and the solids are filtered off with suction, washed three times with 20 ml of methanol and then dried under reduced pressure. This gives the iridium complexes brominated/halogenated in the para position to the iridium. Complexes having a HOMO (CV) of about −5.1 to −5.0 eV and of smaller magnitude have a tendency to oxidation (Ir(III)→Ir(IV)), the oxidizing agent being bromine released from NBS. This oxidation reaction is apparent by a distinct green hue or brown hue in the otherwise yellow to red solutions/suspensions of the emitters. In such cases, 1-2 further equivalents of NBS are added. For workup, 30-100 ml of methanol and 0.5 ml of hydrazine hydrate as reducing agent are added, which causes the green or brown solution/suspension to turn yellow or red (reduction of Ir(IV)→Ir(III)). Then the solvent is substantially drawn off under reduced pressure, 50 ml of methanol are added, and the solids are filtered off with suction, washed three times with 20 ml each time of methanol and dried under reduced pressure. Substoichiometric brominations, for example mono- or dibrominations etc., of complexes having 6 C—H groups in the para position to the iridium atoms usually proceed less selectively than the stoichiometric brominations. The crude products of these brominations can be separated by chromatography (CombiFlash Torrent from A. Semrau).

Synthesis of Ir2(L1-6Br):

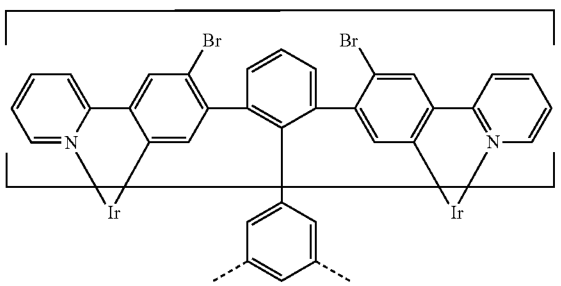

To a suspension of 1.61 g (1.0 mmol) of Ir2(L1) in 200 ml of DCM are added 1.16 g (6.5 mmol) of N-bromosuccinimide (NBS) all at once and then the mixture is stirred for a further 20 h. 0.5 ml of hydrazine hydrate in 30 ml of MeOH is added. After removing about 180 ml of the solvent under reduced pressure, the yellow solids are filtered off with suction, washed three times with about 20 ml of methanol and then dried under reduced pressure. Yield: 1.98 g (0.95 mmol), 95%; purity: >99.5% by NMR.

The following compounds can be synthesized in an analogous manner:

| Ex. | Reactants variant | Product | Yield |
|---|---|---|---|
| $Ir_2$(L3-Br6) | $Ir_2$(L3) | 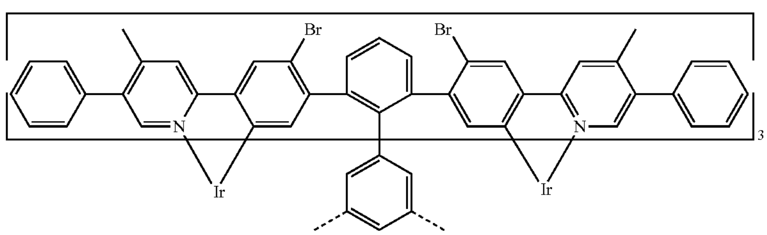 | 95% |
| $Ir_2$(L6-6Br) | $Ir_2$(L6) | 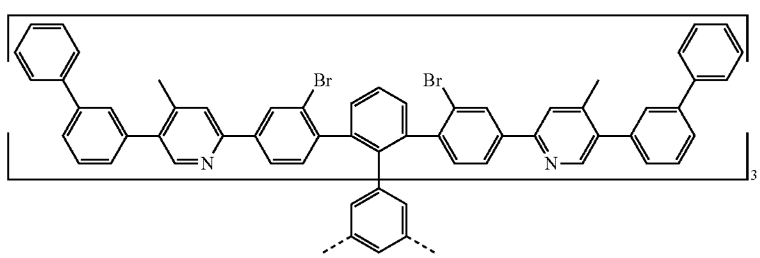 | 93% |
| $Ir_2$(L8-6Br) | $Ir_2$(L8) | 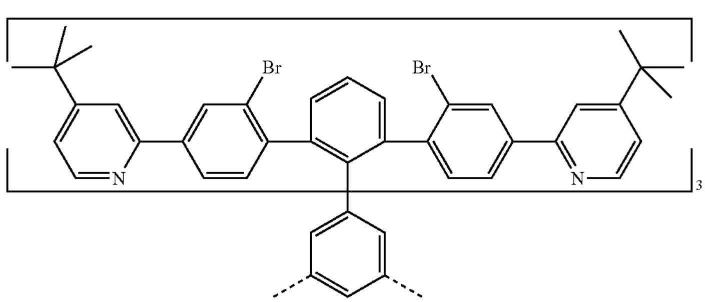 | 97% |

-continued
| Ex. | Reactants variant | Product | Yield |
|---|---|---|---|
| $Ir_2$(L10-6Br) | $Ir_2$(L10) | 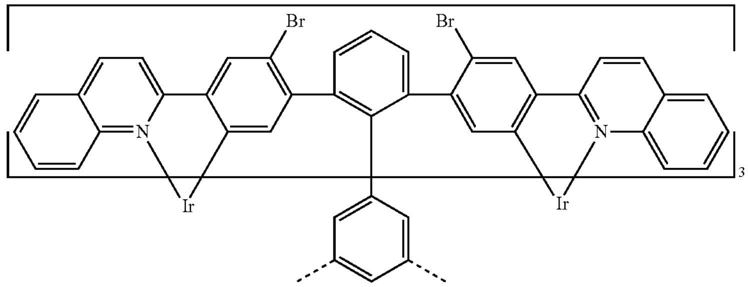 | 96% |
| $Ir_2$(L11-6Br) | $Ir_2$(L11) | 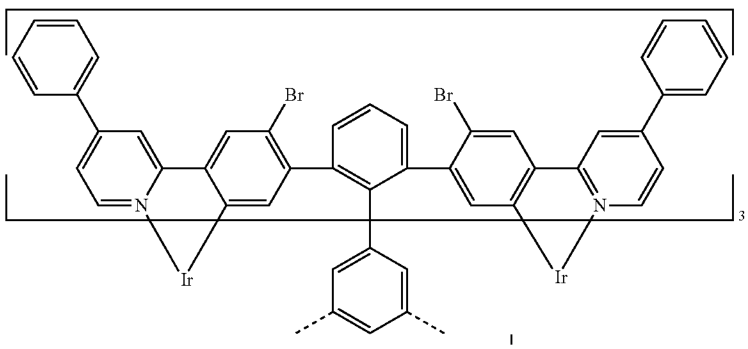 | 96% |
| $Ir_2$(L16-6Br) | $Ir_2$(L16) | 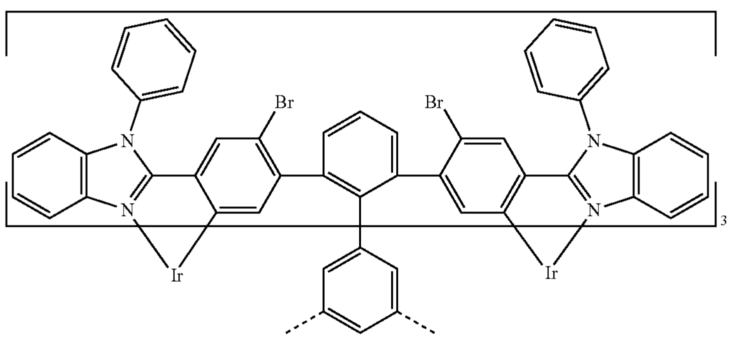 | 94% |
| $Ir_2$(L21-6Br) | $Ir_2$(L21) | 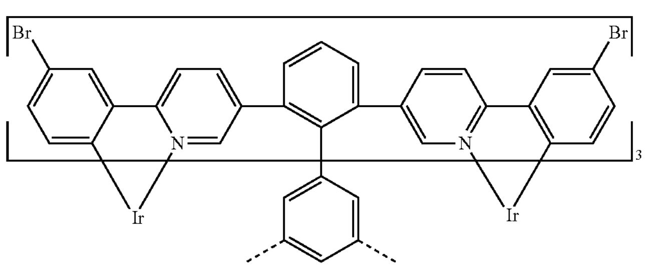 | 95% |
| $Ir_2$(L26-6Br) | $Ir_2$(L26) | 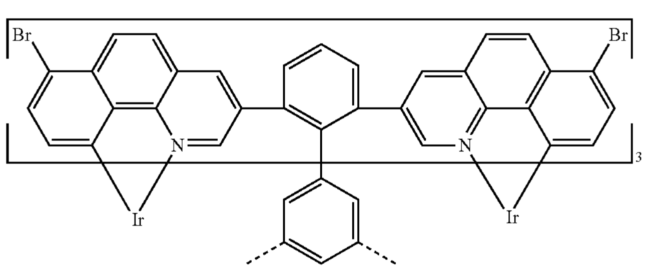 | 96 |

2) Suzuki Coupling with the Brominated Iridium Complexes:

Variant a, Biphasic Reaction Mixture:

To a suspension of 1 mmol of a brominated complex, 1.2-2 mmol of boronic acid or boronic ester per Br function and 6-10 mmol of tripotassium phosphate in a mixture of 50 ml of toluene, 20 ml of dioxane and 50 ml of water are added 0.36 mmol of tri-o-tolylphosphine and then 0.06 mmol of palladium(II) acetate, and the mixture is heated under reflux for 16 h. After cooling, 50 ml of water and 50 ml of toluene are added, the aqueous phase is removed, and the organic phase is washed three times with 50 ml of water and once with 50 ml of saturated sodium chloride solution and dried over magnesium sulfate. The mixture is filtered through a Celite bed in the form of a toluene slurry and washed through with toluene, the toluene is removed almost completely under reduced pressure, 50 ml of methanol are added, and the precipitated crude product is filtered off with suction, washed three times with 30 ml each time of methanol and dried under reduced pressure. The crude product is columned on silica gel in an automated column system (Torrent from Semrau). Subsequently, the complex is purified further by hot extraction in solvents such as ethyl acetate, toluene, dioxane, acetonitrile, cyclohexane, ortho- or para-xylene, n-butyl acetate, chlorobenzene, etc. Alternatively, it is possible to recrystallize from these solvents and high boilers such as dimethylformamide, dimethyl sulfoxide or mesitylene. The metal complex is finally heat-treated or sublimed. The heat treatment is effected under high vacuum (p about $10^{-6}$ mbar) within the temperature range of about 200-300° C.

Variant B, Monophasic Reaction Mixture:

To a suspension of 1 mmol of a brominated complex, 1.2-2 mmol of boronic acid or boronic ester per Br function and 2-4 mmol of the base per Br function (potassium fluoride, tripotassium phosphate, anhydrous or monohydrate or trihydrate, potassium carbonate, cesium carbonate, etc.) and 10 g of glass beads (diameter 3 mm) in 30-50 ml of an aprotic solvent (THF, dioxane, xylene, mesitylene, dimethylacetamide, NMP, DMSO, etc.) is added 0.01 mmol per Br function of tetrakis(triphenylphosphine)palladium(0) [14221-01-3], and the mixture is heated under reflux for 24 h. Alternatively, it is possible to use other phosphines such as triphenylphosphine, tri-tert-butylphosphine, SPhos, XPhos, RuPhos, XanthPhos, etc. in combination with $Pd(OAc)_2$, the preferred phosphine:palladium ratio in the case of these phosphines being 3:1 to 1.2:1. The solvent is removed under reduced pressure, the product is taken up in a suitable solvent (toluene, dichloromethane, ethyl acetate, etc.) and purification is effected as described in Variant A.

In the case of sparingly soluble reactant complexes, it may be advantageous first to conduct the Suzuki coupling by variant B and to subject the crude product obtained to another Suzuki coupling by variant A in order to achieve maximum conversion. After the crude product has been isolated, trace contaminations by remaining bromine can be removed by boiling the crude product in 100 ml of toluene with addition of 10 mg of palladium(II) acetate and 1 ml of hydrazine hydrate for 16 h. Thereafter, the crude product is purified as described above.

Synthesis of Ir21:

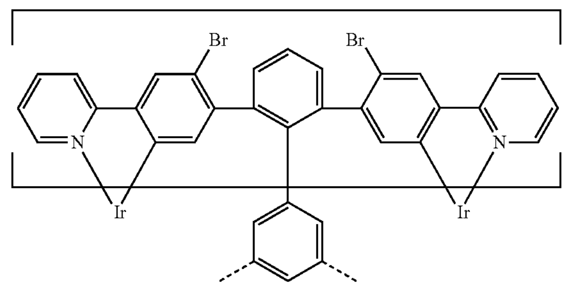

Variant B:

Use of 2.08 g (1.0 mmol) of Ir(L1-6Br) and 1.46 g (12.0 mmol) of phenylboronic acid [98-80-6], 4.15 g (18.0 mmol) of tripotassium phosphate monohydrate, 70 mg (0.06 mmol) of tetrakis(triphenylphosphine)palladium(0) and 50 ml of dry dimethyl sulfoxide. Reaction time 16 h at 100° C. Chromatographic separation on silica gel with DCM/n-heptane (automated column system, Torrent from Axel Semrau), followed by hot extraction five times with toluene. Yield: 1.21 g (0.58 mmol), 58%. Purity: about 99.9% by HPLC.

In an analogous manner, it is possible to prepare the following compounds:

| Ex. | Reactants Variant | Product Hot extraction solvent | Yield |
|---|---|---|---|
| $Ir_22$ | Ir(L1-6Br) 912844-88-4 B, then A, then debromination with hydrazine hydrate | 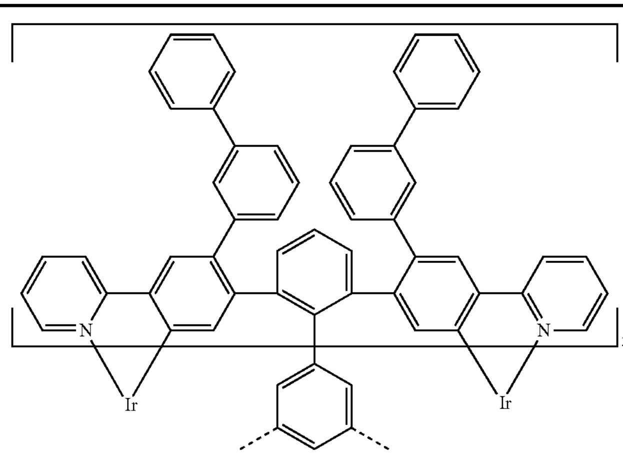 butyl acetate | 61% |

-continued
| Ex. | Reactants<br>Variant | Product<br>Hot extraction solvent | Yield |
|---|---|---|---|
| $Ir_23$ | Ir(L1-6Br)<br>888330-89-0<br>B | 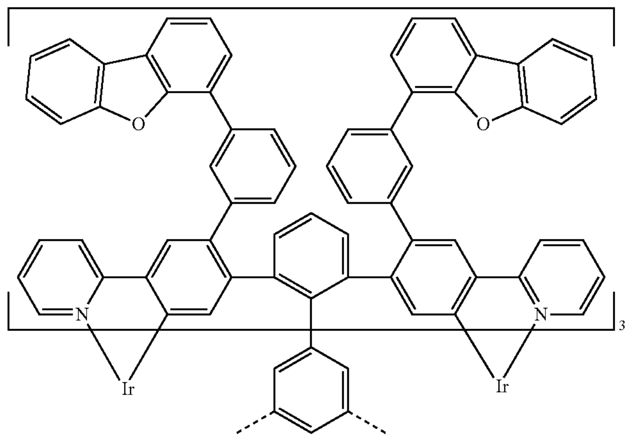<br>toluene | 55% |
| $Ir_24$ | Ir2(L3-Br6)<br>1257248-43-3<br>B,<br>then A, then debromination with hydrazine hydrate | 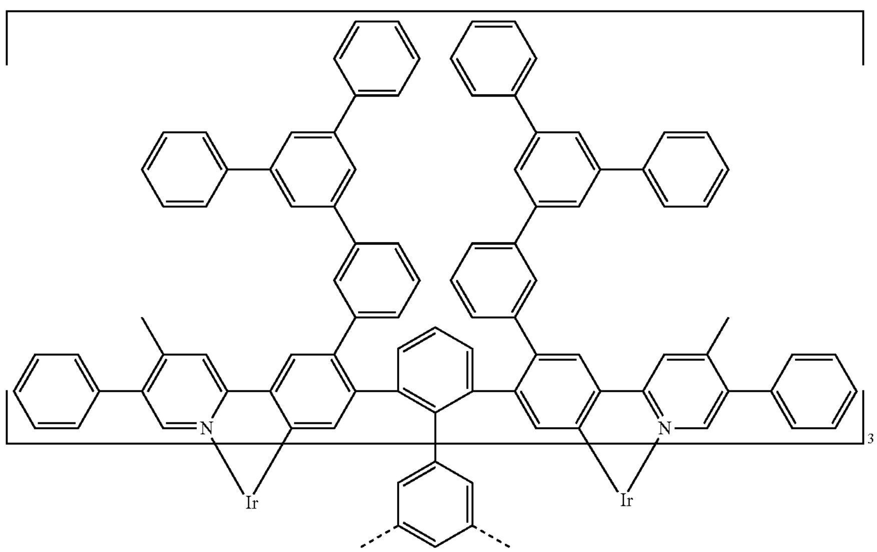<br>toluene | 59% |
| $Ir_25$ | Ir2(L6-6Br)<br>1126522-69-7<br>B,<br>then A, then debromination with hydrazine hydrate | 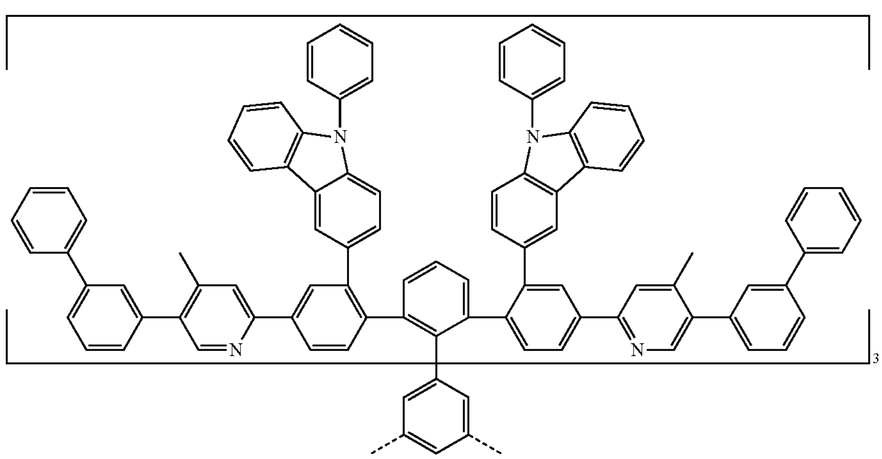<br>toluene | 52% |

-continued
| Ex. | Reactants<br>Variant | Product<br>Hot extraction solvent | Yield |
|---|---|---|---|
| $Ir_26$ | $Ir_2$(L8-6Br)<br>80042-13-4<br>B,<br>then A, then debromination with hydrazine hydrate | 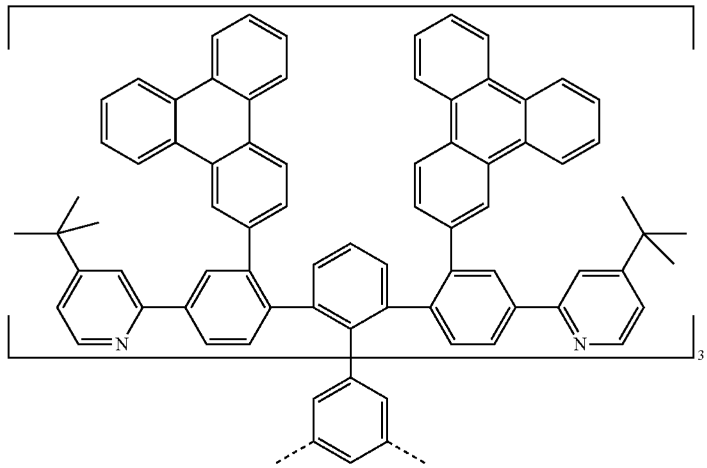<br>o-xylene | 60% |
| $Ir_27$ | $Ir_2$(L10-6Br)<br>627526-15-2<br>B | 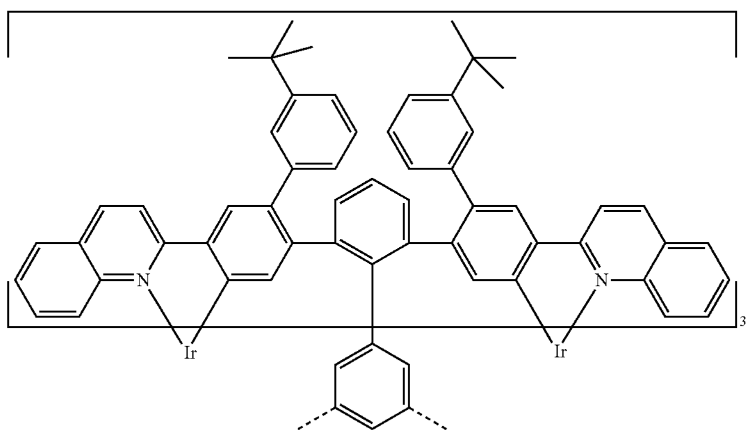<br>butyl acetate | 53% |
| $Ir_28$ | $Ir_2$(L11-6Br)<br>84110-40-7<br>A<br>S-Phos/<br>Pd(ac)$_2$<br>2/1 | 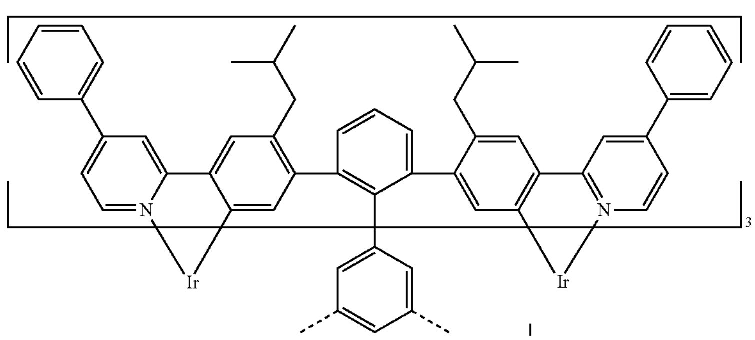<br>ethyl acetate | 49% |

-continued
| Ex. | Reactants Variant | Product Hot extraction solvent | Yield |
|---|---|---|---|
| $Ir_2$9 | $Ir_2$(L16-6Br) 796071-96-0 B, then A, then debromination with hydrazine hydrate | 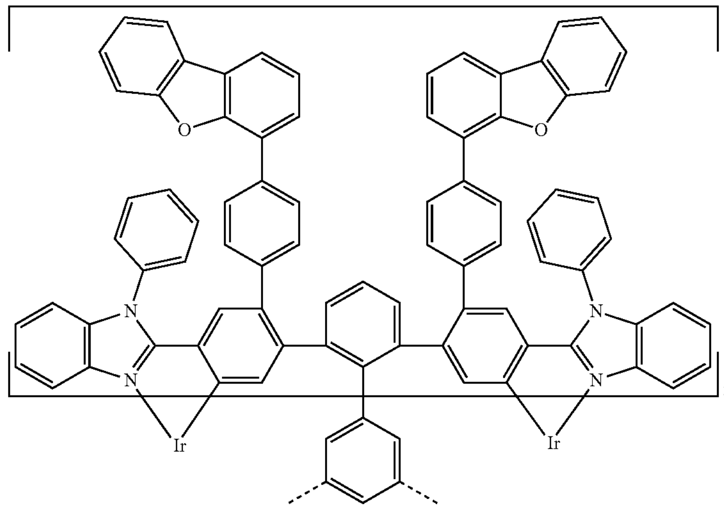 toluene | 59% |
| $Ir_2$10 | $Ir_2$(L21-6Br) 4688-76-0 B | 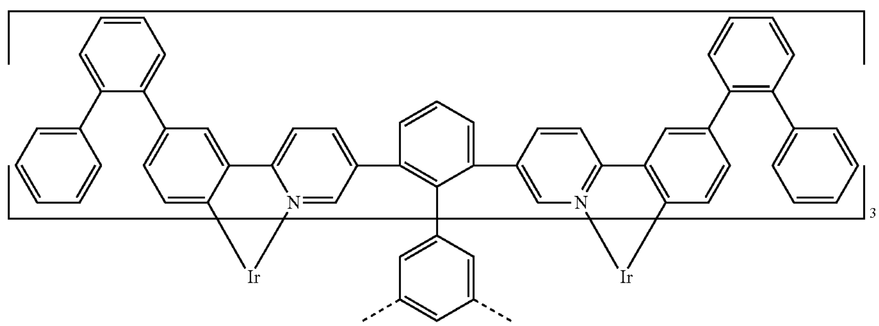 butyl acetate | 54% |
| $Ir_2$11 | $Ir_2$(L26-6Br) 610787-99-0 B | 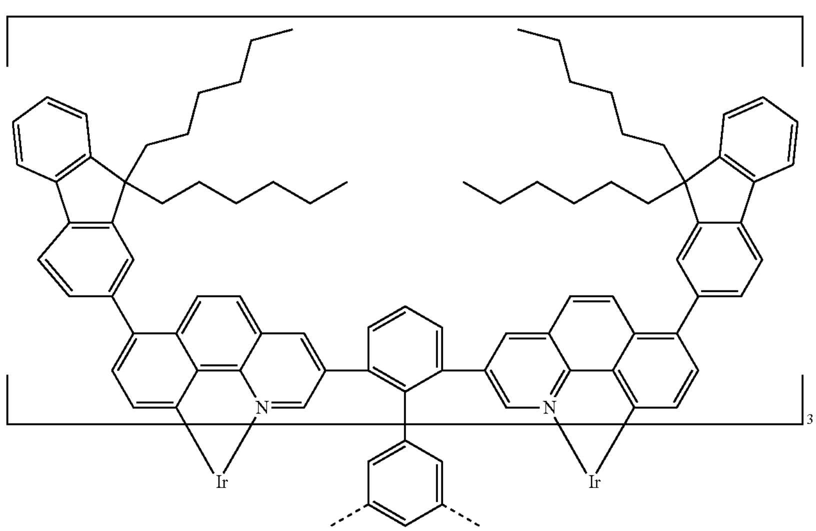 acetonitrile/ethyl acetate 2:1 (vv) | 46% |

Thermal and Photophysical Properties and Oxidation and Reduction Potentials

Table 1 summarizes the thermal and photochemical properties and oxidation potentials of comparative materials and materials of the invention. The compounds of the invention have improved thermal stability and photostability compared to the non-polypodal materials according to the prior art. While non-polypodal materials according to the prior art exhibit brown discoloration and ashing after thermal storage at 380° C. for 7 days and secondary components in the region of >2 mol % can be detected in the $^{1}$H NMR, the complexes of the invention are inert under these conditions. In addition, the compounds of the invention have very good photostability in anhydrous $C_6D_6$ solution under irradiation with light of wavelength about 455 nm. More particularly, in contrast to non-polypodal prior art complexes containing bidentate ligands, no facial-meridional isomerization is detectable in the $^{1}$H NMR. As can be inferred from Table 1, the compounds of the invention in solution show universally very high PL quantum efficiencies.

TABLE 1

| Complex | HOMO [eV] | PL-max [nm]. FWHM [nm] | PLQE Solvent | Decay time τ [µs] | Therm. stability Photochem. stab. |
|---|---|---|---|---|---|
| Comparative examples, for structures see device examples, table 2 | | | | | |
| Ref1 | −5.10 | 509 | 0.97 | 1.3 | decomp. |
| IrPPy | | 67 | toluene | | decomp. |
| Ref2 | −5.12 | 520 | 0.98 | 1.6 | no decomp. |
| | | 64 | toluene | | no decomp. |
| Inventive examples | | | | | |
| $Ir_2$(L1) | −5.00 | 519 | 0.98 | 1.2 | no decomp. |
| | | 60 | toluene | | no decomp. |
| $Ir_2$(L21) | −5.21 | 537 | 0.96 | 1.2 | no decomp. |
| | | 67 | toluene | | no decomp. |
| $Ir_2$2 | −5.03 | 521 | 0.98 | 1.1 | no decomp. |
| | | 56 | toluene | | no decomp. |
| $Ir_2$3 | −5.05 | 520 | 0.97 | 1.2 | no decomp. |
| | | 55 | toluene | | no decomp. |

Legend:

Therm. stab. (thermal stability): Storage in ampoules closed by fusion under reduced pressure, 7 days at 380° C. Visual assessment for color change/brown discoloration/ashing and analysis by means of $^{1}$H NMR spectroscopy.

Photo. stab. (photochemical stability): Irradiation of about 1 mmolar solutions in anhydrous $C_6D_6$ (degassed NMR tubes closed by fusion) with blue light (about 455 nm, 1.2 W Lumispot from Dialight Corporation, USA) at RT.

TABLE 1-continued

| Complex | HOMO [eV] | PL-max [nm]. FWHM [nm] | PLQE Solvent | Decay time τ [µs] | Therm. stability Photochem. stab. |
|---|---|---|---|---|---|

PL-max.: Maximum of the PL spectrum in [nm] of a degassed about $10^{-5}$ molar solution at RT, excitation wavelength 370 nm, for solvent see PLQE column.

FWHM: Half-height width of the PL spectrum in [nm] at RT; for solvent see PLQE column.

PLQE: Abs. photoluminescence quantum efficiency of a degassed, about $10^{-5}$ molar solution in the solvent specified measured at RT as an absolute value via Ulbricht sphere.

Decay time:

$T_1$ lifetime measurements were determined by time-correlated single photon counting of a degassed $10^{-5}$ molar solution in toluene at room temperature.

HOMO, LUMO: in [eV] vs. vacuum, determined in dichloromethane solution (oxidation) or THF (reduction) with ferrocene as internal reference (−4.8 eV vs. vacuum).

Device Examples

Example 1: Production of the OLEDs

The complexes of the invention can be processed from solution and lead, compared to vacuum-processed OLEDs, to significantly more easily producible OLEDs having properties that are nevertheless good. There are already many descriptions of the production of completely solution-based OLEDs in the literature, for example in WO 2004/037887. There have likewise been many previous descriptions of the production of vacuum-based OLEDs, including in WO 2004/058911. In the examples discussed hereinafter, layers applied in a solution-based and vacuum-based manner are combined within an OLED, and so the processing up to and including the emission layer is effected from solution and in the subsequent layers (hole blocker layer and electron transport layer) from vacuum. For this purpose, the previously described general methods are matched to the circumstances described here (layer thickness variation, materials) and combined as follows. The general structure is as follows: substrate/ITO (50 nm)/hole injection layer (HIL)/hole transport layer (HTL)/emission layer (EML)/hole blocker layer (HBL)/electron transport layer (ETL)/cathode (aluminum, 100 nm). Substrates used are glass plates coated with structured ITO (indium tin oxide) of thickness 50 nm. For better processing, they are coated with PEDOT:PSS (poly (3,4-ethylenedioxy-2,5-thiophene) polystyrenesulfonate, purchased from Heraeus Precious Metals GmbH & Co. KG, Germany). PEDOT:PSS is spun on from water under air and subsequently baked under air at 180° C. for 10 minutes in order to remove residual water. The hole transport layer and the emission layer are applied to these coated glass plates. The hole transport layer used is crosslinkable. A polymer of the structures shown below is used, which can be synthesized according to WO 2010/097155 or WO 2013/156130:

HTL-1

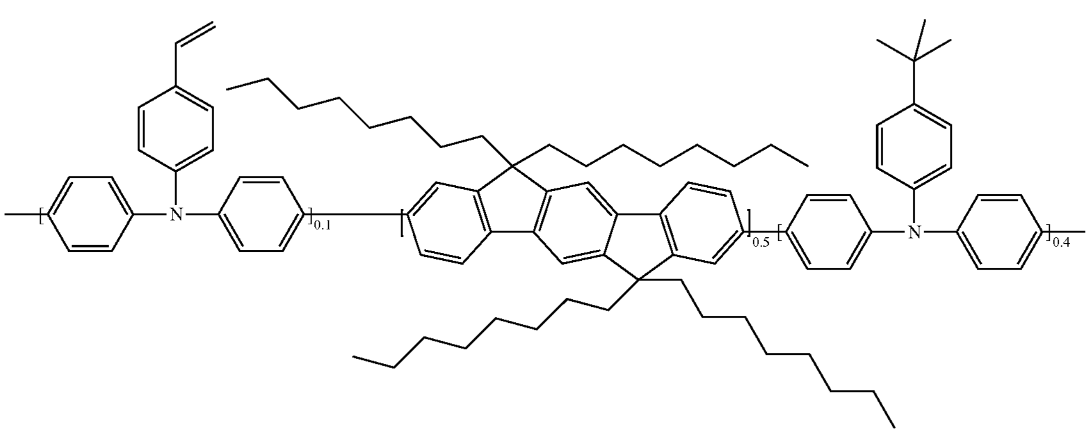

-continued

HTL-2

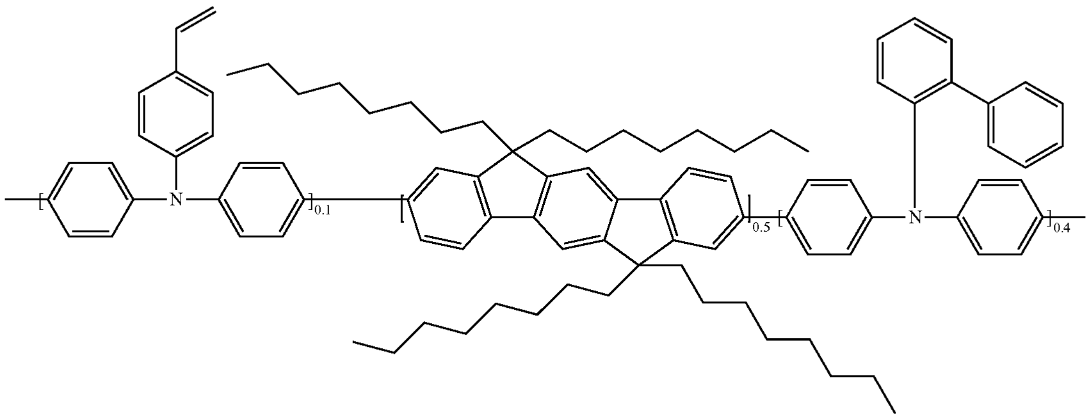

The hole transport polymer is dissolved in toluene. The typical solids content of such solutions is about 5 g/I when, as here, the layer thickness of 20 nm which is typical of a device is to be achieved by means of spin-coating. The layers are spun on in an inert gas atmosphere, argon in the present case, and baked at 180° C. for 60 minutes.

The emission layer is always composed of at least one matrix material (host material) and an emitting dopant (emitter). In addition, mixtures of a plurality of matrix materials and co-dopants may occur. Details given in such a form as TMM-A (92%):dopant (8%) mean here that the material TMM-A is present in the emission layer in a proportion by weight of 92% and dopant in a proportion by weight of 8%. The mixture for the emission layer is dissolved in toluene or optionally chlorobenzene. The typical solids content of such solutions is about 17 g/I when, as here, the layer thickness of 60 nm which is typical of a device is to be achieved by means of spin-coating. The layers are spun on in an inert gas atmosphere, argon in the present case, and baked at 150° C. for 10 minutes. The materials used in the present case are shown in Table 2.

TABLE 2

| EML materials used |
| --- |
| 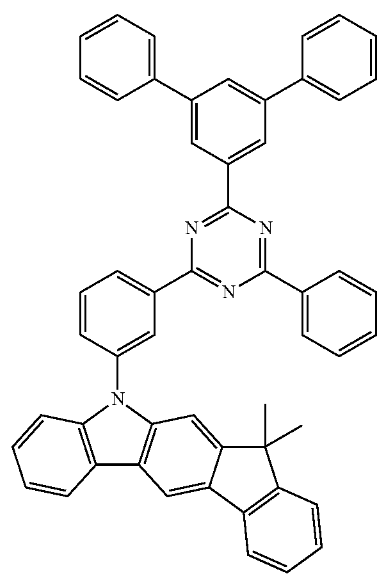 A-1 [1616231-83-4] |

TABLE 2-continued
| EML materials used |
| --- |
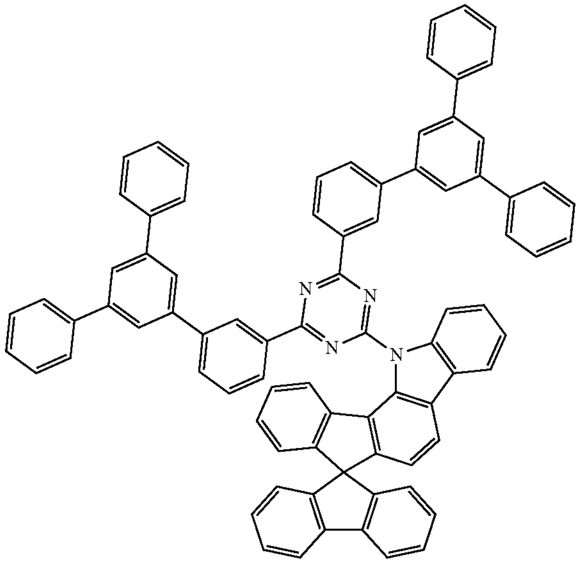
A-2
see WO 2014/094963
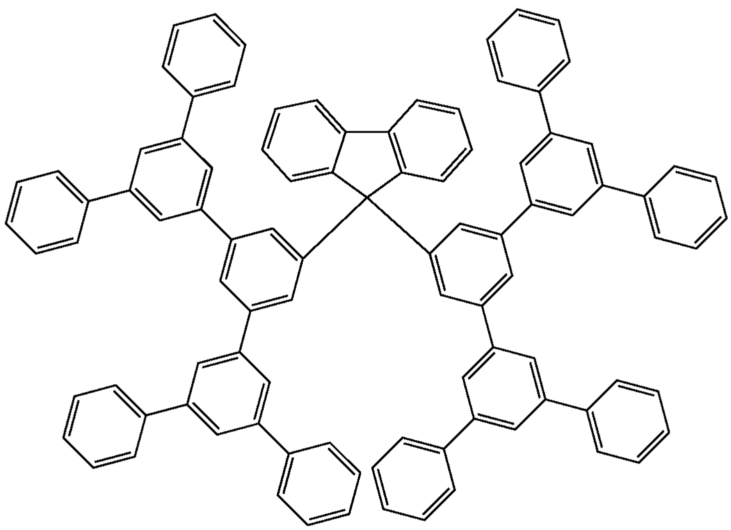
B-1
[1257248-8-7]
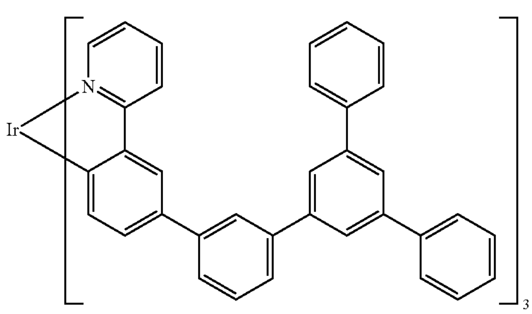
G-1
[129508-30-6]

TABLE 2-continued
| EML materials used |
| --- |
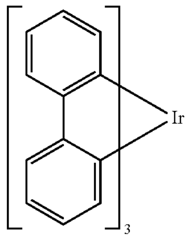
Ref1
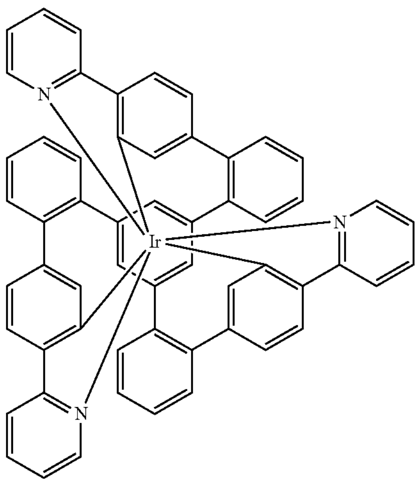
Ref2
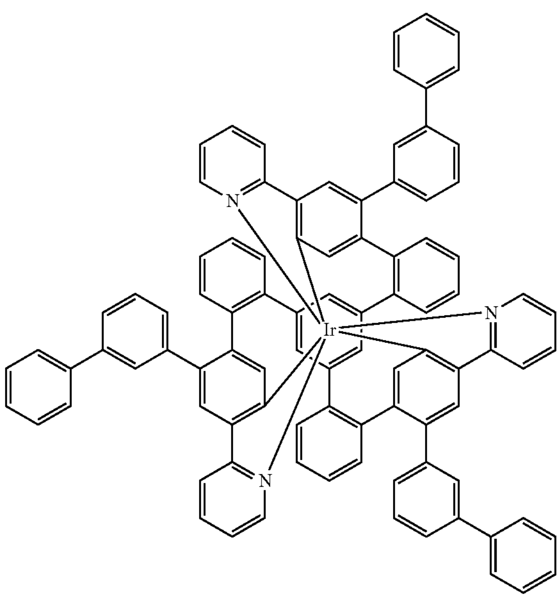
G-2
see WO 2016/124304

TABLE 2-continued
| EML materials used |
|---|
| 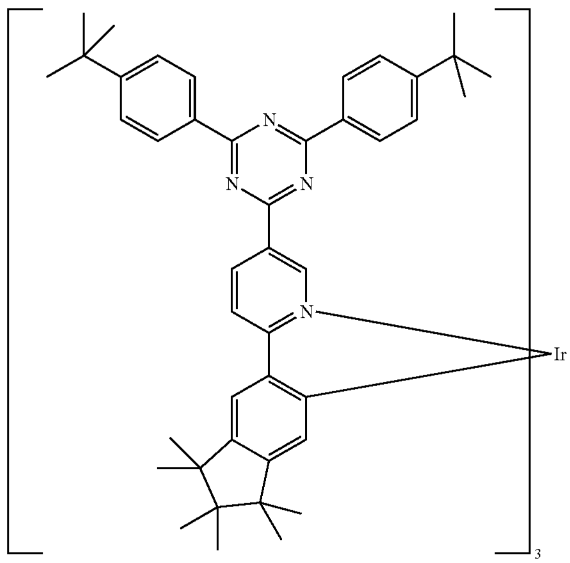<br>R-1<br>1870013-87-8 |
| 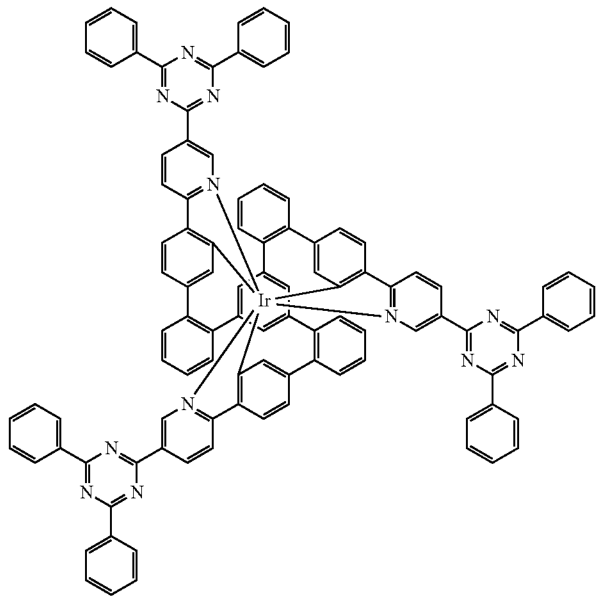<br>R-2<br>see WO 2016/124304 |

The materials for the hole blocker layer and electron transport layer are applied by thermal vapor deposition in a vacuum chamber. The electron transport layer, for example, may consist of more than one material which are added to one another by co-evaporation in a particular proportion by volume. Details given in such a form as ETM1:ETM2 (50%:50%) mean here that the ETM1 and ETM2 materials are present in the layer in a proportion by volume of 50% each. The materials used in the present case are shown in Table 3.

TABLE 3

HBL and ETL materials used

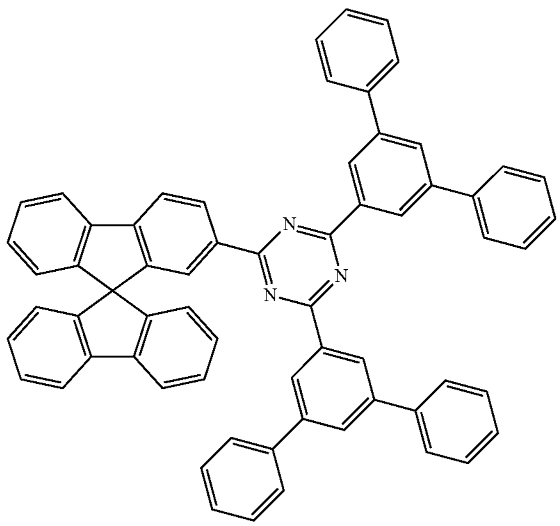

ETM1
[1233200-52-6]

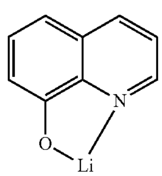

ETM2
[25387-93-3]

The cathode is formed by the thermal evaporation of a 100 nm aluminum layer. The OLEDs are characterized in a standard manner. For this purpose, the electroluminescence spectra, current-voltage-luminance characteristics (IUL characteristics) assuming Lambertian radiation characteristics and the (operating) lifetime are determined. The IUL characteristics are used to determine parameters such as the operating voltage (in V) and the efficiency (cd/A) at a particular brightness. The electroluminescence spectra are measured at a luminance of 1000 cd/m$^2$, and the CIE 1931 x and y color coordinates are calculated therefrom. The lifetime is defined as the time after which the luminance has fallen from a particular starting luminance to a certain proportion. The figure LT90 means that the lifetime specified is the time at which the luminance has dropped to 90% of the starting luminance, i.e. from, for example, 1000 cd/m$^2$ to 900 cd/m$^2$. According to the emission color, different starting brightnesses are chosen. The values for the lifetime can be converted to a figure for other starting luminances with the aid of conversion formulae known to those skilled in the art. In this context, the lifetime for a starting luminance of 1000 cd/m$^2$ is a standard figure. Alternatively, lifetimes can be determined for a particular initial current, e.g. 60 mA/cm$^2$. The EML mixtures and structures of the OLED components examined are shown in table 4 and table 5. The corresponding results can be found in table 6.

TABLE 4

EML mixtures of the OLED components examined

| | Matrix A | | Co-matrix B | | Co-dopant C | | Dopant D | |
|---|---|---|---|---|---|---|---|---|
| Ex. | material | % | material | % | material | % | material | % |
| red | | | | | | | | |
| VR1 | A-2 | 30 | B-1 | 47 | G-1 | 17 | R-1 | 6 |
| VR2 | A-2 | 30 | B-1 | 34 | G-1 | 30 | R-2 | 6 |
| ER1 | A-2 | 30 | B-1 | 47 | G-1 | 17 | $Ir_2$(L14) | 6 |
| ER2 | A-2 | 30 | B-1 | 34 | G-1 | 30 | $Ir_2$(L14) | 6 |
| ER3 | A-2 | 30 | B-1 | 34 | G-1 | 28 | $Ir_2$7 | 8 |
| green - yellow | | | | | | | | |
| VG1 | A-2 | 20 | B-1 | 60 | — | — | G1 | 20 |
| VG2 | A-2 | 20 | B-1 | 60 | — | — | G2 | 20 |
| EG1 | A-2 | 20 | B-1 | 60 | — | — | $Ir_2$(L6) | 20 |
| EG2 | A-2 | 20 | B-1 | 60 | — | — | $Ir_2$(L11) | 20 |
| EG3 | A-2 | 20 | B-1 | 60 | — | — | $Ir_2$2 | 20 |
| EG4 | A-2 | 20 | B-1 | 60 | — | — | $Ir_2$3 | 20 |
| EG5 | A-2 | 20 | B-1 | 60 | — | — | $Ir_2$9 | 20 |
| EG6 | A-1 | 20 | B-1 | 60 | — | — | $Ir_2$11 | 20 |

TABLE 5

Structure of the OLED components examined

| Ex. | HIL (thickness) | HTL (thickness) | EML thickness | HBL (thickness) | ETL (thickness) |
|---|---|---|---|---|---|
| red | | | | | |
| VR1 | PEDOT (60 nm) | HTL2 (20 nm) | 60 nm | ETM-1 (10 nm) | ETM-1 (50%):ETM-2 (50%) (40 nm) |
| VR2 | PEDOT (60 nm) | HTL2 (20 nm) | 60 nm | ETM-1 (10 nm) | ETM-1 (50%):ETM-2 (50%) (40 nm) |
| ER1 | PEDOT (60 nm) | HTL2 (20 nm) | 60 nm | ETM-1 (10 nm) | ETM-1 (50%):ETM-2 (50%) (40 nm) |
| ER2 | PEDOT (60 nm) | HTL2 (20 nm) | 60 nm | ETM-1 (10 nm) | ETM-1 (50%):ETM-2 (50%) (40 nm) |
| ER3 | PEDOT (60 nm) | HTL2 (20 nm) | 60 nm | ETM-1 (10 nm) | ETM-1 (50%):ETM-2 (50%) (40 nm) |
| yellow - green | | | | | |
| VG1 | PEDOT (60 nm) | HTL2 (20 nm) | 60 nm | ETM-1 (10 nm) | ETM-1 (50%):ETM-2 (50%) (40 nm) |
| VG2 | PEDOT (60 nm) | HTL2 (20 nm) | 60 nm | ETM-1 (10 nm) | ETM-1 (50%):ETM-2 (50%) (40 nm) |
| EG1 | PEDOT (60 nm) | HTL2 (20 nm) | 60 nm | ETM-1 (10 nm) | ETM-1 (50%):ETM-2 (50%) (40 nm) |
| EG2 | PEDOT (60 nm) | HTL2 (20 nm) | 60 nm | ETM-1 (10 nm) | ETM-1 (50%):ETM-2 (50%) (40 nm) |
| EG3 | PEDOT (60 nm) | HTL2 (20 nm) | 60 nm | ETM-1 (10 nm) | ETM-1 (50%):ETM-2 (50%) (40 nm) |
| EG4 | PEDOT (60 nm) | HTL2 (20 nm) | 60 nm | ETM-1 (10 nm) | ETM-1 (50%):ETM-2 (50%) (40 nm) |
| EG5 | PEDOT (60 nm) | HTL2 (20 nm) | 60 nm | ETM-1 (10 nm) | ETM-1 (50 %):ETM-2 (50%) (40 nm) |
| EG6 | PEDOT (60 nm) | HTL2 (20 nm) | 60 nm | ETM-1 (10 nm) | ETM-1 (50%):ETM-2 (50%) (40 nm) |

The compounds Ir2(L1), Rh—Ir(L1), Ir2(L2), Ir2(L3), Ir2(L4), Ir2(L5), Ir2(L7), Ir2(L8), Ir2(L9), Ir2(L10), Ir2 (L12), Ir2(L13), Ir2(L15), Ir2(L16), Rh—Ir(L16), Ir2(L17), Ir2(L18), Ir2(L19), Ir2(L20), Ir2(L21), Ir2(L22), Ir2(L23), Ir2(L24), Ir2(L25), Ir2(L26), Ir2(L27), Ir2(L28), Ir2(L29), Ir2(L30), Ir2(L31), Ir2(L32), Ir2(L33), Ir2(L34), Ir24, Ir25, Ir26, Ir28 and Ir210 can be used in devices as described in the examples ER1, ER2, ER3, EG1, EG2, EG3, EG4, EG5 and EG6, and show intense green, yellow, orange or red electroluminescence and good efficiency.

TABLE 6

Results for solution-processed OLEDs (measured at a brightness of 1000 cd/m$^2$)

| red | | | | |
|---|---|---|---|---|
| Ex. | EQE [%] | CIE x | CIE y | LT90 @60 mA/cm$^2$ |
| VR1 | 16.2 | 0.66 | 0.34 | 276 |
| VR2 | 18.2 | 0.64 | 0.36 | 298 |
| ER1 | 19.6 | 0.66 | 0.34 | 329 |
| ER2 | 19.9 | 0.66 | 0.34 | 323 |
| ER3 | 19.8 | 0.65 | 0.35 | 305 |
| **yellow-green** | | | | |
| Ex. | EQE [%] | CIE x | CIE y | LT90 @1000 cd/m$^2$ |
| VG1 | 19.9 | 0.32 | 0.63 | 20000 |
| VG2 | 21.5 | 0.32 | 0.65 | 28000 |
| EG1 | 19.5 | 0.35 | 0.61 | 34000 |
| EG2 | 21.8 | 0.48 | 0.50 | 49000 |
| EG3 | 21.9 | 0.32 | 0.64 | 30000 |
| EG4 | 21.7 | 0.32 | 0.64 | 31000 |
| EG5 | 20.5 | 0.38 | 0.59 | 24000 |
| EG6 | 19.4 | 0.51 | 0.48 | 52000 |

The invention claimed is:

1. A compound comprising a ligand of formula (1) coordinated to two metals, wherein the metals are the same or different and are selected from iridium and rhodium:

(1)

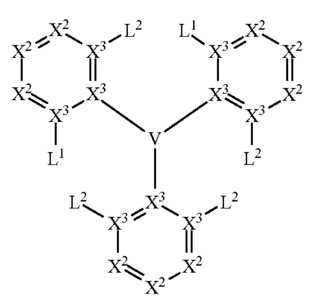

wherein

V is a group of formula (2) or (3):

(2)

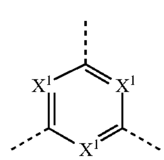

-continued (3)

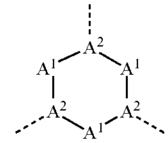

wherein the dotted lines denote the bonds to $X^3$;

$L^1$ is the same or different in each instance and is a bidentate monoanionic sub-ligand, wherein all sub-ligands $L^1$ coordinate to one of the two metals;

$L^2$ is the same or different in each instance and is a bidentate monoanionic sub-ligand, where all sub-ligands $L^2$ coordinate to the one of the two metals not coordinated to $L^1$;

$X^1$ is the same or different in each instance and is CR or N;

$X^2$ is the same or different in each instance and is CR or N or two adjacent $X^2$ groups together are NR, O, or S, so as to define a five-membered ring, and the remaining $X^2$ are the same or different in each instance and are CR or N; or two adjacent $X^2$ groups together are CR or N when one of the $X^3$ groups in the cycle is N, so as to define a five-membered ring; with the proviso that not more than two adjacent $X^2$ groups are N;

$X^3$ is C in each instance or one $X^3$ group is N and the other $X^3$ groups in the same cycle are C; with the proviso that two adjacent $X^2$ groups together are CR or N when one of the $X^3$ groups in the cycle is N;

$A^1$ is the same or different in each instance and is $C(R)_2$ or O;

$A^2$ is the same or different in each instance and is CH, CD, or B, with the proviso that, when $A^2$ is B, $A^1$ is O;

R is the same or different in each instance and is H, D, F, Cl, Br, I, $N(R^1)_2$, CN, $NO_2$, $OR^1$, $SR^1$, COOH, $C({=}O)N(R^1)_2$, $Si(R^1)_3$, $B(OR^1)_2$, $C({=}O)R^1$, $P({=}O)(R^1)_2$, $S({=}O)R^1$, $S({=}O)_2R^1$, $OSO_2R^1$, COO(cation), $SO_3$(cation), $OSO_3$(cation), $OPO_3(\text{cation})_2$, O(cation), $N(R^1)_3$(anion), $P(R^1)_3$(anion), a straight-chain alkyl group having 1 to 20 carbon atoms or an alkenyl or alkynyl group having 2 to 20 carbon atoms or a branched or cyclic alkyl group having 3 to 20 carbon atoms, where the alkyl, alkenyl, or alkynyl group in each case is optionally substituted by one or more $R^1$ radicals, wherein one or more nonadjacent $CH_2$ groups are optionally replaced by $Si(R^1)_2$, C=O, $NR^1$, O, S, or $CONR^1$, or an aromatic or heteroaromatic ring system which has 5 to 40 aromatic ring atoms and is optionally substituted in each case by one or more $R^1$ radicals; and wherein two R radicals together optionally define a ring system;

$R^1$ is the same or different in each instance and is H, D, F, Cl, Br, I, $N(R^2)_2$, CN, $NO_2$, $OR^2$, $SR^2$, $Si(R^2)_3$, $B(OR^2)_2$, $C({=}O)R^2$, $P({=}O)(R^2)_2$, $S({=}O)R^2$, $S({=}O)_2R^2$, $OSO_2R^2$, COO(cation), $SO_3$(cation), $OSO_3$(cation), $OPO_3(\text{cation})_2$, O(cation), $N(R^2)_3$(anion), $P(R^2)_3$(anion), a straight-chain alkyl group having 1 to 20 carbon atoms or an alkenyl or alkynyl group having 2 to 20 carbon atoms or a branched or cyclic alkyl group having 3 to 20 carbon atoms, where the alkyl, alkenyl, or alkynyl group in each case is optionally substituted by one or more $R^2$ radicals, wherein one or more nonadjacent $CH_2$ groups are optionally replaced by $Si(R^2)_2$, C=O, $NR^2$, O, S, or $CONR^2$, or an aromatic or heteroaromatic ring system which has 5 to 40 aromatic ring atoms and is optionally substituted in each case by one or more $R^2$ radicals; and wherein two or more $R^1$ radicals together optionally define a ring system;

$R^2$ is the same or different in each instance and is H, D, F, or an aliphatic, aromatic, or heteroaromatic organic radical having 1 to 20 carbon atoms, wherein one or more hydrogen atoms is also optionally replaced by F;

cation is the same or different in each instance and is selected from the group consisting of proton, deuteron, alkali metal ions, alkaline earth metal ions, ammonium, tetraalkylammonium, and tetraalkylphosphonium;

anion is the same or different in each instance and is selected from the group consisting of halides, carboxylates $R^2$—$COO^-$, cyanide, cyanate, isocyanate, thiocyanate, thioisocyanate, hydroxide, $BF_4^-$, $PF_6^-$, $B(C_6F_5)_4^-$, carbonate and sulfonates.

2. The compound of claim 1, wherein both metals are Ir(III) and the compound is a an electrically uncharged compound.

3. The compound of claim 1, wherein the ligand of formula (1) has a structure of formula (1'):

(1')

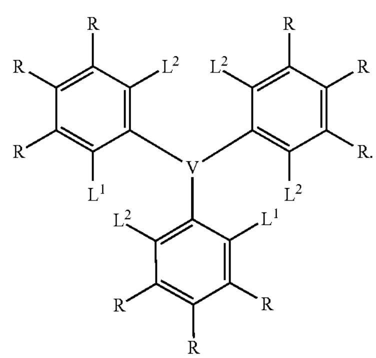

4. The compound of claim 1, wherein the group of formula (2) is selected from the group consisting of structures of formulae (2a) through (2d) and wherein the group of formula (3) is selected from the group consisting of structures of formulae (3a) and (3b):

Formula(2a)

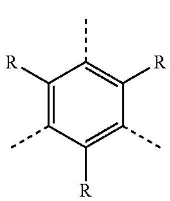

Formula(2b)

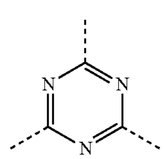

-continued

Formula(2c)

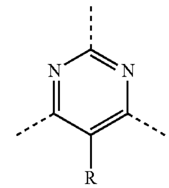

Formula(2d)

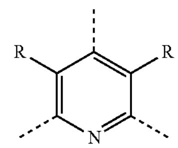

Formula (3a)

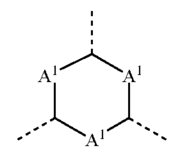

Formula (3b)

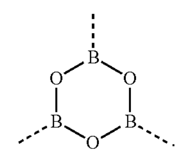

5. The compound of claim 1, wherein the group of formula (2) is a group of formula (2a') and wherein the group of formula (3) is a group of formulae (3a') or (3a"):

(2a')

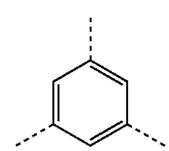

Formel (2a')

(3a')

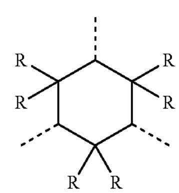

Formel (3a')

(3a")

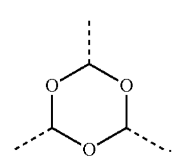

Formel (3a")

6. The compound of claim 1, wherein the ligand of formula (1) has a structure of one of formulae (1a") through (1d"):

(1a")

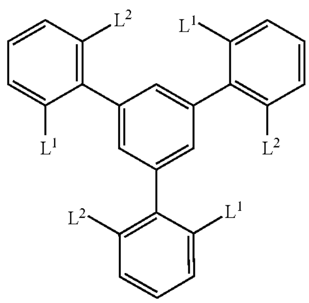

(1b")

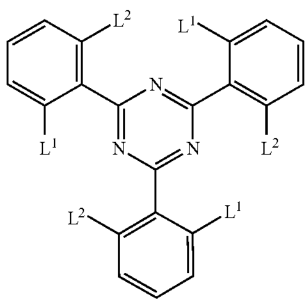

(1c")

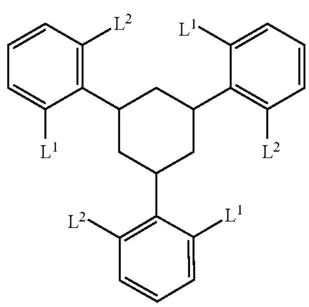

(1d")

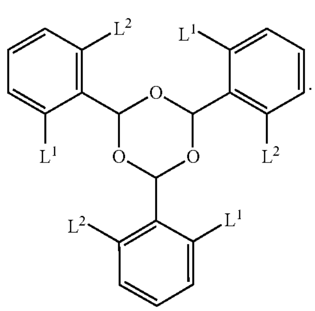

7. The compound of claim 1, wherein all sub-ligands $L^1$ and $L^2$ are identical.

8. The compound of claim 1, wherein all sub-ligands $L^1$ and $L^2$ have one carbon atom and one nitrogen atom or two carbon atoms as coordinating atoms.

9. The compound of claim 1, wherein at least two of the sub-ligands $L^1$ and at least two of the sub-ligands $L^2$ are the same or different in each instance and are selected from the group consisting of structures of formulae (L-1), (L-2), and (L-3):

Formula (L-1)

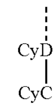

Formula (L-2)

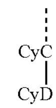

Formula (L-3)

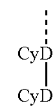

wherein the dotted line denotes the bond of the sub-ligand $L^1$ or $L^2$ to $X^3$ within the ligand of formula (1);

CyC is the same or different in each instance and is a substituted or unsubstituted aryl or heteroaryl group which has 5 to 14 aromatic ring atoms and coordinates to M via a carbon atom and is bonded to CyD via a covalent bond;

CyD is the same or different in each instance and is a substituted or unsubstituted heteroaryl group which has 5 to 14 aromatic ring atoms and coordinates to M via a nitrogen atom or via a carbene carbon atom and is bonded to CyC via a covalent bond; and wherein two or more of substituents together optionally define a ring system.

10. The compound of claim 1, wherein the CyC group is selected from the group consisting of structures of formulae (CyC-1) through (CyC-20) and wherein the CyD group is selected from the group consisting of structures of formulae (CyD-1) through (CyD-14):

(CyC-1)

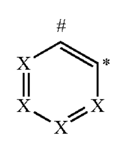

(CyC-2)

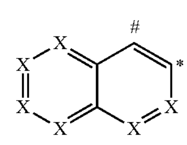

(CyC-3)

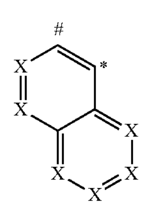

-continued
(CyC-4)
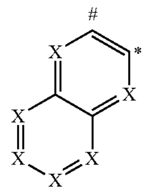
(CyC-5)
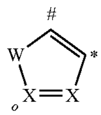
(CyC-6)
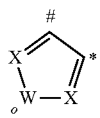
(CyC-7)
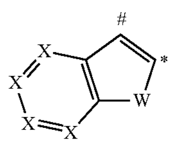
(CyC-8)
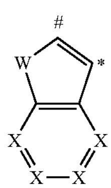
(CyC-9)
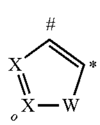
(CyC-10)
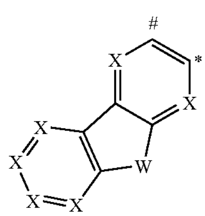
(CyC-11)
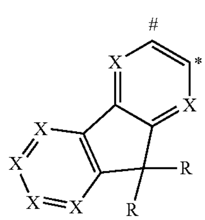
-continued
(CyC-12)
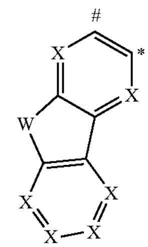
(CyC-13)
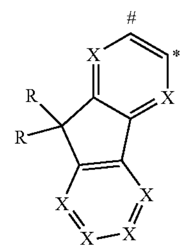
(CyC-14)
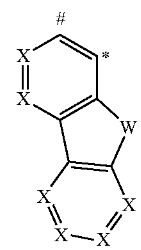
(CyC-15)
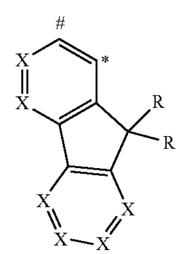
(CyC-16)
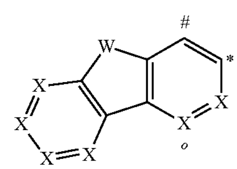
(CyC-17)
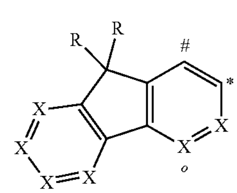
(CyC-18)
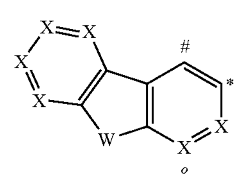

-continued (CyC-19)

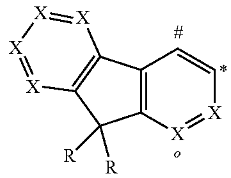

(CyC-20)

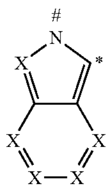

(CyD-1)

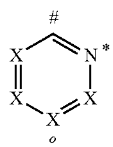

(CyD-2)

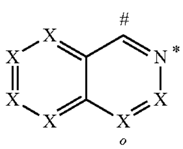

(CyD-3)

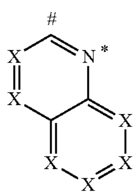

(CyD-4)

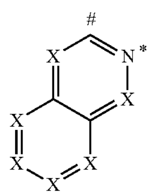

(CyD-5)

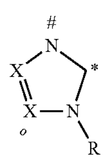

(CyD-6)

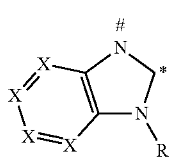

(CyD-7)

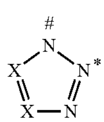

-continued (CyC-8)

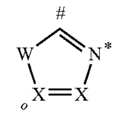

(CyD-9)

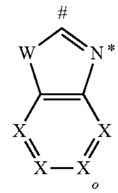

(CyD-10)

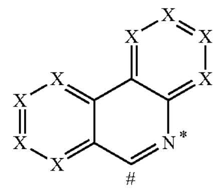

(CyD-11)

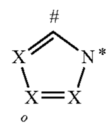

(CyD-12)

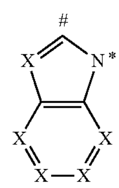

(CyD-13)

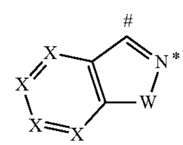

(CyD-14)

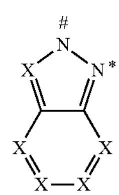

wherein the CyC and CyD groups each bind at the position denoted by # and coordinate to the metal at the position denoted by * and "o" denotes the possible position of the bond to $X^3$ if this group is bonded to $X^3$;

X is the same or different in each instance and is CR or N, with the proviso that not more than two X per cycle are N;

W is NR, O, or S;

with the proviso that the X in CyC or CyD via which the sub-ligand is bonded to $X^3$ is C and $X^3$ is bonded to this carbon atom.

11. The compound of claim 1, wherein the sub-ligands $L^1$ and $L^2$ are the same or different in each instance and are selected from the group consisting of structures of formulae (L-1-1), (L-1-2), (L-2-1) through (L-2-3), and (L-4) through (L-38):
(L-1-1)
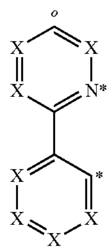
(L-1-2)
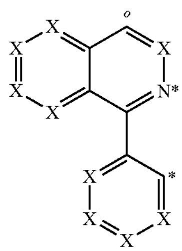
(L-2-1)
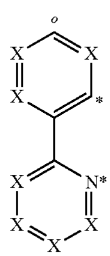
(L-2-2)
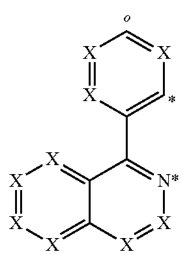
(L-2-3)
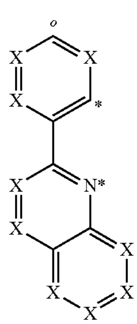
-continued
(L-4)
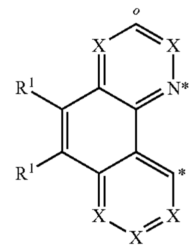
(L-5)
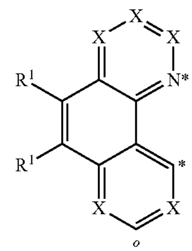
(L-6)
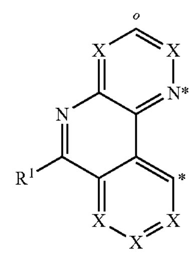
(L-7)
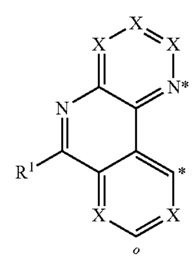
(L-8)
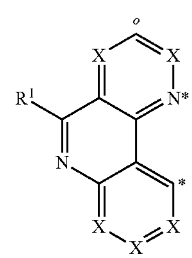
(L-9)
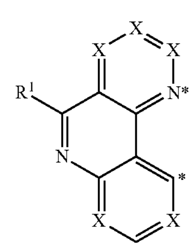

-continued
(L-10)
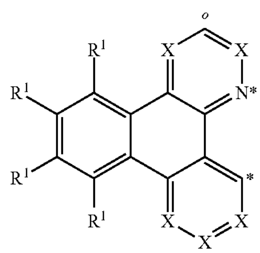
(L-11)
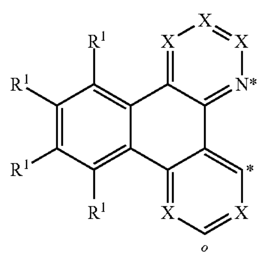
(L-12)
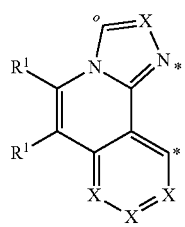
(L-13)
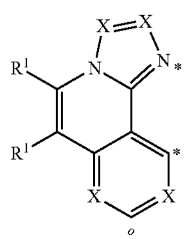
(L-14)
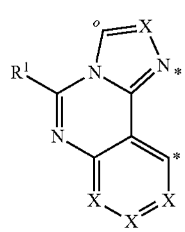
(L-15)
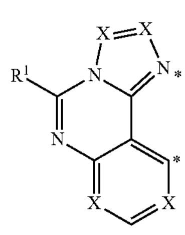
-continued
(L-16)
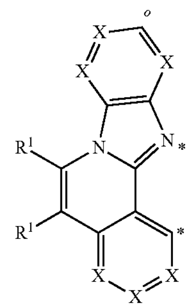
(L-17)
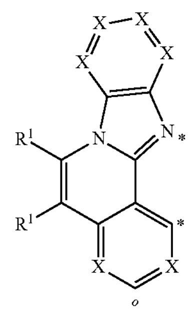
(L-18)
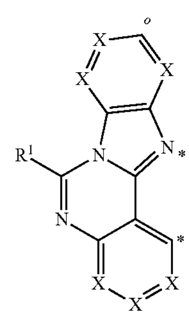
(L-19)
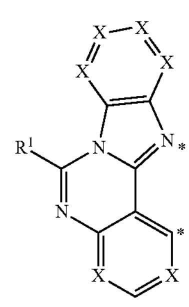
(L-20)
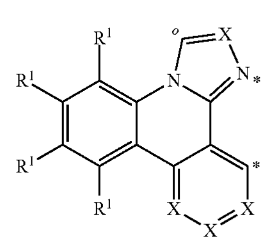

-continued
(L-21)
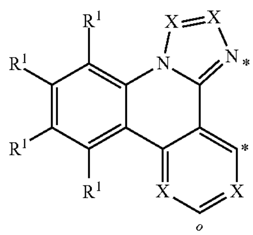
(L-22)
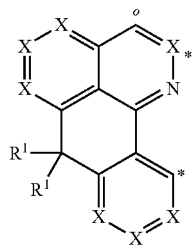
(L-23)
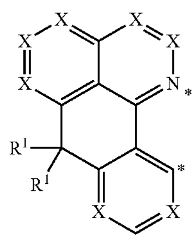
(L-24)
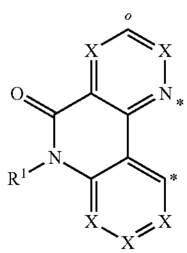
(L-25)
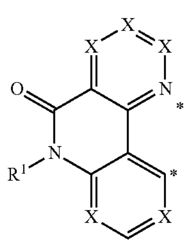
(L-26)
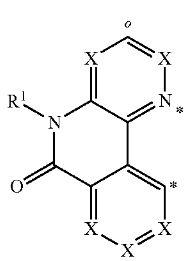
-continued
(L-27)
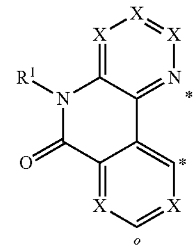
(L-28)
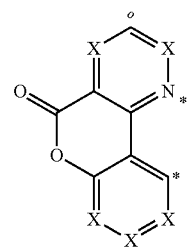
(L-29)
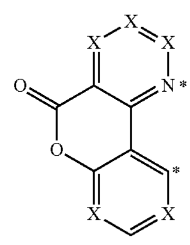
(L-30)
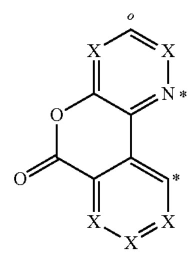
(L-31)
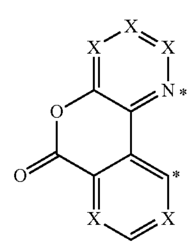
(L-32)
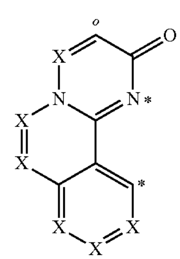

-continued (L-33)

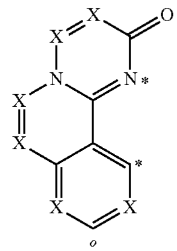

(L-34)

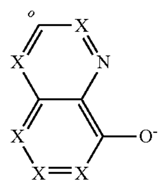

(L-35)

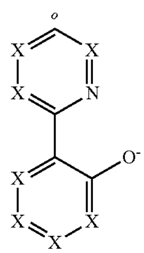

(L-36)

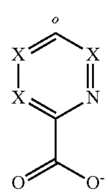

(L-37)

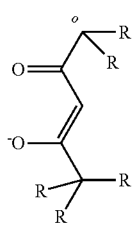

(L-38)

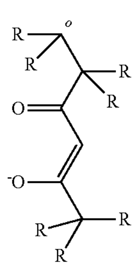

wherein

X is the same or different in each instance and is CR or N, with the proviso that not more than two X per cycle are N; and

* denotes the position of coordination to the metal and "o" denotes the position of the bond to $X^3$; and wherein the sub-ligands (L-34) through (L-36) each coordinate via the nitrogen atom explicitly shown and the negatively charged oxygen atom and the sub-ligands (L-37) and (L-38) coordinate via the two oxygen atoms.

12. The compound of claim 1, wherein $R^2$ is a hydrocarbyl radical.

13. A process for preparing the compound of claim 1 comprising reacting the ligand with metal alkoxides of formula (22), with metal ketoketonates of formula (23), with metal halides of formula (24), with metal carboxylates of formula (25), or with iridium compounds or rhodium compounds bearing both alkoxide and/or halide and/or hydroxyl radicals and ketoketonate radicals:

$$M(OR)_3 \tag{22}$$

(23)

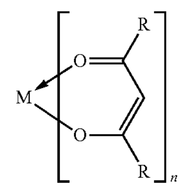

$$MHal_3 \tag{24}$$

$$M(OOCR)_3 \tag{25}$$

wherein

M is iridium or rhodium;

Hal is F, Cl, Br, or I;

and the iridium reactants or rhodium reactants may also be in the form of their corresponding hydrates.

14. A formulation comprising at least one compound of claim 1 and at least one further compound, wherein the at least one further compound is selected from the group consisting of at least one solvent and/or at least one matrix material.

15. An electronic device comprising at least one compound of claim 1.

16. The electronic device of claim 15, wherein the electronic device is selected from the group consisting of organic electroluminescent devices, organic integrated circuits, organic field-effect transistors, organic thin-film transistors, organic light-emitting transistors, organic solar cells, organic optical detectors, organic photoreceptors, organic field-quench devices, light-emitting electrochemical cells, oxygen sensors, and organic laser diodes.

17. The electronic device of claim 16, wherein the electronic device is an organic electroluminescent device and wherein the compound of formula (1) is present in the electroluminescent device as an emitting compound in one or more emitting layers.

* * * * *